US011165484B2

(12) United States Patent
Yang

(10) Patent No.: US 11,165,484 B2
(45) **Date of Patent: *Nov. 2, 2021**

(54) RADIO FREQUENCY SYSTEM, METHOD FOR CONTROLLING ANTENNA SWITCHING, AND RELATED PRODUCTS

(71) Applicant: Guangdong Oppo Mobile Telecommunications Corp., Ltd., Guangdong (CN)

(72) Inventor: Xin Yang, Guangdong (CN)

(73) Assignee: GUANGDONG OPPO MOBILE TELECOMMUNICATIONS CORP., LTD., Dongguan (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/518,476

(22) Filed: Jul. 22, 2019

(65) Prior Publication Data

US 2020/0028562 A1 Jan. 23, 2020

(30) Foreign Application Priority Data

Jul. 23, 2018 (CN) ......................... 201810812238.2

(51) Int. Cl.
*H04B 7/06* (2006.01)
*H04B 7/0413* (2017.01)
*H04B 7/08* (2006.01)

(52) U.S. Cl.
CPC ......... *H04B 7/0691* (2013.01); *H04B 7/0413* (2013.01); *H04B 7/0874* (2013.01)

(58) Field of Classification Search
CPC .. H04B 7/0691; H04B 7/0413; H04B 7/0874; H04B 1/40; H04B 2001/0408
See application file for complete search history.

(56) References Cited

U.S. PATENT DOCUMENTS 9,866,259 B1 1/2018 Margomenos
2004/0005871 A1 1/2004 Saito et al.
(Continued)

FOREIGN PATENT DOCUMENTS

CN 101572939 A 11/2009
CN 102474332 A 5/2012
(Continued)

OTHER PUBLICATIONS

International search report issued in corresponding international application No. PCT/CN2019/097165 dated Oct. 24, 2019.
(Continued)

*Primary Examiner* — Janice N Tieu
(74) *Attorney, Agent, or Firm* — Young Basile Hanlon & MacFarlane, P.C.

(57) ABSTRACT

A radio frequency system, a method for controlling antenna switching, and related products are provided. The radio frequency system supports a simultaneous downlink reception with four antennas and includes m antennas, a radio frequency processing circuit, and a radio frequency transceiver coupled with the radio frequency processing circuit. The m antennas are divided into at least two antenna groups, where m is greater than or equal to 4 and less than or equal to 8. The radio frequency processing circuit is coupled with the at least two antenna groups and includes modules which are the same in number as the at least two antenna groups. Each module is coupled with one antenna group and is disposed adjacent to the antenna group with which the module is coupled. The modules include at least one transmitting module, or at least one transmitting module and at least one receiving module.

15 Claims, 60 Drawing Sheets

(56) References Cited

U.S. PATENT DOCUMENTS

| | | | | |
|---|---|---|---|---|
| 2005/0048938 | A1 | 3/2005 | Sahota | |
| 2010/0151908 | A1 * | 6/2010 | Skarby | H04W 88/08 455/562.1 |
| 2014/0378074 | A1 | 12/2014 | Yang et al. | |
| 2016/0285500 | A1 | 9/2016 | Tsai et al. | |
| 2016/0337025 | A1 | 11/2016 | Xu et al. | |
| 2017/0195004 | A1 | 7/2017 | Cheng et al. | |
| 2018/0062682 | A1 * | 3/2018 | Wloczysiak | H03F 3/72 |
| 2018/0145718 | A1 * | 5/2018 | Margomenos | H05K 999/99 |
| 2018/0368082 | A1 | 12/2018 | O'Shea et al. | |
| 2019/0200357 | A1 * | 6/2019 | Yokote | H01Q 1/24 |

FOREIGN PATENT DOCUMENTS

| | | | |
|---|---|---|---|
| CN | 104753553 | A | 7/2015 |
| CN | 105306112 | A | 2/2016 |
| CN | 105577206 | A | 5/2016 |
| CN | 106559277 | A | 4/2017 |
| CN | 106877914 | A | 6/2017 |
| CN | 206498399 | U | 9/2017 |
| CN | 108111185 | A | 6/2018 |
| CN | 108199727 | A | 6/2018 |
| CN | 108199729 | A | 6/2018 |
| CN | 108282182 | A | 7/2018 |
| CN | 108900234 | A | 11/2018 |
| CN | 209057208 | U | 7/2019 |
| EP | 3540959 | A1 | 9/2019 |
| WO | 2012076813 | A1 | 6/2012 |

OTHER PUBLICATIONS

Extended European search report issued in corresponding European application No. 19187819.8 dated Dec. 4, 2019.

Second China Office Action issued in corresponding CN application No. 201810812238.2 dated Apr. 20, 2020 with english translation.

International search report issued in corresponding international application No. PCT/CN2019/097164 dated Sep. 26, 2019.

English Translation of the first office action issued in corresponding CN application No. 201810812417.6 dated Feb. 3, 2020.

Extended European search report issued in corresponding European application No. 19187926.1 dated Jan. 13, 2020.

Non final rejection issued in corresponding U.S. Appl. No. 16/519,646 dated Jan. 21, 2020.

English translation of the first office action issued in corresponding CN application No. 201810812238.2 dated Nov. 1, 2019.

Indian First examination report for IN Application No. 201914029728 dated Jan. 21, 2021. (5 pages).

India First examination report for IN application No. 201914029781 dated Jan. 18, 2021. (6 pages).

Communication pursuant to Article 94(3) EPC for EP Application 19187819.8 dated May 10, 2021. (6 pages).

* cited by examiner

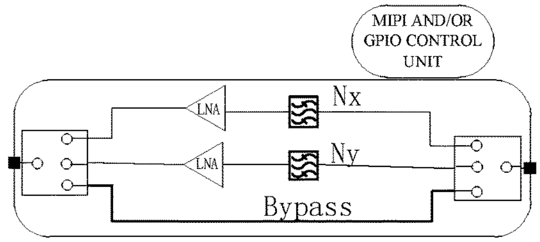
FIG. 1A
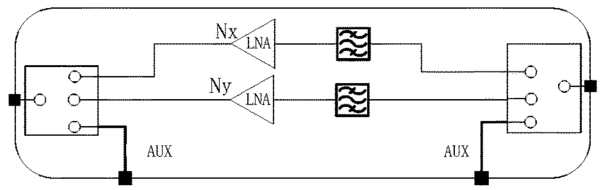
FIG. 1B
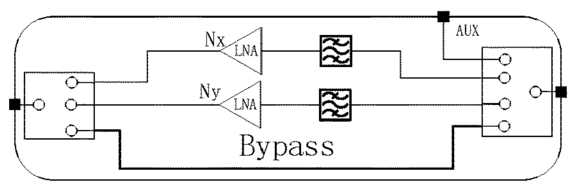
FIG. 1C
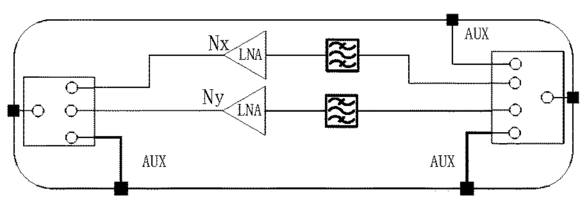
FIG. 1D
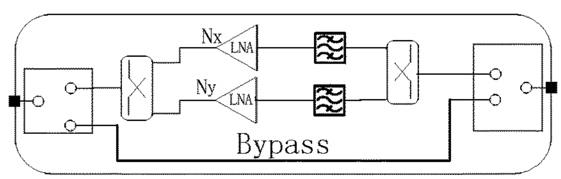
FIG. 1E1
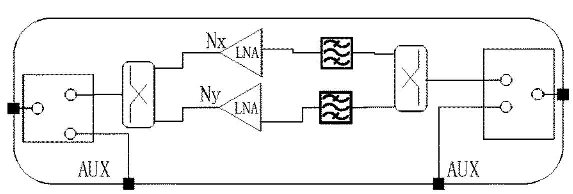
FIG. 1E2

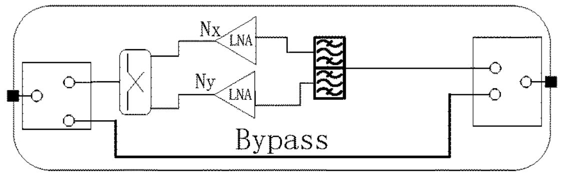
FIG. 1F1
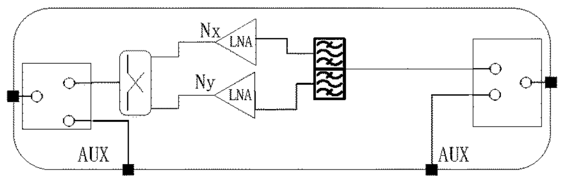
FIG. 1F2
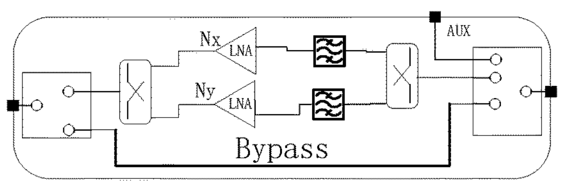
FIG. 1G1
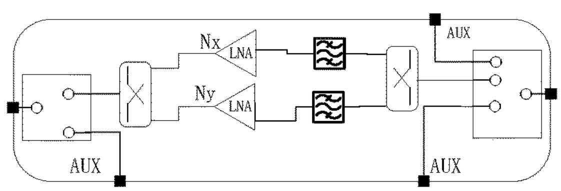
FIG. 1G2
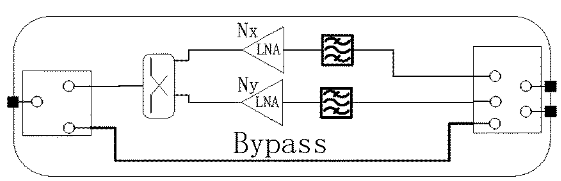
FIG. 1H1
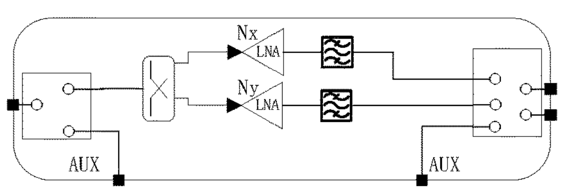
FIG. 1H2

RADIO FREQUENCY SYSTEM, METHOD FOR CONTROLLING ANTENNA SWITCHING, AND RELATED PRODUCTS

CROSS-REFERENCE TO RELATED APPLICATION(S)

This application claims priority to Chinese Patent Application No. 201810812238.2, filed on Jul. 23, 2018, the content of which is hereby incorporated by reference in its entirety.

TECHNICAL FIELD

This disclosure relates to the field of mobile terminal technology, and particularly to a radio frequency system, a method for controlling antenna switching, and related products.

BACKGROUND

With the widespread use of electronic devices such as smart phones, the smart phone can support an increasing number of applications and is becoming more and more powerful. The smart phone is developing in a diversified and personalized way, becoming indispensable electronic products in users' life. In the fourth generation (4G) mobile communication system, the electronic device generally adopts a single-antenna or dual-antenna radio frequency (RF) system architecture. Currently, in a new radio (NR) system of the fifth generation (5G) mobile communication system, requirements on a RF system architecture supporting four antenna groups are proposed.

SUMMARY

Implementations of the present disclosure provide a radio frequency system, a method for controlling antenna switching, and related products, to improve sensitivity of respective channels. Compared with a structure in which devices are separated, the degree of integration is higher and the area/cost/power consumption is optimized.

In a first aspect, implementations of the present disclosure provide a radio frequency system. The radio frequency system supports a simultaneous downlink reception with four antennas and includes m antennas, a radio frequency processing circuit, and a radio frequency transceiver. The m antennas are divided into at least two antenna groups, where m is greater than or equal to 4 and less than or equal to 8. The radio frequency processing circuit is coupled with the at least two antenna groups and includes modules which are the same in number as the at least two antenna groups. The modules include at least one transmitting module or the modules include at least one transmitting module and at least one receiving module. Each transmitting module is disposed adjacent to an antenna group with which the transmitting module is coupled, and each receiving module is disposed adjacent to an antenna group with which the receiving module is coupled. The radio frequency transceiver is coupled with the radio frequency processing circuit.

In a second aspect, implementations of the present disclosure provide a method for controlling antenna switching. The method is applicable to an electronic device. The electronic device includes a radio frequency system. The radio frequency system includes a radio frequency transceiver, a radio frequency processing circuit, and at least two antenna groups. The method includes: switching on a transmitting path between a transmitting port in a target band of the radio frequency transceiver and a target antenna group in the radio frequency system, to transmit a signal through an antenna in the target antenna group.

In a third aspect, implementations of the present disclosure provide a computer readable storage medium. The computer readable storage medium is configured to store computer programs for electronic data interchange. The computer programs are operable with a computer to perform the method of the third aspect.

BRIEF DESCRIPTION OF DRAWINGS

To describe technical solutions in implementations of the present disclosure or in the related art more clearly, the following briefly introduces the accompanying drawings required for describing the implementations or the related art. Apparently, the accompanying drawings in the following description only illustrate some implementations of the present disclosure. Those of ordinary skill in the art may also obtain other drawings based on these accompanying drawings without creative efforts.

FIG. 1A is a schematic structural diagram illustrating a receiving module according to an implementation of the present disclosure.

FIG. 1B is a schematic structural diagram illustrating a receiving module according to another implementation of the present disclosure.

FIG. 1C is a schematic structural diagram illustrating a receiving module according to another implementation of the present disclosure.

FIG. 1D is a schematic structural diagram illustrating a receiving module according to another implementation of the present disclosure.

FIG. 1E1 is a schematic structural diagram illustrating a receiving module according to another implementation of the present disclosure.

FIG. 1E2 is a schematic structural diagram illustrating a receiving module according to another implementation of the present disclosure.

FIG. 1F1 is a schematic structural diagram illustrating a receiving module according to another implementation of the present disclosure.

FIG. 1F2 is a schematic structural diagram illustrating a receiving module according to another implementation of the present disclosure.

FIG. 1G1 is a schematic structural diagram illustrating a receiving module according to another implementation of the present disclosure.

FIG. 1G2 is a schematic structural diagram illustrating a receiving module according to another implementation of the present disclosure.

FIG. 1H1 is a schematic structural diagram illustrating a receiving module according to another implementation of the present disclosure.

FIG. 1H2 is a schematic structural diagram illustrating a receiving module according to another implementation of the present disclosure.

FIG. 1I1 is a schematic structural diagram illustrating a receiving module according to another implementation of the present disclosure.

FIG. 1I2 is a schematic structural diagram illustrating a receiving module according to another implementation of the present disclosure.

FIG. 1N1 is a schematic structural diagram illustrating a receiving module according to another implementation of the present disclosure.

FIG. 1N2 is a schematic structural diagram illustrating a receiving module according to another implementation of the present disclosure.

FIG. 1O1 is a schematic structural diagram illustrating a receiving module according to another implementation of the present disclosure.

FIG. 1O2 is a schematic structural diagram illustrating a receiving module according to another implementation of the present disclosure.

DETAILED DESCRIPTION

Figure 1J:
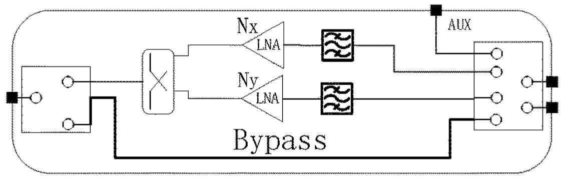
FIG. 1J is a schematic structural diagram illustrating a receiving module according to another implementation of the present disclosure.
Figure 1J:
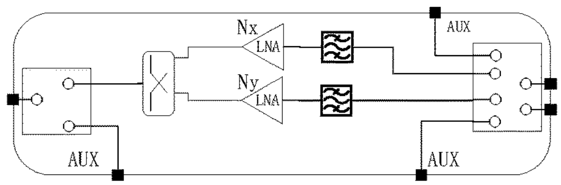
Figure 1J:
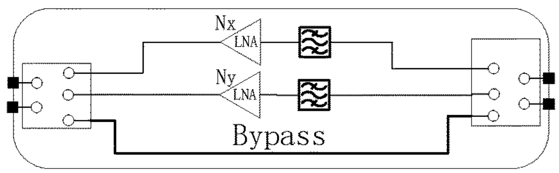

Technical solutions in implementations of the present disclosure will be described clearly and completely hereinafter with reference to the accompanying drawings described in the previous chapter. Apparently, the described implementations are merely some rather than all implementations of the present disclosure. All other implementations obtained by those of ordinary skill in the art based on the implementations of the present disclosure without creative efforts shall fall within the protection scope of the present disclosure.

The terms “first”, “second”, and the like used in the specification, the claims, and the accompany drawings of the present disclosure are to distinguish different objects rather than describe a particular order. The terms “include”, “comprise”, and “have” as well as variations thereof are intended to cover non-exclusive inclusion. For example, a process, method, system, product, or apparatus including a series of steps or units is not limited to the listed steps or units. Instead, it can optionally include other steps or units that are not listed; alternatively, other steps or units inherent to the process, method, product, or device can also be included.

The term “implementation” referred to herein means that a particular feature, structure, or characteristic described in conjunction with the implementation may be contained in at least one implementation of the present disclosure. The phrase appearing in various places in the specification does not necessarily refer to the same implementation, nor does it refer to an independent or alternative implementation that is mutually exclusive with other implementations. It is explicitly and implicitly understood by those skilled in the art that an implementation described herein may be combined with other implementations.

The electronic device involved in the implementations of the present disclosure may include various handheld devices, in-vehicle devices, wearable devices, computing devices that have wireless communication functions or other processing devices connected to the wireless modem, as well as various forms of user equipment (UE), mobile stations (MS), terminal devices, and the like. For the convenience of description, the above-mentioned devices are collectively referred to as an electronic device.

At present, sounding reference signal (SRS) switching in four antennas of a mobile phone is a mandatory option for China mobile communications corporation (CMCC) in the China mobile fifth generation (5G) Scale Test Technical White Paper_Terminal, which is optional in the 3rd generation partnership project (3GPP). Its main purpose is for a base station to determine quality and parameters of four channels via measuring uplink (UL) signals of the four antennas of the mobile phone, to perform a beamforming of a downlink optimal multi-input multi-output (MIMO) antenna array on the four channels according to a channel reciprocity, and finally to obtain the best data transmission performance for a downlink 4×4 MIMO.

The electronic device may be a mobile phone or other terminal devices supporting the fifth generation new radio (5G NR), such as a customer premise equipment (CPE) or a mobile wireless-fidelity (MIFI).

The reasons for structuring the receiving module and the transmitting module presented in the implementations of the disclosure are as follows. ① 5GNR requires downlink 4×4 MIMO or four-way diversity reception; ② SRS switching in four antennas or transmitting (TX) an SRS with four antennas in turn (optional); ③ a function of switching among transmit antennas (optional); ④ the sub 6 GHz band ranges from 3.3 to 4.2 G and 4.4 to 5 G. This band has a higher frequency than the 600~2700 MHz band of LTE (long term evolution). Therefore, the loss of the radio frequency (RF) cable (coaxial cable), from one side of a main board to the other side of the main board and from the main board to a lower board, is large;

The formula of sensitivity of a system: Ps=10 lg (KT)+10 lg (BW)+NF+SNR;

K: Boltzmann constant (1.38×E-23, unit: J/K);

T: Absolute temperature (273.15, unit: K); the formula adopts 20° C. (normal temperature), so T=293.15;

NF: Noise figure;

BW: Bandwidth;

SNR: Minimum demodulation threshold, determined by the platform vendor (Qualcomm, MTK) baseband algorithm;

In this formula, K and T are fixed constants, BW is determined by a tested bandwidth, and SNR is determined by the baseband algorithm of the system.

The formula regarding NF is as follows.

$$NF = NF_1 + \frac{NF_2 - 1}{G_1} + \cdots + \frac{NF_i - 1}{G_1 G_2 \cdots G_{i-1}} + \cdots + \frac{NF_n - 1}{G_1 G_2 \cdots G_{n-1}}$$

In the above formula, $NF_1 = IL_{pre\text{-}1st\ LNA} + NF_{1st\ LNA}$, where $IL_{pre\text{-}1st\ LNA}$ is an insertion loss occurred before a LNA (low noise amplifier) in a first stage, and $NF_{1st\ LNA}$ is a noise figure in the first stage. These two are main contributions of NF.

In contrast, $$\frac{NF_2 - 1}{G_1} + \cdots + \frac{NF_i - 1}{G_1 G_2 \cdots G_{i-1}} + \cdots + \frac{NF_n - 1}{G_1 G_2 \cdots G_{n-1}}$$

is the contribution of the noise figure in a latter stage. Generally, Gn>15 and NF2~NFn<5, this part contributes less to NF.

In conclusion, in the RF front-end design, in order to improve the sensitivity, it is necessary to reduce the value of NF. As $NF_1$ is the main contributor, in addition to using external LNAs to reduce $NF_{1st\ LNA}$, how to reduce $IL_{pre\text{-}1st\ LNA}$ becomes a problem to be solved, that is, how to reduce the insertion loss occurred before the LNA in the first stage.

The receiving module and transmitting module for 5GNR are defined in the implementations of the disclosure. These modules can be disposed adjacent to antennas, to reduce the insertion loss occurred before the LNA in the first stage and improve the sensitivity of the system.

In a first aspect, implementations of the disclosure provide a receiving module. The receiving module includes at least one signal receiving channel, a first transfer switch, and a second transfer switch. The first transfer switch is coupled with the at least one signal receiving channel. The at least one signal receiving channel is coupled with the second transfer switch. The first transfer switch or the second transfer switch includes an n1Pn2T switch. Each of the at least one signal receiving channel includes a filter and a low noise amplifier (LNA), and the LNA is coupled with the filter.

The first transfer switch is configured to be coupled with an antenna in an antenna group (also known as antenna array) corresponding to the receiving module. The second transfer switch is configured to be coupled with a transmitting module and/or a radio frequency transceiver. The receiving module is disposed adjacent to the antenna group. n1 is a positive integer and n2 is an integer greater than or equal to 2.

In this implementation, since the receiving module is integrated with the at least one signal receiving channel and is disposed adjacent to a corresponding antenna group, it is possible to reduce insertion loss of the link and beneficial to improving sensitivity of the channel. Compared with a structure in which devices are separated, the degree of integration is higher and the area/cost/power consumption is optimized.

The receiving module further includes one internal Bypass channel, and the internal Bypass channel is disposed between the first transfer switch and the second transfer switch of the receiving module and is configured to be coupled with the transmitting module to support a signal transmitting function of the receiving module.

The receiving module further includes one auxiliary port (AUX). The AUX is coupled with the first transfer switch and is configured to be coupled with the transmitting module to support the signal transmitting function of the receiving module. Compared with adopting an external Bypass channel, this structure can save one switch, thereby further reducing the insertion loss of the channel.

The receiving module further includes two AUXes, i.e., a first AUX and a second AUX. The first AUX is coupled with the first transfer switch. The second AUX is coupled with the second transfer switch. An external Bypass channel is disposed between the first AUX and the second AUX and is configured to be coupled with the transmitting module to support the signal transmitting function of the receiving module.

The receiving module further includes three AUXes, i.e., a first AUX, a second AUX, and a third AUX. The first AUX and the second AUX are coupled with the first transfer switch. The third AUX is coupled with the second transfer switch. The first AUX or the second AUX is configured to be coupled with the transmitting module to support the signal transmitting function of the receiving module.

Alternatively, the first AUX and the third AUX or the second AUX and the third AUX are configured to be coupled with an external Bypass channel and the external Bypass channel is configured to be coupled with the transmitting module to support the signal transmitting function of the receiving module.

The receiving module supports the signal transmitting function.

The receiving module is disposed on a main board of an electronic device, and one AUX of the receiving module, which is coupled with the first transfer switch, is configured to be coupled with the transmitting module.

Alternatively, the receiving module is disposed on a sub board of the electronic device, and the first AUX or the second AUX is coupled with the third AUX.

With the receiving module, NF of a receiving path can be reduced and sensitivity during receiving can be improved.

Furthermore, the receiving module further includes the following features.

(1) Each receiving module is coupled with a corresponding antenna group (including one or two antennas) and is disposed adjacent to an antenna (feed point) with which the receiving module is coupled.

Optionally, (2) for the NR carrier aggregation (CA) scenario, when multiple signal receiving channels are required to work simultaneously, the number of ports of this receiving module can be increased to introduce more cables, so that the multiple signal receiving channels can work simultaneously. In this way, there is no need to introduce other extra devices but the cables, and thus cost and area of modules can be better restricted. The simultaneous working of the multiple signal receiving channels can also be achieved by introducing a combiner(s). In this way, extra cables are not required but other devices are introduced, and thus the trace can be more simplified. In addition, the simultaneous working of the multiple signal receiving channels can be achieved with two filters sharing one port and a special design (that is, constituting a duplexer or multiplexer), which can achieve combining. In this way, there is no need to introduce new cables or devices, and thus the cost and area can be even better restricted.

(3) This module has a shielding layer or no shielding layer (a shielding cover is required if there is no shielding layer).

In addition, the receiving module further includes a mobile industry processor interface (MIPI) and/or a general-purpose input/output (GPIO) control unit. The MIPI control unit and/or the GPIO control unit is configured to control devices in the receiving module. The devices include any one of: a first transfer switch and a second transfer switch.

In one example, a receiving module supports dual-band and does not support uplink CA and downlink CA, and is configured to be coupled with one antenna. Such example is considered to elaborate the configuration of the receiving module of the implementations of the disclosure.

As illustrated in FIG. 1A, the receiving module includes two low noise amplifiers (LNA), two filters, two transfer switches (a first transfer switch for coupling with the antenna and a second transfer switch for coupling with a radio frequency transceiver and/or a transmitting module, here two SP3T switches), and an internal Bypass channel. Nx and Ny correspond to two bands. The receiving module can further include an MIPI and/or GPIO control unit to control LNA/switch switching. The first transfer switch (including an SP3T switch, that is, embodied as an SP3T switch) has a P port configured to be coupled with the antenna, and a first T port coupled with a first filter. The first filter is coupled with a first LNA. The first LNA is coupled with a first T port of the second transfer switch (including an SP3T switch). The first transfer switch has a second T port coupled with a second filter. The second filter is coupled with a second LNA. The second LNA is coupled with a second T port of the second transfer switch. The internal Bypass channel is coupled between a third T port of the first transfer switch and a third T port of the second transfer switch. The second transfer switch has a P port configured to be coupled with the transmitting module.

As illustrated in FIG. 1B, the receiving module includes two LNAs, two filters, two transfer switches (a first transfer switch and a second transfer switch, here two SP3T switches), and two AUXes (for coupling with an external Bypass channel or a transmitting module to achieve SRS switching or self-switching function). The receiving module can further include an MIPI and/or GPIO control unit to control LNA/switch switching. The connection between internal devices of FIG. 1B is similar to that of FIG. 1A, which is not repeated herein.

As illustrated in FIG. 1C, the receiving module includes two LNAs, two filters, two transfer switches (a first transfer switch embodied as an SP4T switch and a second transfer switch embodied as an SP3T switch), one AUX, and an internal Bypass channel. The receiving module can further include an MIPI and/or GPIO control unit to control LNA/switch switching. The connection between internal devices of FIG. 1C is similar to that of FIG. 1A, which is not repeated herein.

As illustrated in FIG. 1D, the receiving module includes two LNAs, two filters, two transfer switches (a first transfer switch embodied as an SP4T switch and a second transfer switch embodied as an SP3T switch), and three AUXes (an AUX coupled with the SP3T switch, any other AUX for coupling with an external Bypass channel, and an AUX, coupled with the SP4T switch, for coupling with a transmitting module to support a transmitting function of a corresponding antenna). The receiving module can further include an MIPI and/or GPIO control unit to control LNA/switch switching. The connection between internal devices of FIG. 1D is similar to that of FIG. 1A, which is not repeated herein.

In one example, a receiving module supports dual-band and supports two downlink CA, and is configured to be coupled with one antenna. Such example is considered to elaborate the configuration of the receiving module of the implementations of the disclosure.

As illustrated in FIG. 1E1, the receiving module includes two LNAs, two filters, two combiners, two transfer switches, and an internal Bypass channel. A first transfer switch has a P port configured to be coupled with an antenna of a corresponding antenna group and a first T port coupled with a first combiner. The first combiner is coupled with a first filter and a second filter. The first filter is coupled with a first LNA. The second filter is coupled with a second LNA. The first LNA and the second LNA are coupled with a second combiner. The second combiner is coupled with a first T port of a second transfer switch. The internal Bypass channel is coupled between a second T port of the first transfer switch and a second T port of the second transfer switch.

As illustrated in FIG. 1E2, the receiving module includes two LNAs, two filters, two combiners, two transfer switches, and two AUXes. A first transfer switch has a P port configured to be coupled with an antenna of a corresponding antenna group and a first T port coupled with a first combiner. The first combiner is coupled with a first filter and a second filter. The first filter is coupled with a first LNA. The second filter is coupled with a second LNA. The first LNA and the second LNA are coupled with a second combiner. The second combiner is coupled with a first T port of a second transfer switch. The first transfer switch has a second T port coupled with a first AUX. The second transfer switch has a second T port coupled with a second AUX. The first AUX and the second AUX are configured to be coupled with an external Bypass channel. Alternatively, the first AUX is configured to be coupled with a transmitting module to support a transmitting function of the corresponding antenna.

As illustrated in FIG. 1F1, the receiving module includes two LNAs, a duplexer (consisting of two filters), one combiner, two transfer switches (a first transfer switch and a second transfer switch, here two SPDT switches), and an internal Bypass channel. The receiving module can further include an MIPI and/or GPIO control unit to control LNA/switch switching. The first transfer switch has a P port configured to be coupled with a corresponding antenna and a first T port coupled with the duplexer. The duplexer is coupled with a first LNA and a second LNA. The first LNA and the second LNA are coupled with the combiner. The combiner is coupled with a first T port of the second transfer switch. The internal Bypass channel is disposed between a second T port of the first transfer switch and a second T port of the second transfer switch. The second transfer switch has a P port configured to be coupled with a radio frequency transceiver or a transmitting module.

As illustrated in FIG. 1F2, the receiving module includes two LNAs, a duplexer (consisting of two filters), one combiner, two transfer switches (a first transfer switch and a second transfer switch, here two SPDT switches), and two AUXes (a first AUX and a second AUX). The receiving module can further include an MIPI and/or GPIO control unit to control LNA/switch switching. The first transfer switch has a P port configured to be coupled with a corresponding antenna and a first T port coupled with the duplexer. The duplexer is coupled with a first LNA and a second LNA. The first LNA and the second LNA are coupled with the combiner. The combiner is coupled with a first T port of the second transfer switch. The first transfer switch has a second T port coupled with the first AUX. The second transfer switch has a second T port coupled with the second AUX. The first AUX and the second AUX are configured to be coupled with an external Bypass channel. Alternatively, the first AUX is configured to be coupled with a transmitting module to support a transmitting function of the corresponding antenna.

As illustrated in FIG. 1G1, the receiving module includes two LNAs, two filters, two combiners, two transfer switches (a first transfer switch embodied as an SP3T switch and a second transfer switch embodied as an SPDT switch), one AUX (for coupling with a transmitting module to support a transmitting function of a corresponding antenna), and an internal Bypass channel. The receiving module can further include an MIPI and/or GPIO control unit to control LNA/switch switching. The AUX is configured to be coupled with the transmitting module to support the transmitting function of the corresponding antenna. In this case, in the receiving module, the internal Bypass channel may not be used. Compared with using the internal Bypass channel, one switch can be omitted, thereby further reducing insertion loss of the channel. The connection between internal devices of FIG. 1G1 is similar to that of FIG. 1F1, which is not repeated herein.

As illustrated in FIG. 1G2, the receiving module includes two LNAs, two filters, two combiners, two transfer switches (a first transfer switch embodied as an SP3T switch and a second transfer switch embodied as an SPDT switch), and three AUXes (a first AUX coupled with a T port of the first transfer switch, a second AUX coupled with another T port of the first transfer switch, and a third AUX coupled with a T port of the second transfer switch). The receiving module can further include an MIPI and/or GPIO control unit to control LNA/switch switching. The first AUX and the third AUX or the second AUX and the third AUX are configured to be coupled with an external Bypass channel. Alternatively, the first AUX or the second AUX is configured to be coupled with a transmitting module. In this case, in the receiving module, the external Bypass channel may not be used. Compared with using the external Bypass channel, one switch can be omitted, thereby further reducing insertion loss of the channel. The connection between internal devices of FIG. 1G2 is similar to that of FIG. 1F1, which is not repeated herein.

In one example, a receiving module supports dual-band and supports two downlink CA, and is configured to be coupled with two antennas. Such example is considered to elaborate the configuration of the receiving module of the implementations of the disclosure.

As illustrated in FIG. 1H1, the receiving module includes two LNAs, two filters, one combiner, two transfer switches (a first transfer switch embodied as a DP3T switch and a second transfer switch embodied as an SPDT switch), and an internal Bypass channel. The receiving module can further include an MIPI and/or GPIO control unit to control LNA/switch switching. The first transfer switch has two P ports configured to be coupled with two corresponding antennas. The first transfer switch has a first T port coupled with a first filter. The first filter is coupled with a first LNA. The first transfer switch has a second T port coupled with a second filter. The second filter is coupled with a second LNA. The first LNA and the second LNA are coupled with the combiner. The combiner is coupled with a first T port of the second transfer switch. The internal Bypass channel is disposed between a third T port of the first transfer switch and a second T port of the second transfer switch. The second transfer switch has a P port configured to be coupled with a radio frequency transceiver or a transmitting module.

As illustrated in FIG. 1H2, the receiving module includes two LNAs, two filters, one combiner, two transfer switches (a first transfer switch embodied as a DP3T switch and a second transfer switch embodied as an SPDT switch), and two AUXes (a first AUX coupled with a T port of the first transfer switch and a second AUX coupled with a T port of the second transfer switch). The receiving module can further include an MIPI and/or GPIO control unit to control LNA/switch switching. The first transfer switch has two P ports configured to be coupled with two corresponding antennas. The first transfer switch has a first T port coupled with a first filter. The first filter is coupled with a first LNA. The first transfer switch has a second T port coupled with a second filter. The second filter is coupled with a second LNA. The first LNA and the second LNA are coupled with the combiner. The combiner is coupled with a first T port of the second transfer switch. The first AUX and the second AUX are configured to be coupled with an external Bypass channel. Alternatively, the first AUX is configured to be coupled with a transmitting module to support a transmitting function of a corresponding antenna.

As illustrated in FIG. 1I1, the receiving module includes two LNAs, two filters, one combiner, two transfer switches (a first transfer switch embodied as a DP4T switch and a second transfer switch embodied as an SPDT switch), one AUX (a port for coupling with a port TX transmitting SRS of a transmitting module), and an internal Bypass channel. The receiving module can further include an MIPI and/or GPIO control unit to control LNA/switch switching. The connection between internal devices of FIG. 1I1 is similar to that of FIG. 1H1, which is not repeated herein.

As illustrated in FIG. 1I2, the receiving module includes two LNAs, two filters, one combiner, two transfer switches (a first transfer switch embodied as a DP4T switch and a second transfer switch embodied as an SPDT switch), and three AUXes (a first AUX coupled with a T port of the first transfer switch, a second AUX coupled with another T port of the first transfer switch, and a third AUX coupled with a T port of the second transfer switch). The first AUX and the third AUX or the second AUX and the third AUX are configured to be coupled with an external Bypass channel, or the first AUX or the second AUX is configured to be coupled with a transmitting module. The receiving module can further include an MIPI and/or GPIO control unit to control LNA/switch switching. The connection between internal devices of FIG. 1I2 is similar to that of FIG. 1H1, which is not repeated herein.

As illustrated in FIG. 1J, the receiving module includes two LNAs, two filters, two transfer switches (a first transfer switch and a second transfer switch, here two DP3T switches), and an internal Bypass channel. The receiving module can further include an MIPI and/or GPIO control unit to control LNA/switch switching. The first transfer switch has two P ports configured to be coupled with two corresponding antennas. The first transfer switch has a first T port coupled with a first filter. The first filter is coupled with a first LNA. The first LNA is coupled with a first T port of the second transfer switch. The first transfer switch has a second T port coupled with a second filter. The second filter is coupled with a second LNA. The second LNA is coupled with a second T port of the second transfer switch. The internal Bypass channel is disposed between a third T port of the first transfer switch and a third T port of the second transfer switch. The second transfer switch has two P ports configured to be coupled with a transmitting module and/or a radio frequency transceiver.

Figure 1K:
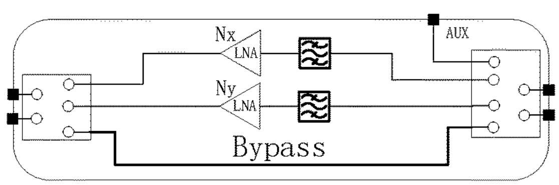
FIG. 1K is a schematic structural diagram illustrating a receiving module according to another implementation of the present disclosure.

As illustrated in FIG. 1K, the receiving module includes two LNAs, two filters, two transfer switches (a first transfer switch and a second transfer switch), one AUX, and an internal Bypass channel. The first transfer switch is embodied as a DP4T switch and the second transfer switch is embodied as a DP3Tswitch. The AUX is configured to be coupled with a transmitting module. The first transfer switch has a first T port coupled with a first filter. The first filter is coupled with a first LNA. The first LNA is coupled with a first T port of the second transfer switch. The first transfer switch has a second T port coupled with a second filter. The second filter is coupled with a second LNA. The second LNA is coupled with a second T port of the second transfer switch. The first transfer switch has a third T port coupled with the AUX. The internal Bypass channel is coupled between a fourth T port of the first transfer switch and a third T port of the second transfer switch.

Figure 1L:
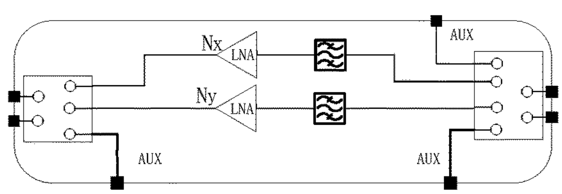
FIG. 1L is a schematic structural diagram illustrating a receiving module according to another implementation of the present disclosure.

As illustrated in FIG. 1L, the receiving module includes two LNAs, two filters, two transfer switches (a first transfer switch and a second transfer switch), and three AUXes. The first transfer switch is embodied as a DP4T switch and the second transfer switch is embodied as a DP3T switch. The first transfer switch has a second T port coupled with a first filter. The first filter is coupled with a first LNA. The first LNA is coupled with a first T port of the second transfer switch. The first transfer switch has a third T port coupled with a second filter. The second filter is coupled with a second LNA. The second LNA is coupled with a second T port of the second transfer switch. The first transfer switch has a first T port coupled with a first AUX and a fourth T port coupled with a second AUX. The second transfer switch has a third T port coupled with a third AUX. The first AUX and the third AUX or the second AUX and the third AUX are configured to be coupled with an external Bypass channel, or the first AUX or the second AUX is configured to be coupled with a transmitting module.

Figure 1M:
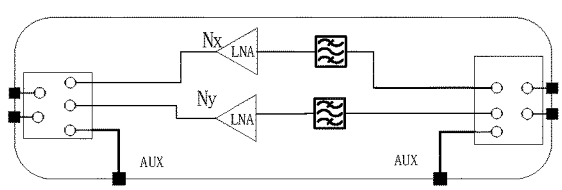
FIG. 1M is a schematic structural diagram illustrating a receiving module according to another implementation of the present disclosure.

As illustrated in FIG. 1M, the receiving module includes two LNAs, two filters, two transfer switches, and two AUXes. The first transfer switch has a first T port coupled with a first filter. The first filter is coupled with a first LNA. The first LNA is coupled with a first T port of the second transfer switch. The first transfer switch has a second T port coupled with a second filter. The second filter is coupled with a second LNA. The second LNA is coupled with a second T port of the second transfer switch. The first transfer switch has a third T port coupled with a first AUX. The second transfer switch has a third T port coupled with a second AUX. The first transfer switch and the second transfer switch are embodied as DP3T switches. The first AUX and the second AUX are configured to be coupled with an external Bypass channel. Alternatively, the first AUX is configured to be coupled with a transmitting module to support a transmitting function of a corresponding antenna.

As illustrated in FIG. 1N1, the receiving module includes one LNA, one filter, two transfer switches (a first transfer switch embodied as an SPDT switch and a second transfer switch embodied as an SPDT switch), and an internal Bypass channel. The connection between internal devices of FIG. 1N1 is similar to that of FIG. 1K, which is not repeated herein.

As illustrated in FIG. 1N2, the receiving module includes one LNA, one filter, two transfer switches (a first transfer switch embodied as an SPDT switch and a second transfer switch embodied as an SPDT switch), and two AUXes (for coupling with an external Bypass channel or ports transmitting SRS of a transmitting module). The connection between internal devices of FIG. 1N2 is similar to that of FIG. 1K, which is not repeated herein.

As illustrated in FIG. 1O1, the receiving module includes one LNA, one filter, two transfer switches, one AUX, and an internal Bypass channel. The first transfer switch has a first T port coupled with the AUX and a second T port coupled with the filter. The filter is coupled with the LNA. The LNA is coupled with a first T port of the second transfer switch. The internal Bypass channel is disposed between a third T port of the first transfer switch and a second T port of the second transfer switch. The first transfer switch is embodied as an SP3T switch and the second transfer switch is embodied as an SPDT switch. The AUX is configured to be coupled with a transmitting module to support a transmitting function of a corresponding antenna. Alternatively, the internal Bypass channel is configured to be coupled with a transmitting module to support a transmitting function of a corresponding antenna.

As illustrated in FIG. 1O2, the receiving module includes one LNA, one filter, two transfer switches, and three AUXes. The first transfer switch has a first T port coupled with a first AUX and a second T port coupled with the filter. The filter is coupled with the LNA. The LNA is coupled with a first T port of the second transfer switch. The first transfer switch has a third T port coupled with a second AUX. The second transfer switch has a second T port coupled with a third AUX. The first transfer switch is embodied as an SP3T switch and the second transfer switch is embodied as an SPDT switch. The first AUX and the third AUX or the second AUX and the third AUX are configured to be coupled with an external Bypass channel, or the first AUX or the second AUX is configured to be coupled with a transmitting module.

According to the implementations of the disclosure, as the receiving module can support the switching function of the transmit antenna through the Bypass channel or the AUX, and various modules are disposed adjacent to corresponding antenna groups, it is beneficial to improving sensitivity of various channels. Compared with a structure in which devices are separated, the degree of integration is higher and the area/cost/power consumption is optimized.

In a second aspect, implementations of the disclosure provide a transmitting module. The transmitting module includes at least one signal transmit-receive processing circuit and at least one channel selector-switch. The at least one signal transmit-receive processing circuit is coupled with the at least one channel selector-switch. Each channel selector-switch is an n1Pn2T switch. The at least one channel selector-switch includes a channel selector-switch(es) in full connection or in simplified connection. n1 is a positive integer and n2 is an integer greater than or equal to 2.

The at least one channel selector-switch is configured to be coupled with an antenna group corresponding to the transmitting module. The transmitting module is disposed adjacent to the antenna group.

The channel selector-switch in simplified connection refers to a channel selector-switch including one or more non-full-coupling ports. The non-full-coupling port refers to a port that is not coupled with all peer ports. For example, in a 4P4T switch, a first T port can be coupled with all the four P ports but each of a second T port, a third T port, and a fourth T port can only be coupled with one P port.

According to the implementation, as the transmitting module is integrated with the at least one signal transmit-receive processing circuit and includes the channel selector-switch in simplified connection, it is possible to reduce the number of switches in the radio frequency (RF) link and insertion loss of the link and is beneficial to improving sensitivity of various channels. Compared with a structure in which devices are separated, degree of integration is higher and area/cost/power consumption is optimized.

First Type

The transmitting module supports one band and further includes one power coupler. The signal transmit-receive processing circuit includes one power amplifier (PA), one LNA, one transmit-receive transfer switch, and one filter. The PA and the LNA are coupled with the transmit-receive transfer switch. The transmit-receive transfer switch is coupled with the filter. The signal transmit-receive processing circuit is coupled with the power coupler and the at least one channel selector-switch. The transmit-receive transfer switch includes an SPDT switch.

The at least one channel selector-switch is embodied as one channel selector-switch. The channel selector-switch is a 4P4T switch or a DP3T switch. The filter is coupled with the power coupler. The power coupler is coupled with the channel selector-switch.

The at least one channel selector-switch is embodied as two channel selector-switches, including a first channel selector-switch and a second channel selector-switch. The first channel selector-switch includes an SPDT switch, and the second channel selector-switch includes a 4P4T switch. The filter of the signal transmit-receive processing circuit is coupled with the first channel selector-switch, the first channel selector-switch is coupled with the power coupler, and the power coupler is coupled with the second channel selector-switch.

The first channel selector-switch has a remaining T port which corresponds to an AUX of the transmitting module, and the AUX is configured to be coupled with a transmitting module with another band. The remaining T port is a T port with which the filter is not coupled.

The transmitting module further includes a signal receiving channel. The signal receiving channel includes one filter and one LNA. The LNA is coupled with the filter. The filter is coupled with the at least one channel selector-switch.

The transmitting module further includes a power detection selector-switch, and the power coupler is coupled with the power detection selector-switch.

The PA of the signal transmit-receive processing circuit has an input port configured to be coupled with a signal transmitting port of a radio frequency transceiver. The LNA of the signal transmit-receive processing circuit has an output port configured to be coupled with a signal receiving port of the radio frequency transceiver. The power coupler is configured to be coupled with a power detection (PDET) port of the radio frequency transceiver. Alternatively, the power detection selector-switch has a P port configured to be coupled with the PDET port of the radio frequency transceiver.

The LNA of the signal receiving channel has an output port configured to be coupled with a signal receiving port of the radio frequency transceiver.

The at least one channel selector-switch has at least three ports configured as external ports of the transmitting module, where one or two external ports of the external ports are configured to be coupled with an antenna(s) of the antenna group, and the rest of the external ports are configured to be coupled with a port(s) of a receiving module, the radio frequency transceiver, and/or other transmitting modules.

Second Type

The transmitting module supports n bands, where n is 2 or 3. The transmitting module further includes one power coupler. The at least one signal transmit-receive processing circuit is embodied as n signal transmit-receive processing circuits. Each signal transmit-receive processing circuit includes one PA, one LNA, one transmit-receive transfer switch, and one filter. The PA and the LNA are coupled with the transmit-receive transfer switch. The transmit-receive transfer switch is coupled with the filter. The n signal transmit-receive processing circuits are coupled with the power coupler and the at least one channel selector-switch. The transmit-receive transfer switch includes an SPDT switch.

The at least one channel selector-switch is embodied as two channel selector-switches, including a first channel selector-switch and a second channel selector-switch. The first channel selector-switch includes an SPnT switch or an SP(n+1)T switch. The remaining one T port of the SP(n+1)T switch is configured to be coupled with another transmitting module. The second channel selector-switch includes a 4P4T switch. The signal transmit-receive processing circuit is coupled with the first channel selector-switch, the first channel selector-switch is coupled with the power coupler, and the power coupler is coupled with the second channel selector-switch.

Alternatively, the first channel selector-switch includes a 3P3T switch, and the second channel selector-switch includes a 3P3T switch.

The transmitting module further includes a power detection selector-switch, and the power coupler is coupled with the power detection selector-switch.

The PA of the signal transmit-receive processing circuit has an input port configured to be coupled with a signal transmitting port of a radio frequency transceiver. The LNA of the signal transmit-receive processing circuit has an output port configured to be coupled with a signal receiving port of the radio frequency transceiver. The power coupler is configured to be coupled with a PDET port of the radio frequency transceiver. Alternatively, the power detection selector-switch has a P port configured to be coupled with the PDET port of the radio frequency transceiver.

An output port of a LNA of a signal receiving channel is configured to be coupled with the signal receiving port of the radio frequency transceiver.

The at least one channel selector-switch has at least three ports configured as external ports of the transmitting module, where one or two external ports of the external ports are configured to be coupled with an antenna(s) of the antenna group, and the rest of the external ports are configured to be coupled with a port(s) of a receiving module, the radio frequency transceiver, and/or other transmitting modules.

Third Type

The transmitting module supports two bands or three bands. The transmitting module includes n signal transmit-receive processing circuits, a power detection selector-switch, multiple channel selector-switches. Each signal transmit-receive processing circuit includes one PA, one LNA, one transmit-receive transfer switch (including an SPDT switch), one filter, and one power coupler. The PA and the LNA are coupled with the transmit-receive transfer switch. The transmit-receive transfer switch is coupled with the filter. The filter is coupled with the power coupler. The n signal transmit-receive processing circuits are coupled with the multiple channel selector-switches and the power detection selector-switch. The power detection selector-switch includes an SPnT switch or an SP(n+1)T switch. A remaining T port of the SP(n+1)T switch is configured to merge power detection channels of other transmitting modules. The transmit-receive transfer switch includes an SPDT switch. The remaining T port is a T port with which the n signal transmit-receive processing circuits are not coupled.

The multiple channel selector-switches are embodied as two channel selector-switches (a first channel selector-switch and a second channel selector-switch). The first channel selector-switch includes an SPnT switch or an SP(n+1)T switch (with such configuration, the remaining one T port of the SP(n+1)T switch is configured to be coupled with another transmitting module). The second channel selector-switch includes a 4P4T switch. Alternatively, the first channel selector-switch and second channel selector-switch each include a 3P3T switch. The signal transmit-receive processing circuit is coupled with the first channel selector-switch and the first channel selector-switch is coupled with the second channel selector-switch.

The multiple channel selector-switches are embodied as three channel selector-switches (a first channel selector-switch, a second channel selector-switch, and a third channel selector-switch). The first channel selector-switch includes a 3P3T switch, the second channel selector-switch includes a SP3T switch, and the third channel selector-switch includes an SP4T switch. The signal transmit-receive processing circuit is coupled with the first channel selector-switch and the first channel selector-switch is coupled with the second channel selector-switch and the third channel selector-switch.

The PA of the signal transmit-receive processing circuit has an input port configured to be coupled with a signal transmitting port of a radio frequency transceiver. The LNA of the signal transmit-receive processing circuit has an output port configured to be coupled with a signal receiving port of the radio frequency transceiver. The power coupler is configured to be coupled with a PDET port of the radio frequency transceiver. Alternatively, the power detection selector-switch has a P port configured to be coupled with the PDET port of the radio frequency transceiver.

An output port of a LNA of a signal receiving channel is configured to be coupled with the signal receiving port of the radio frequency transceiver. If there is an independent module with another band, power detection of the independent module can be achieved via a remaining T port of the power detection selector-switch and in this case, a P port of the power detection selector-switch is coupled with the PDET port of the radio frequency transceiver.

The at least one channel selector-switch has at least three ports configured as external ports of the transmitting module, where one or two external ports of the external ports are configured to be coupled with an antenna(s) of the antenna group, and the rest of the external ports are configured to be coupled with a port(s) of a receiving module, the radio frequency transceiver, and/or other transmitting modules.

In addition, the transmitting module further includes an MIPI and/or a GPIO control unit. The MIPI control unit and/or the GPIO control unit is configured to control devices in the transmitting module. The device includes any one of: a transmit-receive transfer switch, a channel selector-switch, and a power detection selector-switch.

The following description will be made with reference to examples.

Figure 2A:
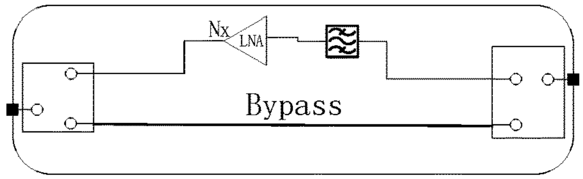
FIG. 2A is a schematic structural diagram illustrating a transmitting module according to another implementation of the present disclosure.
Figure 2A:
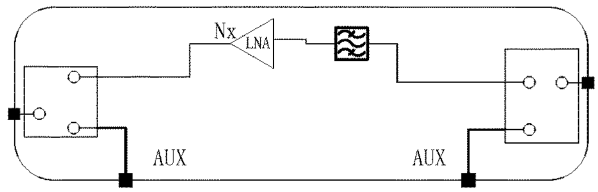
Figure 2A:
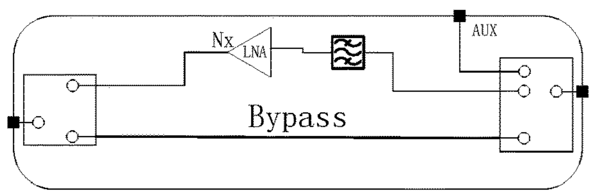
Figure 2A:
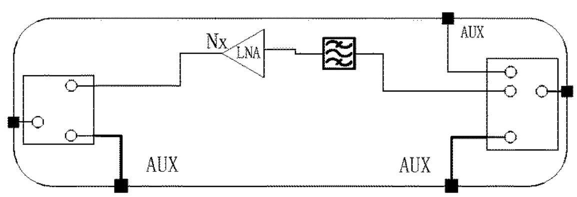
Figure 2A:
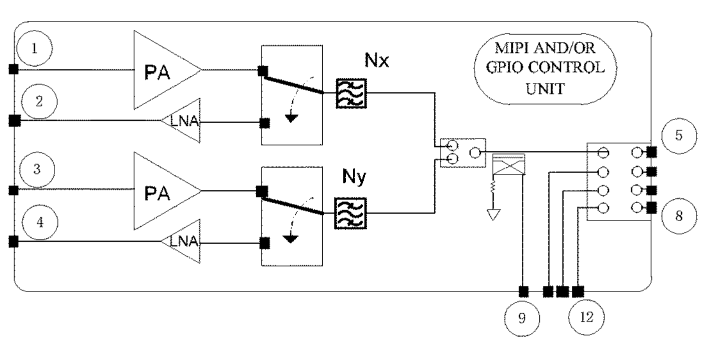

As illustrated in FIG. 2A, the transmitting module includes two signal transmit-receive processing circuits, one power coupler, and two channel selector-switches (including a first channel selector-switch and a second channel selector-switch). Each signal transmit-receive processing circuit includes one PA, one LNA, one transmit-receive transfer switch (including SPDT switch), and one filter. The PA and LNA are coupled with the transmit-receive transfer switch. The transmit-receive transfer switch is coupled with the filter. The signal transmit-receive processing circuit is coupled with the first channel selector-switch. The first channel selector-switch is coupled with the power coupler. The power coupler is coupled with the second channel selector-switch.

The transmitting module can further include an MIPI and/or GPIO control unit to control PA/LNA/power coupler/switch switching.

A first PA and a first LNA are coupled with a first transmit-receive transfer switch. The first transmit-receive transfer switch is coupled with a first filter. A second PA and a second LNA are coupled with a second transmit-receive transfer switch. The second transmit-receive transfer switch is coupled with a second filter. The first filter and the second filter are coupled with two T ports of a first channel selector-switch (embodied as an SPDT switch) respectively. The first channel selector-switch has a P port coupled with a first port of the power coupler. The power coupler has a second port coupled with a first T port of a second channel selector-switch (embodied as a 4P4T switch).

The first PA has an input port that corresponds to a first external port of the transmitting module, and the first LNA has an output port that corresponds to a second external port of the transmitting module. The second PA has an input port that corresponds to a third external port of the transmitting module, and the second LNA has an output port that corresponds to a fourth external port of the transmitting module. The second channel selector-switch has a first P port that corresponds a fifth external port of the transmitting module. The second channel selector-switch has a second P port that corresponds a sixth external port of the transmitting module. The second channel selector-switch has a third P port that corresponds a seventh external port of the transmitting module. The second channel selector-switch has a fourth P port that corresponds an eighth external port of the transmitting module. The power coupler has a third port that corresponds a ninth external port of the transmitting module. The second channel selector-switch has a second T port that corresponds a tenth external port of the transmitting module. The second channel selector-switch has a third T port that corresponds an eleventh external port of the transmitting module. The second channel selector-switch has a fourth T port that corresponds a twelfth external port of the transmitting module.

The first external port and the third external port are configured to be coupled with signal transmitting ports of a radio frequency transceiver. The fifth external port is configured to be coupled with an antenna of a corresponding antenna group. The sixth external port, the seventh external port, and the eighth external port are configured to be coupled with a receiving module or to be coupled with a receiving module and the transmitting module. The ninth external port is configured to be coupled with a PDET port of the radio frequency transceiver. External ports among the second external port, the fourth external port, the tenth external port, the eleventh external port, and the twelfth external port are configured to be coupled with signal receiving ports of the radio frequency transceiver. Alternatively, external ports among the tenth external port, the eleventh external port, and the twelfth external port are configured to be coupled with external ports of other transmitting module(s).

Figure 2B:
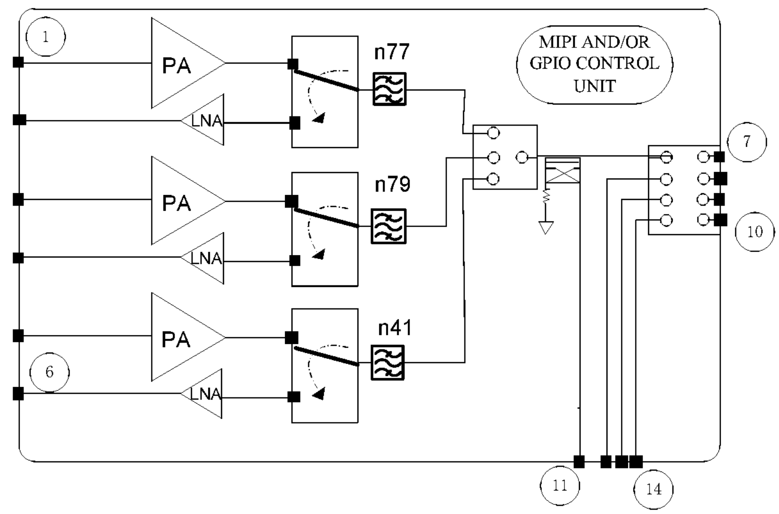
FIG. 2B is a schematic structural diagram illustrating a transmitting module according to another implementation of the present disclosure.

As illustrated in FIG. 2B, the transmitting module includes three signal transmit-receive processing circuits, one power coupler, and two channel selector-switches (including a first channel selector-switch and a second channel selector-switch). Each signal transmit-receive processing circuit includes one PA, one LNA, one transmit-receive transfer switch (including SPDT switch), and one filter. The transmitting module can further include an MIPI and/or GPIO control unit to control PA/LNA/power coupler/switch switching.

A first PA and a first LNA are coupled with a first transmit-receive transfer switch. The first transmit-receive transfer switch is coupled with a first filter. A second PA and a second LNA are coupled with a second transmit-receive transfer switch. The second transmit-receive transfer switch is coupled with a second filter. A third PA and a third LNA are coupled with a third transmit-receive transfer switch. The third transmit-receive transfer switch is coupled with a third filter. The first filter, the second filter, and the third filter are coupled with three T ports of the first channel selector-switch (embodied as an SP3T switch) respectively. The first channel selector-switch has a P port coupled with a first port of the power coupler. The power coupler has a second port coupled with a first T port of the second channel selector-switch (embodied as a 4P4T switch).

The first PA has an input port that corresponds to a first external port of the transmitting module, and the first LNA has an output port that corresponds to a second external port of the transmitting module. The second PA has an input port that corresponds to a third external port of the transmitting module, and the second LNA has an output port that corresponds to a fourth external port of the transmitting module. The third PA has an input port that corresponds to a fifth external port of the transmitting module, and the third LNA has an output port that corresponds to a sixth external port of the transmitting module. The second channel selector-switch has a first P port that corresponds a seventh external port of the transmitting module. The second channel selector-switch has a second P port that corresponds an eighth external port of the transmitting module. The second channel selector-switch has a third P port that corresponds a ninth external port of the transmitting module. The second channel selector-switch has a fourth P port that corresponds a tenth external port of the transmitting module. The power coupler has a third port that corresponds an eleventh external port of the transmitting module. The second channel selector-switch has a second T port that corresponds a twelfth external port of the transmitting module. The second channel selector-switch has a third T port that corresponds a thirteenth external port of the transmitting module. The second channel selector-switch has a fourth T port that corresponds a fourteenth external port of the transmitting module.

The first external port, the third external port, and the fifth external port are configured to be coupled with signal transmitting ports of a radio frequency transceiver. The seventh external port is configured to be coupled with an antenna of a corresponding antenna group. The eight external port, the ninth external port, and the tenth external port are configured to be coupled with a receiving module or to be coupled with a receiving module and the transmitting module. The eleventh external port is configured to be coupled with a PDET port of the radio frequency transceiver. External ports among the second external port, the fourth external port, the sixth external port, the twelfth external port, the thirteenth external port, and the fourteenth external port are configured to be coupled with signal receiving ports of the radio frequency transceiver. Alternatively, external ports among the sixth external port, the twelfth external port, the thirteenth external port, and the fourteenth external port are configured to be coupled with external ports of other transmitting module(s).

Figure 2C:
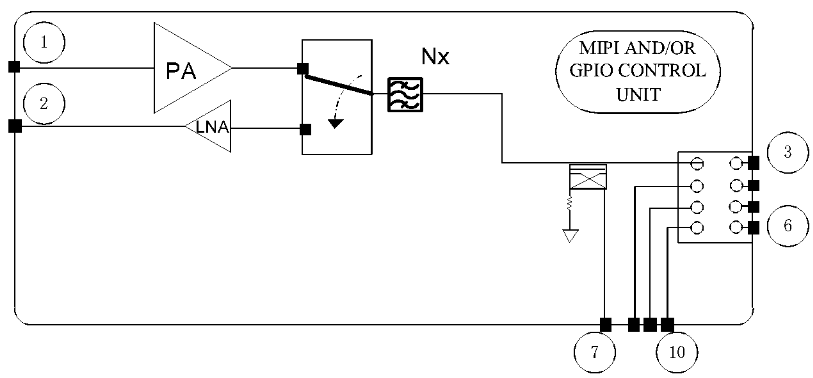
FIG. 2C is a schematic structural diagram illustrating a transmitting module according to another implementation of the present disclosure.

As illustrated in FIG. 2C, the transmitting module includes one signal transmit-receive processing circuit, one power coupler, and one channel selector-switch. The signal transmit-receive processing circuit includes one PA, one LNA, one transmit-receive transfer switch (including SPDT switch), and one filter. The transmitting module can further include an MIPI and/or GPIO control unit to control PA/LNA/power coupler/switch switching. The connection between internal devices of FIG. 2C is similar to that of FIG. 2A and FIG. 2B, which is not repeated herein.

Figure 2D:
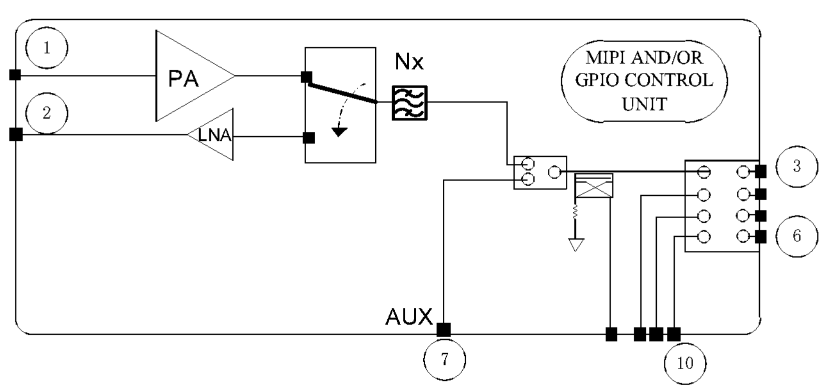
FIG. 2D is a schematic structural diagram illustrating a transmitting module according to another implementation of the present disclosure.

As illustrated in FIG. 2D, the transmitting module includes one signal transmit-receive processing circuit, one power coupler, and two channel selector-switches (including a first channel selector-switch and a second channel selector-switch). The signal transmit-receive processing circuit includes one PA, one LNA, one transmit-receive transfer switch (including SPDT switch), and one filter. The first channel selector-switch is an SPDT switch, and a remaining T port of the first channel selector-switch is configured to be coupled with a transmitting module with another band. The transmitting module can further include an MIPI and/or GPIO control unit to control PA/LNA/power coupler/switch switching. The connection between internal devices of FIG. 2D is similar to that of FIG. 2A and FIG. 2B, which is not repeated herein.

Figure 2E:
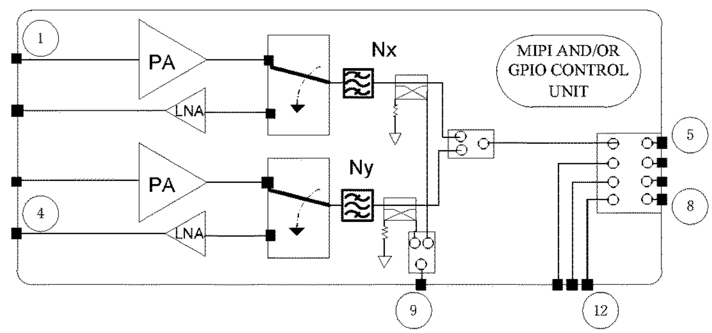
FIG. 2E is a schematic structural diagram illustrating a transmitting module according to another implementation of the present disclosure.

As illustrated in FIG. 2E, the transmitting module includes two signal transmit-receive processing circuits, two channel selector-switches (including a first channel selector-switch and a second channel selector-switch), and one power detection selector-switch. The transmitting module can further include an MIPI and/or GPIO control unit to control PA/LNA/power coupler/switch switching.

A first PA and a first LNA are coupled with a first transmit-receive transfer switch (including an SPDT switch). The first transmit-receive transfer switch is coupled with a first filter. The first filter is coupled with a first power coupler. A second PA and a second LNA are coupled with a second transmit-receive transfer switch (including an SPDT switch). The second transmit-receive transfer switch is coupled with a second filter. The second filter is coupled with a second power coupler. The first power coupler and the second power coupler are coupled with the power detection selector-switch (including an SPDT switch). The first power coupler and the second power coupler are coupled with the first channel selector-switch (including an SPDT switch). The first channel selector-switch is coupled with the second channel selector-switch (including an SPDT switch).

The first PA has an input port that corresponds to a first external port of the transmitting module, and the first LNA has an output port that corresponds to a second external port of the transmitting module. The second PA has an input port that corresponds to a third external port of the transmitting module, and the second LNA has an output port that corresponds to a fourth external port of the transmitting module. The second channel selector-switch has a first P port that corresponds a fifth external port of the transmitting module. The second channel selector-switch has a second P port that corresponds a sixth external port of the transmitting module. The second channel selector-switch has a third P port that corresponds a seventh external port of the transmitting module. The second channel selector-switch has a fourth P port that corresponds an eighth external port of the transmitting module. The power detection selector-switch has a P port that corresponds a ninth external port of the transmitting module. Remaining three T ports (T ports that are not coupled with the first power coupler and the second power coupler) of the second channel selector-switch correspond to a tenth external port, an eleventh external port, and a twelfth external port of the transmitting module respectively.

The first external port and the third external port are configured to be coupled with signal transmitting ports of a radio frequency transceiver. The fifth external port is configured to be coupled with an antenna of a corresponding antenna group. The sixth external port, the seventh external port, and the eighth external port are configured to be coupled with a receiving module or to be coupled with a receiving module and the transmitting module. The ninth external port is configured to be coupled with a PDET port of the radio frequency transceiver. External ports among the second external port, the fourth external port, the tenth external port, the eleventh external port, and the twelfth external port are configured to be coupled with signal receiving ports of the radio frequency transceiver. Alternatively, external ports among the tenth external port, the eleventh external port, and the twelfth external port are configured to be coupled with external ports of other transmitting module(s).

Figure 2F:
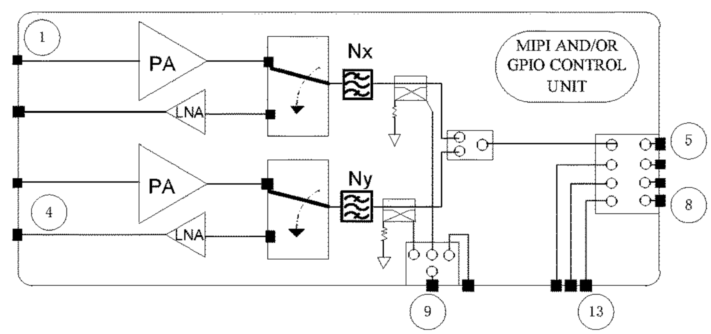
FIG. 2F is a schematic structural diagram illustrating a transmitting module according to another implementation of the present disclosure.

As illustrated in FIG. 2F, the transmitting module includes two signal transmit-receive processing circuits, two channel selector-switches (including an SPDT switch and a 4P4T switch), and one power detection selector-switch. The signal transmit-receive processing circuit includes one PA, one LNA, one transmit-receive transfer switch (including SPDT switch), one filter, and one power coupler. The transmitting module can further include an MIPI and/or GPIO control unit to control PA/LNA/power coupler/switch switching. The connection between internal devices of FIG. 2F is similar to that of FIG. 2E, which is not repeated herein.

Figure 2G:
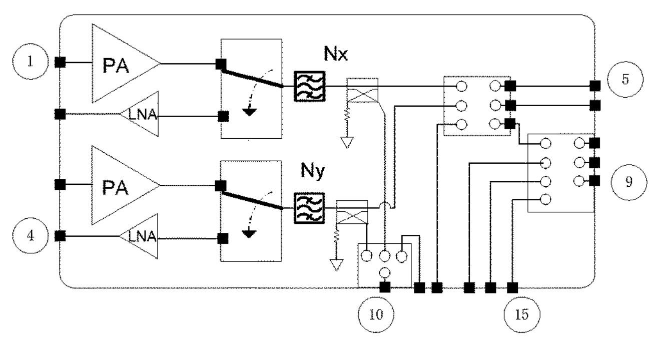
FIG. 2G is a schematic structural diagram illustrating a transmitting module according to another implementation of the present disclosure.

As illustrated in FIG. 2G, the transmitting module includes two signal transmit-receive processing circuits, two channel selector-switches (including a 3P3T switch and a 3P4T switch), and one power detection selector-switch. The signal transmit-receive processing circuit includes one PA, one LNA, one transmit-receive transfer switch (including SPDT switch), one filter, and one power coupler. The transmitting module can further include an MIPI and/or GPIO control unit to control PA/LNA/power coupler/switch switching.

A first PA and a first LNA are coupled with a first transmit-receive transfer switch. The first transmit-receive transfer switch is coupled with a first filter. The first filter is coupled with a first power coupler. A second PA and a second LNA are coupled with a second transmit-receive transfer switch. The second transmit-receive transfer switch is coupled with a second filter. The second filter is coupled with a second power coupler. The first power coupler and the second power coupler are coupled with the power detection selector-switch (including an SP3T switch, where a remaining T port acts as an external port of the transmitting module and the external port is configured to switch n power coupling paths of other transmitting modules to one power coupling path to output). The first power coupler and the second power coupler are coupled with a switch set including a first channel selector-switch and a second channel selector-switch. The first channel selector-switch includes a 3P3T switch. The second channel selector-switch includes a 3P4T switch. The first channel selector-switch is coupled with the second channel selector-switch.

The first PA has an input port that corresponds to a first external port of the transmitting module, and the first LNA has an output port that corresponds to a second external port of the transmitting module. The second PA has an input port that corresponds to a third external port of the transmitting module, and the second LNA has an output port that corresponds to a fourth external port of the transmitting module. The first channel selector-switch has a first P port that corresponds a fifth external port of the transmitting module. The first channel selector-switch has a second P port that corresponds a sixth external port of the transmitting module. The second channel selector-switch has a first P port that corresponds a seventh external port of the transmitting module. The second channel selector-switch has a second P port that corresponds an eighth external port of the transmitting module. The second channel selector-switch has a third P port that corresponds a ninth external port of the transmitting module. The power detection selector-switch has a P port that corresponds a tenth external port of the transmitting module. The power detection selector-switch has a remaining T port (a T port that is not coupled with the first power coupler and the second power coupler) that corresponds to an eleventh external port of the transmitting module. The first channel selector-switch has a remaining T port (a T port that is not coupled with the first power coupler and the second power coupler) that correspond to a twelfth external port of the transmitting module. The second channel selector-switch has remaining three T ports (T ports that are not coupled with the first channel selector-switch) that correspond to a thirteenth external port, a fourteenth external port, and a fifteenth external port of the transmitting module respectively.

The first external port and the third external port are configured to be coupled with signal transmitting ports of a radio frequency transceiver. The fifth external port and the sixth external port are configured to be coupled with antennas of a corresponding antenna group. The seventh external port, the eighth external port, and the ninth external port are configured to be coupled with a receiving module or to be coupled with a receiving module and the transmitting module. The tenth external port is configured to be coupled with a PDET port of the radio frequency transceiver. The eleventh external port is optionally coupled with a power detection channel of another module to achieve power detection. External ports among the second external port, the fourth external port, the twelfth external port, the thirteenth external port, the fourteenth external port, and the fifteenth external port are configured to be coupled with signal receiving ports of the radio frequency transceiver. Alternatively, external ports among the twelfth external port, the thirteenth external port, the fourteenth external port, and the fifteenth external port are configured to be coupled with external ports of other transmitting module(s).

Figure 2H:
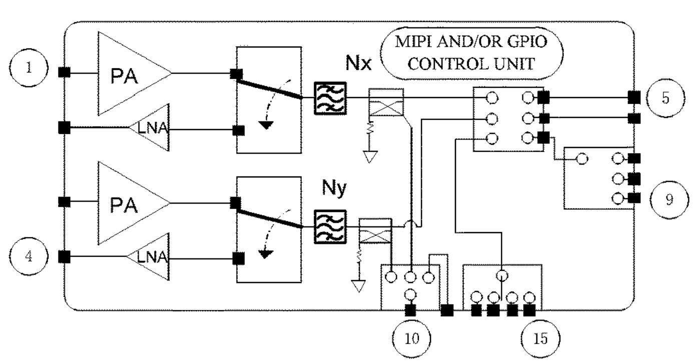
FIG. 2H is a schematic structural diagram illustrating a transmitting module according to another implementation of the present disclosure.

As illustrated in FIG. 2H, the transmitting module includes two signal transmit-receive processing circuits, three channel selector-switches (including a 3P3T switch, a 3PST switch, and an 4PST switch), and one power detection selector-switch. The signal transmit-receive processing circuit includes one PA, one LNA, one transmit-receive transfer switch (including SPDT switch), one filter, and one power coupler. The transmitting module can further include an MIPI and/or GPIO control unit to control PA/LNA/power coupler/switch switching.

A first PA and a first LNA are coupled with a first transmit-receive transfer switch. The first transmit-receive transfer switch is coupled with a first filter. The first filter is coupled with a first power coupler. A second PA and a second LNA are coupled with a second transmit-receive transfer switch. The second transmit-receive transfer switch is coupled with a second filter. The second filter is coupled with a second power coupler. The first power coupler and the second power coupler are coupled with the power detection selector-switch (including an SP3T switch, where a remaining T port acts as an external port of the transmitting module and the external port is configured to switch n power coupling paths of other transmitting module(s) to one power coupling path to output). The first power coupler and the second power coupler are coupled with a switch set including a first channel selector-switch, a second channel selector-switch, and a third channel selector-switch. The first channel selector-switch includes a 3P3T switch. The second channel selector-switch includes a 3PST switch. The third channel selector-switch includes an 4PST switch. The first channel selector-switch is coupled with the second channel selector-switch and the third channel selector-switch.

The first PA has an input port that corresponds to a first external port of the transmitting module, and the first LNA has an output port that corresponds to a second external port of the transmitting module. The second PA has an input port that corresponds to a third external port of the transmitting module, and the second LNA has an output port that corresponds to a fourth external port of the transmitting module. The first channel selector-switch has a first P port that corresponds a fifth external port of the transmitting module. The first channel selector-switch has a second P port that corresponds a sixth external port of the transmitting module. The second channel selector-switch has a first P port that corresponds a seventh external port of the transmitting module. The second channel selector-switch has a second P port that corresponds an eighth external port of the transmitting module. The second channel selector-switch has a third P port that corresponds a ninth external port of the transmitting module. The power detection selector-switch has a P port that corresponds a tenth external port of the transmitting module. The power detection selector-switch has a remaining T port (a T port that is not coupled with the first power coupler and the second power coupler) that corresponds to an eleventh external port of the transmitting module. The third channel selector-switch has a first P port, a second P port, a third P port, and a fourth P port that correspond to a twelfth external port, a thirteenth external port, a fourteenth external port, and a fifteenth external port of the transmitting module respectively.

The first external port and the third external port are configured to be coupled with signal transmitting ports of a radio frequency transceiver. The fifth external port and the sixth external port are configured to be coupled with antennas of a corresponding antenna group. The seventh external port, the eighth external port, and the ninth external port are configured to be coupled with a receiving module or to be coupled with a receiving module and the transmitting module. The tenth external port is configured to be coupled with a PDET port of the radio frequency transceiver. The eleventh external port is optionally coupled with a power detection channel of another module to achieve power detection. External ports among the second external port, the fourth external port, the twelfth external port, the thirteenth external port, the fourteenth external port, and the fifteenth external port are configured to be coupled with signal receiving ports of the radio frequency transceiver. Alternatively, external ports among the twelfth external port, the thirteenth external port, the fourteenth external port, and the fifteenth external port are configured to be coupled with external ports of other transmitting module(s).

Figure 2I:
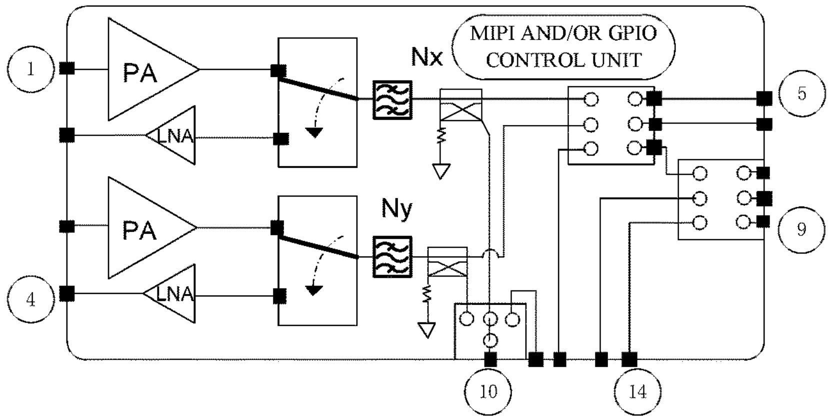
FIG. 2I is a schematic structural diagram illustrating a transmitting module according to another implementation of the present disclosure.

As illustrated in FIG. 2I, the transmitting module includes two signal transmit-receive processing circuits, two channel selector-switches (including a 3P3T switch), and one power detection selector-switch. The signal transmit-receive processing circuit includes one PA, one LNA, one transmit-receive transfer switch (including SPDT switch), one filter, and one power coupler. The transmitting module can further include an MIPI and/or GPIO control unit to control PA/LNA/power coupler/switch switching.

A first PA and a first LNA are coupled with a first transmit-receive transfer switch. The first transmit-receive transfer switch is coupled with a first filter. The first filter is coupled with a first power coupler. A second PA and a second LNA are coupled with a second transmit-receive transfer switch. The second transmit-receive transfer switch is coupled with a second filter. The second filter is coupled with a second power coupler. The first power coupler and the second power coupler are coupled with the power detection selector-switch (including an SP3T switch, where a remaining T port acts as an external port of the transmitting module and the external port is configured to switch n power coupling paths of other transmitting module(s) to one power coupling path to output). The first power coupler and the second power coupler are further coupled with two channel selector-switches (including a first channel selector-switch and a second channel selector-switch). The first channel selector-switch includes a 3P3T switch. The second channel selector-switch includes a 3P3T switch. The first channel selector-switch is coupled with the second channel selector-switch.

The first PA has an input port that corresponds to a first external port of the transmitting module, and the first LNA has an output port that corresponds to a second external port of the transmitting module. The second PA has an input port that corresponds to a third external port of the transmitting module, and the second LNA has an output port that corresponds to a fourth external port of the transmitting module. The first channel selector-switch has a first P port that corresponds a fifth external port of the transmitting module. The first channel selector-switch has a second P port that corresponds a sixth external port of the transmitting module. The second channel selector-switch has a first P port that corresponds a seventh external port of the transmitting module. The second channel selector-switch has a second P port that corresponds an eighth external port of the transmitting module. The second channel selector-switch has a third P port that corresponds a ninth external port of the transmitting module. The power detection selector-switch has a P port that corresponds a tenth external port of the transmitting module. The power detection selector-switch has a remaining T port (a T port that is not coupled with the first power coupler and the second power coupler) that corresponds to an eleventh external port of the transmitting module. The first channel selector-switch has a third T port that corresponds to a twelfth external port of the transmitting module. The second channel selector-switch has a second T port that corresponds to a thirteenth external port of the transmitting module, and a third T port that corresponds to a fourteenth external port of the transmitting module.

The first external port and the third external port are configured to be coupled with signal transmitting ports of a radio frequency transceiver. The fifth external port and the sixth external port are configured to be coupled with antennas of a corresponding antenna group. The seventh external port, the eighth external port, and the ninth external port are configured to be coupled with a receiving module or to be coupled with a receiving module and the transmitting module. The tenth external port is configured to be coupled with a PDET port of the radio frequency transceiver. The eleventh external port is optionally coupled with a power detection channel of another module to achieve power detection. External ports among the second external port, the fourth external port, the twelfth external port, the thirteenth external port, and the fourteenth external port are configured to be coupled with signal receiving ports of the radio frequency transceiver. Alternatively, external ports among the twelfth external port, the thirteenth external port, and the fourteenth external port are configured to be coupled with external ports of other transmitting module(s).

Figure 2J:
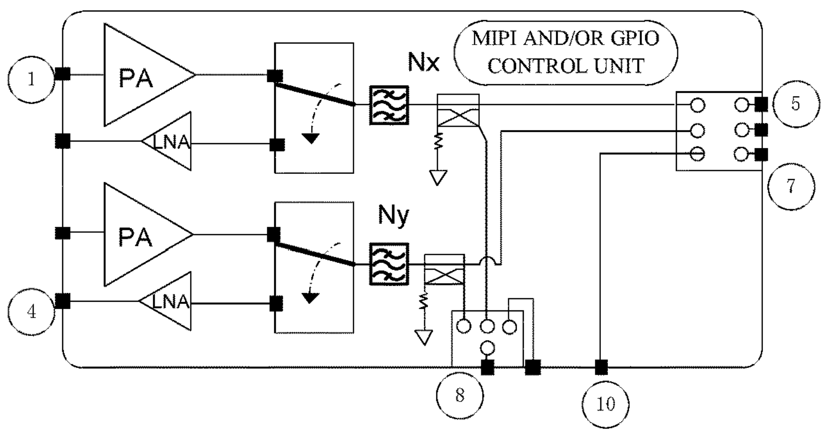
FIG. 2J is a schematic structural diagram illustrating a transmitting module according to another implementation of the present disclosure.

As illustrated in FIG. 2J, the transmitting module includes two signal transmit-receive processing circuits, one channel selector-switch (including a 3P3T switch), and one power detection selector-switch. The signal transmit-receive processing circuit includes one PA, one LNA, one transmit-receive transfer switch (including SPDT switch), one filter, and one power coupler. The transmitting module can further include an MIPI and/or GPIO control unit to control PA/LNA/power coupler/switch switching.

A first PA and a first LNA are coupled with a first transmit-receive transfer switch. The first transmit-receive transfer switch is coupled with a first filter. The first filter is coupled with a first power coupler. A second PA and a second LNA are coupled with a second transmit-receive transfer switch. The second transmit-receive transfer switch is coupled with a second filter. The second filter is coupled with a second power coupler. The first power coupler and the second power coupler are coupled with the power detection selector-switch (including an SP3T switch, where a remaining T port acts as an external port of the transmitting module and the external port is configured to switch n power coupling paths of other transmitting modules to one power coupling path to output). The first power coupler and the second power coupler are further coupled with the channel selector-switch.

The first PA has an input port that corresponds to a first external port of the transmitting module, and the first LNA has an output port that corresponds to a second external port of the transmitting module. The second PA has an input port that corresponds to a third external port of the transmitting module, and the second LNA has an output port that corresponds to a fourth external port of the transmitting module. The channel selector-switch has a first P port that corresponds a fifth external port of the transmitting module. The channel selector-switch has a second P port that corresponds a sixth external port of the transmitting module. The channel selector-switch has a third P port that corresponds a seventh external port of the transmitting module. The power detection selector-switch has a P port that corresponds an eighth external port of the transmitting module. The power detection selector-switch has a remaining T port that corresponds to a ninth external port of the transmitting module. The channel selector-switch has a third T port that corresponds a tenth external port of the transmitting module.

The first external port and the third external port are configured to be coupled with signal transmitting ports of a radio frequency transceiver. The fifth external port and the sixth external port are configured to be coupled with antennas of a corresponding antenna group. The seventh external port is configured to be coupled with a receiving module and/or the transmitting module. The eighth external port is configured to be coupled with a PDET port of the radio frequency transceiver. The tenth external port is configured to be coupled with a signal receiving port of the radio frequency transceiver or an external port of another transmitting module.

Figure 2K:
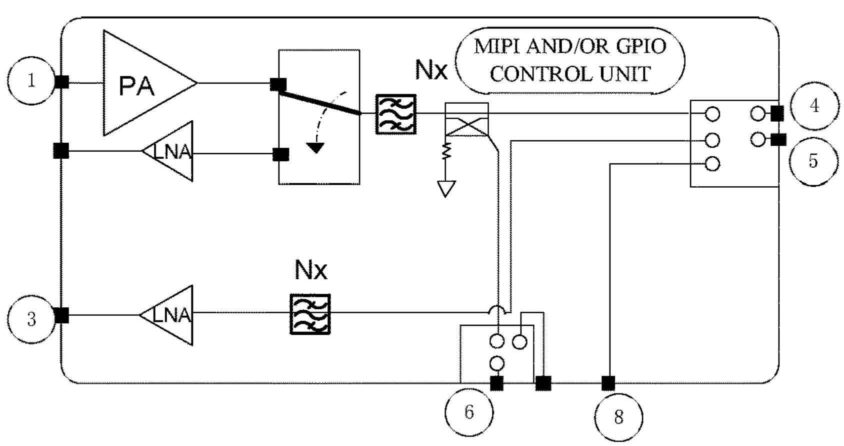
FIG. 2K is a schematic structural diagram illustrating a transmitting module according to another implementation of the present disclosure.

As illustrated in FIG. 2K, the transmitting module includes one signal transmit-receive processing circuit, one signal receiving channel, one channel selector-switch (including a DP3T switch), and one power detection selector-switch. The signal transmit-receive processing circuit includes one PA, one LNA, one transmit-receive transfer switch (including SPDT switch), one filter, and one power coupler. The signal receiving channel includes one LNA and one filter. The transmitting module can further include an MIPI and/or GPIO control unit to control PA/LNA/power coupler/switch switching.

A first PA and a first LNA are coupled with a first transmit-receive transfer switch. The first transmit-receive transfer switch is coupled with a first filter. The first filter is coupled with the power coupler. A second LNA is coupled with a second filter. The power coupler is coupled with the power detection selector-switch (including an SPDT switch, where a remaining T port acts as an external port of the transmitting module and the external port is configured to switch n power coupling paths of other transmitting modules to one power coupling path to output). The power coupler and the second filter is coupled with the channel selector-switch.

The first PA has an input port that corresponds to a first external port of the transmitting module, and the first LNA has an output port that corresponds to a second external port of the transmitting module. The second LNA has an output port that corresponds to a third external port of the transmitting module. The channel selector-switch has a first P port that corresponds a fourth external port of the transmitting module. The channel selector-switch has a second P port that corresponds a fifth external port of the transmitting module. The power detection selector-switch has a P port that corresponds a sixth external port of the transmitting module. The power detection selector-switch has a remaining T port that corresponds to a seventh external port of the transmitting module. The channel selector-switch has a third T port that corresponds an eighth external port of the transmitting module.

The first external port is configured to be coupled with a signal transmitting port of a radio frequency transceiver. The fourth external port and the fifth external port are configured to be coupled with antennas of a corresponding antenna group. The sixth external port is configured to be coupled with a PDET port of the radio frequency transceiver. The eighth external port is configured to be coupled with a signal receiving port of the radio frequency transceiver or an external port of another transmitting module.

Figure 2L:
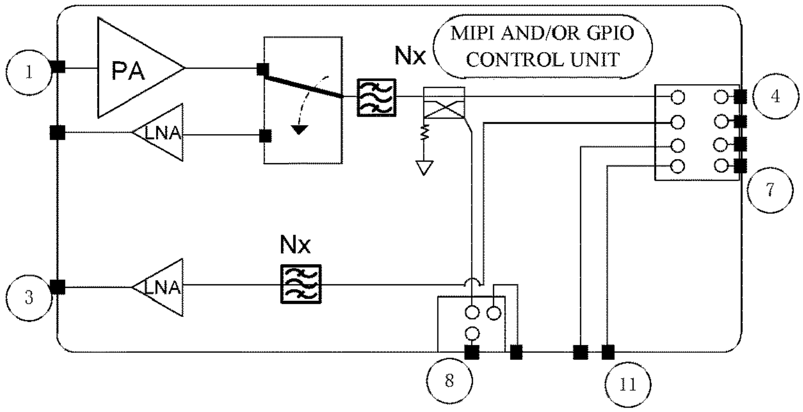
FIG. 2L is a schematic structural diagram illustrating a transmitting module according to another implementation of the present disclosure.

As illustrated in FIG. 2L, the transmitting module includes one signal transmit-receive processing circuit, one signal receiving channel, one channel selector-switch (including a 4P4T switch), and one power detection selector-switch. The signal transmit-receive processing circuit includes one PA, one LNA, one transmit-receive transfer switch (including SPDT switch), one filter, and one power coupler. The signal receiving channel includes one LNA and one filter. The transmitting module can further include an MIPI and/or GPIO control unit to control PA/LNA/power coupler/switch switching.

A first PA and a first LNA are coupled with a first transmit-receive transfer switch. The first transmit-receive transfer switch is coupled with a first filter. The first filter is coupled with the power coupler. A second LNA is coupled with a second filter. The power coupler is coupled with the power detection selector-switch (including an SPDT switch, where a remaining T port serves as an external port of the transmitting module and the external port is configured to switch n power coupling paths of other transmitting modules to one power coupling path to output). The power coupler and the second filter is coupled with the channel selector-switch.

The first PA has an input port that corresponds to a first external port of the transmitting module, and the first LNA has an output port that corresponds to a second external port of the transmitting module. The second LNA has an output port that corresponds to a third external port of the transmitting module. The channel selector-switch has a first P port, a second P port, a third P port, and a fourth P port that correspond a fourth external port, a fifth external port, a sixth external port, and a seventh external port of the transmitting module, respectively. The power detection selector-switch has a P port that corresponds an eighth external port of the transmitting module. The power detection selector-switch has a remaining T port that corresponds to a ninth external port of the transmitting module. The channel selector-switch has a third T port and a fourth T port that correspond a tenth external port and an eleventh external port of the transmitting module, respectively.

The first external port is configured to be coupled with a signal transmitting port of a radio frequency transceiver. The fourth external port and the fifth external port are configured to be coupled with antennas of a corresponding antenna group. The sixth external port and the seventh external port are configured to be coupled with a receiving module and/or other transmitting module(s). The eighth external port is configured to be coupled with a PDET port of the radio frequency transceiver. The tenth external port and the eleventh external port are configured to be coupled with signal receiving ports of the radio frequency transceiver or external ports of other transmitting module(s).

Figure 2M:
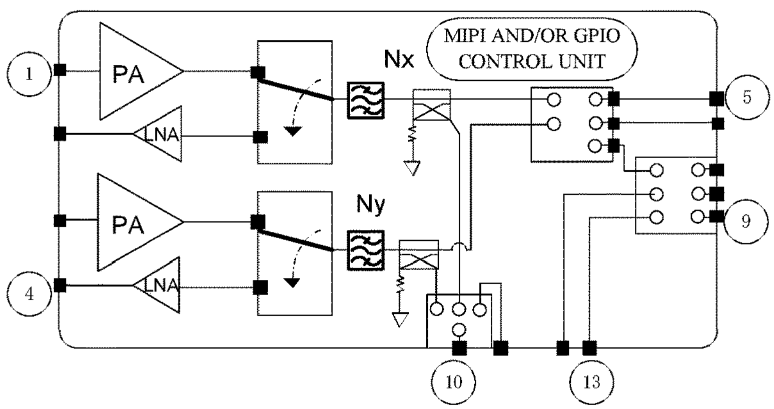
FIG. 2M is a schematic structural diagram illustrating a transmitting module according to another implementation of the present disclosure.

As illustrated in FIG. 2M, the transmitting module includes two signal transmit-receive processing circuits, two channel selector-switches (including 3PDT and a 3P3T switch), and one power detection selector-switch. The signal transmit-receive processing circuit includes one PA, one LNA, one transmit-receive transfer switch (including SPDT switch), one filter, and one power coupler. The transmitting module can further include an MIPI and/or GPIO control unit to control PA/LNA/power coupler/switch switching.

A first PA and a first LNA are coupled with a first transmit-receive transfer switch. The first transmit-receive transfer switch is coupled with a first filter. The first filter is coupled with a first power coupler. A second PA and a second LNA are coupled with a second transmit-receive transfer switch. The second transmit-receive transfer switch is coupled with a second filter. The second filter is coupled with a second power coupler. The first power coupler and the second power coupler are coupled with the power detection selector-switch (including an SP3T switch, where a remaining T port acts as an external port of the transmitting module and the external port is configured to switch n power coupling paths of other transmitting modules to one power coupling path to output). The first power coupler and the second power coupler are coupled with a first channel selector-switch (including a 3PDT switch). The first channel selector-switch is coupled with the second channel selector-switch (including a 3P3T switch).

The first PA has an input port that corresponds to a first external port of the transmitting module, and the first LNA has an output port that corresponds to a second external port of the transmitting module. The second PA has an input port that corresponds to a third external port of the transmitting module, and the second LNA has an output port that corresponds to a fourth external port of the transmitting module. The first channel selector-switch has a first P port that corresponds a fifth external port of the transmitting module. The first channel selector-switch has a second P port that corresponds a sixth external port of the transmitting module. The second channel selector-switch has a first P port that corresponds a seventh external port of the transmitting module. The second channel selector-switch has a second P port that corresponds an eighth external port of the transmitting module. The second channel selector-switch has a third P port that corresponds a ninth external port of the transmitting module. The power detection selector-switch has a P port that corresponds a tenth external port of the transmitting module. The power detection selector-switch has a remaining T port (a T port that is not coupled with the first power coupler and the second power coupler) that corresponds to an eleventh external port of the transmitting module. The second channel selector-switch has a second T port that corresponds to a twelfth external port of the transmitting module, and a third T port that corresponds to a thirteenth external port of the transmitting module.

The first external port and the third external port are configured to be coupled with signal transmitting ports of a radio frequency transceiver. The fifth external port and the sixth external port are configured to be coupled with antennas of a corresponding antenna group. The seventh external port, the eighth external port, and the ninth external port are configured to be coupled with a receiving module and/or other transmitting module(s). The tenth external port is configured to be coupled with a PDET port of the radio frequency transceiver. External ports among the second external port, the fourth external port, the twelfth external port, and the thirteenth external port are configured to be coupled with signal receiving ports of the radio frequency transceiver. Alternatively, external ports among the twelfth external port and the thirteenth external port are configured to be coupled with external ports of other transmitting module(s).

Figure 3:
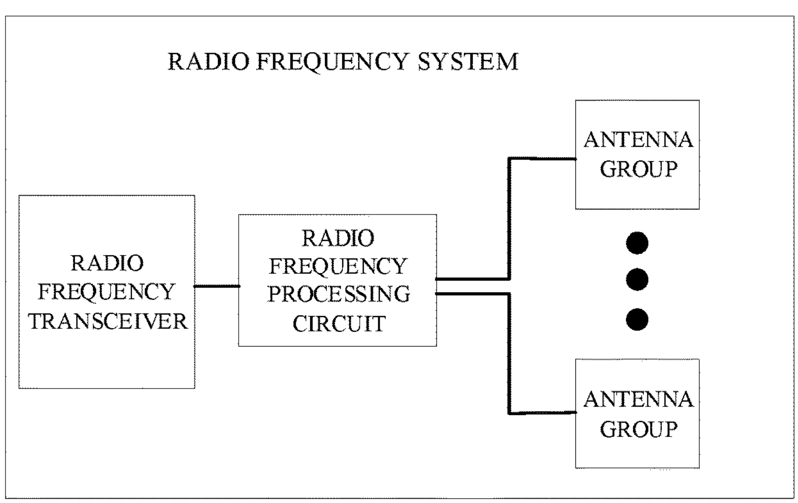
FIG. 3 is a schematic structural diagram illustrating a radio frequency system according to another implementation of the present disclosure.

In a third aspect, with the definitions of the above receiving module and transmitting module, a radio frequency architecture (also referred as a radio frequency system) supporting an electronic device for 5G is provided. The above receiving module and the transmitting module are applied to an electronic device. As illustrated in FIG. 3, the radio frequency system includes a radio frequency transceiver, a radio frequency processing circuit, and at least two antenna groups. The radio frequency transceiver is coupled with the radio frequency processing circuit, and the radio frequency processing circuit is coupled with the at least two antenna groups.

The radio frequency system supports a simultaneous downlink reception with four antennas. The at least two antenna groups include m antennas, and m is greater than or equal to 4 and less than or equal to 8. The radio frequency processing circuit includes multiple modules which are the same in number as the at least two antenna groups. Each module is coupled with one antenna group, and is disposed adjacent to the antenna group with which the module is coupled. The modules include a transmitting module, or a transmitting module and a receiving module.

In this example, as various modules of the radio frequency system are disposed adjacent to corresponding antenna groups and only the receiving module and the transmitting module are used to construct a central processing circuit, it is beneficial to improving sensitivity of various channels. Compared with a structure in which devices are separated, the degree of integration is higher and the area/cost/power consumption is optimized.

In one possible implementation, in the case that the radio frequency system supports (in other words, is operable in) a single-transmit mode, the radio frequency processing circuit includes one transmitting module and two or three receiving modules. The single-transmit mode refers to an operating mode in which the radio frequency system can support one uplink transmitting path.

The transmitting module and at least one receiving module of the two or three receiving modules are disposed on a main board, and the rest of the two or three receiving modules are disposed on a sub board. The rest of the two or three receiving modules refers to one or more receiving modules except the at least one receiving module (one or two receiving modules) disposed on the main board.

The radio frequency transceiver is coupled with the transmitting module and the two receiving modules or the three receiving modules.

The transmitting module is coupled with at least one receiving module of the two or three receiving modules, to support a signal transmitting function of the at least one receiving module.

In one possible implementation, in the case that the radio frequency system supports a dual-transmit mode, the radio frequency processing circuit at least includes two transmitting modules. The dual-transmit mode refers to an operating mode in which the radio frequency system can support two uplink transmitting paths.

The two transmitting modules are disposed on the main board.

The radio frequency processing circuit further includes one or two receiving modules, and at least one receiving module of the one or two receiving modules is disposed on the sub board.

In one possible implementation, the radio frequency transceiver is coupled with the two transmitting modules; the two transmitting modules are coupled with each other; the radio frequency transceiver is coupled with the one or two receiving modules; and/or at least one transmitting module of the two transmitting modules is coupled with at least one receiving module of the one or two receiving modules to support a signal transmitting function of the at least one receiving module.

In one possible implementation, the radio frequency processing circuit further includes at least one receiving port selector-switch, and each receiving port selector-switch is coupled with a signal receiving port of the radio frequency transceiver and is coupled with the transmitting module or the receiving module.

The following is a detailed description in conjunction with examples.

Figure 3A:
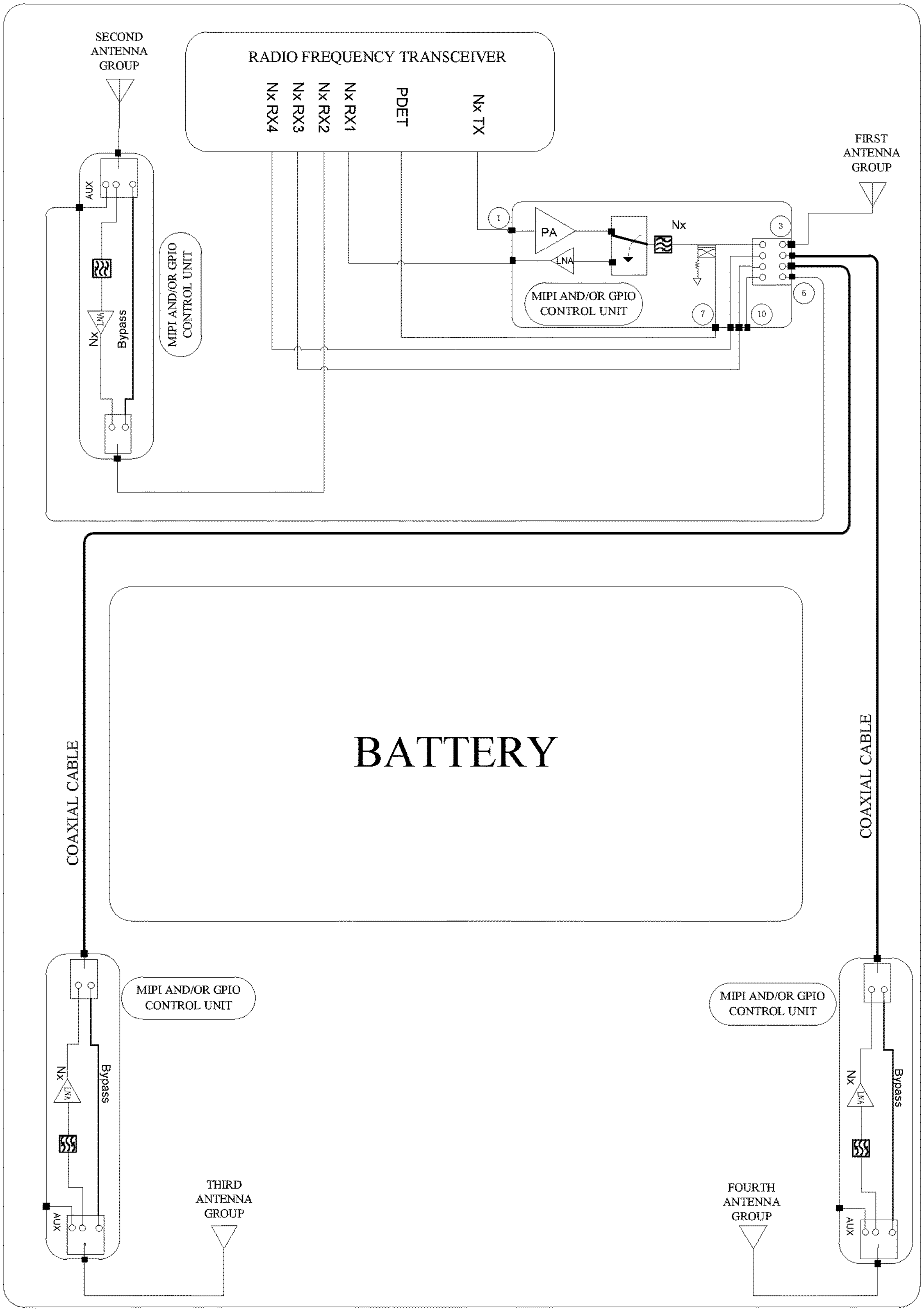
FIG. 3A is a schematic structural diagram illustrating a radio frequency system according to another implementation of the present disclosure.

As illustrated in FIG. 3A, in this example, the radio frequency architecture has the following function: ① supporting 5G NR single-band; ② not supporting UL CA; ③ not supporting DL CA; ④ supporting SRS switching in four antennas; ⑤ supporting NR 1T4R (one transmitting path and four receiving paths).

The radio frequency architecture for 5G includes a radio frequency transceiver, one transmitting module, three receiving modules (a first receiving module, a second receiving module, and a third receiving module), and four antenna groups (a first antenna group, a second antenna group, a third antenna group, and a fourth antenna group). Each antenna group includes one antenna. The radio frequency transceiver, the transmitting module, and the first receiving module are disposed on a main board (two modules above a battery in this figure). The second receiving module and the third receiving module are disposed on a sub board (two modules below the battery in this figure). Each receiving module is disposed adjacent to an antenna with which the receiving module is coupled.

The transmitting module is disposed adjacent to the first antenna group. The first receiving module is disposed adjacent to the second antenna group. The second receiving module is disposed adjacent to the third antenna group. The third receiving module is disposed adjacent to the fourth antenna group.

The structure and connection of internal devices of the transmitting module of FIG. 3A are similar to that of FIG. 2C. Each receiving module includes one LNA, one filter, two transfer switches (a first transfer switch embodied as an SP3T switch, and a second transfer switch embodied as an SPDT switch), an AUX, and an internal Bypass channel. The first receiving module has an AUX coupled with a sixth external port of the transmitting module, to support transmission of an SRS TX signal or self-switching among antennas for signal transmission.

The radio frequency transceiver has a transmitting port Nx TX coupled with a first external port of the transmitting module. The radio frequency transceiver has a first receiving port Nx RX1 coupled with a second external port of the transmitting module. The radio frequency transceiver has a second receiving port Nx RX2 coupled with a P port of a second transfer switch of the first receiving module. The radio frequency transceiver has a third receiving port Nx RX3 coupled with a ninth external port of the transmitting module. The radio frequency transceiver has a fourth receiving port Nx RX4 coupled with an eighth external port of the transmitting module.

The second antenna group is coupled with a P port of a first transfer switch (SP3T switch) of the first receiving module. The first transfer switch has a first T port that corresponds to the AUX of the first receiving module. The AUX is coupled with the sixth external port of the transmitting module. The first transfer switch has a second T port coupled with a filter of the first receiving module. The filter is coupled with an LNA of the first receiving module, and the LNA is coupled with a first T port of the second transfer switch (SPDT switch). The first receiving module has a Bypass channel provided between a third T port of the first transfer switch and a second T port of the second transfer switch. The third antenna group is coupled with a P port of a first transfer switch of the second receiving module, and a P port of a second transfer switch of the second receiving module is coupled with a fifth external port of the transmitting module. The fourth antenna group is coupled with a P port of a first transfer switch of the third receiving module, and a P port of a second transfer switch of the third receiving module is coupled with a fourth external port of the transmitting module.

An electronic device including the radio frequency architecture described above switches on a transmitting path between a transmitting port in a target band of the radio frequency transceiver and a target antenna group in the radio frequency system, to transmit a signal through an antenna in the target antenna group.

In an example, the electronic device including the foregoing radio frequency architecture performs transmitting an SRS with four antennas in turn or autonomous transmission switching as follows.

In a first transmission period, the electronic device controls a first T port of a channel selector-switch of the transmitting module to be connected to a first P port to transmit a signal, to support a base station to detect a channel quality of a corresponding antenna.

In a second transmission period, the electronic device controls the first T port of the channel selector-switch of the transmitting module to be connected to a second P port to transmit a signal, to support the base station to detect a channel quality of a corresponding antenna.

In a third transmission period, the electronic device controls the first T port of the channel selector-switch of the transmitting module to be connected to a third P port to transmit a signal, to support the base station to detect a channel quality of a corresponding antenna.

In a fourth transmission period, the electronic device controls the first T port of the channel selector-switch of the transmitting module to be connected to a fourth P port to transmit a signal, to support the base station to detect a channel quality of a corresponding antenna.

Figure 3B:
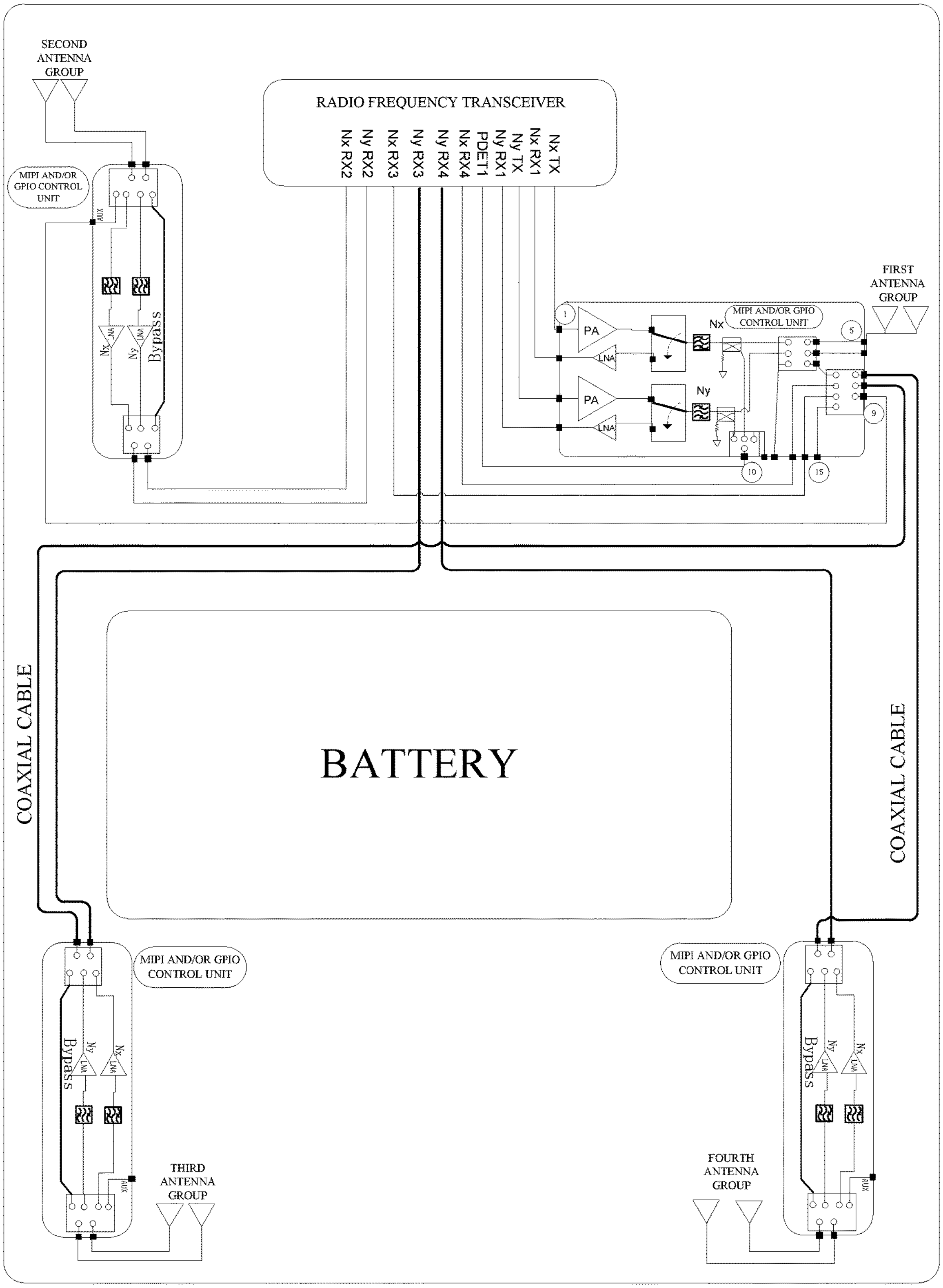
FIG. 3B is a schematic structural diagram illustrating another radio frequency system according to another implementation of the present disclosure.

As illustrated in FIG. 3B, in this example, the radio frequency architecture has the following function: ① supporting 5G NR dual-band; ② not supporting UL CA; ③ supporting DL CA; ④ supporting transmission of an SSR with four antennas in a polling manner; ⑤ supporting NR 1T4R (one transmitting path and four receiving paths in single-band).

The radio frequency architecture for 5G includes a radio frequency transceiver, one transmitting module, three receiving modules (a first receiving module, a second receiving module, and a third receiving module), and four antenna groups (a first antenna group, a second antenna group, a third antenna group, and a fourth antenna group). Each antenna group includes two antennas. The radio frequency transceiver, the transmitting module, and the first receiving module are disposed on a main board (two modules above a battery in this figure). The second receiving module and the third receiving module are disposed on a sub board (two modules below the battery in this figure). Each receiving module is disposed adjacent to an antenna with which the receiving module is coupled.

The transmitting module is disposed adjacent to the first antenna group. The first receiving module is disposed adjacent to the second antenna group. The second receiving module is disposed adjacent to the third antenna group. The third receiving module is disposed adjacent to the fourth antenna group.

The structure and connection of internal devices of the transmitting module of FIG. 3B are similar to that of FIG. 2G. The internal devices and the connection therebetween of the receiving module of FIG. 3B are similar to that of FIG. 1K. The first receiving module has an AUX coupled with a ninth external port of the transmitting module, to support transmission of an SRS TX signal through a corresponding antenna or self-switching among antennas for signal transmission.

The radio frequency transceiver has a transmitting port Nx TX in a first band coupled with a first external port of the transmitting module. The radio frequency transceiver has a transmitting port Ny TX in a second band coupled with a third external port of the transmitting module. The radio frequency transceiver has a first receiving port Nx RX1 in the first band coupled with a second external port of the transmitting module. The radio frequency transceiver has a first receiving port Ny RX1 in the second band coupled with a fourth external port of the transmitting module. The radio frequency transceiver has a second receiving port Nx RX2 in the first band coupled with a first P port of a second transfer switch of the first receiving module. The radio frequency transceiver has a second receiving port Ny RX2 in the second band coupled with a second P port of the second transfer switch of the first receiving module. The radio frequency transceiver has a third receiving port Nx RX3 in the first band coupled with a fourteenth external port of the transmitting module. The radio frequency transceiver has a third receiving port Ny RX3 in the second band coupled with a second P port of a second transfer switch of the second receiving module. The radio frequency transceiver has a fourth receiving port Nx RX4 in the first band coupled with a thirteen external port of the transmitting module. The radio frequency transceiver has a fourth receiving port Ny RX4 in the second band coupled with a second P port of a second transfer switch of the third receiving module. The radio frequency transceiver has a PDET port coupled with a tenth external port of the transmitting module.

The second antenna group is coupled with two P ports of a first transfer switch (DP4T switch) of the first receiving module. The first transfer switch has a first T port that corresponds to the AUX of the first receiving module. The AUX is coupled with the ninth external port of the transmitting module. The first transfer switch has a second T port coupled with a first filter of the first receiving module. The first filter is coupled with a first LNA of the first receiving module, and the first LNA is coupled with a first T port of the second transfer switch (DP3T switch). The first transfer switch has a third T port coupled with a second filter of the first receiving module. The second filter is coupled with a second LNA of the first receiving module, and the second LNA is coupled with a second T port of the second transfer switch. The first receiving module has a Bypass channel provided between a fourth T port of the first transfer switch and a third T port of the second transfer switch.

The connection between the third antenna group and the second receiving module as well as the connection between the internal devices of the second receiving module are similar to that between the second antenna group and the first receiving module as well as that of the first receiving module. The connection between the fourth antenna group and the third receiving module as well as the connection between the internal devices of the third receiving module are similar to that between the second antenna group and the first receiving module as well as that of the first receiving module. The disclosure will not be repeated herein.

An electronic device including the radio frequency architecture described above switches on a transmitting path between a transmitting port in a target band of the radio frequency transceiver and a target antenna group in the radio frequency system, to transmit a signal through an antenna in the target antenna group.

In an example, the electronic device including the foregoing radio frequency architecture performs, in single-band (for example, Nx band), transmitting an SRS with four antennas in turn or autonomous transmission switching as follows.

In a first transmission period, the electronic device controls a first T port of a first channel selector-switch of the transmitting module to be connected to a first P port of the first channel selector-switch, to transmit a signal through an antenna of an antenna group.

In a second transmission period, the electronic device controls the first T port of the first channel selector-switch of the transmitting module to be connected to a third P port of the first channel selector-switch and controls a first T port of a second channel selector-switch to be connected to a third P of the second channel selector-switch, to transmit a signal through an antenna of an antenna group.

In a third transmission period, the electronic device controls the first T port of the first channel selector-switch of the transmitting module to be connected to the third P port of the first channel selector-switch and controls the first T port of the second channel selector-switch to be connected to a second P of the second channel selector-switch, to transmit a signal through an antenna of an antenna group.

In a fourth transmission period, the electronic device controls the first T port of the first channel selector-switch of the transmitting module to be connected to the third P port of the first channel selector-switch and controls the first T port of the second channel selector-switch to be connected to a first P of the second channel selector-switch, to transmit a signal through an antenna of an antenna group.

Figure 3C:
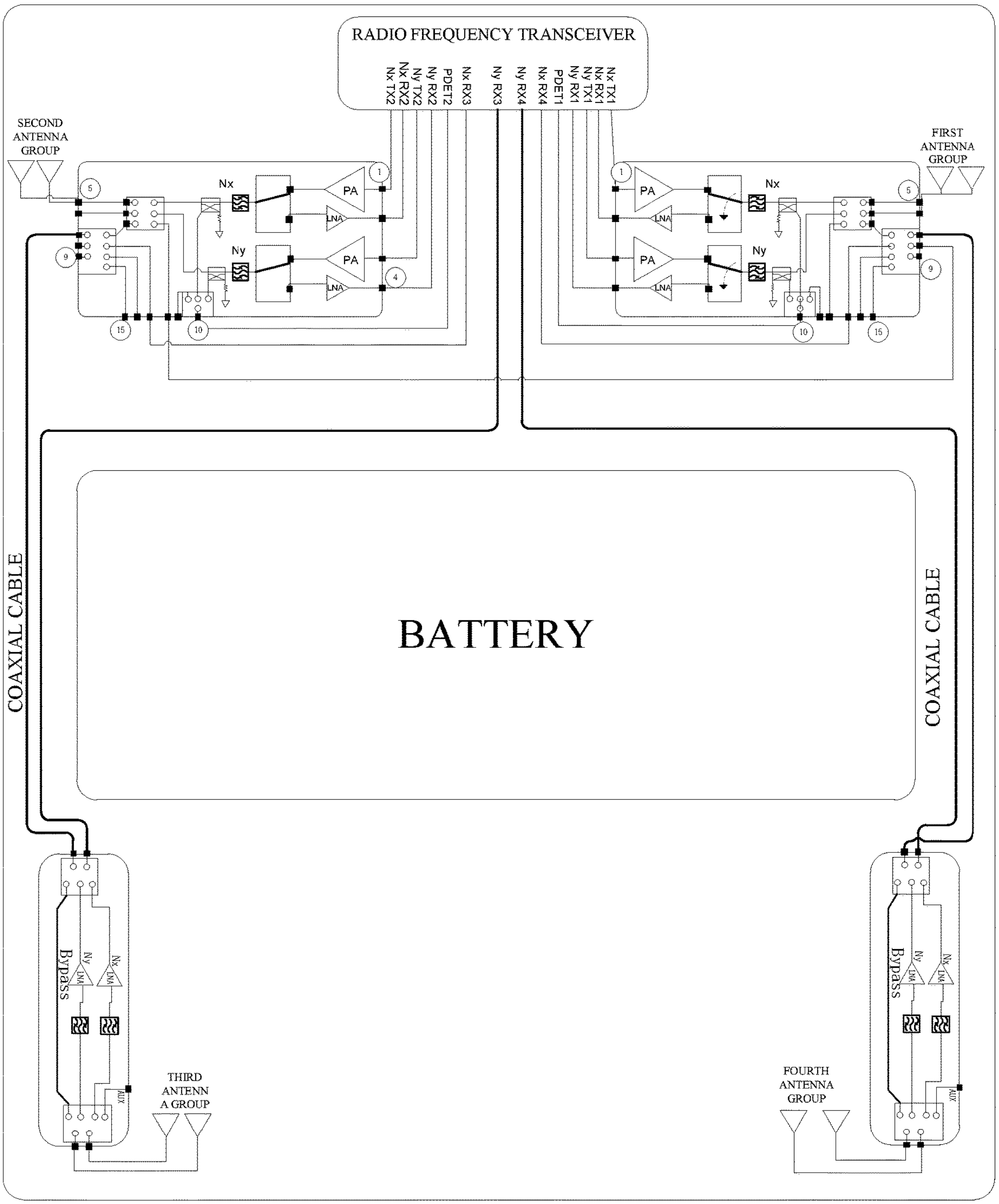
FIG. 3C is a schematic structural diagram illustrating yet another radio frequency system according to another implementation of the present disclosure.

As illustrated in FIG. 3C, in this example, the radio frequency architecture has the following function: ① supporting 5G NR dual-band; ② not supporting UL CA; ③ supporting DL CA; ④ supporting transmission of an SSR with four antennas in a polling manner; ⑤ supporting NR 2T4R (two transmitting paths and four receiving paths in single-band).

The radio frequency architecture for 5G includes a radio frequency transceiver, two transmitting modules (a first transmitting module and a second transmitting module), two receiving modules (a first receiving module and a second receiving module), and four antenna groups (a first antenna group, a second antenna group, a third antenna group, and a fourth antenna group). Each antenna group includes two antennas. The radio frequency transceiver, the first transmitting module, and the second transmitting module are disposed on a main board (two modules above a battery in this figure). The first receiving module and the second receiving module are disposed on a sub board (two modules below the battery in this figure). Each receiving module is disposed adjacent to an antenna with which the receiving module is coupled.

The first transmitting module is disposed adjacent to the first antenna group. The second transmitting module is disposed adjacent to the second antenna group. The first receiving module is disposed adjacent to the third antenna group. The second receiving module is disposed adjacent to the fourth antenna group.

The structure and connection of internal devices of the transmitting module of FIG. 3C are similar to that of FIG. 2G. The internal devices and connection therebetween of the receiving module of FIG. 3C are similar to that of FIG. 1K. The disclosure will not be repeated herein. The first transmitting module has a seventh external port coupled with a P port of a second transfer switch of the second receiving module. The first transmitting module has an eighth external port coupled with a twelfth external port of the second transmitting module. The second transmitting module has a seventh external port coupled with a P port of a second transfer switch of the first receiving module.

The radio frequency transceiver has a first transmitting port Nx TX1 in a first band coupled with a first external port of the first transmitting module. The radio frequency transceiver has a second transmitting port Nx TX2 in the first band coupled with a first external port of the second transmitting module. The radio frequency transceiver has a first transmitting port Ny TX1 in the second band coupled with a third external port of the first transmitting module. The radio frequency transceiver has a second transmitting port Ny TX2 in the second band coupled with a third external port of the second transmitting module. The radio frequency transceiver has a first receiving port Nx RX1 in the first band coupled with a second external port of the first transmitting module. The radio frequency transceiver has a first receiving port Ny RX1 in the second band coupled with a fourth external port of the first transmitting module. The radio frequency transceiver has a second receiving port Nx RX2 in the first band coupled with a second external port of the second transmitting module. The radio frequency transceiver has a second receiving port Ny RX2 in the second band coupled with a fourth external port of the second transmitting module. The radio frequency transceiver has a third receiving port Nx RX3 in the first band coupled with a thirteenth external port of the second transmitting module. The radio frequency transceiver has a third receiving port Ny RX3 in the second band coupled with a P port of a second transfer switch of the first receiving module. The P port is coupled with a T port of a receiving path in an Ny band to implement a third signal receiving channel in the Ny band. The radio frequency transceiver has a fourth receiving port Nx RX4 in the first band coupled with a thirteen external port of the first transmitting module. The radio frequency transceiver has a fourth receiving port Ny RX4 in the second band coupled with a P port of a second transfer switch of the second receiving module. The P port is switched to a signal receiving channel in the Ny band. The radio frequency transceiver has a first PDET1 port coupled with a tenth external port of the first transmitting module. The radio frequency transceiver has a second PDET2 port coupled with a tenth external port of the second transmitting module.

The first antenna group includes two antennas respectively coupled with a fifth external port and a sixth external port of the first transmitting module. The connection between the second antenna group and the second transmitting module is similar to that between the first antenna group and the first transmitting module.

The third antenna group includes two antennas respectively coupled with two P port of a first transfer switch of the first receiving module. The connection between the fourth antenna group and the second receiving module is similar to that between the third antenna group and the first receiving module.

An electronic device including the radio frequency architecture described above switches on a transmitting path between a transmitting port in a target band of the radio frequency transceiver and a target antenna group in the radio frequency system, to transmit a signal through an antenna in the target antenna group.

In an example, the electronic device including the foregoing radio frequency architecture performs, in single-band (for example, Nx band), transmitting an SRS with four antennas in turn or autonomous transmission switching (applicable to a scenario where a user holds an antenna or the antenna is blocked, which affects uplink transmission of the antenna) as follows.

In a first transmission period, the electronic device controls a first T port of a first channel selector-switch of the first transmitting module to be connected to a first P port of the first channel selector-switch, to transmit a signal, and controls the first T port of the first channel selector-switch of the second transmitting module to be connected to a third P port of the first channel selector-switch and a first T port of a second channel selector-switch of the first transmitting module to be connected to a first P of the second channel selector-switch, to transmit a signal, to achieve signal transmission through antennas of antenna groups.

In a second transmission period, the electronic device controls a first T port of a first channel selector-switch of the second transmitting module to be connected to a first P port of the first channel selector-switch, to transmit a signal, and controls the first T port of the first channel selector-switch of the second transmitting module to be connected to a third P port of the first channel selector-switch and a first T port of a second channel selector-switch of the second transmitting module to be connected to a first P of the second channel selector-switch, to transmit a signal, to achieve signal transmission through antennas of antenna groups.

In addition, the radio frequency architecture is compatible with 1T4R SRS switching, that is, has the ability to transmit from the first transmitting module to the four antenna groups. In the first transmission period and the second transmission period, a signal passes through the fifth external port/the sixth external port and the seventh external port of the first transmitting module. In the third transmission period, a signal is transferred from the eighth external port of the first transmitting module to the twelfth external port of the second transmitting module, and then from the twelfth external port of the second transmitting module to the second antenna group via the first channel selector-switch of the second transmitting module. In the fourth transmission period, a signal is transferred from the eighth external port of the first transmitting module to the twelfth external port of the second transmitting module, and then from the twelfth external port of the second transmitting module to the first receiving module via the first channel selector-switch and second channel selector-switch of the second transmitting module.

Figure 3D:
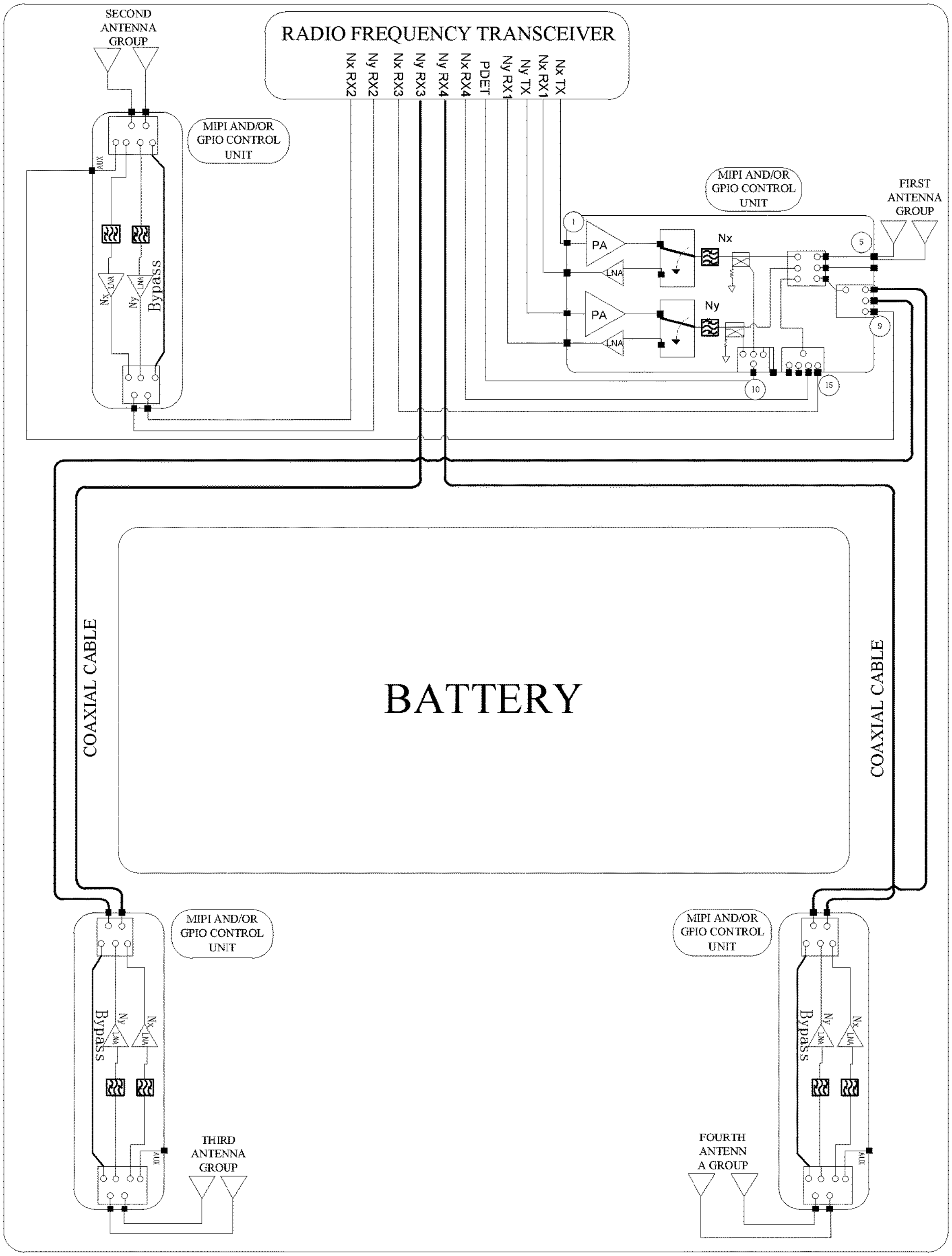
FIG. 3D is a schematic structural diagram illustrating a radio frequency system according to another implementation of the present disclosure.

In the example illustrated in FIG. 3D, the radio frequency architecture has the following function: ① supporting 5G NR dual-band; ② not supporting UL CA; ③ supporting DL CA; ④ supporting transmitting an SRS with four antennas in turn; ⑤ supporting NR 1T4R (one transmitting path and four receiving paths in single-band).

The radio frequency architecture for 5G includes a radio frequency transceiver, one transmitting module, three receiving modules (a first receiving module, a second receiving module, and a third receiving module), and four antenna groups (a first antenna group, a second antenna group, a third antenna group, and a fourth antenna group). Each antenna group includes two antennas. The radio frequency transceiver, the transmitting module, and the first receiving module are disposed on a main board (two modules above a battery in this figure). The second receiving module and the third receiving module are disposed on a sub board (two modules below the battery in this figure). Each receiving module is disposed adjacent to an antenna with which the receiving module is coupled.

The transmitting module is disposed adjacent to the first antenna group. The first receiving module is disposed adjacent to the second antenna group. The second receiving module is disposed adjacent to the third antenna group. The third receiving module is disposed adjacent to the fourth antenna group.

The structure and connection of internal devices of the transmitting module of FIG. 3D are similar to that of FIG. 2H. The internal devices and connection therebetween of the receiving module of FIG. 3D are similar to that of FIG. 1K. The first receiving module has an AUX coupled with a ninth external port of the transmitting module, to support transmitting an SRS TX signal through a corresponding antenna or self-switching among antennas for signal transmission.

The radio frequency transceiver has a transmitting port Nx TX in a first band coupled with a first external port of the transmitting module. The radio frequency transceiver has a transmitting port Ny TX in a second band coupled with a third external port of the transmitting module. The radio frequency transceiver has a first receiving port Nx RX1 in the first band coupled with a second external port of the transmitting module. The radio frequency transceiver has a first receiving port Ny RX1 in the second band coupled with a fourth external port of the transmitting module. The radio frequency transceiver has a second receiving port Nx RX2 in the first band coupled with a first P port of a second transfer switch of the first receiving module. The radio frequency transceiver has a second receiving port Ny RX2 in the second band coupled with a second P port of the second transfer switch of the first receiving module. The radio frequency transceiver has a third receiving port Nx RX3 in the first band coupled with a fifteen external port of the transmitting module. The radio frequency transceiver has a third receiving port Ny RX3 in the second band coupled with a second P port of a second transfer switch of the second receiving module. The radio frequency transceiver has a fourth receiving port Nx RX4 in the first band coupled with a fourteenth external port of the transmitting module. The radio frequency transceiver has a fourth receiving port Ny RX4 in the second band coupled with a second P port of a second transfer switch of the third receiving module. The radio frequency transceiver has a PDET port coupled with a tenth external port of the transmitting module.

The second antenna group is coupled with two P ports of a first transfer switch (DP4T switch) of the first receiving module. The first transfer switch has a first T port that corresponds to the AUX of the first receiving module. The AUX is coupled with the ninth external port of the transmitting module. The first transfer switch has a second T port coupled with a first filter of the first receiving module. The first filter is coupled with a first LNA of the first receiving module, and the first LNA is coupled with a first T port of the second transfer switch (DP3T switch). The first transfer switch has a third T port coupled with a second filter of the first receiving module. The second filter is coupled with a second LNA of the first receiving module, and the second LNA is coupled with a second T port of the second transfer switch. The first receiving module has a Bypass channel disposed between a fourth T port of the first transfer switch and a third T port of the second transfer switch.

The connection between the third antenna group and the second receiving module as well as the connection between the internal devices of the second receiving module are similar to that between the second antenna group and the first receiving module as well as that of the first receiving module. The connection between the fourth antenna group and the third receiving module as well as the connection between the internal devices of the third receiving module are similar to that between the second antenna group and the first receiving module as well as that of the first receiving module. The disclosure will not be repeated herein.

An electronic device including the radio frequency architecture described above switches on a transmitting path between a transmitting port in a target band of the radio frequency transceiver and a target antenna group in the radio frequency system, to transmit a signal through an antenna in the target antenna group.

In an example, the electronic device including the foregoing radio frequency architecture performs, in single-band (for example, Nx band), transmitting an SRS with four antennas in turn or autonomous transmission switching as follows.

In a first transmission period, the electronic device controls a first T port of a first channel selector-switch of the transmitting module to be connected to a first P port of the first channel selector-switch, to transmit a signal, to achieve signal transmission through an antenna of an antenna group.

In a second transmission period, the electronic device controls the first T port of the first channel selector-switch of the transmitting module to be connected to a third P port of the first channel selector-switch and controls a T port of a second channel selector-switch to be connected to a third P of the second channel selector-switch, to transmit a signal, to achieve signal transmission through an antenna of an antenna group.

In a third transmission period, the electronic device controls the first T port of the first channel selector-switch of the transmitting module to remain connected to the third P port of the first channel selector-switch and controls the T port of the second channel selector-switch to be connected to a second P of the second channel selector-switch, to transmit a signal, to achieve signal transmission through an antenna of an antenna group.

In a fourth transmission period, the electronic device controls the first T port of the first channel selector-switch of the transmitting module to remain connected to the third P port of the first channel selector-switch and controls the T port of the second channel selector-switch to be connected to a first P of the second channel selector-switch, to transmit a signal, to achieve signal transmission through an antenna of an antenna group.

Figure 3E:
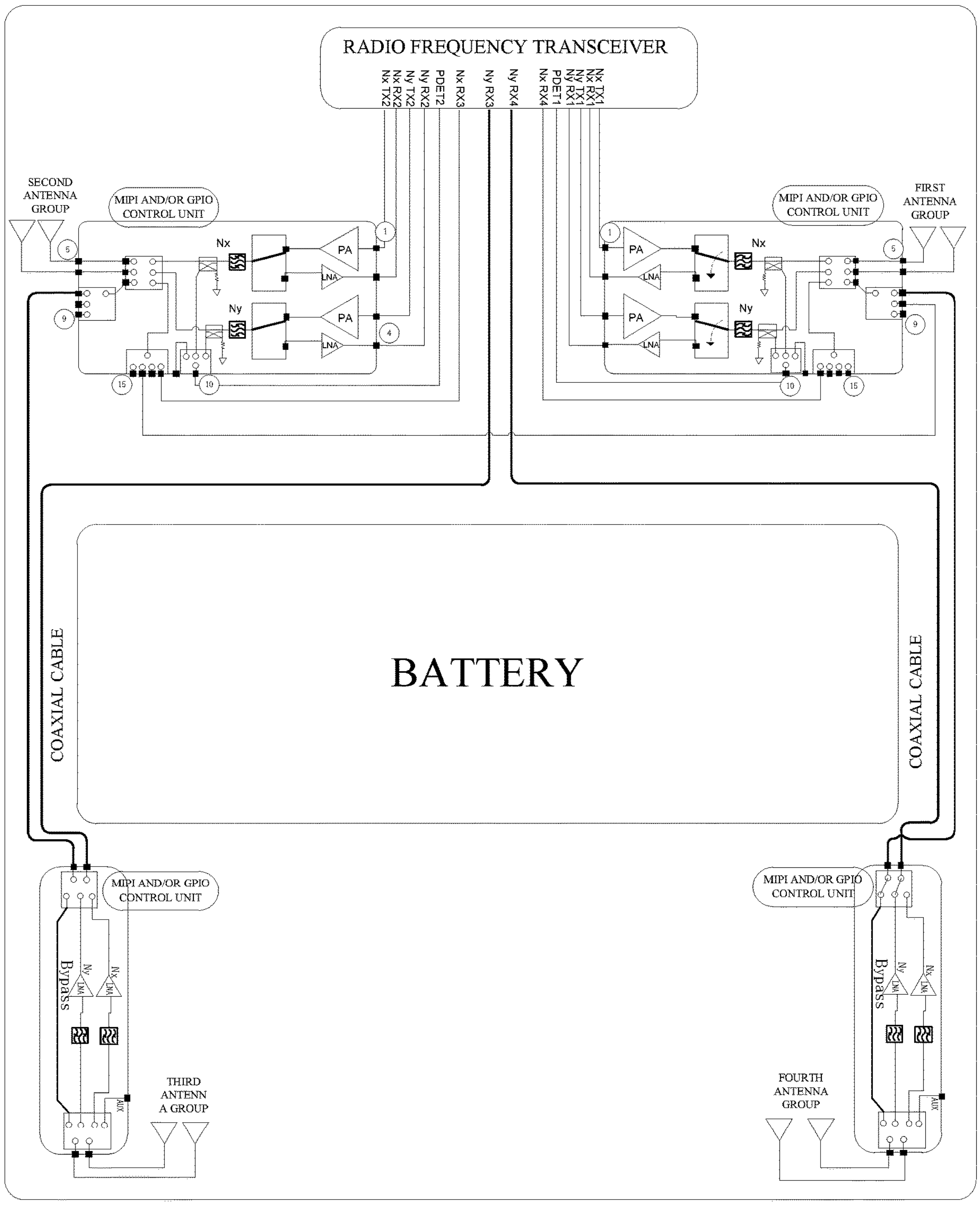
FIG. 3E is a schematic structural diagram illustrating a radio frequency system according to another implementation of the present disclosure.

As illustrated in FIG. 3E, in this example, the radio frequency architecture has the following function: ① supporting 5G NR dual-band; ② not supporting UL CA; ③ supporting DL CA; ④ supporting transmitting an SRS with four antennas in turn; ⑤ supporting NR 2T4R (two transmitting paths and four receiving paths in single-band).

The radio frequency architecture for 5G includes a radio frequency transceiver, two transmitting modules (a first transmitting module and a second transmitting module), two receiving modules (a first receiving module and a second receiving module), and four antenna groups (a first antenna group, a second antenna group, a third antenna group, and a fourth antenna group). Each antenna group includes two antennas. The radio frequency transceiver, the first transmitting module, and the second transmitting module are disposed on a main board (two modules above a battery in this figure). The first receiving module and the second receiving module are disposed on a sub board (two modules below the battery in this figure). Each receiving module is disposed adjacent to an antenna with which the receiving module is coupled.

The first transmitting module is disposed adjacent to the first antenna group. The second transmitting module is disposed adjacent to the second antenna group. The first receiving module is disposed adjacent to the third antenna group. The second receiving module is disposed adjacent to the fourth antenna group.

The internal devices and connection therebetween of the receiving module of FIG. 3E are similar to that of FIG. 1K. The disclosure will not be repeated herein. The structure and connection of internal devices of the transmitting module of FIG. 3E are similar to that of FIG. 2H. The disclosure will not be repeated herein. The first transmitting module has an eighth external port coupled with a fourteenth external port of the second transmitting module.

The radio frequency transceiver has a first transmitting port Nx TX1 in a first band coupled with a first external port of the first transmitting module. The radio frequency transceiver has a second transmitting port Nx TX2 in the first band coupled with a first external port of the second transmitting module. The radio frequency transceiver has a first transmitting port Ny TX1 in the second band coupled with a third external port of the first transmitting module. The radio frequency transceiver has a second transmitting port Ny TX2 in the second band coupled with a third external port of the second transmitting module. The radio frequency transceiver has a first receiving port Nx RX1 in the first band coupled with a second external port of the first transmitting module. The radio frequency transceiver has a first receiving port Ny RX1 in the second band coupled with a fourth external port of the first transmitting module. The radio frequency transceiver has a second receiving port Nx RX2 in the first band coupled with a second external port of the second transmitting module. The radio frequency transceiver has a second receiving port Ny RX2 in the second band coupled with a fourth external port of the second transmitting module. The radio frequency transceiver has a third receiving port Nx RX3 in the first band coupled with a twelfth external port of the second transmitting module. The radio frequency transceiver has a third receiving port Ny RX3 in the second band coupled with a P port of a second transfer switch of the first receiving module. The P port is coupled with a T port of a receiving path in an Ny band to implement a third signal receiving channel in the Ny band.

The radio frequency transceiver has a fourth receiving port Nx RX4 in the first band coupled with a twelfth external port of the first transmitting module. The radio frequency transceiver has a fourth receiving port Ny RX4 in the second band coupled with a P port of a second transfer switch of the second receiving module. The P port is switched to a signal receiving channel in the Ny band. The radio frequency transceiver has a first PDET1 port coupled with a tenth external port of the first transmitting module. The radio frequency transceiver has a second PDET2 port coupled with a tenth external port of the second transmitting module.

The first antenna group includes two antennas respectively coupled with a fifth external port and a sixth external port of the first transmitting module. The connection between the second antenna group and the second transmitting module is similar to that between the first antenna group and the first transmitting module.

The third antenna group includes two antennas respectively coupled with two P port of a first transfer switch of the first receiving module. The connection between the fourth antenna group and the second receiving module is similar to that between the third antenna group and the first receiving module.

An electronic device including the radio frequency architecture described above switches on a transmitting path between a transmitting port in a target band of the radio frequency transceiver and a target antenna group in the radio frequency system, to transmit a signal through an antenna in the target antenna group.

In an example, the electronic device including the foregoing radio frequency architecture performs, in single-band (for example, Nx band), an SRS four antenna rotation or autonomous transmission switching as follows.

In a first transmission period, the electronic device controls a first T port of a first channel selector-switch of the first transmitting module to be connected to a first P port of the first channel selector-switch, to transmit a signal, and controls the first T port of the first channel selector-switch of the first transmitting module to be connected to a third P port of the first channel selector-switch and a T port of a second channel selector-switch of the first transmitting module to be connected to a first P of the second channel selector-switch, to transmit a signal, to achieve signal transmission through antennas of antenna groups.

In a second transmission period, the electronic device controls a first T port of a first channel selector-switch of the second transmitting module to be connected to a first P port of the first channel selector-switch, to transmit a signal, and controls the first T port of the first channel selector-switch of the second transmitting module to be connected to a third P port of the first channel selector-switch and a T port of a second channel selector-switch of the second transmitting module to be connected to a first P of the second channel selector-switch, to transmit a signal, to achieve signal transmission through antennas of antenna groups.

In addition, the radio frequency architecture is compatible with 1T4R SRS switching, that is, has the ability to transmit from the first transmitting module to the four antenna groups. In the first transmission period and the second transmission period, a signal passes through the fifth external port and the seventh external port of the first transmitting module. In the third transmission period, a signal is transferred from the eighth external port of the first transmitting module to the fourteenth external port of the second transmitting module, and then from the fourteenth external port of the second transmitting module to the second antenna group via the first channel selector-switch of the second transmitting module. In the fourth transmission period, a signal is transferred from the eighth external port of the first transmitting module to the fourteenth external port of the second transmitting module, and then from the fourteenth external port of the second transmitting module to the first receiving module via the first channel selector-switch and second channel selector-switch of the second transmitting module.

Figure 3F:
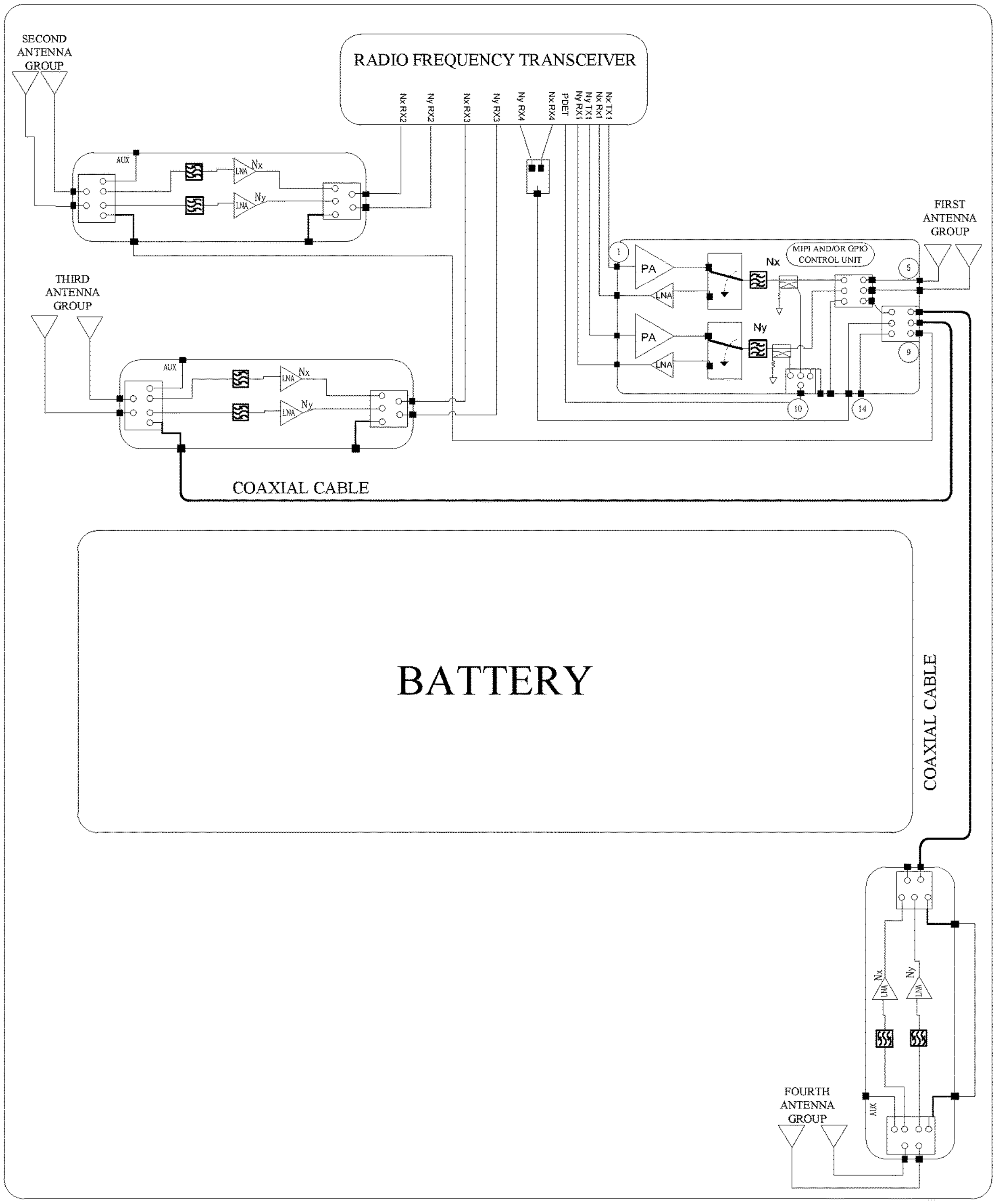
FIG. 3F is a schematic structural diagram illustrating a radio frequency system according to another implementation of the present disclosure.

As illustrated in FIG. 3F, in this example, the radio frequency architecture has the following function: ① supporting 5G NR dual-band; ② not supporting UL CA; ③ not supporting DL CA; ④ supporting SRS switching in four antennas; ⑤ supporting NR 1T4R (one transmitting path and four receiving paths).

The radio frequency architecture for 5G includes a radio frequency transceiver, one transmitting module, three receiving modules (a first receiving module, a second receiving module, and a third receiving module), one receiving port selector-switch (including an SPDT switch), and four antenna groups (a first antenna group, a second antenna group, a third antenna group, and a fourth antenna group). The radio frequency transceiver, the transmitting module, the first receiving module, the second receiving module, and the receiving port selector-switch are disposed on a main board (three modules above a battery in this figure). The third receiving module is disposed on a sub board (one module below the battery in this figure). Each receiving module is disposed adjacent to an antenna with which the receiving module is coupled.

The transmitting module is disposed adjacent to the first antenna group. The first receiving module is disposed adjacent to the second antenna group. The second receiving module is disposed adjacent to the third antenna group. The third receiving module is disposed adjacent to the fourth antenna group.

The structure and connection of internal devices of the transmitting module of FIG. 3F are similar to that of FIG. 2I. Each receiving module of FIG. 3F is the receiving module of FIG. 1L. The first receiving module has a first AUX (an AUX coupled with a first transfer switch of the first receiving module) coupled with a ninth external port of the transmitting module and the second receiving module has a first AUX (an AUX coupled with a first transfer switch of the second receiving module) coupled with an eighth external port of the transmitting module, to support transmitting an SRS TX signal through a corresponding antenna or self-switching among antennas for signal transmission. The third receiving module has a first AUX (an AUX coupled with a second transfer switch of the third receiving module) coupled with a second AUX (any other one AUX), to support transmitting an SRS TX signal.

The radio frequency transceiver has a transmitting port Nx TX1 in a first band coupled with a first external port of the transmitting module. The radio frequency transceiver has a transmitting port Ny TX1 in a second band coupled with a third external port of the transmitting module. The radio frequency transceiver has a first receiving port Nx RX1 in the first band coupled with a second external port of the transmitting module. The radio frequency transceiver has a second receiving port Nx RX2 in the first band coupled with a first P port of a second transfer switch of the first receiving module. The radio frequency transceiver has a third receiving port Nx RX3 in the first band coupled with a first P port of a second transfer switch of the second receiving module. The radio frequency transceiver has a first receiving port Ny RX1 in the second band coupled with a fourth external port of the transmitting module. The radio frequency transceiver has a second receiving port Ny RX2 in the second band coupled with a second P port of the second transfer switch of the first receiving module. The radio frequency transceiver has a third receiving port Ny RX3 in the second band coupled with a second P port of the second transfer switch of the second receiving module. The radio frequency transceiver has a fourth receiving port Nx RX4 in the first band and a fourth receiving port Ny RX4 in the second band coupled with two T port of the receiving port selector-switch. The receiving port selector-switch has a P port coupled with a thirteenth external port of the transmitting module. The radio frequency transceiver has a PDET port coupled with a tenth external port of the transmitting module.

The first antenna group includes two antennas respectively coupled with a fifth external port and a sixth external port of the first transmitting module. The second antenna group includes two antennas coupled with two P port of the first transfer switch of the first receiving module. The connection between the third antenna group and the second receiving module is similar to the above. The connection between the fourth antenna group and the third receiving module is similar to the above.

An electronic device including the radio frequency architecture described above switches on a transmitting path between a transmitting port in a target band of the radio frequency transceiver and a target antenna group in the radio frequency system, to transmit a signal through an antenna in the target antenna group.

In an example, the electronic device including the foregoing radio frequency architecture performs, in single-band (for example, Nx band), transmitting an SRS with four antennas in turn or autonomous transmission switching as follows.

In a first transmission period, the electronic device controls a first T port of a first channel selector-switch of the transmitting module to be connected to a first P port of the first channel selector-switch, to transmit a signal, to achieve signal transmission through an antenna of an antenna group.

In a second transmission period, the electronic device controls the first T port of the first channel selector-switch of the transmitting module to be connected to a third P port of the first channel selector-switch and controls a first T port of a second channel selector-switch to be connected to a third P of the second channel selector-switch, to transmit a signal through an antenna of an antenna group.

In a third transmission period, the electronic device controls the first T port of the first channel selector-switch of the transmitting module to be connected to the third P port of the first channel selector-switch and controls the first T port of the second channel selector-switch to be connected to a second P of the second channel selector-switch, to transmit a signal, to achieve signal transmission through an antenna of an antenna group.

In a fourth transmission period, the electronic device controls the first T port of the first channel selector-switch of the transmitting module to be connected to the third P port of the first channel selector-switch and controls the first T port of the second channel selector-switch to be connected to a first P of the second channel selector-switch, to transmit a signal, to achieve signal transmission through an antenna of an antenna group.

Figure 3G:
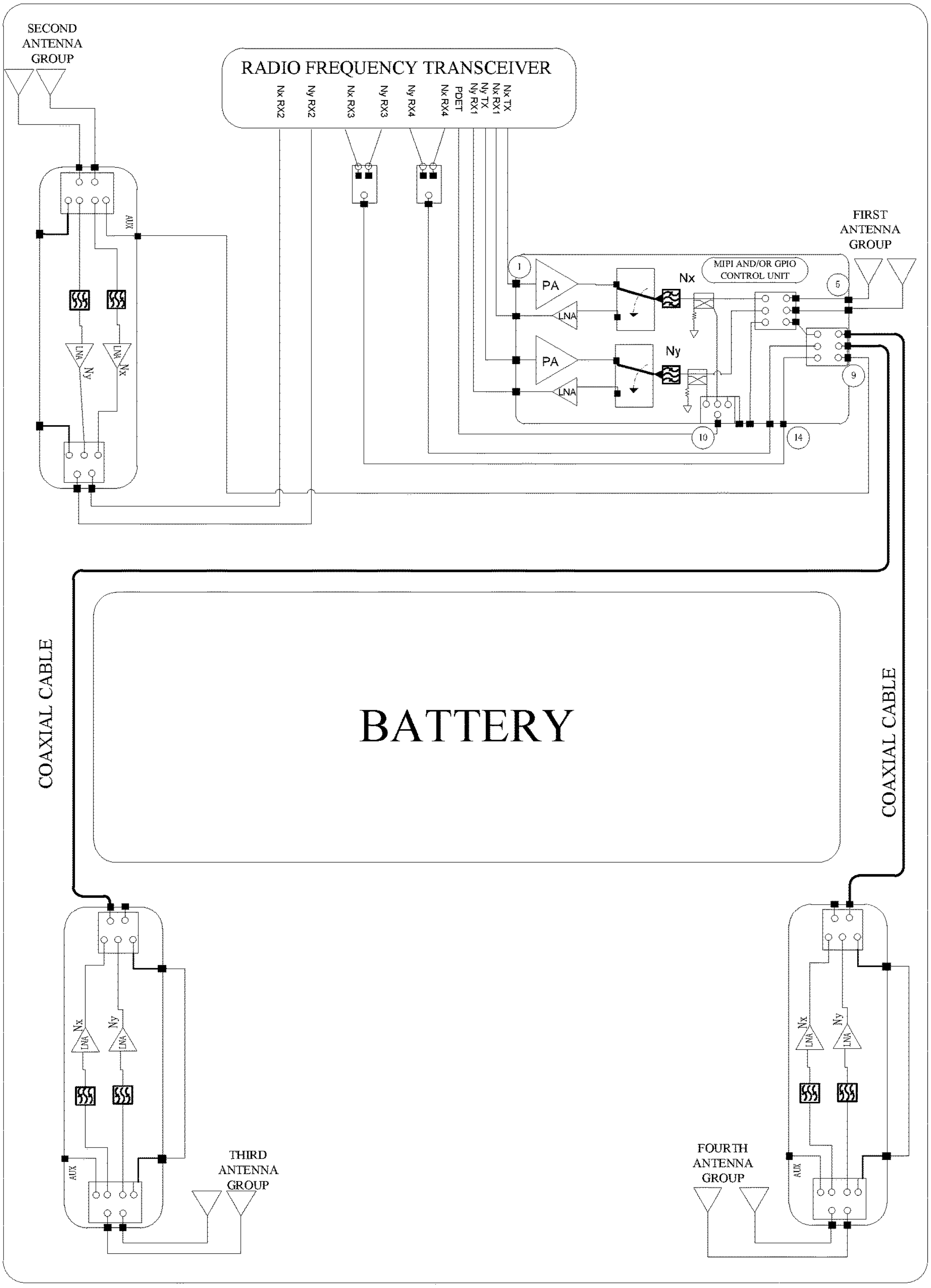
FIG. 3G is a schematic structural diagram illustrating a radio frequency system according to another implementation of the present disclosure.

As illustrated in FIG. 3G, in this example, the radio frequency architecture has the following function: ① supporting 5G NR dual-band; ② not supporting UL CA; ③ not supporting DL CA; ④ supporting SRS switching in four antennas; ⑤ supporting NR 1T4R (one transmitting path and four receiving paths).

The radio frequency architecture for 5G includes a radio frequency transceiver, one transmitting module, three receiving modules (a first receiving module, a second receiving module, and a third receiving module), two receiving port selector-switches (a first receiving port selector-switch and a second receiving port selector-switch, embodied as SPDT switches), and four antenna groups (a first antenna group, a second antenna group, a third antenna group, and a fourth antenna group). The radio frequency transceiver, the transmitting module, the first receiving module, and the two receiving port selector-switches are disposed on a main board (two modules above a battery in this figure). The second receiving module and the third receiving module are disposed on a sub board (two modules below the battery in this figure). Each receiving module is disposed adjacent to an antenna with which the receiving module is coupled.

The transmitting module is disposed adjacent to the first antenna group. The first receiving module is disposed adjacent to the second antenna group. The second receiving module is disposed adjacent to the third antenna group. The third receiving module is disposed adjacent to the fourth antenna group.

The structure and connection of internal devices of the transmitting module of FIG. 3G are similar to that of FIG. 2I. Each receiving module of FIG. 3G is the receiving module of FIG. 1L. The first receiving module has an AUX (an AUX coupled with a first transfer switch of the first receiving module) coupled with a ninth external port of the transmitting module, to support transmitting an SRS TX signal through a corresponding antenna or self-switching among antennas for signal transmission. The second receiving module has a first AUX (an AUX coupled with a second transfer switch of the second receiving module) coupled with a second AUX (any other one AUX) of the second receiving module, and the third receiving module has a first AUX (an AUX coupled with a second transfer switch of the third receiving module) coupled with a second AUX (any other one AUX) of the third receiving module, to support transmission of an SRS TX signal.

The radio frequency transceiver has a transmitting port Nx TX in a first band coupled with a first external port of the transmitting module. The radio frequency transceiver has a transmitting port Ny TX in a second band coupled with a third external port of the transmitting module. The radio frequency transceiver has a first receiving port Nx RX1 in the first band coupled with a second external port of the transmitting module. The radio frequency transceiver has a second receiving port Nx RX2 in the first band coupled with a first P port of a second transfer switch of the first receiving module. The radio frequency transceiver has a first receiving port Ny RX1 in the second band coupled with a fourth external port of the transmitting module. The radio frequency transceiver has a second receiving port Ny RX2 in the second band coupled with a second P port of the second transfer switch of the first receiving module. The radio frequency transceiver has a third receiving port Nx RX3 in the first band and a third receiving port Ny RX3 in the second band coupled with two T port of the first receiving port selector-switch. The first receiving port selector-switch has a P port coupled with a fourteenth external port of the transmitting module. The radio frequency transceiver has a fourth receiving port Nx RX4 in the first band and a fourth receiving port Ny RX4 in the second band coupled with two T port of the second receiving port selector-switch. The second receiving port selector-switch has a P port coupled with a thirteenth external port of the transmitting module. The radio frequency transceiver has a PDET port coupled with a tenth external port of the transmitting module.

The first antenna group includes two antennas respectively coupled with a fifth external port and a sixth external port of the transmitting module. The second antenna group includes two antennas coupled with two P port of the first transfer switch of the first receiving module. The connection between the third antenna group and the second receiving module is similar to the above. The connection between the fourth antenna group and the third receiving module is similar to the above.

An electronic device including the radio frequency architecture described above switches on a transmitting path between a transmitting port in a target band of the radio frequency transceiver and a target antenna group in the radio frequency system, to transmit a signal through an antenna in the target antenna group.

In an example, the electronic device including the foregoing radio frequency architecture performs, in single-band (for example, Nx band), transmitting an SRS with four antennas in turn or autonomous transmission switching as follows.

In a first transmission period, the electronic device controls a first T port of a first channel selector-switch of the transmitting module to be connected to a first P port of the first channel selector-switch, to achieve signal transmission through an antenna of an antenna group.

In a second transmission period, the electronic device controls the first T port of the first channel selector-switch of the transmitting module to be connected to a third P port of the first channel selector-switch and controls a first T port of a second channel selector-switch to be connected to a third P of the second channel selector-switch, to transmit a signal through an antenna of an antenna group.

In a third transmission period, the electronic device controls the first T port of the first channel selector-switch of the transmitting module to be connected to the third P port of the first channel selector-switch and controls the first T port of the second channel selector-switch to be connected to a second P of the second channel selector-switch, to achieve signal transmission through an antenna of an antenna group.

In a fourth transmission period, the electronic device controls the first T port of the first channel selector-switch of the transmitting module to be connected to the third P port of the first channel selector-switch and controls the first T port of the second channel selector-switch to be connected to a first P of the second channel selector-switch, to achieve signal transmission through an antenna of an antenna group.

Figure 3H:
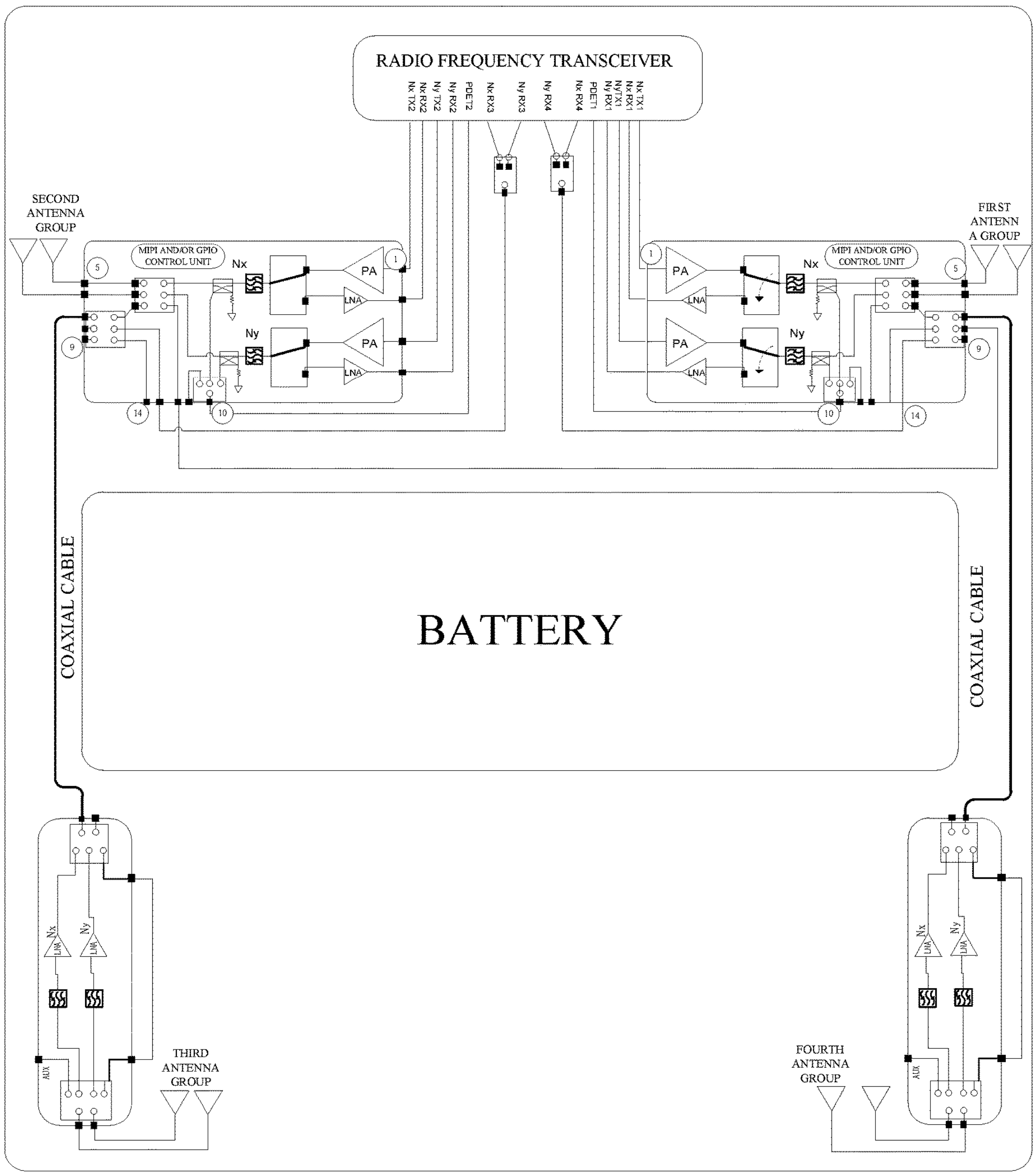
FIG. 3H is a schematic structural diagram illustrating a radio frequency system according to another implementation of the present disclosure.

As illustrated in FIG. 3H, in this example, the radio frequency architecture has the following function: ① supporting 5G NR dual-band; ② not supporting UL CA; ③ not supporting DL CA; ④ supporting SRS switching in four antennas; ⑤ supporting NR 2T4R (four transmitting paths and eight receiving paths in total).

The radio frequency architecture for 5G includes a radio frequency transceiver, two transmitting modules (a first transmitting module and a second transmitting module), two receiving modules (a first receiving module and a second receiving module), two receiving port selector-switches (a first receiving port selector-switch and a second receiving port selector-switch, embodied as SPDT switches), and four antenna groups (a first antenna group, a second antenna group, a third antenna group, and a fourth antenna group). The radio frequency transceiver, the first transmitting module, the second transmitting module, and the two receiving port selector-switches are disposed on a main board (two modules above a battery in this figure). The first receiving module and the second receiving module are disposed on a sub board (two modules below the battery in this figure). Each receiving module is disposed adjacent to an antenna with which the receiving module is coupled.

The first transmitting module is disposed adjacent to the first antenna group. The second transmitting module is disposed adjacent to the second antenna group. The first receiving module is disposed adjacent to the third antenna group. The second receiving module is disposed adjacent to the fourth antenna group.

The structure and connection of internal devices of the transmitting module of FIG. 3H are similar to that of FIG. 2I. Each receiving module of FIG. 3H is the receiving module of FIG. 1L. The first receiving module has a first AUX (an AUX coupled with a second transfer switch of the first receiving module) coupled with a second AUX (any other one AUX) of the first receiving module and the second receiving module has a first AUX (an AUX coupled with a second transfer switch of the second receiving module) coupled with a second AUX (any other one AUX) of the second receiving module, to support transmitting an SRS TX signal. The first transmitting module has an eighth external port coupled with a twelfth external of the second transmitting module.

The radio frequency transceiver has a first transmitting port Nx TX1 in a first band coupled with a first external port of the first transmitting module. The radio frequency transceiver has a first transmitting port Ny TX1 in a second band coupled with a third external port of the first transmitting module. The radio frequency transceiver has a second transmitting port Nx TX2 in the first band coupled with a first external port of the second transmitting module. The radio frequency transceiver has a second transmitting port Ny TX2 in the second band coupled with a third external port of the second transmitting module. The radio frequency transceiver has a first receiving port Nx RX1 in the first band coupled with a second external port of the first transmitting module. The radio frequency transceiver has a first receiving port Ny RX1 in the second band coupled with a fourth external port of the first transmitting module. The radio frequency transceiver has a second receiving port Nx RX2 in the first band coupled with a second external port of the second transmitting module. The radio frequency transceiver has a second receiving port Ny RX2 in the second band coupled with a fourth external port of the second transmitting module. The radio frequency transceiver has a third receiving port Nx RX3 in the first band and a third receiving port Ny RX3 in the second band coupled with two T port of the first receiving port selector-switch. The first receiving port selector-switch has a P port coupled with a fourteenth external port of the second transmitting module. The radio frequency transceiver has a fourth receiving port Nx RX4 in the first band and a fourth receiving port Ny RX4 in the second band coupled with two T port of the second receiving port selector-switch. The second receiving port selector-switch has a P port coupled with a fourteenth external port of the first transmitting module. The radio frequency transceiver has a first PDET1 port coupled with a tenth external port of the first transmitting module. The radio frequency transceiver has a second PDET2 port coupled with a tenth external port of the second transmitting module.

The first antenna group includes two antennas respectively coupled with a fifth external port and a sixth external port of the first transmitting module. The second antenna group includes two antennas respectively coupled with a fifth external port and a sixth external port of the second transmitting module. The third antenna group includes two antennas respectively coupled with two P port of a first transfer switch of the first receiving module. The fourth antenna group includes two antennas respectively coupled with two P port of a first transfer switch of the second receiving module.

An electronic device including the radio frequency architecture described above switches on a transmitting path between a transmitting port in a target band of the radio frequency transceiver and a target antenna group in the radio frequency system, to transmit a signal through an antenna in the target antenna group.

In an example, the electronic device including the foregoing radio frequency architecture performs, in single-band (for example, Nx band), transmitting an SRS with four antennas in turn or autonomous transmission switching as follows.

In a first transmission period, the electronic device controls a first T port of a first channel selector-switch of the first transmitting module to be connected to a first P port of the first channel selector-switch, to transmit a signal, and controls the first T port of the first channel selector-switch of the first transmitting module to be connected to a third P port of the first channel selector-switch and a first T port of a second channel selector-switch of the first transmitting module to be connected to a first P of the second channel selector-switch, to transmit a signal, to achieve signal transmission through antennas of antenna groups.

In a second transmission period, the electronic device controls a first T port of a first channel selector-switch of the second transmitting module to be connected to a first P port of the first channel selector-switch, to transmit a signal, and controls the first T port of the first channel selector-switch of the second transmitting module to be connected to a third P port of the first channel selector-switch and a first T port of a second channel selector-switch of the second transmitting module to be connected to a first P of the second channel selector-switch, to transmit a signal, to achieve signal transmission through antennas of antenna groups.

In addition, the radio frequency architecture is compatible with 1T4R SRS switching, that is, has the ability to transmit from the first transmitting module to the four antenna groups. In the first transmission period and the second transmission period, a signal passes through the fifth external port and the seventh external port of the first transmitting module. In the third transmission period, a signal is transferred from the eighth external port of the first transmitting module to the twelfth external port of the second transmitting module, and then from the twelfth external port of the second transmitting module to the second antenna group via the first channel selector-switch of the second transmitting module. In the fourth transmission period, a signal is transferred from the eighth external port of the first transmitting module to the twelfth external port of the second transmitting module, and then from the twelfth external port of the second transmitting module to the first receiving module via the first channel selector-switch and the first channel selector-switch and the second channel selector-switch of the second transmitting module.

Figure 3I:
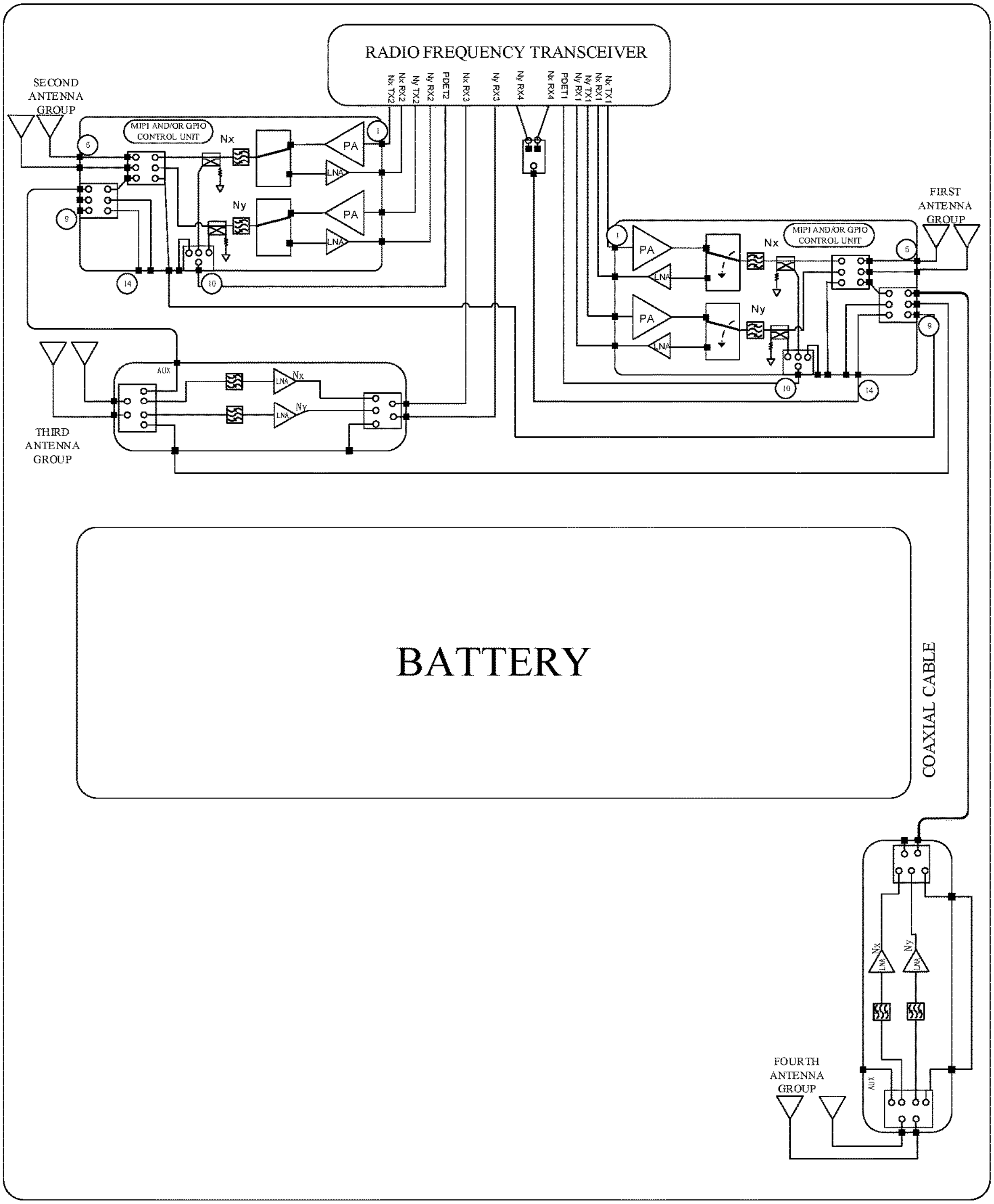
FIG. 3I is a schematic structural diagram illustrating a radio frequency system according to another implementation of the present disclosure.

As illustrated in FIG. 3I, in this example, the radio frequency architecture has the following function: ① supporting 5G NR dual-band; ② not supporting UL CA; ③ not supporting DL CA; ④ supporting SRS switching in four antennas; ⑤ supporting NR 2T4R (four transmitting paths and eight receiving paths in total).

The radio frequency architecture for 5G includes a radio frequency transceiver, two transmitting modules (a first transmitting module and a second transmitting module), two receiving modules (a first receiving module and a second receiving module), one receiving port selector-switch (including an SPDT switch), and four antenna groups (a first antenna group, a second antenna group, a third antenna group, and a fourth antenna group). The radio frequency transceiver, the first transmitting module, the second transmitting module, the first receiving module, and the receiving port selector-switch are disposed on a main board (three modules above a battery in this figure). The second receiving module is disposed on a sub board (one module below the battery in this figure). Each receiving module is disposed adjacent to an antenna with which the receiving module is coupled.

The first transmitting module is disposed adjacent to the first antenna group. The second transmitting module is disposed adjacent to the second antenna group. The first receiving module is disposed adjacent to the third antenna group. The second receiving module is disposed adjacent to the fourth antenna group.

The structure and connection of internal devices of the transmitting module of FIG. 3I are similar to that of FIG. 2I. Each receiving module of FIG. 3I is the receiving module of FIG. 1L. The first receiving module has a first AUX (an AUX coupled with a first transfer switch of the first receiving module) coupled with a seventh external port of the second transmitting module, to support transmitting an SRS TX signal through a corresponding antenna. The first receiving module has a second AUX (the other AUX coupled with the first transfer switch of the first receiving module) coupled with an eight external port of the first transmitting module, to support transmitting an SRS TX signal through a corresponding antenna or self-switching among antennas for signal transmission. The second receiving module has a first AUX (an AUX coupled with a second transfer switch of the second receiving module) coupled with a second AUX (any AUX coupled with a first transfer switch of the second receiving module) of the second receiving module, to support transmitting an SRS TX signal. The first transmitting module has a ninth external port coupled with a twelfth external of the second transmitting module.

The radio frequency transceiver has a first transmitting port Nx TX1 in a first band coupled with a first external port of the first transmitting module. The radio frequency transceiver has a first transmitting port Ny TX1 in a second band coupled with a third external port of the first transmitting module. The radio frequency transceiver has a second transmitting port Nx TX2 in the first band coupled with a first external port of the second transmitting module. The radio frequency transceiver has a second transmitting port Ny TX2 in the second band coupled with a third external port of the second transmitting module. The radio frequency transceiver has a first receiving port Nx RX1 in the first band coupled with a second external port of the first transmitting module. The radio frequency transceiver has a first receiving port Ny RX1 in the second band coupled with a fourth external port of the first transmitting module. The radio frequency transceiver has a second receiving port Nx RX2 in the first band coupled with a second external port of the second transmitting module. The radio frequency transceiver has a second receiving port Ny RX2 in the second band coupled with a fourth external port of the second transmitting module. The radio frequency transceiver has a third receiving port Nx RX3 in the first band coupled with a first P port of a second transfer switch of the first receiving module. The radio frequency transceiver has a third receiving port Ny RX3 in the second band coupled with a second P port of the second transfer switch of the first receiving module. The radio frequency transceiver has a fourth receiving port Nx RX4 in the first band and a fourth receiving port Ny RX4 in the second band coupled with two T port of the receiving port selector-switch. The receiving port selector-switch has a P port coupled with a fourteenth external port of the first transmitting module. The radio frequency transceiver has a first PDET1 port coupled with a tenth external port of the first transmitting module. The radio frequency transceiver has a second PDET2 port coupled with a tenth external port of the second transmitting module.

The first antenna group includes two antennas respectively coupled with a fifth external port and a sixth external port of the first transmitting module. The second antenna group includes two antennas respectively coupled with a fifth external port and a sixth external port of the second transmitting module. The third antenna group includes two antennas respectively coupled with two P port of the first transfer switch of the first receiving module. The fourth antenna group includes two antennas respectively coupled with two P port of the first transfer switch of the second receiving module.

An electronic device including the radio frequency architecture described above switches on a transmitting path between a transmitting port in a target band of the radio frequency transceiver and a target antenna group in the radio frequency system, to transmit a signal through an antenna in the target antenna group.

In an example, the electronic device including the foregoing radio frequency architecture performs, in single-band (for example, Nx band), transmitting an SRS with four antennas in turn or autonomous transmission switching as follows.

In a first transmission period, the electronic device controls a first T port of a first channel selector-switch of the first transmitting module to be connected to a first P port of the first channel selector-switch, to transmit a signal, and controls the first T port of the first channel selector-switch of the first transmitting module to be connected to a third P port of the first channel selector-switch and a first T port of a second channel selector-switch of the first transmitting module to be connected to a first P of the second channel selector-switch, to transmit a signal, to achieve signal transmission through antennas of antenna groups.

In a second transmission period, the electronic device controls a first T port of a first channel selector-switch of the second transmitting module to be connected to a first P port of the first channel selector-switch, to transmit a signal, and controls the first T port of the first channel selector-switch of the second transmitting module to be connected to a third P port of the first channel selector-switch and a first T port of a second channel selector-switch of the second transmitting module to be connected to a first P of the second channel selector-switch, to transmit a signal, to achieve signal transmission through antennas of antenna groups.

In addition, the radio frequency architecture is compatible with 1T4R SRS switching, that is, has the ability to transmit from the first transmitting module to the four antenna groups. In the first transmission period and the second transmission period, a signal passes through the fifth external port and the seventh external port of the first transmitting module. In the third transmission period, a signal is transferred from the ninth external port of the first transmitting module is coupled with the twelfth external port of the second transmitting module, and then from the twelfth external port of the second transmitting module to the second antenna group via the first channel selector-switch of the second transmitting module. In the fourth transmission period, a signal is transferred from the eighth external port of the first transmitting module to the second AUX of the first receiving module.

Figure 3J:
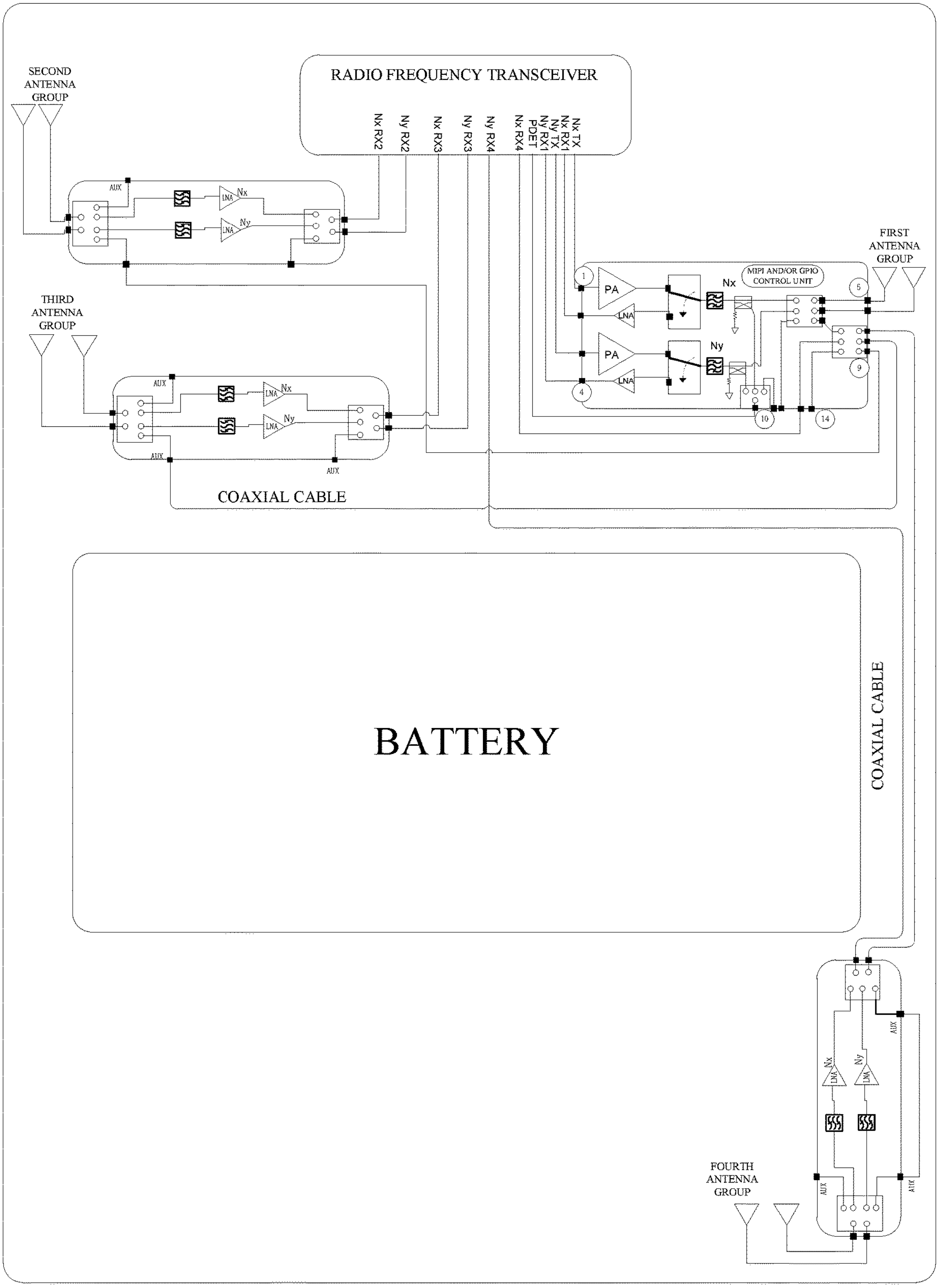
FIG. 3J is a schematic structural diagram illustrating a radio frequency system according to another implementation of the present disclosure.

As illustrated in FIG. 3J, in this example, the radio frequency architecture has the following function: ① supporting 5G NR dual-band; ② not supporting UL CA; ③ supporting DL CA; ④ supporting transmitting an SRS with four antennas in turn; ⑤ supporting NR 1T4R (one transmitting path and four receiving paths in single-band).

The radio frequency architecture for 5G includes a radio frequency transceiver, one transmitting module, three receiving modules (a first receiving module, a second receiving module, and a third receiving module), and four antenna groups (a first antenna group, a second antenna group, a third antenna group, and a fourth antenna group). Each antenna group includes two antennas. The radio frequency transceiver, the transmitting module, the first receiving module, and the second receiving module are disposed on a main board. The third receiving module is disposed on a sub board. The transmitting module is disposed adjacent to an antenna with which the transmitting module is coupled. Each receiving module is disposed adjacent to an antenna with which the receiving module is coupled.

The transmitting module is disposed adjacent to the first antenna group. The first receiving module is disposed adjacent to the second antenna group. The second receiving module is disposed adjacent to the third antenna group. The third receiving module is disposed adjacent to the fourth antenna group.

The structure and connection of internal devices of the transmitting module of FIG. 3J are similar to that of FIG. 2I. The internal devices and connection therebetween of each receiving module of FIG. 3J are similar FIG. 1L. The first receiving module has an AUX coupled with a ninth external port of the transmitting module, to support transmitting an SRS TX signal through a corresponding antenna or self-switching among antennas for signal transmission. The second receiving module has an AUX coupled with an eighth external port of the transmitting module, to support transmitting an SRS TX signal through a corresponding antenna or self-switching among antennas for signal transmission. The third receiving module has an AUX (an AUX coupled with a second transfer switch of the third receiving module) coupled with any other one AUX, to support transmitting an SRS TX signal.

The radio frequency transceiver has a transmitting port Nx TX in a first band coupled with a first external port of the transmitting module. The radio frequency transceiver has a transmitting port Ny TX in a second band coupled with a third external port of the transmitting module. The radio frequency transceiver has a first receiving port Nx RX1 in the first band coupled with a second external port of the transmitting module. The radio frequency transceiver has a first receiving port Ny RX1 in the second band coupled with a fourth external port of the transmitting module. The radio frequency transceiver has a second receiving port Nx RX2 in the first band coupled with a first P port of a second transfer switch of the first receiving module. The radio frequency transceiver has a second receiving port Ny RX2 in the second band coupled with a second P port of the second transfer switch of the first receiving module. The radio frequency transceiver has a third receiving port Nx RX3 in the first band coupled with a first P port of a second transfer switch of the second receiving module. The radio frequency transceiver has a third receiving port Ny RX3 in the second band coupled with a second P port of the second transfer switch of the second receiving module. The radio frequency transceiver has a fourth receiving port Nx RX4 in the first band coupled with a thirteenth external port of the transmitting module. The radio frequency transceiver has a fourth receiving port Ny RX4 in the second band coupled with a first P port of the second transfer switch of the third receiving module. The radio frequency transceiver has a PDET port coupled with a tenth external port of the transmitting module.

The first antenna group includes two antennas respectively coupled with a fifth external port and a sixth external port of the transmitting module. The second antenna group includes two antennas respectively coupled with two P port of a first transfer switch of the first receiving module. The third antenna group includes two antennas respectively coupled with two P port of a first transfer switch of the second receiving module. The fourth antenna group includes two antennas respectively coupled with two P port of a first transfer switch of the third receiving module.

An electronic device including the radio frequency architecture described above switches on a transmitting path between a transmitting port in a target band of the radio frequency transceiver and a target antenna group in the radio frequency system, to transmit a signal through an antenna in the target antenna group.

In an example, the electronic device including the foregoing radio frequency architecture performs, in single-band (for example, Nx band), transmitting an SRS with four antennas in turn or autonomous transmission switching as follows.

In a first transmission period, the electronic device controls a first T port of a first channel selector-switch of the transmitting module to be connected to a first P port of the first channel selector-switch, to transmit a signal, to achieve signal transmission through an antenna of an antenna group.

In a second transmission period, the electronic device controls the first T port of the first channel selector-switch of the transmitting module to be connected to a third P port of the first channel selector-switch and controls a first T port of a second channel selector-switch of the transmitting module to be connected to a third P of the second channel selector-switch, to transmit a signal, to transmit a signal through an antenna of an antenna group.

In a third transmission period, the electronic device controls the first T port of the first channel selector-switch of the transmitting module to be connected to the third P port of the first channel selector-switch and controls the first T port of the second channel selector-switch of the transmitting module to be connected to a second P of the second channel selector-switch, to transmit a signal, to achieve signal transmission through an antenna of an antenna group.

In a fourth transmission period, the electronic device controls the first T port of the first channel selector-switch of the transmitting module to be connected to the third P port of the first channel selector-switch and controls the first T port of the second channel selector-switch of the transmitting module to be connected to a first P of the second channel selector-switch, to transmit a signal, to achieve signal transmission through an antenna of an antenna group.

Figure 3K:
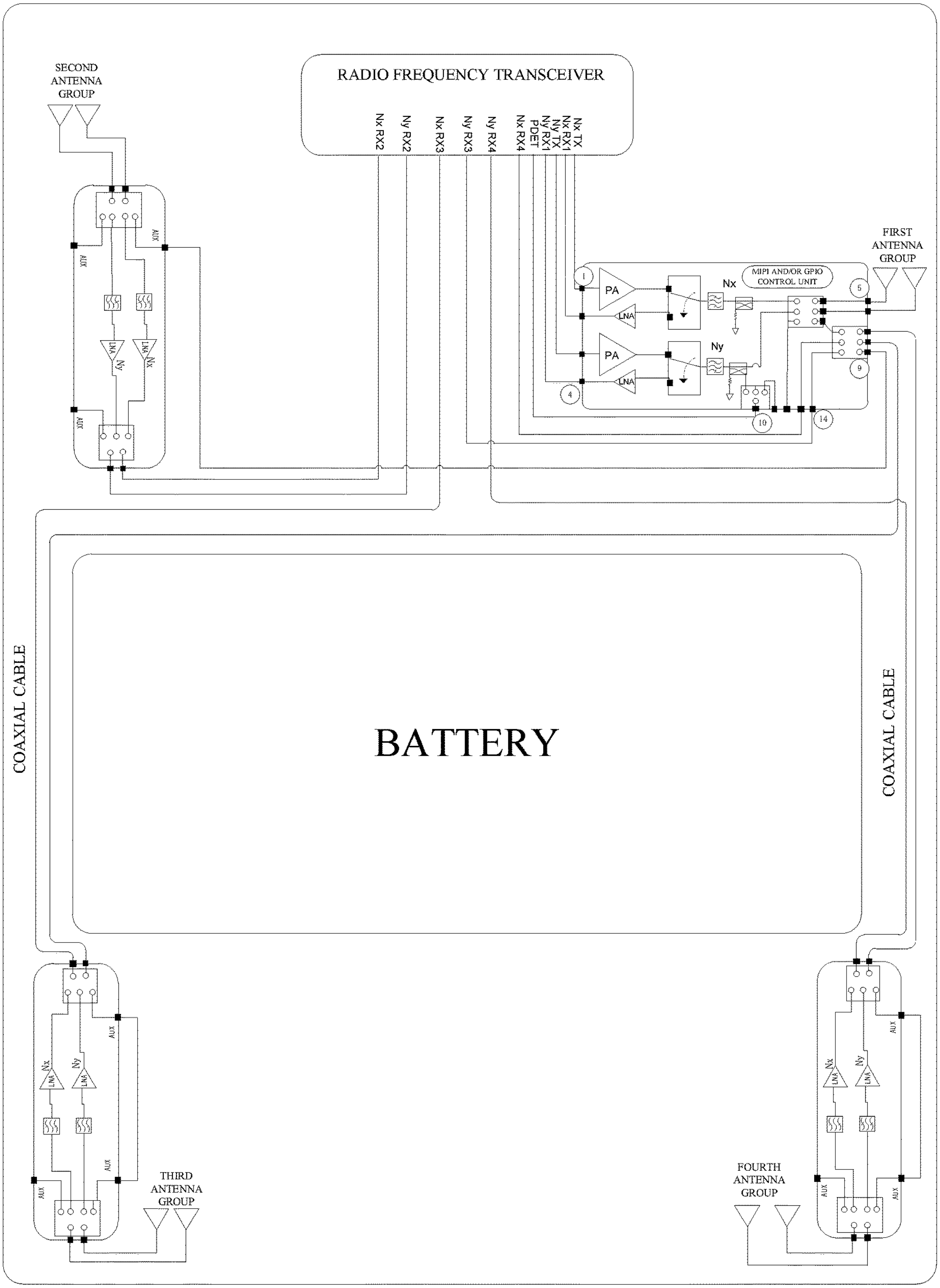
FIG. 3K is a schematic structural diagram illustrating a radio frequency system according to another implementation of the present disclosure.

As illustrated in FIG. 3K, in this example, the radio frequency architecture has the following function: ① supporting 5G NR dual-band; ② not supporting UL CA; ③ supporting DL CA; ④ supporting transmitting an SRS with four antennas in turn; ⑤ supporting NR 1T4R (one transmitting path and four receiving paths in single-band).

The radio frequency architecture for 5G includes a radio frequency transceiver, one transmitting module, three receiving modules (a first receiving module, a second receiving module, and a third receiving module), and four antenna groups (a first antenna group, a second antenna group, a third antenna group, and a fourth antenna group). Each antenna group includes two antennas. The radio frequency transceiver, the transmitting module, and the first receiving module are disposed on a main board. The second receiving module and the third receiving module are disposed on a sub board. The transmitting module is disposed adjacent to an antenna with which the transmitting module is coupled. Each receiving module is disposed adjacent to an antenna with which the receiving module is coupled.

The transmitting module is disposed adjacent to the first antenna group. The first receiving module is disposed adjacent to the second antenna group. The second receiving module is disposed adjacent to the third antenna group. The third receiving module is disposed adjacent to the fourth antenna group.

The structure and connection of internal devices of the transmitting module are similar to that of the transmitting module in FIG. 2I. The internal devices and connection therebetween of each receiving module are similar to that of the receiving module in FIG. 1L. The first receiving module has an AUX coupled with a ninth external port of the transmitting module, to support transmitting an SRS TX signal through a corresponding antenna or self-switching among antennas for signal transmission. The second receiving module has an AUX (an AUX coupled with a second transfer switch of the second receiving module) coupled with any other one AUX of the second receiving module, to support transmitting an SRS TX signal. The third receiving module has an AUX (an AUX coupled with a second transfer switch of the third receiving module) coupled with any other one AUX of the third receiving module, to support transmitting an SRS TX signal.

The radio frequency transceiver has a transmitting port Nx TX in a first band coupled with a first external port of the transmitting module. The radio frequency transceiver has a transmitting port Ny TX in a second band coupled with a third external port of the transmitting module. The radio frequency transceiver has a first receiving port Nx RX1 in the first band coupled with a second external port of the transmitting module. The radio frequency transceiver has a first receiving port Ny RX1 in the second band coupled with a fourth external port of the transmitting module. The radio frequency transceiver has a second receiving port Nx RX2 in the first band coupled with a first P port of a second transfer switch of the first receiving module. The radio frequency transceiver has a second receiving port Ny RX2 in the second band coupled with a second P port of the second transfer switch of the first receiving module. The radio frequency transceiver has a third receiving port Nx RX3 in the first band coupled with a first P port of the second transfer switch of the second receiving module. The radio frequency transceiver has a third receiving port Ny RX3 in the second band coupled with a fourteenth external port of the transmitting module. The radio frequency transceiver has a fourth receiving port Nx RX4 in the first band coupled with a thirteenth external port of the transmitting module. The radio frequency transceiver has a fourth receiving port Ny RX4 in the second band coupled with a first P port of the second transfer switch of the third receiving module. The radio frequency transceiver has a PDET port coupled with a tenth external port of the transmitting module.

The first antenna group includes two antennas respectively coupled with a fifth external port and a sixth external port of the transmitting module. The second antenna group includes two antennas respectively coupled with two P port of a first transfer switch of the first receiving module. The third antenna group includes two antennas respectively coupled with two P port of a first transfer switch of the second receiving module. The fourth antenna group includes two antennas respectively coupled with two P port of a first transfer switch of the third receiving module.

An electronic device including the radio frequency architecture described above switches on a transmitting path between a transmitting port in a target band of the radio frequency transceiver and a target antenna group in the radio frequency system, to transmit a signal through an antenna in the target antenna group.

In an example, the electronic device including the foregoing radio frequency architecture performs, in single-band (for example, Nx band), transmitting an SRS with four antennas in turn or autonomous transmission switching as follows.

In a first transmission period, the electronic device controls a first T port of a first channel selector-switch of the transmitting module to be connected to a first P port of the first channel selector-switch, to transmit a signal, to achieve signal transmission through an antenna of an antenna group.

In a second transmission period, the electronic device controls the first T port of the first channel selector-switch of the transmitting module to be connected to a third P port of the first channel selector-switch and controls a first T port of a second channel selector-switch to be connected to a third P of the second channel selector-switch, to transmit a signal, to transmit a signal through an antenna of an antenna group.

In a third transmission period, the electronic device controls the first T port of the first channel selector-switch of the transmitting module to be connected to the third P port of the first channel selector-switch and controls the first T port of the second channel selector-switch to be connected to a second P of the second channel selector-switch, to transmit a signal, to achieve signal transmission through an antenna of an antenna group.

In a fourth transmission period, the electronic device controls the first T port of the first channel selector-switch of the transmitting module to be connected to the third P port of the first channel selector-switch and controls the first T port of the second channel selector-switch to be connected to a first P of the second channel selector-switch, to transmit a signal, to achieve signal transmission through an antenna of an antenna group.

Figure 3L:
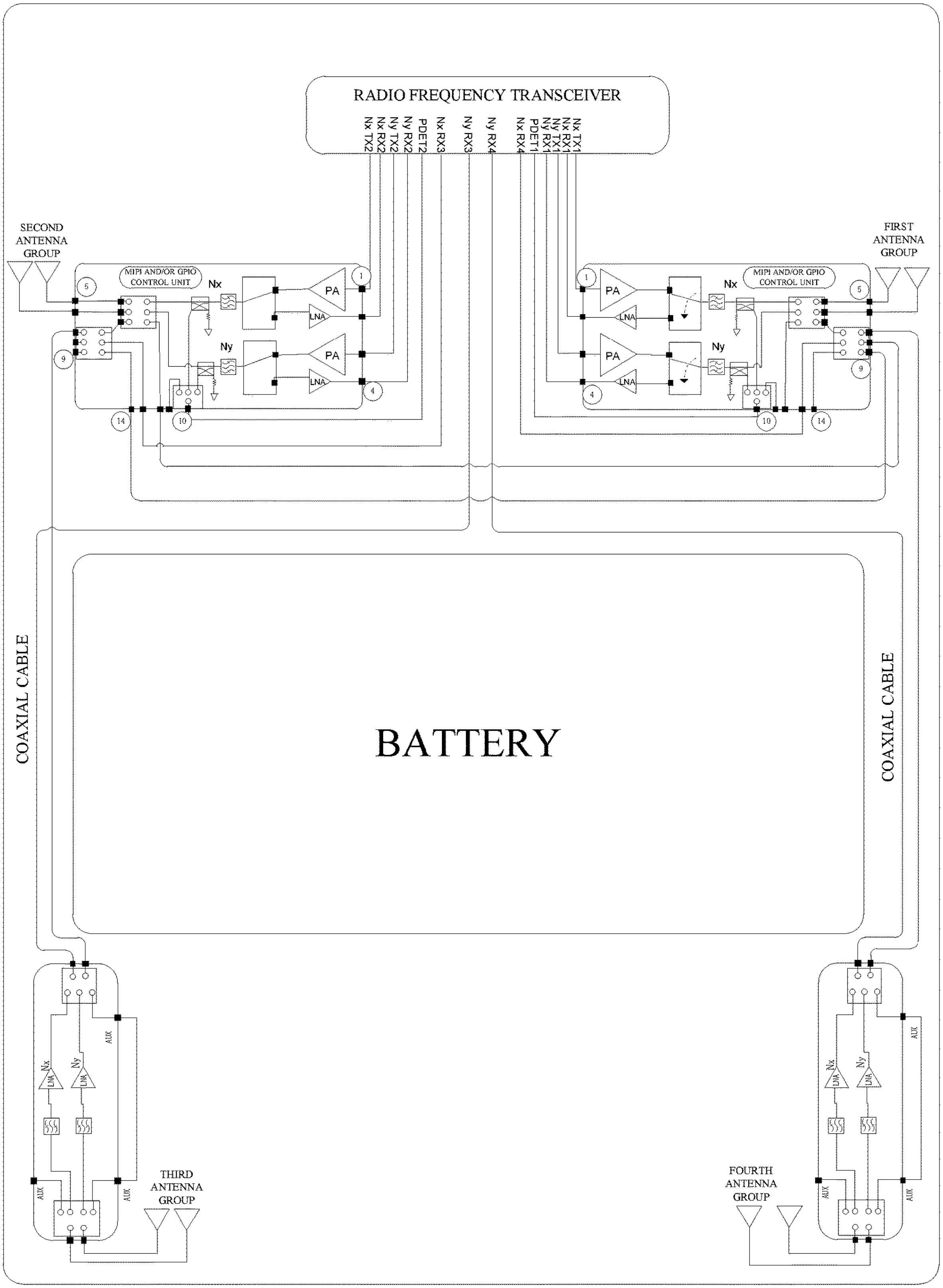
FIG. 3L is a schematic structural diagram illustrating a radio frequency system according to another implementation of the present disclosure.

As illustrated in FIG. 3L, in this example, the radio frequency architecture has the following function: ① supporting 5G NR dual-band; ② not supporting UL CA; ③ supporting DL CA; ④ supporting SRS switching in four antennas; ⑤ supporting NR 2T4R (four transmitting paths and eight receiving paths in total and compatible with NR 1T4R).

The radio frequency architecture for 5G includes a radio frequency transceiver, two transmitting modules (a first transmitting module and a second transmitting module), two receiving modules (a first receiving module and a second receiving module), and four antenna groups (a first antenna group, a second antenna group, a third antenna group, and a fourth antenna group). The radio frequency transceiver, the first transmitting module, and the second transmitting module are disposed on a main board. The first receiving module and the second receiving module are disposed on a sub board. Each transmitting module is disposed adjacent to an antenna with which the transmitting module is coupled. Each receiving module is disposed adjacent to an antenna with which the receiving module is coupled.

The first transmitting module is disposed adjacent to the first antenna group. The second transmitting module is disposed adjacent to the second antenna group. The first receiving module is disposed adjacent to the third antenna group. The second receiving module is disposed adjacent to the fourth antenna group.

The structure and connection of internal devices of the transmitting module are similar to that of the transmitting module in FIG. 2I. Each receiving module is the receiving module of FIG. 1L. The first receiving module has an AUX (an AUX coupled with a second transfer switch of the first receiving module) coupled with any other one AUX of the first receiving module, to support transmitting an SRS TX signal. The second receiving module has an AUX (an AUX coupled with a second transfer switch of the second receiving module) coupled with any other one AUX of the second receiving module, to support transmitting an SRS TX signal.

The radio frequency transceiver has a first transmitting port Nx TX1 in a first band coupled with a first external port of the first transmitting module. The radio frequency transceiver has a first transmitting port Ny TX1 in a second band coupled with a third external port of the first transmitting module. The radio frequency transceiver has a second transmitting port Nx TX2 in the first band coupled with a first external port of the second transmitting module. The radio frequency transceiver has a second transmitting port Ny TX2 in the second band coupled with a third external port of the second transmitting module. The radio frequency transceiver has a first receiving port Nx RX1 in the first band coupled with a second external port of the first transmitting module. The radio frequency transceiver has a first receiving port Ny RX1 in the second band coupled with a fourth external port of the first transmitting module. The radio frequency transceiver has a second receiving port Nx RX2 in the first band coupled with a second external port of the second transmitting module. The radio frequency transceiver has a second receiving port Ny RX2 in the second band coupled with a fourth external port of the second transmitting module. The radio frequency transceiver has a third receiving port Nx RX3 in the first band coupled with a thirteenth external port of the second transmitting module. The radio frequency transceiver has a third receiving port Ny RX3 in the second band coupled with a first P port of the second transfer switch of the first receiving module. The radio frequency transceiver has a fourth receiving port Nx RX4 in the first band coupled with coupled with a thirteenth external port of the first transmitting module. The radio frequency transceiver has a fourth receiving port Ny RX4 in the second band coupled with a first P port of the second transfer switch of the second receiving module. The radio frequency transceiver has a first PDET1 port coupled with a tenth external port of the first transmitting module. The radio frequency transceiver has a second PDET2 port coupled with a tenth external port of the second transmitting module.

The first antenna group includes two antennas respectively coupled with a fifth external port and a sixth external port of the first transmitting module. The second antenna group includes two antennas respectively coupled with a fifth external port and a sixth external port of the second transmitting module. The third antenna group includes two antennas respectively coupled with two P port of a first transfer switch of the first receiving module. The fourth antenna group includes two antennas respectively coupled with two P port of a first transfer switch of the second receiving module.

An electronic device including the radio frequency architecture described above switches on a transmitting path between a transmitting port in a target band of the radio frequency transceiver and a target antenna group in the radio frequency system, to transmit a signal through an antenna in the target antenna group.

In an example, the electronic device including the foregoing radio frequency architecture performs, in single-band (for example, Nx band), transmitting an SRS with four antennas in turn or autonomous transmission switching as follows.

In a first transmission period, the electronic device controls a first T port of a first channel selector-switch of the first transmitting module to be connected to a first P port of the first channel selector-switch, to transmit a signal, and controls the first T port of the first channel selector-switch of the first transmitting module to be connected to a third P port of the first channel selector-switch and a first T port of a second channel selector-switch of the first transmitting module to be connected to a first P of the second channel selector-switch, to transmit a signal, to achieve signal transmission through antennas of antenna groups.

In a second transmission period, the electronic device controls a first T port of a first channel selector-switch of the second transmitting module to be connected to a first P port of the first channel selector-switch, to transmit a signal, and controls the first T port of the first channel selector-switch of the second transmitting module to be connected to a third P port of the first channel selector-switch and a first T port of a second channel selector-switch of the second transmitting module to be connected to a first P of the second channel selector-switch, to transmit a signal, to achieve signal transmission through antenna of antenna groups.

In addition, the radio frequency architecture is compatible with 1T4R SRS switching, that is, has the ability to transmit from the first transmitting module to the four antenna groups. In the first transmission period and the second transmission period, a signal passes through the fifth external port and the seventh external port of the first transmitting module. In the third transmission period, a signal is transferred from the eighth external port of the first transmitting module to a twelfth external port of the second transmitting module, and then from the twelfth external port of the second transmitting module to the second antenna group via the first channel selector-switch of the second transmitting module. In the fourth transmission period, a signal is transferred from the ninth external port of the first transmitting module to a fourteenth external port of the second transmitting module, and then from the fourteenth external port of the second transmitting module to the first receiving module via the second channel selector-switch of the second transmitting module.

Figure 3M:
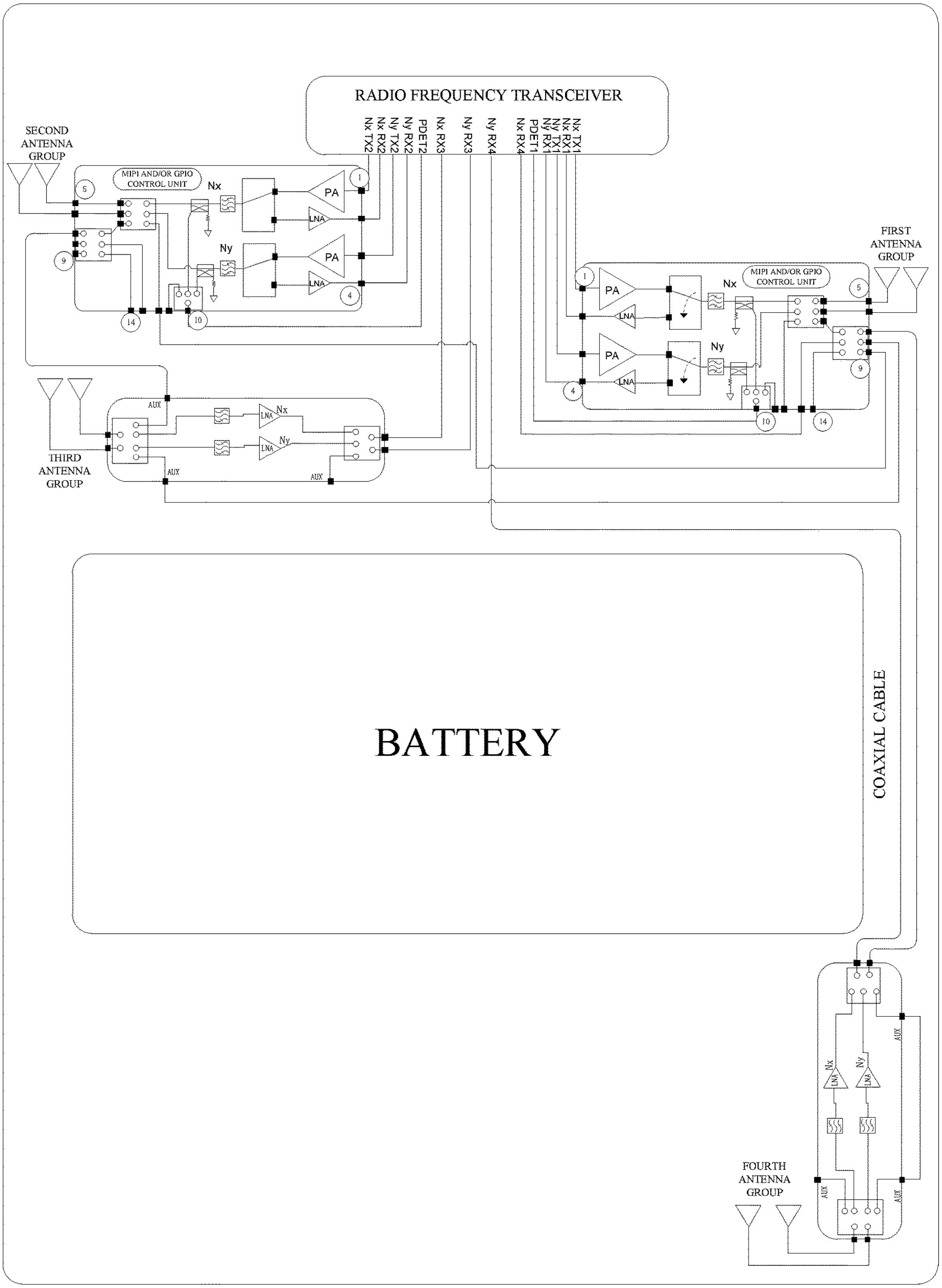
FIG. 3M is a schematic structural diagram illustrating a radio frequency system according to another implementation of the present disclosure.

As illustrated in FIG. 3M, in this example, the radio frequency architecture has the following function: ① supporting 5G NR dual-band; ② not supporting UL CA; ③ supporting DL CA; ④ supporting SRS switching in four antennas; ⑤ supporting NR 2T4R (four transmitting paths and eight receiving paths in total and compatible with NR 1T4R).

The radio frequency architecture for 5G includes a radio frequency transceiver, two transmitting modules (a first transmitting module and a second transmitting module), two receiving modules (a first receiving module and a second receiving module), and four antenna groups (a first antenna group, a second antenna group, a third antenna group, and a fourth antenna group). The radio frequency transceiver, the first transmitting module, the second transmitting module, and a first receiving module are disposed on a main board. The second receiving module is disposed on a sub board. Each transmitting module is disposed adjacent to an antenna with which the transmitting module is coupled. Each receiving module is disposed adjacent to an antenna with which the receiving module is coupled.

The first transmitting module is disposed adjacent to the first antenna group. The second transmitting module is disposed adjacent to the second antenna group. The first receiving module is disposed adjacent to the third antenna group. The second receiving module is disposed adjacent to the fourth antenna group.

The structure and connection of internal devices of the transmitting module is illustrated in FIG. 2I. Each receiving module is the receiving module of FIG. 1L. The first receiving module has a first AUX (an AUX coupled with a first transfer switch of the first receiving module) coupled with a seventh external port of the second transmitting module, to support transmitting an SRS TX signal through a corresponding antenna or self-switching among antennas for signal transmission. The first receiving module has a second AUX (the other AUX coupled with the first transfer switch of the first receiving module) coupled with an eight external port of the first transmitting module, to support transmitting an SRS TX signal through a corresponding antenna or self-switching among antennas for signal transmission. The second receiving module has an AUX (an AUX coupled with a second transfer switch of the second receiving module) coupled with any one AUX, to support transmitting an SRS TX signal. The first transmitting module has a ninth external port coupled with a twelfth external of the second transmitting module, to support transmitting an SRS TX signal.

The radio frequency transceiver has a first transmitting port Nx TX1 in a first band coupled with a first external port of the first transmitting module. The radio frequency transceiver has a first transmitting port Ny TX1 in a second band coupled with a third external port of the first transmitting module. The radio frequency transceiver has a second transmitting port Nx TX2 in the first band coupled with a first external port of the second transmitting module. The radio frequency transceiver has a second transmitting port Ny TX2 in the second band coupled with a third external port of the second transmitting module. The radio frequency transceiver has a first receiving port Nx RX1 in the first band coupled with a second external port of the first transmitting module. The radio frequency transceiver has a first receiving port Ny RX1 in the second band coupled with a fourth external port of the first transmitting module. The radio frequency transceiver has a second receiving port Nx RX2 in the first band coupled with a second external port of the second transmitting module. The radio frequency transceiver has a second receiving port Ny RX2 in the second band coupled with a fourth external port of the second transmitting module. The radio frequency transceiver has a third receiving port Nx RX3 in the first band coupled with a first P port of a second transfer switch of the first receiving module. The radio frequency transceiver has a third receiving port Ny RX3 in the second band coupled with a second P port of the second transfer switch of the first receiving module. The radio frequency transceiver has a fourth receiving port Nx RX4 in the first band coupled with coupled with a thirteenth external port of the first transmitting module. The radio frequency transceiver has a fourth receiving port Ny RX4 in the second band coupled with a first P port of the second transfer switch of the second receiving module. The radio frequency transceiver has a first PDET1 port coupled with a tenth external port of the first transmitting module. The radio frequency transceiver has a second PDET2 port coupled with a tenth external port of the second transmitting module.

The first antenna group includes two antennas respectively coupled with a fifth external port and a sixth external port of the first transmitting module. The second antenna group includes two antennas respectively coupled with a fifth external port and a sixth external port of the second transmitting module. The third antenna group includes two antennas respectively coupled with two P port of the first transfer switch of the first receiving module. The fourth antenna group includes two antennas respectively coupled with two P port of a first transfer switch of the second receiving module.

An electronic device including the radio frequency architecture described above switches on a transmitting path between a transmitting port in a target band of the radio frequency transceiver and a target antenna group in the radio frequency system, to transmit a signal through an antenna in the target antenna group.

In an example, the electronic device including the foregoing radio frequency architecture performs, in single-band (for example, Nx band), transmitting an SRS with four antennas in turn or autonomous transmission switching as follows.

In a first transmission period, the electronic device controls a first T port of a first channel selector-switch of the first transmitting module to be connected to a first P port of the first channel selector-switch, to transmit a signal, and controls the first T port of the first channel selector-switch of the first transmitting module to be connected to a third P port of the first channel selector-switch and a first T port of a second channel selector-switch of the first transmitting module to be connected to a first P of the second channel selector-switch, to transmit a signal, to achieve signal transmission through antennas of antenna groups.

In a second transmission period, the electronic device controls a first T port of a first channel selector-switch of the second transmitting module to be connected to a first P port of the first channel selector-switch, to transmit a signal, and controls the first T port of the first channel selector-switch of the second transmitting module to be connected to a third P port of the first channel selector-switch and a first T port of a second channel selector-switch of the second transmitting module to be connected to a first P of the second channel selector-switch, to transmit a signal, to achieve signal transmission through antennas of antenna groups.

In addition, the radio frequency architecture is compatible with 1T4R SRS switching, that is, has the ability to transmit from the first transmitting module to the four antenna groups. In the first transmission period and the second transmission period, a signal passes through the fifth external port and the seventh external port of the first transmitting module. In the third transmission period, a signal is transferred from the ninth external port of the first transmitting module to the twelfth external port of the second transmitting module, and then from the twelfth external port of the second transmitting module to the second antenna group via the first channel selector-switch of the second transmitting module. In the fourth transmission period, a signal is transferred from an eighth external port of the first transmitting module to the second AUX of the first receiving module.

Figure 3N:
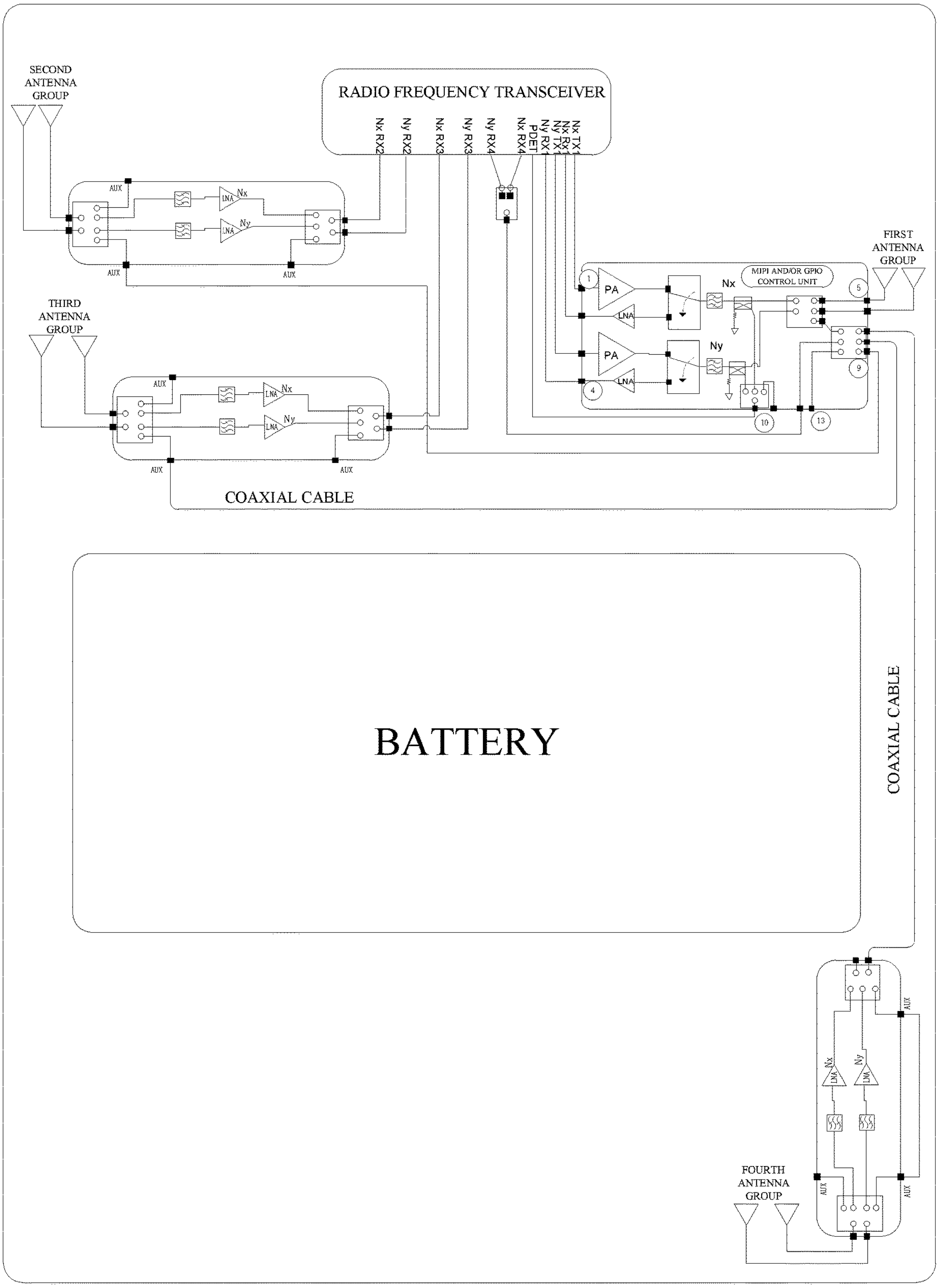
FIG. 3N is a schematic structural diagram illustrating a radio frequency system according to another implementation of the present disclosure.

As illustrated in FIG. 3N, in this example, the radio frequency architecture has the following function: ① supporting 5G NR dual-band; ② not supporting UL CA; ③ not supporting DL CA; ④ supporting transmitting an SRS with four antennas in turn; ⑤ supporting NR 1T4R (one transmitting path and four receiving paths in single-band).

The radio frequency architecture for 5G includes a radio frequency transceiver, one transmitting module, three receiving modules (a first receiving module, a second receiving module, and a third receiving module), four antenna groups (a first antenna group, a second antenna group, a third antenna group, and a fourth antenna group), and one receiving port selector-switch (including an SPDT switch). Each antenna group includes two antennas. The radio frequency transceiver, the transmitting module, the first receiving module, the second receiving module, and the receiving port selector-switch are disposed on a main board. The third receiving module is disposed on a sub board. The transmitting module is disposed adjacent to an antenna with which the transmitting module is coupled. Each receiving module is disposed adjacent to an antenna with which the receiving module is coupled.

The transmitting module is disposed adjacent to the first antenna group. The first receiving module is disposed adjacent to the second antenna group. The second receiving module is disposed adjacent to the third antenna group. The third receiving module is disposed adjacent to the fourth antenna group.

The structure and connection of internal devices of the transmitting module are similar to that of the transmitting module in FIG. 2M. The internal devices and connection therebetween of each receiving module are similar to that of the receiving module in FIG. 1L. The first receiving module has an AUX coupled with a ninth external port of the transmitting module, to support transmitting an SRS TX signal through a corresponding antenna or self-switching among antennas for signal transmission. The second receiving module has an AUX coupled with an eighth external port of the transmitting module, to support transmitting an SRS TX signal through a corresponding antenna or self-switching among antennas for signal transmission. The third receiving module has an AUX (an AUX coupled with a second transfer switch of the third receiving module) coupled with any other one AUX of the third receiving module, to support transmitting an SRS TX signal.

The radio frequency transceiver has a transmitting port Nx TX in a first band coupled with a first external port of the transmitting module. The radio frequency transceiver has a transmitting port Ny TX in a second band coupled with a third external port of the transmitting module. The radio frequency transceiver has a first receiving port Nx RX1 in the first band coupled with a second external port of the transmitting module. The radio frequency transceiver has a first receiving port Ny RX1 in the second band coupled with a fourth external port of the transmitting module. The radio frequency transceiver has a second receiving port Nx RX2 in the first band coupled with a first P port of a second transfer switch of the first receiving module. The radio frequency transceiver has a second receiving port Ny RX2 in the second band coupled with a second P port of the second transfer switch of the first receiving module. The radio frequency transceiver has a third receiving port Nx RX3 in the first band coupled with a first P port of a second transfer switch of the second receiving module. The radio frequency transceiver has a third receiving port Ny RX3 in the second band coupled with a second P port of the second transfer switch of the second receiving module. The radio frequency transceiver has a fourth receiving port Nx RX4 in the first band and a fourth receiving port Ny RX4 in the second band coupled with two T port of the receiving port selector-switch. The receiving port selector-switch has a P port coupled with a twelfth external port of the transmitting module. The radio frequency transceiver has a PDET port coupled with a tenth external port of the transmitting module.

The first antenna group includes two antennas respectively coupled with a fifth external port and a sixth external port of the transmitting module. The second antenna group includes two antennas respectively coupled with two P port of a first transfer switch of the first receiving module. The third antenna group includes two antennas respectively coupled with two P port of a first transfer switch of the second receiving module. The fourth antenna group includes two antennas respectively coupled with two P port of a first transfer switch of the third receiving module.

An electronic device including the radio frequency architecture described above switches on a transmitting path between a transmitting port in a target band of the radio frequency transceiver and a target antenna group in the radio frequency system, to transmit a signal through an antenna in the target antenna group.

In an example, the electronic device including the foregoing radio frequency architecture performs, in single-band (for example, Nx band), transmitting an SRS with four antennas in turn or autonomous transmission switching as follows.

In a first transmission period, the electronic device controls a first T port of a first channel selector-switch of the transmitting module to be connected to a first P port of the first channel selector-switch, to transmit a signal, to achieve signal transmission through an antenna of an antenna group.

In a second transmission period, the electronic device controls the first T port of the first channel selector-switch of the transmitting module to be connected to a third P port of the first channel selector-switch and controls a first T port of a second channel selector-switch of the transmitting module to be connected to a third P of the second channel selector-switch, to transmit a signal, to transmit a signal through an antenna of an antenna group.

In a third transmission period, the electronic device controls the first T port of the first channel selector-switch of the transmitting module to be connected to the third P port of the first channel selector-switch and controls the first T port of the second channel selector-switch to be connected to a second P of the second channel selector-switch, to transmit a signal, to achieve signal transmission through an antenna of an antenna group.

In a fourth transmission period, the electronic device controls the first T port of the first channel selector-switch of the transmitting module to be connected to the third P port of the first channel selector-switch and controls the first T port of the second channel selector-switch to be connected to a first P of the second channel selector-switch, to transmit a signal, to achieve signal transmission through an antenna of an antenna group.

Figure 3O:
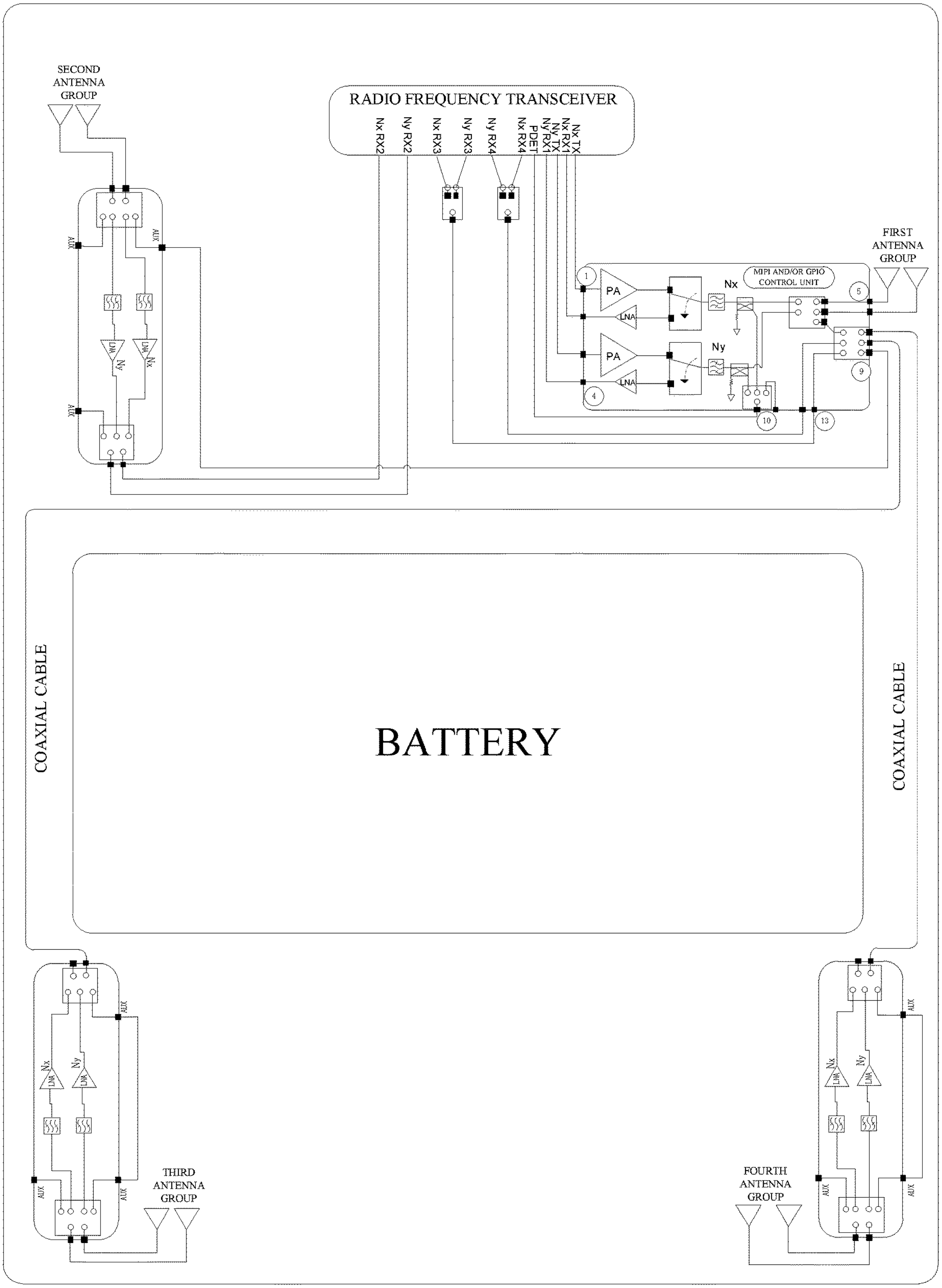
FIG. 3O is a schematic structural diagram illustrating a radio frequency system according to another implementation of the present disclosure.

As illustrated in FIG. 3O, in this example, the radio frequency architecture has the following function: ① supporting 5G NR dual-band; ② not supporting UL CA; ③ not supporting DL CA; ④ supporting transmitting an SRS with four antennas in turn; ⑤ supporting NR 1T4R (one transmitting path and four receiving paths in single-band).

The radio frequency architecture for 5G includes a radio frequency transceiver, one transmitting module, three receiving modules (a first receiving module, a second receiving module, and a third receiving module), four antenna groups (a first antenna group, a second antenna group, a third antenna group, and a fourth antenna group), and two receiving port selector-switches (a first receiving port selector-switch and a second receiving port selector-switch, embodied as SPDT switches). Each antenna group includes two antennas. The radio frequency transceiver, the transmitting module, the first receiving module, the first receiving port selector-switch, and the second receiving port selector-switch are disposed on a main board. The second receiving module and the third receiving module are disposed on a sub board. The transmitting module is disposed adjacent to an antenna with which the transmitting module is coupled. Each receiving module is disposed adjacent to an antenna with which the receiving module is coupled.

The transmitting module is disposed adjacent to the first antenna group. The first receiving module is disposed adjacent to the second antenna group. The second receiving module is disposed adjacent to the third antenna group. The third receiving module is disposed adjacent to the fourth antenna group.

The structure and connection of internal devices of the transmitting module are similar to that of the transmitting module in FIG. 2M. The internal devices and connection therebetween of each receiving module are similar to that of the receiving module in FIG. 1L. The first receiving module has an AUX coupled with a ninth external port of the transmitting module, to support transmitting an SRS TX signal through a corresponding antenna or self-switching among antennas for signal transmission. The second receiving module has an AUX (an AUX coupled with a second transfer switch of the second receiving module) coupled with any other one AUX of the second receiving module, to support transmitting an SRS TX signal. The third receiving module has an AUX (an AUX coupled with a second transfer switch of the third receiving module) coupled with any other one AUX of the third receiving module, to support transmitting an SRS TX signal.

The radio frequency transceiver has a transmitting port Nx TX in a first band coupled with a first external port of the transmitting module. The radio frequency transceiver has a transmitting port Ny TX in a second band coupled with a third external port of the transmitting module. The radio frequency transceiver has a first receiving port Nx RX1 in the first band coupled with a second external port of the transmitting module. The radio frequency transceiver has a first receiving port Ny RX1 in the second band coupled with a fourth external port of the transmitting module. The radio frequency transceiver has a second receiving port Nx RX2 in the first band coupled with a first P port of a second transfer switch of the first receiving module. The radio frequency transceiver has a second receiving port Ny RX2 in the second band coupled with a second P port of the second transfer switch of the first receiving module. The radio frequency transceiver has a third receiving port Nx RX3 in the first band and a third receiving port Ny RX3 in the second band coupled with two T port of the first receiving port selector-switch. The first receiving port selector-switch has a P port coupled with a thirteenth external port of the transmitting module. The radio frequency transceiver has a fourth receiving port Nx RX4 in the first band and a fourth receiving port Ny RX4 in the second band coupled with two T port of the second receiving port selector-switch. The second receiving port selector-switch has a P port coupled with a twelfth external port of the transmitting module. The radio frequency transceiver has a PDET port coupled with a tenth external port of the transmitting module.

The first antenna group includes two antennas respectively coupled with a fifth external port and a sixth external port of the transmitting module. The second antenna group includes two antennas respectively coupled with two P port of a first transfer switch of the first receiving module. The third antenna group includes two antennas respectively coupled with two P port of a first transfer switch of the second receiving module. The fourth antenna group includes two antennas respectively coupled with two P port of a first transfer switch of the third receiving module.

An electronic device including the radio frequency architecture described above switches on a transmitting path between a transmitting port in a target band of the radio frequency transceiver and a target antenna group in the radio frequency system, to transmit a signal through an antenna in the target antenna group.

In an example, the electronic device including the foregoing radio frequency architecture performs, in single-band (for example, Nx band), transmitting an SRS with four antennas in turn or autonomous transmission switching as follows.

In a first transmission period, the electronic device controls a first T port of a first channel selector-switch of the transmitting module to be connected to a first P port of the first channel selector-switch, to transmit a signal, to achieve signal transmission through an antenna of an antenna group.

In a second transmission period, the electronic device controls the first T port of the first channel selector-switch of the transmitting module to be connected to a third P port of the first channel selector-switch and controls a first T port of a second channel selector-switch of the transmitting module to be connected to a third P of the second channel selector-switch, to transmit a signal, to transmit a signal through an antenna of an antenna group.

In a third transmission period, the electronic device controls the first T port of the first channel selector-switch of the transmitting module to be connected to the third P port of the first channel selector-switch and controls the first T port of the second channel selector-switch to be connected to a second P of the second channel selector-switch, to transmit a signal, to achieve signal transmission through an antenna of an antenna group.

In a fourth transmission period, the electronic device controls the first T port of the first channel selector-switch of the transmitting module to be connected to the third P port of the first channel selector-switch and controls the first T port of the second channel selector-switch to be connected to a first P of the second channel selector-switch, to transmit a signal, to achieve signal transmission through an antenna of an antenna group.

Figure 3P:
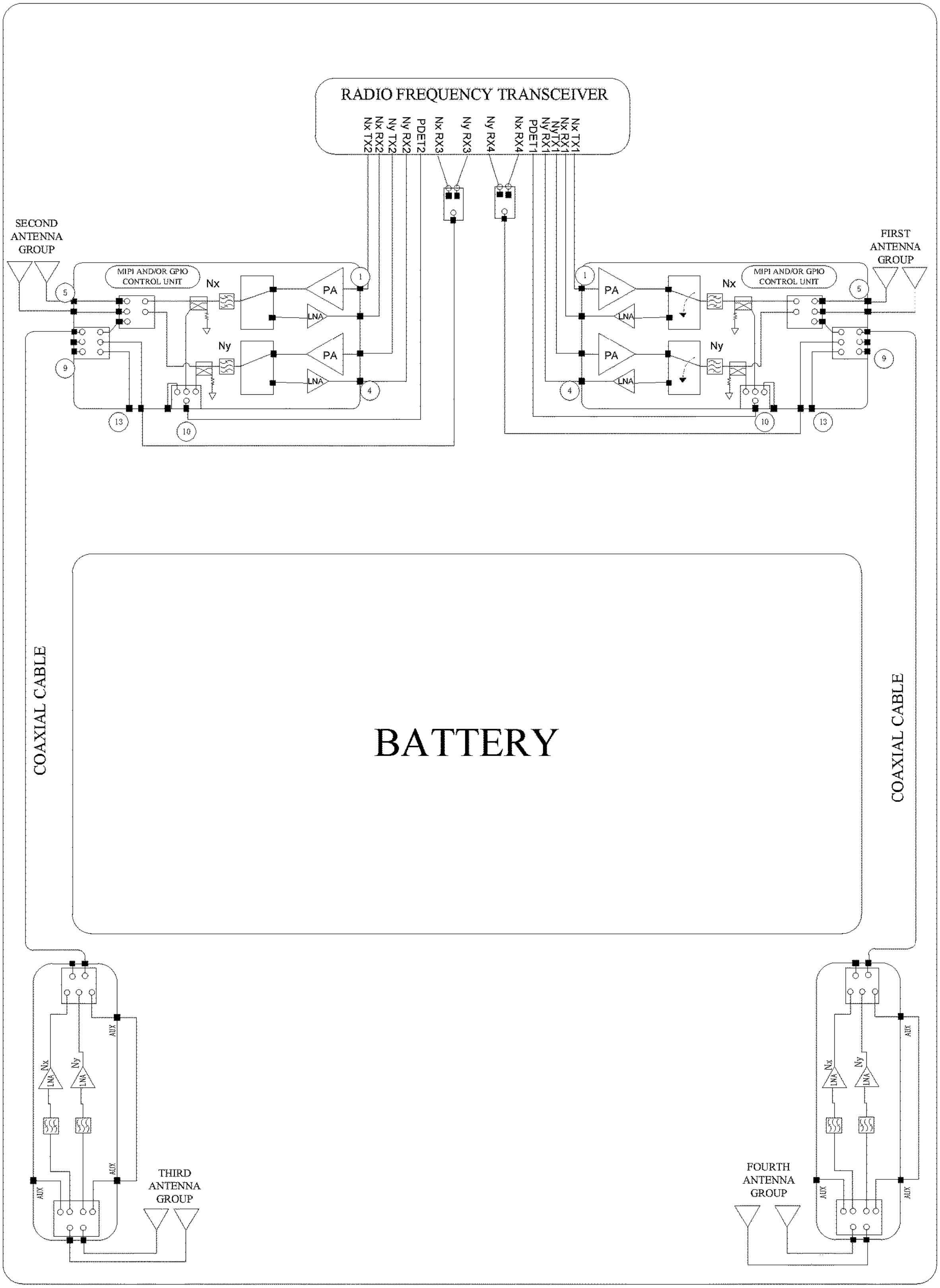
FIG. 3P is a schematic structural diagram illustrating a radio frequency system according to another implementation of the present disclosure.

As illustrated in FIG. 3P, in this example, the radio frequency architecture has the following function: ① supporting 5G NR dual-band; ② not supporting UL CA; ③ not supporting DL CA; ④ supporting transmitting an SRS with four antennas in turn; ⑤ supporting NR 2T4R (four transmitting paths and eight receiving paths in total).

The radio frequency architecture for 5G includes a radio frequency transceiver, two transmitting modules (a first transmitting module and a second transmitting module), two receiving modules (a first receiving module and a second receiving module), four antenna groups (a first antenna group, a second antenna group, a third antenna group, and a fourth antenna group), and two receiving port selector-switches (a first receiving port selector-switch and a second receiving port selector-switch, embodied as SPDT switches). Each antenna group includes two antennas. The radio frequency transceiver, the first transmitting module, the second transmitting module, the first receiving port selector-switch, and the second receiving port selector-switch are disposed on a main board. The first receiving module and the second receiving module are disposed on a sub board. Each transmitting module is disposed adjacent to an antenna with which the transmitting module is coupled. Each receiving module is disposed adjacent to an antenna with which the receiving module is coupled.

The first transmitting module is disposed adjacent to the first antenna group. The second transmitting module is disposed adjacent to the second antenna group. The first receiving module is disposed adjacent to the third antenna group. The second receiving module is disposed adjacent to the fourth antenna group.

The structure and connection of internal devices of the transmitting module are similar to that of the transmitting module in FIG. 2M. The internal devices and connection therebetween of the receiving module are similar to that of the receiving module in FIG. 1L. The first receiving module has an AUX (an AUX coupled with a second transfer switch of the first receiving module) coupled with any other one AUX of the first receiving module, to support transmitting an SRS TX signal. The second receiving module has an AUX (an AUX coupled with a second transfer switch of the second receiving module) coupled with any other one AUX of the second receiving module, to support transmitting an SRS TX signal.

The radio frequency transceiver has a first transmitting port Nx TX1 in a first band coupled with a first external port of the first transmitting module. The radio frequency transceiver has a first transmitting port Ny TX1 in a second band coupled with a third external port of the first transmitting module. The radio frequency transceiver has a second transmitting port Nx TX2 in the first band coupled with a first external port of the second transmitting module. The radio frequency transceiver has a second transmitting port Ny TX2 in the second band coupled with a third external port of the second transmitting module. The radio frequency transceiver has a first receiving port Nx RX1 in the first band coupled with a second external port of the first transmitting module. The radio frequency transceiver has a first receiving port Ny RX1 in the second band coupled with a fourth external port of the first transmitting module. The radio frequency transceiver has a second receiving port Nx RX2 in the first band coupled with a second external port of the second transmitting module. The radio frequency transceiver has a second receiving port Ny RX2 in the second band coupled with a fourth external port of the second transmitting module. The radio frequency transceiver has a third receiving port Nx RX3 in the first band and a third receiving port Ny RX3 in the second band coupled with two T port of the first receiving port selector-switch. The first receiving port selector-switch has a P port coupled with a twelfth external port of the second transmitting module. The radio frequency transceiver has a fourth receiving port Nx RX4 in the first band and a fourth receiving port Ny RX4 in the second band coupled with two T port of the second receiving port selector-switch. The second receiving port selector-switch has a P port coupled with a twelfth external port of the first transmitting module. The radio frequency transceiver has a first PDET1 port coupled with a tenth external port of the first transmitting module. The radio frequency transceiver has a second PDET2 port coupled with a tenth external port of the second transmitting module.

The first antenna group includes two antennas respectively coupled with a fifth external port and a sixth external port of the first transmitting module. The second antenna group includes two antennas respectively coupled with a fifth external port and a sixth external port of the second transmitting module. The third antenna group includes two antennas respectively coupled with two P port of a first transfer switch of the first receiving module. The fourth antenna group includes two antennas respectively coupled with two P port of a first transfer switch of the second receiving module.

An electronic device including the radio frequency architecture described above switches on a transmitting path between a transmitting port in a target band of the radio frequency transceiver and a target antenna group in the radio frequency system, to transmit a signal through an antenna in the target antenna group.

In an example, the electronic device including the foregoing radio frequency architecture performs, in single-band (for example, Nx band), transmitting an SRS with four antennas in turn or autonomous transmission switching as follows.

In a first transmission period, the electronic device controls a first T port of a first channel selector-switch of the first transmitting module to be connected to a first P port of the first channel selector-switch, to transmit a signal, and controls the first T port of the first channel selector-switch of the first transmitting module to be connected to a third P port of the first channel selector-switch and a first T port of a second channel selector-switch of the first transmitting module to be connected to a first P of the second channel selector-switch, to transmit a signal, to achieve signal transmission through antennas of antenna groups.

In a second transmission period, the electronic device controls a first T port of a first channel selector-switch of the second transmitting module to be connected to a first P port of the first channel selector-switch, to transmit a signal, and controls the first T port of the first channel selector-switch of the second transmitting module to be connected to a third P port of the first channel selector-switch and a first T port of a second channel selector-switch of the second transmitting module to be connected to a first P of the second channel selector-switch, to transmit a signal, to achieve signal transmission through antennas of antenna groups.

Figure 3Q:
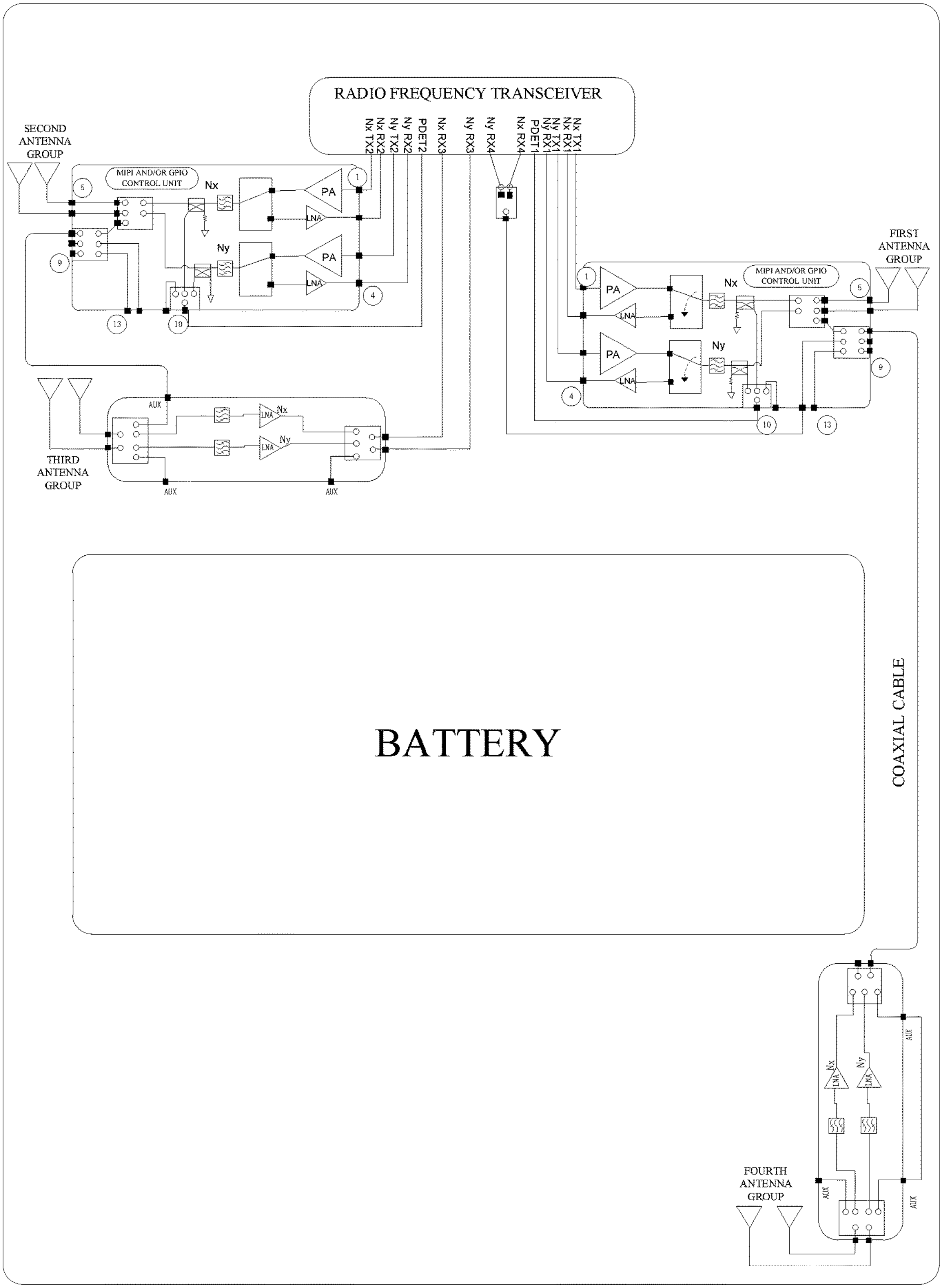
FIG. 3Q is a schematic structural diagram illustrating a radio frequency system according to another implementation of the present disclosure.

As illustrated in FIG. 3Q, in this example, the radio frequency architecture has the following function: ① supporting 5G NR dual-band; ② not supporting UL CA; ③ not supporting DL CA; ④ supporting transmission of an SRS with four antennas in turn; ⑤ supporting NR 2T4R (four transmitting paths and eight receiving paths in total).

The radio frequency architecture for 5G includes a radio frequency transceiver, two transmitting modules (a first transmitting module and a second transmitting module), two receiving modules (a first receiving module and a second receiving module), four antenna groups (a first antenna group, a second antenna group, a third antenna group, and a fourth antenna group), and one receiving port selector-switch (embodied as an SPDT switch). Each antenna group includes two antennas. The radio frequency transceiver, the first transmitting module, the second transmitting module, the first receiving module, and the receiving port selector-switch are disposed on a main board. The second receiving module is disposed on a sub board. Each transmitting module is disposed adjacent to an antenna with which the transmitting module is coupled. Each receiving module is disposed adjacent to an antenna with which the receiving module is coupled.

The first transmitting module is disposed adjacent to the first antenna group. The second transmitting module is disposed adjacent to the second antenna group. The first receiving module is disposed adjacent to the third antenna group. The second receiving module is disposed adjacent to the fourth antenna group.

The structure and connection of internal devices of the transmitting module are similar to that of the transmitting module in FIG. 2M. The internal devices and connection therebetween of each receiving module are similar to that of the receiving module in FIG. 1L. The first receiving module has an AUX coupled with a seventh external port of the second transmitting module, to support transmitting an SRS TX signal through a corresponding antenna or self-switching among antennas for signal transmission. The second receiving module has an AUX (an AUX coupled with a second transfer switch of the second receiving module) coupled with any other one AUX of the second receiving module, to support transmitting an SRS TX signal.

The radio frequency transceiver has a first transmitting port Nx TX1 in a first band coupled with a first external port of the first transmitting module. The radio frequency transceiver has a first transmitting port Ny TX1 in a second band coupled with a third external port of the first transmitting module. The radio frequency transceiver has a second transmitting port Nx TX2 in the first band coupled with a first external port of the second transmitting module. The radio frequency transceiver has a second transmitting port Ny TX2 in the second band coupled with a third external port of the second transmitting module. The radio frequency transceiver has a first receiving port Nx RX1 in the first band coupled with a second external port of the first transmitting module. The radio frequency transceiver has a first receiving port Ny RX1 in the second band coupled with a fourth external port of the first transmitting module. The radio frequency transceiver has a second receiving port Nx RX2 in the first band coupled with a second external port of the second transmitting module. The radio frequency transceiver has a second receiving port Ny RX2 in the second band coupled with a fourth external port of the second transmitting module. The radio frequency transceiver has a third receiving port Nx RX3 in the first band coupled with a first P port of a second transfer switch of the first receiving module. The radio frequency transceiver has a third receiving port Ny RX3 in the second band coupled with a second P port of the second transfer switch of the first receiving module. The radio frequency transceiver has a fourth receiving port Nx RX4 in the first band and a fourth receiving port Ny RX4 in the second band coupled with two T port of the receiving port selector-switch. The receiving port selector-switch has a P port coupled with a twelfth external port of the first transmitting module. The radio frequency transceiver has a first PDET1 port coupled with a tenth external port of the first transmitting module. The radio frequency transceiver has a second PDET2 port coupled with a tenth external port of the second transmitting module.

The first antenna group includes two antennas respectively coupled with a fifth external port and a sixth external port of the first transmitting module. The second antenna group includes two antennas respectively coupled with a fifth external port and a sixth external port of the second transmitting module. The third antenna group includes two antennas respectively coupled with two P port of a first transfer switch of the first receiving module. The fourth antenna group includes two antennas respectively coupled with two P port of a first transfer switch of the second receiving module.

An electronic device including the radio frequency architecture described above switches on a transmitting path between a transmitting port in a target band of the radio frequency transceiver and a target antenna group in the radio frequency system, to transmit a signal through an antenna in the target antenna group.

In an example, the electronic device including the foregoing radio frequency architecture performs, in single-band (for example, Nx band), transmitting an SRS with four antennas in turn or autonomous transmission switching as follows.

In a first transmission period, the electronic device controls a first T port of a first channel selector-switch of the first transmitting module to be connected to a first P port of the first channel selector-switch, to transmit a signal, and controls the first T port of the first channel selector-switch of the first transmitting module to be connected to a third P port of the first channel selector-switch and a first T port of a second channel selector-switch of the first transmitting module to be connected to a first P of the second channel selector-switch, to transmit a signal, to achieve signal transmission through antennas of antenna groups.

In a second transmission period, the electronic device controls a first T port of a first channel selector-switch of the second transmitting module to be connected to a first P port of the first channel selector-switch, to transmit a signal, and controls the first T port of the first channel selector-switch of the second transmitting module to be connected to a third P port of the first channel selector-switch and a first T port of a second channel selector-switch of the second transmitting module to be connected to a first P of the second channel selector-switch, to achieve signal transmission through antennas of antenna groups.

Figure 3R:
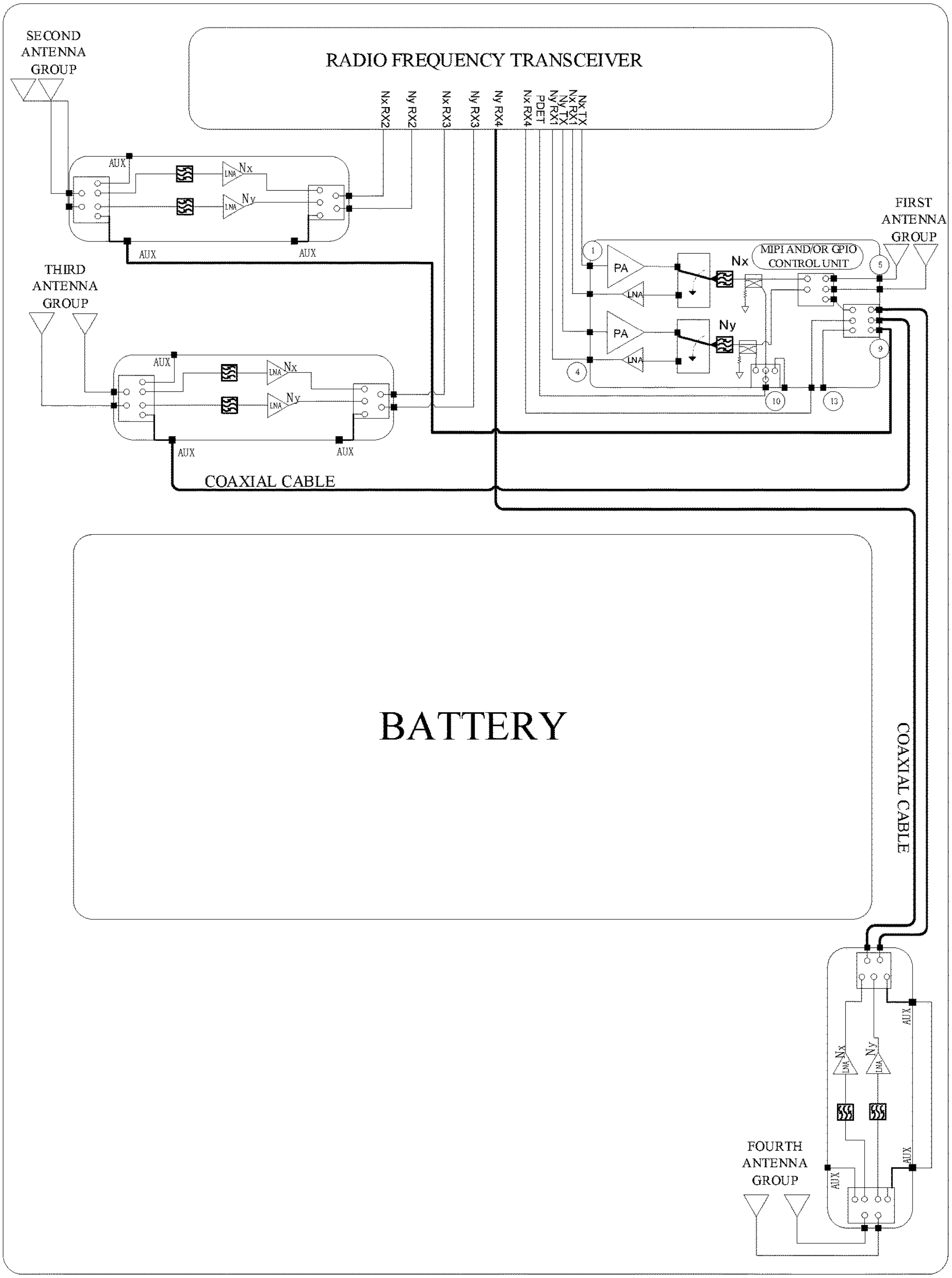
FIG. 3R is a schematic structural diagram illustrating a radio frequency system according to another implementation of the present disclosure.

As illustrated in FIG. 3R, in this example, the radio frequency architecture has the following function: ① supporting 5G NR dual-band; ② supporting DL CA; ③ supporting SRS switching in four antennas; ④ supporting NR 1T4R (one transmitting path and four receiving paths in total).

The radio frequency architecture for 5G includes a radio frequency transceiver, one transmitting module, three receiving modules (a first receiving module, a second receiving module, and a third receiving module), and four antenna groups (a first antenna group, a second antenna group, a third antenna group, and a fourth antenna group). The radio frequency transceiver, the transmitting module, the first receiving module, and the second receiving module are disposed on a main board (three modules above a battery in this figure). The third receiving module is disposed on a sub board (one module below the battery in this figure). Each receiving module is disposed adjacent to an antenna with which the receiving module is coupled.

The transmitting module is disposed adjacent to the first antenna group. The first receiving module is disposed adjacent to the second antenna group. The second receiving module is disposed adjacent to the third antenna group. The third receiving module is disposed adjacent to the fourth antenna group.

The structure and connection of internal devices of the transmitting module are similar to that of the transmitting module in FIG. 2M. The internal devices and connection therebetween of each receiving module are similar to that of the receiving module in FIG. 1L. The first receiving module has an AUX (an AUX coupled with a first transfer switch of the first receiving module) coupled with a ninth external port of the transmitting module, to support transmitting an SRS TX signal through a corresponding antenna or self-switching among antennas for signal transmission. The second receiving module has an AUX (an AUX coupled with a first transfer switch of the second receiving module) coupled with an eighth external port of the transmitting module, to support transmitting an SRS TX signal through a corresponding antenna or self-switching among antennas for signal transmission. The third receiving module has a second transfer switch, which has a P port coupled with a seventh external port of the transmitting module and has a third T port coupled with an AUX of the third receiving module. The AUX is coupled with another AUX of the third receiving module to support transmission of an SRS TX signal.

The radio frequency transceiver has a transmitting port Nx TX in a first band coupled with a first external port of the transmitting module. The radio frequency transceiver has a transmitting port Ny TX in a second band coupled with a third external port of the transmitting module. The radio frequency transceiver has a first receiving port Nx RX1 in the first band coupled with a second external port of the transmitting module. The radio frequency transceiver has a first receiving port Ny RX1 in the second band coupled with a fourth external port of the transmitting module. The radio frequency transceiver has a PDET port coupled with a tenth external port of the transmitting module. The radio frequency transceiver has a fourth receiving port Nx RX4 in the first band coupled with a twelfth external port of the transmitting module. The radio frequency transceiver has a fourth receiving port Ny RX4 in the second band coupled with the other P port of the second transfer switch of the third receiving module. The radio frequency transceiver has a third receiving port Ny RX3 in the second band coupled with one P port of a second transfer switch of the second receiving module. The radio frequency transceiver has a third receiving port Nx RX3 in the first band coupled with the other P port of the second transfer switch of the second receiving module. The radio frequency transceiver has a second receiving port Ny RX2 in the second band coupled with one P port of a second transfer switch of the first receiving module. The radio frequency transceiver has a second receiving port Nx RX2 in the first band coupled with the other P port of the second transfer switch of the first receiving module.

The first antenna group includes two antennas respectively coupled with a fifth external port and a sixth external port of the transmitting module. The second antenna group includes two antennas respectively coupled with two P port of the first transfer switch of the first receiving module. The third antenna group includes two antennas respectively coupled with two P port of the first transfer switch of the second receiving module. The fourth antenna group includes two antennas respectively coupled with two P port of a first transfer switch of the third receiving module.

An electronic device including the radio frequency architecture described above switches on a transmitting path between a transmitting port in a target band of the radio frequency transceiver and a target antenna group in the radio frequency system, to transmit a signal through an antenna in the target antenna group.

In an example, the electronic device including the foregoing radio frequency architecture performs, in single-band (for example, Nx band), transmitting an SRS with four antennas in turn or autonomous transmission switching as follows.

In a first transmission period, the electronic device controls a first T port of a first channel selector-switch of the transmitting module to be connected to a first P port of the first channel selector-switch, to achieve signal transmission through an antenna of an antenna group.

In a second transmission period, the electronic device controls the first T port of the first channel selector-switch of the transmitting module to be connected to a third P port of the first channel selector-switch and controls a first T port of a second channel selector-switch of the transmitting module to be connected to a third P of the second channel selector-switch, to transmit a signal through an antenna of an antenna group.

In a third transmission period, the electronic device controls the first T port of the first channel selector-switch of the transmitting module to be connected to the third P port of the first channel selector-switch and controls the first T port of the second channel selector-switch to be connected to a second P of the second channel selector-switch, to achieve signal transmission through an antenna of an antenna group.

In a fourth transmission period, the electronic device controls the first T port of the first channel selector-switch of the transmitting module to be connected to the third P port of the first channel selector-switch and controls the first T port of the second channel selector-switch to be connected to a first P of the second channel selector-switch, to achieve signal transmission through an antenna of an antenna group, to support a base station to detect a channel quality of the antenna in Nx band of the fourth antenna group.

Figure 3S:
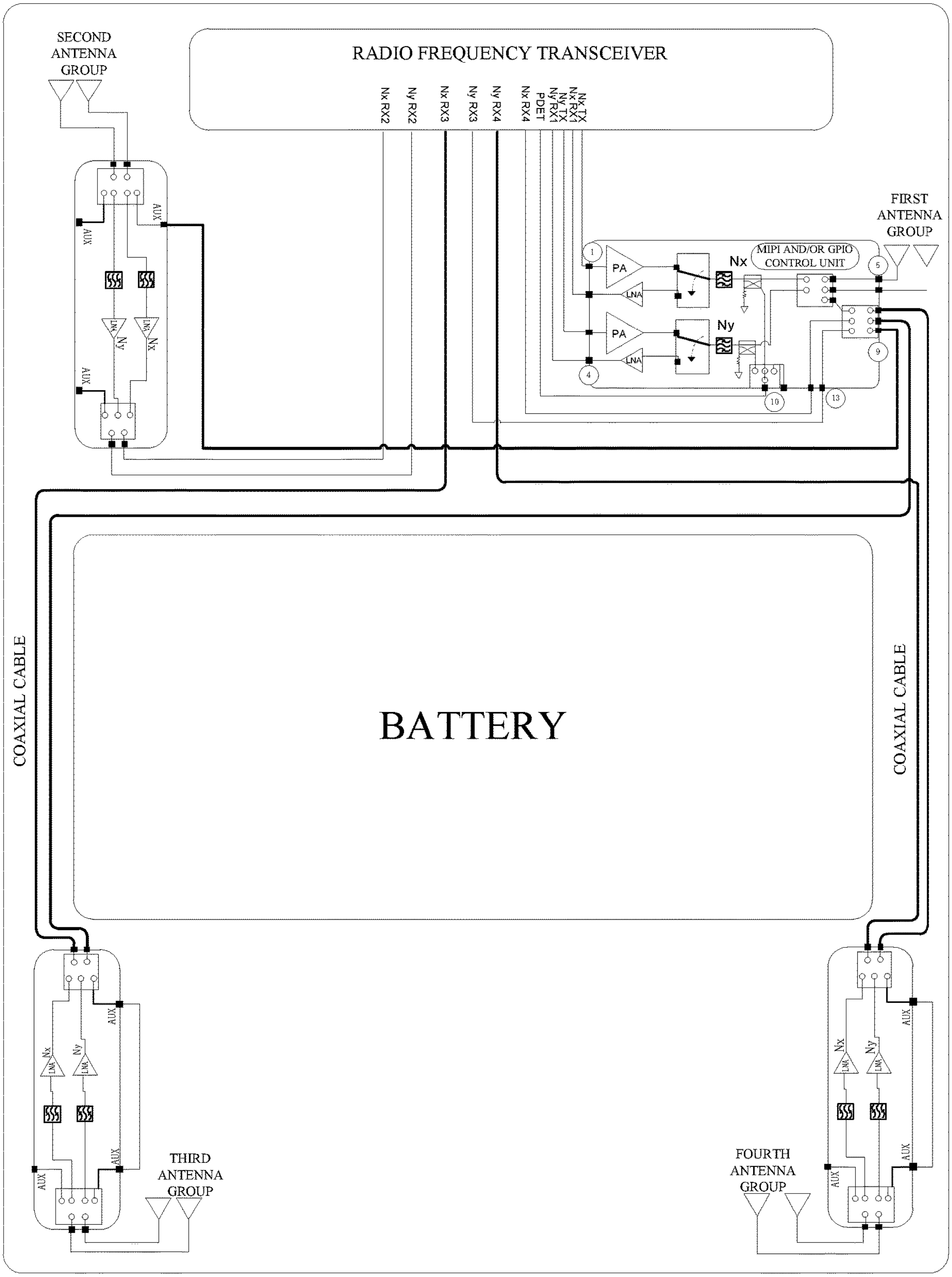
FIG. 3S is a schematic structural diagram illustrating a radio frequency system according to another implementation of the present disclosure.

As illustrated in FIG. 3S, in this example, the radio frequency architecture has the following function: ① supporting 5G NR dual-band; ② supporting DL CA; ③ supporting SRS switching in four antennas; ④ supporting NR 1T4R (one transmitting path and four receiving paths in total).

The radio frequency architecture for 5G includes a radio frequency transceiver, one transmitting module, three receiving modules (a first receiving module, a second receiving module, and a third receiving module), and four antenna groups (a first antenna group, a second antenna group, a third antenna group, and a fourth antenna group). The radio frequency transceiver, the transmitting module, and the first receiving module are disposed on a main board (two modules above a battery in this figure). The second receiving module and the third receiving module is disposed on a sub board (two modules below a battery in this figure). Each receiving module is disposed adjacent to an antenna with which the receiving module is coupled.

The transmitting module is disposed adjacent to the first antenna group. The first receiving module is disposed adjacent to the second antenna group. The second receiving module is disposed adjacent to the third antenna group. The third receiving module is disposed adjacent to the fourth antenna group.

The structure and connection of internal devices of the transmitting module are similar to that of the transmitting module in FIG. 2M. Each receiving module is the receiving module illustrated in FIG. 1L. The first receiving module has an AUX (an AUX coupled with a first transfer switch of the first receiving module) coupled with a ninth external port of the transmitting module, to support transmitting an SRS TX signal through a corresponding antenna or self-switching among antennas for signal transmission. The second receiving module has a second transfer switch, which has a P port coupled with an eighth external port of the transmitting module and has a third T port coupled with an AUX of the second receiving module. The AUX is coupled with another AUX of the second receiving module, to support transmission of an SRS TX signal. The third receiving module has a second transfer switch, which has a P port coupled with a seventh external port of the transmitting module and has a third T port coupled with an AUX of the third receiving module. The AUX is coupled with another AUX of the third receiving module, to support transmitting an SRS TX signal.

The radio frequency transceiver has a transmitting port Nx TX in a first band coupled with a first external port of the transmitting module. The radio frequency transceiver has a transmitting port Ny TX in a second band coupled with a third external port of the transmitting module. The radio frequency transceiver has a first receiving port Nx RX1 in the first band coupled with a second external port of the transmitting module. The radio frequency transceiver has a first receiving port Ny RX1 in the second band coupled with a fourth external port of the transmitting module. The radio frequency transceiver has a PDET port coupled with a tenth external port of the transmitting module. The radio frequency transceiver has a fourth receiving port Nx RX4 in the first band coupled with a twelfth external port of the transmitting module. The radio frequency transceiver has a fourth receiving port Ny RX4 in the second band coupled with the other P port of the second transfer switch of the third receiving module. The radio frequency transceiver has a third receiving port Ny RX3 in the second band coupled with a thirteenth external port of the transmitting module. The radio frequency transceiver has a third receiving port Nx RX3 in the first band coupled with the other P port of the second transfer switch of the second receiving module. The radio frequency transceiver has a second receiving port Ny RX2 in the second band coupled with one P port of a second transfer switch of the first receiving module. The radio frequency transceiver has a second receiving port Nx RX2 in the first band coupled with the other P port of the second transfer switch of the first receiving module.

The first antenna group includes two antennas respectively coupled with a fifth external port and a sixth external port of the transmitting module. The second antenna group includes two antennas respectively coupled with two P port of the first transfer switch of the first receiving module. The third antenna group includes two antennas respectively coupled with two P port of a first transfer switch of the second receiving module. The fourth antenna group includes two antennas respectively coupled with two P port of a first transfer switch of the third receiving module.

An electronic device including the radio frequency architecture described above switches on a transmitting path between a transmitting port in a target band of the radio frequency transceiver and a target antenna group in the radio frequency system, to transmit a signal through an antenna in the target antenna group.

In an example, the electronic device including the foregoing radio frequency architecture performs, in single-band (for example, Nx band), transmitting an SRS with four antennas in turn or autonomous transmission switching as follows.

In a first transmission period, the electronic device controls a first T port of a first channel selector-switch of the transmitting module to be connected to a first P port of the first channel selector-switch, to achieve signal transmission through an antenna of an antenna group.

In a second transmission period, the electronic device controls the first T port of the first channel selector-switch of the transmitting module to be connected to a third P port of the first channel selector-switch and controls a first T port of a second channel selector-switch of the transmitting module to be connected to a third P of the second channel selector-switch, to transmit a signal through an antenna of an antenna group.

In a third transmission period, the electronic device controls the first T port of the first channel selector-switch of the transmitting module to be connected to the third P port of the first channel selector-switch and controls the first T port of the second channel selector-switch to be connected to a second P of the second channel selector-switch, to achieve signal transmission through an antenna of an antenna group.

In a fourth transmission period, the electronic device controls the first T port of the first channel selector-switch of the transmitting module to be connected to the third P port of the first channel selector-switch and controls the first T port of the second channel selector-switch to be connected to a first P of the second channel selector-switch, to achieve signal transmission through an antenna of an antenna group, to support a base station to detect a channel quality of the antenna in Nx band of the fourth antenna group.

Figure 3T:
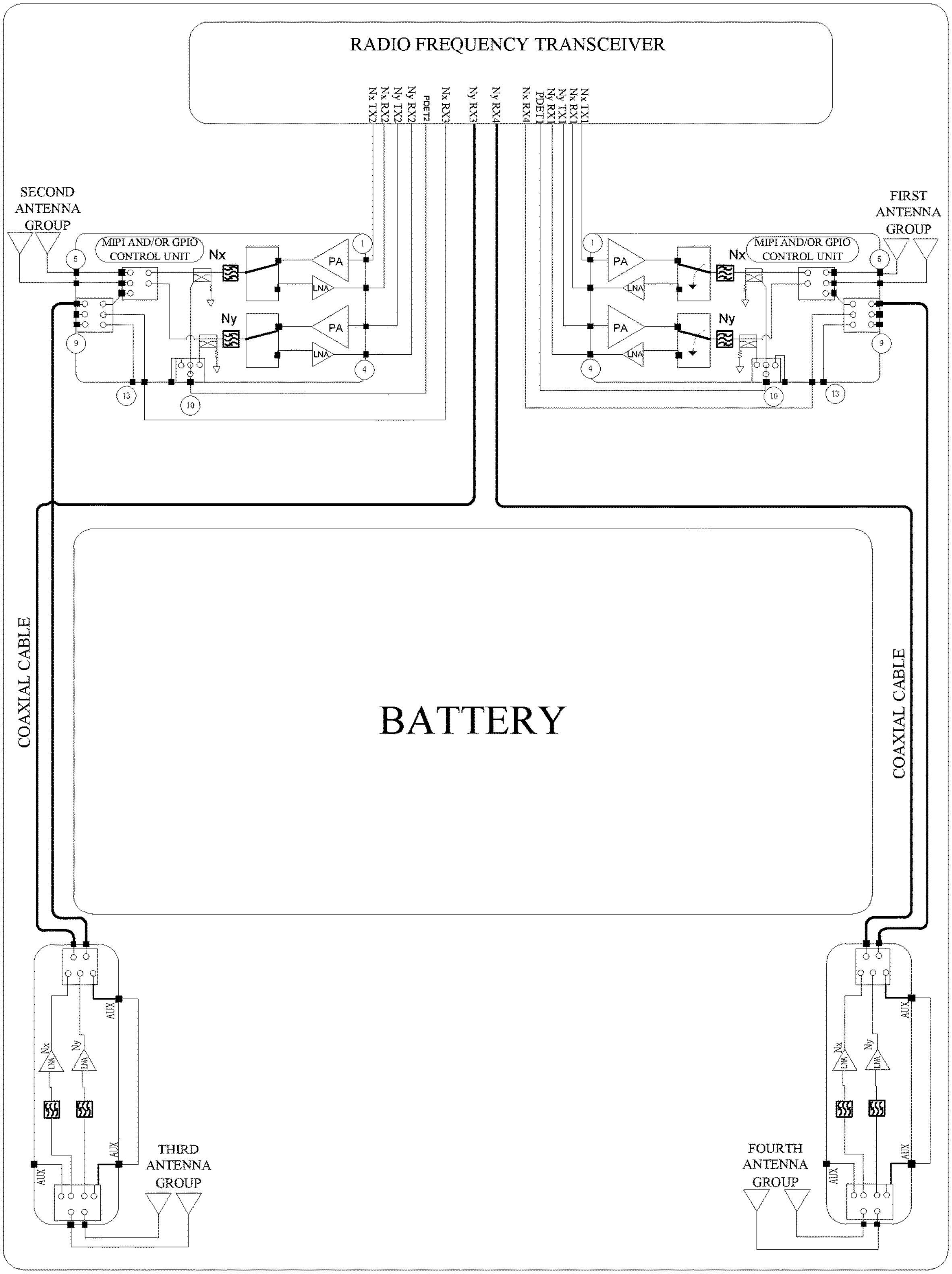
FIG. 3T is a schematic structural diagram illustrating a radio frequency system according to another implementation of the present disclosure.

As illustrated in FIG. 3T, in this example, the radio frequency architecture has the following function: ① supporting 5G NR dual-band; ② supporting DL CA; ③ supporting SRS switching in four antennas; ④ supporting NR 2T4R (four transmitting paths and eight receiving paths in total).

The radio frequency architecture for 5G includes a radio frequency transceiver, two transmitting modules (a first transmitting module and a second transmitting module), two receiving modules (a first receiving module and a second receiving module), and four antenna groups (a first antenna group, a second antenna group, a third antenna group, and a fourth antenna group). The radio frequency transceiver, the first transmitting module, and the second transmitting module are disposed on a main board (two modules above a battery in this figure). The first receiving module and the second receiving module are disposed on a sub board (two modules below the battery in this figure). Each receiving module is disposed adjacent to an antenna with which the receiving module is coupled.

The first transmitting module is disposed adjacent to the first antenna group. The second transmitting module is disposed adjacent to the second antenna group. The first receiving module is disposed adjacent to the third antenna group. The second receiving module is disposed adjacent to the fourth antenna group.

The structure and connection of internal devices of the transmitting module are similar to that of the transmitting module in FIG. 2M. Each receiving module is the receiving module illustrated in FIG. 1L. The second receiving module has a second transfer switch, which has a P port coupled with a seventh external port of the first transmitting module and has a third T port coupled with an AUX of the second receiving module. The AUX is coupled with another AUX of the second receiving module, to support transmitting an SRS TX signal. The first receiving module has a second transfer switch, which has a P port coupled with a seventh external port of the second transmitting module and has a third T port coupled with an AUX of first receiving module. The AUX is coupled with another AUX of first receiving module, to support transmitting an SRS TX signal.

The radio frequency transceiver has a first transmitting port Nx TX1 in a first band coupled with a first external port of the first transmitting module. The radio frequency transceiver has a first transmitting port Ny TX1 in a second band coupled with a third external port of the first transmitting module. The radio frequency transceiver has a second transmitting port Nx TX2 in the first band coupled with a first external port of the second transmitting module. The radio frequency transceiver has a second transmitting port Ny TX2 in the second band coupled with a third external port of the second transmitting module. The radio frequency transceiver has a first receiving port Nx RX1 in the first band coupled with a second external port of the first transmitting module. The radio frequency transceiver has a first receiving port Ny RX1 in the second band coupled with a fourth external port of the first transmitting module. The radio frequency transceiver has a second receiving port Nx RX2 in the first band coupled with a second external port of the second transmitting module. The radio frequency transceiver has a second receiving port Ny RX2 in the second band coupled with a fourth external port of the second transmitting module. The radio frequency transceiver has a third receiving port Nx RX3 in the first band coupled with a twelfth external port of the second transmitting module. The radio frequency transceiver has a third receiving port Ny RX3 in the second band coupled with the other P port of the second transfer switch of the first receiving module. The radio frequency transceiver has a fourth receiving port Ny RX4 in the second band coupled with the other P port of the second transfer switch of the second receiving module. The radio frequency transceiver has a fourth receiving port Nx RX4 in the first band coupled with a twelfth external port of the first transmitting module. The radio frequency transceiver has a first PDET1 port coupled with a tenth external port of the first transmitting module. The radio frequency transceiver has a second PDET2 port coupled with a tenth external port of the second transmitting module.

The first antenna group includes two antennas respectively coupled with a fifth external port and a sixth external port of the first transmitting module. The second antenna group includes two antennas respectively coupled with a fifth external port and a sixth external port of the second transmitting module. The third antenna group includes two antennas respectively coupled with two P port of a first transfer switch of the first receiving module. The fourth antenna group includes two antennas respectively coupled with two P port of a first transfer switch of the second receiving module.

An electronic device including the radio frequency architecture described above switches on a transmitting path between a transmitting port in a target band of the radio frequency transceiver and a target antenna group in the radio frequency system, to transmit a signal through an antenna in the target antenna group.

In an example, the electronic device including the foregoing radio frequency architecture performs, in single-band (for example, Nx band), transmitting an SRS with four antennas in turn or autonomous transmission switching as follows.

In a first transmission period, the electronic device controls a first T port of a first channel selector-switch of the first transmitting module to be connected to a first P port of the first channel selector-switch, to transmit a signal, and controls the first T port of the first channel selector-switch of the first transmitting module to be connected to a third P port of the first channel selector-switch and a first T port of a second channel selector-switch of the first transmitting module to be connected to a first P of the second channel selector-switch, to transmit a signal, to achieve signal transmission through antennas of antenna groups.

In a second transmission period, the electronic device controls a first T port of a first channel selector-switch of the second transmitting module to be connected to a first P port of the first channel selector-switch, to transmit a signal, and controls the first T port of the first channel selector-switch of the second transmitting module to be connected to a third P port of the first channel selector-switch and a first T port of a second channel selector-switch of the second transmitting module to be connected to a first P of the second channel selector-switch, to transmit a signal, to achieve signal transmission through antennas of antenna groups.

Figure 3U:
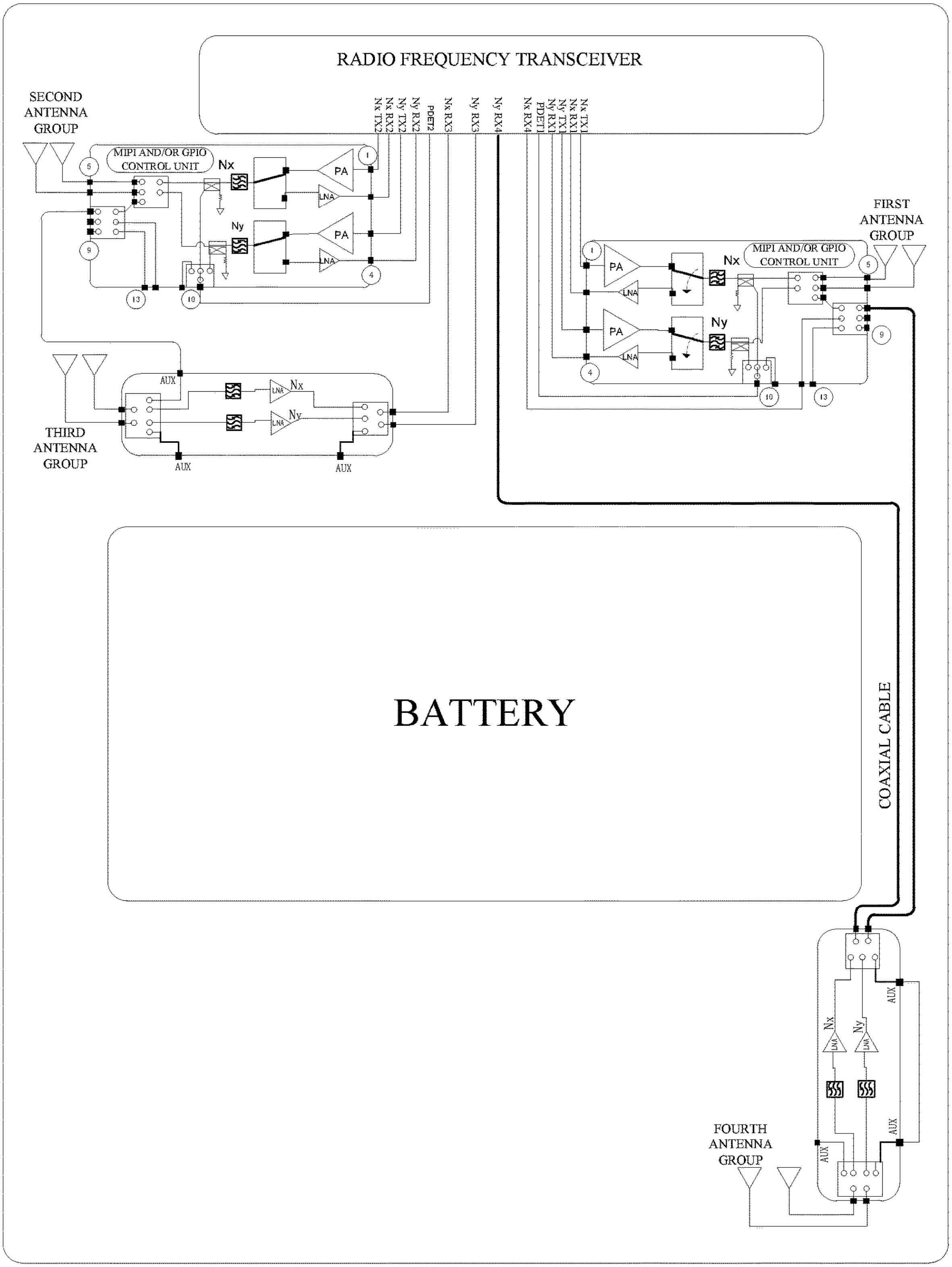
FIG. 3U is a schematic structural diagram illustrating a radio frequency system according to another implementation of the present disclosure.

As illustrated in FIG. 3U, in this example, the radio frequency architecture has the following function: ① supporting 5G NR dual-band; ② supporting DL CA; ③ supporting SRS switching in four antennas; ④ supporting NR 2T4R (four transmitting paths and eight receiving paths in total).

The radio frequency architecture for 5G includes a radio frequency transceiver, two transmitting modules (a first transmitting module and a second transmitting module), two receiving modules (a first receiving module and a second receiving module), and four antenna groups (a first antenna group, a second antenna group, a third antenna group, and a fourth antenna group). The radio frequency transceiver, the first transmitting module, the second transmitting module, and the first receiving module are disposed on a main board (three modules above a battery in this figure). The second receiving module is disposed on a sub board (one module below the battery in this figure). Each receiving module is disposed adjacent to an antenna with which the receiving module is coupled.

The first transmitting module is disposed adjacent to the first antenna group. The second transmitting module is disposed adjacent to the second antenna group. The first receiving module is disposed adjacent to the third antenna group. The second receiving module is disposed adjacent to the fourth antenna group.

The structure and connection of internal devices of the transmitting module are similar to that of the transmitting module in FIG. 2M. Each receiving module is the receiving module illustrated in FIG. 1L. The second receiving module has a second transfer switch, which a P port coupled with a seventh external port of the first transmitting module and has a third T port coupled with an AUX of the second receiving module. The AUX is coupled with another AUX of the second receiving module, to support transmitting an SRS TX signal. The first receiving module has an AUX (an AUX coupled with a first transfer switch of the first receiving module) coupled with a seventh external port of the second transmitting module, to support transmitting an SRS TX signal through a corresponding antenna or self-switching among antennas for signal transmission.

The radio frequency transceiver has a first transmitting port Nx TX1 in a first band coupled with a first external port of the first transmitting module. The radio frequency transceiver has a first transmitting port Ny TX1 in a second band coupled with a third external port of the first transmitting module. The radio frequency transceiver has a second transmitting port Nx TX2 in the first band coupled with a first external port of the second transmitting module. The radio frequency transceiver has a second transmitting port Ny TX2 in the second band coupled with a third external port of the second transmitting module. The radio frequency transceiver has a first receiving port Nx RX1 in the first band coupled with a second external port of the first transmitting module. The radio frequency transceiver has a first receiving port Ny RX1 in the second band coupled with a fourth external port of the first transmitting module. The radio frequency transceiver has a second receiving port Nx RX2 in the first band coupled with a second external port of the second transmitting module. The radio frequency transceiver has a second receiving port Ny RX2 in the second band coupled with a fourth external port of the second transmitting module. The radio frequency transceiver has a third receiving port Nx RX3 in the first band coupled with one P port of a second transfer switch of the first receiving module. The radio frequency transceiver has a third receiving port Ny RX3 in the second band coupled with the other P port of the second transfer switch of the first receiving module. The radio frequency transceiver has a fourth receiving port Ny RX4 in the second band coupled with the other P port of the second transfer switch of the second receiving module. The radio frequency transceiver has a fourth receiving port Nx RX4 in the first band coupled with a twelfth external port of the first transmitting module. The radio frequency transceiver has a first PDET1 port coupled with a tenth external port of the first transmitting module. The radio frequency transceiver has a second PDET2 port coupled with a tenth external port of the second transmitting module.

The first antenna group includes two antennas respectively coupled with a fifth external port and a sixth external port of the first transmitting module. The second antenna group includes two antennas respectively coupled with a fifth external port and a sixth external port of the second transmitting module. The third antenna group includes two antennas respectively coupled with two P port of the first transfer switch of the first receiving module. The fourth antenna group includes two antennas respectively coupled with two P port of a first transfer switch of the second receiving module.

An electronic device including the radio frequency architecture described above switches on a transmitting path between a transmitting port in a target band of the radio frequency transceiver and a target antenna group in the radio frequency system, to transmit a signal through an antenna in the target antenna group.

In an example, the electronic device including the foregoing radio frequency architecture performs, in single-band (for example, Nx band), transmitting an SRS with four antennas in turn or autonomous transmission switching as follows.

In a first transmission period, the electronic device controls a first T port of a first channel selector-switch of the first transmitting module to be connected to a first P port of the first channel selector-switch, to transmit a signal, and controls the first T port of the first channel selector-switch of the first transmitting module to be connected to a third P port of the first channel selector-switch and a first T port of a second channel selector-switch of the first transmitting module to be connected to a first P of the second channel selector-switch, to transmit a signal, to achieve signal transmission through antennas of antenna groups.

In a second transmission period, the electronic device controls a first T port of a first channel selector-switch of the second transmitting module to be connected to a first P port of the first channel selector-switch, to transmit a signal, and controls the first T port of the first channel selector-switch of the second transmitting module to be connected to a third P port of the first channel selector-switch and a first T port of a second channel selector-switch of the second transmitting module to be connected to a first P of the second channel selector-switch, to transmit a signal, to achieve signal transmission through antennas of antenna groups.

Figure 3V:
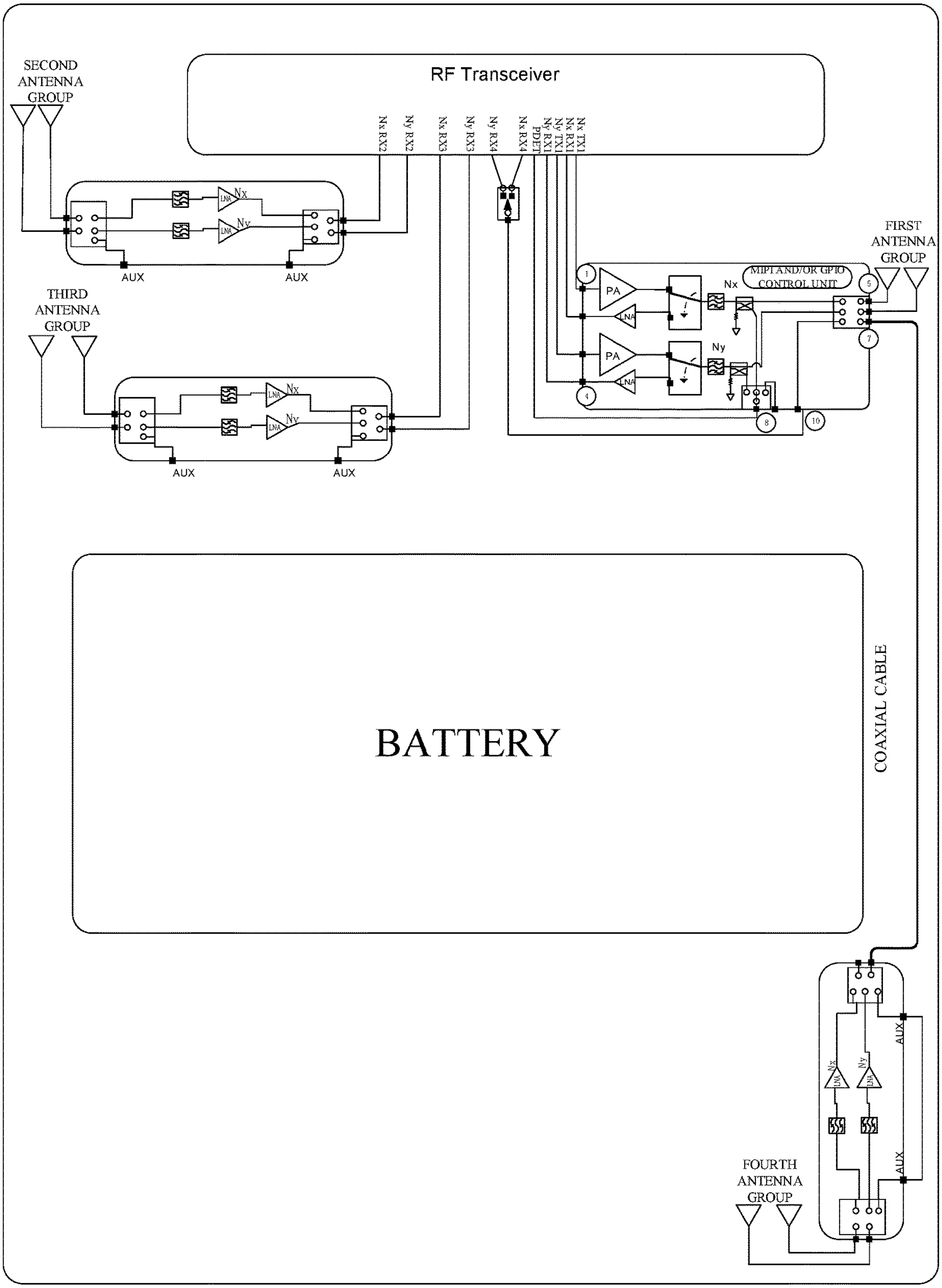
FIG. 3V is a schematic structural diagram illustrating a radio frequency system according to another implementation of the present disclosure.

As illustrate in FIG. 3V, in this example, the radio frequency architecture has the following function: ① supporting 5G NR dual-band; ② not supporting DL CA; ③ not supporting transmission of an SSR with four antennas in a polling manner; ④ supporting NR 1T4R (one transmitting path and four receiving paths in single-band).

The radio frequency architecture for 5G includes a radio frequency transceiver, one transmitting module, three receiving modules (a first receiving module, a second receiving module, and a third receiving module), four antenna groups (a first antenna group, a second antenna group, a third antenna group, and a fourth antenna group), and one receiving port selector-switch (including an SPDT switch). The radio frequency transceiver, the transmitting module, the first receiving module, the second receiving module, and the receiving port selector-switch are disposed on a main board (three modules above a battery in this figure). The third receiving module is disposed on a sub board (one module below the battery in this figure). Each receiving module is disposed adjacent to an antenna with which the receiving module is coupled.

The transmitting module is disposed adjacent to the first antenna group. The first receiving module is disposed adjacent to the second antenna group. The second receiving module is disposed adjacent to the third antenna group. The third receiving module is disposed adjacent to the fourth antenna group.

The structure and connection of internal devices of the transmitting module are similar to that of the transmitting module in FIG. 2J. The internal devices and connection therebetween of each receiving module are similar to that of the receiving module in FIG. 1M.

The radio frequency transceiver has a transmitting port Nx TX in a first band coupled with a first external port of the transmitting module. The radio frequency transceiver has a transmitting port Ny TX in a second band coupled with a third external port of the transmitting module. The radio frequency transceiver has a first receiving port Nx RX1 in the first band coupled with a second external port of the transmitting module. The radio frequency transceiver has a first receiving port Ny RX1 in the second band coupled with a fourth external port of the transmitting module. The radio frequency transceiver has a PDET port coupled with an eighth external port of the transmitting module. The radio frequency transceiver has a fourth receiving port Nx RX4 in the first band and a fourth receiving port Ny RX4 in the second band coupled with two T port of the receiving port selector-switch. The receiving port selector-switch has a P port coupled with a tenth external port of the transmitting module. The radio frequency transceiver has a third receiving port Nx RX3 in the first band coupled with one P port of a second transfer switch of the second receiving module. The radio frequency transceiver has a third receiving port Ny RX3 in the second band coupled with the other P port of the second transfer switch of the second receiving module. The radio frequency transceiver has a second receiving port Nx RX2 in the first band coupled with one P port of a second transfer switch of the first receiving module. The radio frequency transceiver has a second receiving port Ny RX2 in the second band coupled with the other P port of the second transfer switch of the first receiving module.

The first antenna group includes two antennas respectively coupled with a fifth external port and a sixth external port of the transmitting module. The second antenna group includes two antennas respectively coupled with two P port of a first transfer switch of the first receiving module. The third antenna group includes two antennas respectively coupled with two P port of a first transfer switch of the second receiving module. The fourth antenna group includes two antennas respectively coupled with two P port of a first transfer switch of the third receiving module.

An electronic device including the radio frequency architecture described above switches on a transmitting path between a transmitting port in a target band of the radio frequency transceiver and a target antenna group in the radio frequency system, to transmit a signal through an antenna in the target antenna group.

In an example, the electronic device including the foregoing radio frequency architecture performs, in single-band (for example, Nx band), switching among transmit antennas as follows.

In a first transmission period, the electronic device controls a first T port of a channel selector-switch of the transmitting module to be connected to a first P port of the channel selector-switch, to transmit a signal through an antenna of the first antenna group.

In a second transmission period, the electronic device controls the first T port of the channel selector-switch of the transmitting module to be connected to a second P port of the channel selector-switch, to transmit a signal through the other antenna of the first antenna group.

In a third transmission period, the electronic device controls the first T port of the channel selector-switch of the transmitting module to be connected to a third P port of the channel selector-switch, and controls a Bypass channel of the third receiving module to switch on and a third T port of the first transfer switch of the third receiving module to be connected to one P port of the first transfer switch, to transmit a signal through an antenna of the fourth antenna group.

In a fourth transmission period, the electronic device controls the first T port of the channel selector-switch of the transmitting module to remain connected to the third P port of the channel selector-switch, and controls the Bypass channel of the third receiving module to switch on and the third T port of the first transfer switch of the third receiving module to be connected to the other P port of the first transfer switch, to transmit a signal through the other antenna of the fourth antenna group.

Figure 3W:
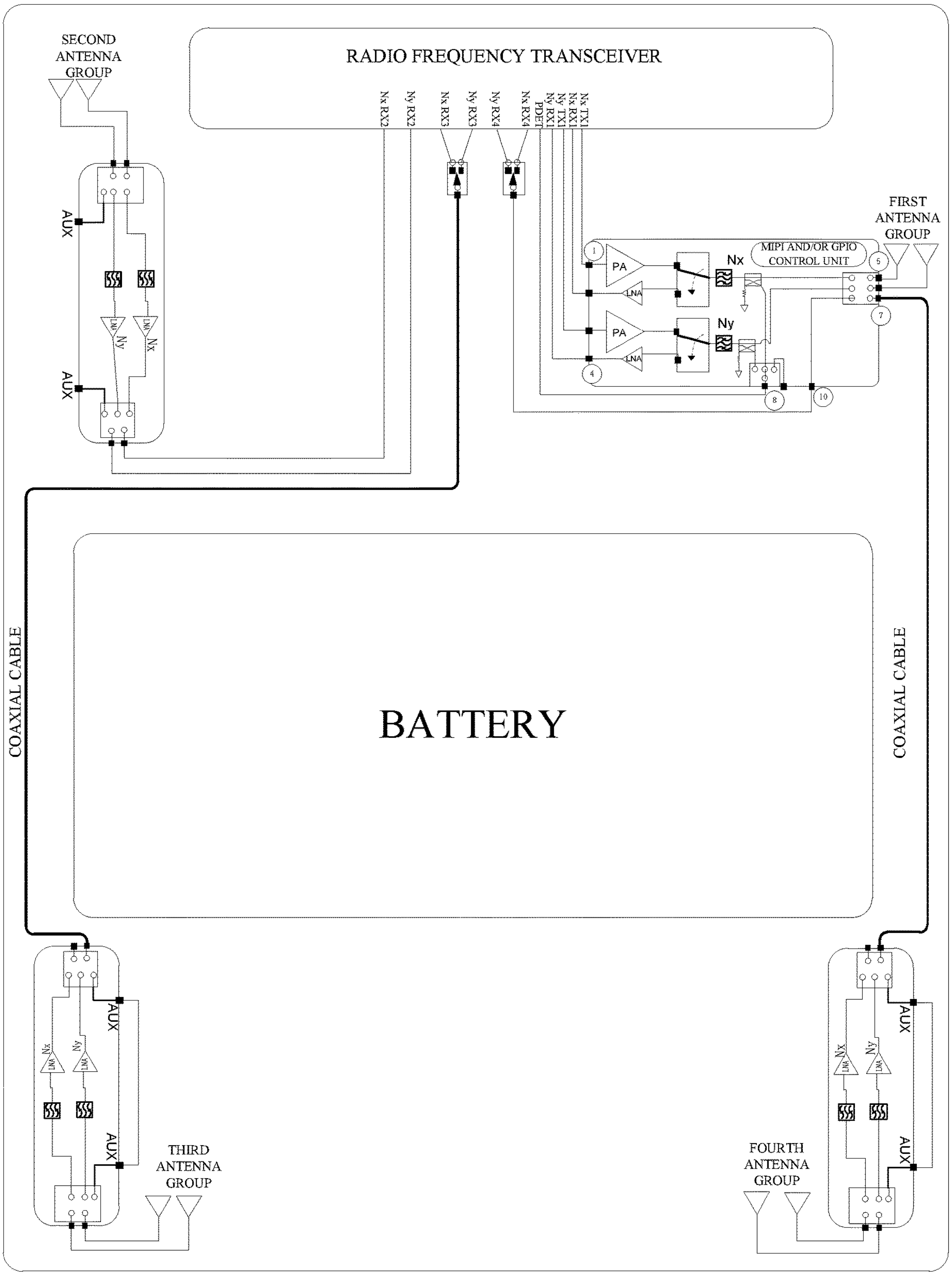
FIG. 3W is a schematic structural diagram illustrating a radio frequency system according to another implementation of the present disclosure.

As illustrate in FIG. 3W, in this example, the radio frequency architecture has the following function: ① supporting 5G NR dual-band; ② not supporting DL CA; ③ not supporting transmission of an SSR with four antennas in a polling manner; ④ supporting NR 1T4R (one transmitting path and four receiving paths in single-band).

The radio frequency architecture for 5G includes a radio frequency transceiver, one transmitting module, three receiving modules (a first receiving module, a second receiving module, and a third receiving module), four antenna groups (a first antenna group, a second antenna group, a third antenna group, and a fourth antenna group), and two receiving port selector-switch (a first receiving port selector-switch and a second receiving port selector-switch, embodied as SPDT switches). The radio frequency transceiver, the transmitting module, the first receiving module, and the two receiving port selector-switches are disposed on a main board (two modules above a battery in this figure). The second receiving module and the third receiving module is disposed on a sub board (two modules below the battery in this figure). Each receiving module is disposed adjacent to an antenna with which the receiving module is coupled.

The transmitting module is disposed adjacent to the first antenna group. The first receiving module is disposed adjacent to the second antenna group. The second receiving module is disposed adjacent to the third antenna group. The third receiving module is disposed adjacent to the fourth antenna group.

The structure and connection of internal devices of the transmitting module are similar to that of the transmitting module in FIG. 2J. The internal devices and connection therebetween of each receiving module are similar to that of the receiving module in FIG. 1M.

The radio frequency transceiver has a transmitting port Nx TX in a first band coupled with a first external port of the transmitting module. The radio frequency transceiver has a transmitting port Ny TX in a second band coupled with a third external port of the transmitting module. The radio frequency transceiver has a first receiving port Nx RX1 in the first band coupled with a second external port of the transmitting module. The radio frequency transceiver has a first receiving port Ny RX1 in the second band coupled with a fourth external port of the transmitting module. The radio frequency transceiver has a PDET port coupled with an eighth external port of the transmitting module. The radio frequency transceiver has a fourth receiving port Nx RX4 in the first band and a fourth receiving port Ny RX4 in the second band coupled with two T port of the first receiving port selector-switch. The first receiving port selector-switch has a P port coupled with a tenth external port of the transmitting module. The radio frequency transceiver has a third receiving port Nx RX3 in the first band and a third receiving port Ny RX3 in the second band coupled with two T port of the second receiving port selector-switch. The second receiving port selector-switch has a P port coupled with a P port of a second transfer switch of the second receiving module. The radio frequency transceiver has a second receiving port Nx RX2 in the first band coupled with one P port of a second transfer switch of the first receiving module. The radio frequency transceiver has a second receiving port Ny RX2 in the second band coupled with the other P port of the second transfer switch of the first receiving module.

The first antenna group includes two antennas respectively coupled with a fifth external port and a sixth external port of the transmitting module. The second antenna group includes two antennas respectively coupled with two P port of a first transfer switch of the first receiving module. The third antenna group includes two antennas respectively coupled with two P port of a first transfer switch of the second receiving module. The fourth antenna group includes two antennas respectively coupled with two P port of a first transfer switch of the third receiving module.

An electronic device including the radio frequency architecture described above switches on a transmitting path between a transmitting port in a target band of the radio frequency transceiver and a target antenna group in the radio frequency system, to transmit a signal through an antenna in the target antenna group.

In an example, the electronic device including the foregoing radio frequency architecture performs, in single-band (for example, Nx band), a switching among transmit antennas as follows.

In a first transmission period, the electronic device controls a first T port of a channel selector-switch of the transmitting module to be connected to a first P port of the channel selector-switch, to transmit a signal through an antenna of the first antenna group.

In a second transmission period, the electronic device controls the first T port of the channel selector-switch of the transmitting module to be connected to a second P port of the channel selector-switch, to transmit a signal through the other antenna of the first antenna group.

In a third transmission period, the electronic device controls the first T port of the channel selector-switch of the transmitting module to be connected to a third P port of the channel selector-switch, and controls a Bypass channel of the third receiving module to switch on and a third T port of the first transfer switch of the third receiving module to be connected to one P port of the first transfer switch, to transmit a signal through an antenna of the fourth antenna group.

In a fourth transmission period, the electronic device controls the first T port of the channel selector-switch of the transmitting module to remain connected to the third P port of the channel selector-switch, and controls the Bypass channel of the third receiving module to switch on and the third T port of the first transfer switch of the third receiving module to be connected to the other P port of the first transfer switch, to transmit a signal through the other antenna of the fourth antenna group.

Figure 3X:
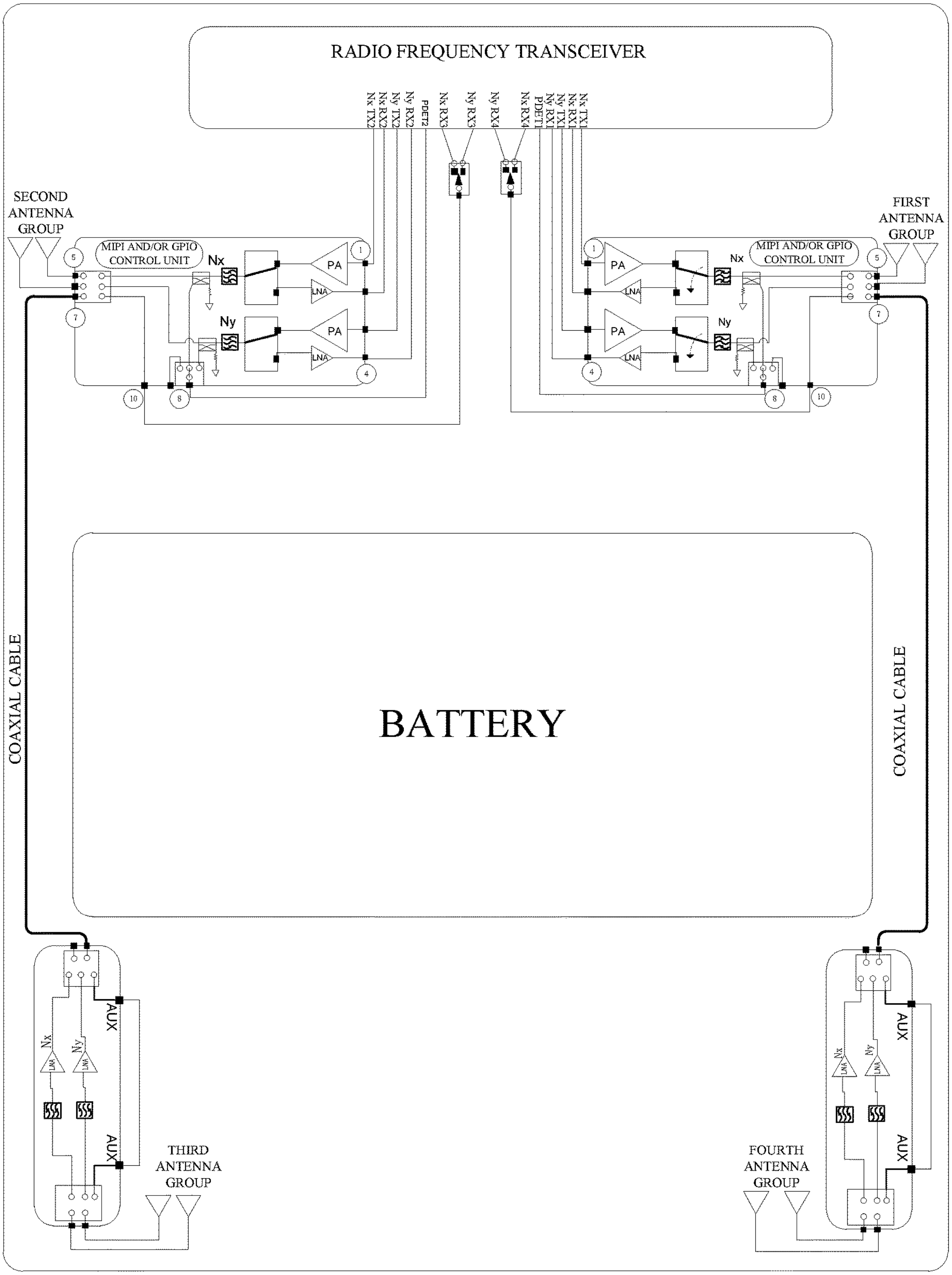
FIG. 3X is a schematic structural diagram illustrating a radio frequency system according to another implementation of the present disclosure.

As illustrate in FIG. 3X, in this example, the radio frequency architecture has the following function: ① supporting 5G NR dual-band; ② not supporting DL CA; ③ not supporting transmission of an SSR with four antennas in a polling manner; ④ supporting NR 2T4R (one transmitting path and four receiving paths in single-band).

The radio frequency architecture for 5G includes a radio frequency transceiver, two transmitting modules (a first transmitting module and a second transmitting module), two receiving modules (a first receiving module and a second receiving module), four antenna groups (a first antenna group, a second antenna group, a third antenna group, and a fourth antenna group), and two receiving port selector-switches (a first receiving port selector-switch and a second receiving port selector-switch, embodied as SPDT switches). The radio frequency transceiver, the first transmitting module, the second transmitting module, and the two receiving port selector-switches are disposed on a main board (two modules above a battery in this figure). The first receiving module and the second receiving module are disposed on a sub board (two modules below the battery in this figure). Each receiving module is disposed adjacent to an antenna with which the receiving module is coupled.

The first transmitting module is disposed adjacent to the first antenna group. The second transmitting module is disposed adjacent to the second antenna group. The first receiving module is disposed adjacent to the third antenna group. The second receiving module is disposed adjacent to the fourth antenna group.

The structure and connection of internal devices of the transmitting module are similar to that of the transmitting module in FIG. 2J. The internal devices and connection therebetween of each receiving module are similar to that of the receiving module in FIG. 1M.

The radio frequency transceiver has a first transmitting port Nx TX1 in a first band coupled with a first external port of the first transmitting module. The radio frequency transceiver has a first transmitting port Ny TX1 in a second band coupled with a third external port of the first transmitting module. The radio frequency transceiver has a second transmitting port Nx TX2 in the first band coupled with a first external port of the second transmitting module. The radio frequency transceiver has a second transmitting port Ny TX2 in the second band coupled with a third external port of the second transmitting module. The radio frequency transceiver has a first receiving port Nx RX1 in the first band coupled with a second external port of the first transmitting module. The radio frequency transceiver has a first receiving port Ny RX1 in the second band coupled with a fourth external port of the first transmitting module. The radio frequency transceiver has a second receiving port Nx RX2 in the first band coupled with a second external port of the second transmitting module. The radio frequency transceiver has a second receiving port Ny RX2 in the second band coupled with a fourth external port of the second transmitting module. The radio frequency transceiver has a first PDET1 port coupled with an eighth external port of the first transmitting module. The radio frequency transceiver has a second PDET2 port coupled with an eighth external port of the second transmitting module. The radio frequency transceiver has a fourth receiving port Nx RX4 in the first band and a fourth receiving port Ny RX4 in the second band coupled with two T port of the first receiving port selector-switch. The first receiving port selector-switch has a P port coupled with a tenth external port of the first transmitting module. The radio frequency transceiver has a third receiving port Nx RX3 in the first band and a third receiving port Ny RX3 in the second band coupled with two T port of the second receiving port selector-switch. The second receiving port selector-switch has a P port coupled with a tenth external port of the second transmitting module.

The first antenna group includes two antennas respectively coupled with a fifth external port and a sixth external port of the first transmitting module. The second antenna group includes two antennas respectively coupled with a fifth external port and a sixth external port of the second transmitting module. The third antenna group includes two antennas respectively coupled with two P port of a first transfer switch of the first receiving module. The fourth antenna group includes two antennas respectively coupled with two P port of a first transfer switch of the second receiving module.

An electronic device including the radio frequency architecture described above switches on a transmitting path between a transmitting port in a target band of the radio frequency transceiver and a target antenna group in the radio frequency system, to transmit a signal through an antenna in the target antenna group.

In an example, the electronic device including the foregoing radio frequency architecture performs, in single-band (for example, Nx band), switching among transmit antennas as follows.

In a first transmission period, the electronic device controls a first T port of a channel selector-switch of the first transmitting module to be connected to a first P port or a second P port of the channel selector-switch to transmit a signal, and controls the first T port of the channel selector-switch of the first transmitting module to be connected to a third P port of the channel selector-switch and a Bypass channel of the second receiving module to switch on to transmit a signal, to achieve signal transmission through antennas of the first antenna group and the fourth antenna group.

In a second transmission period, the electronic device controls a first T port of a channel selector-switch of the second transmitting module to be connected to a first P port or a second P port of the channel selector-switch to transmit a signal, and controls the first T port of the channel selector-switch of the second transmitting module to be connected to a third P port of the channel selector-switch and a Bypass channel of the first receiving module to switch on to transmit a signal, to achieve signal transmission through antennas of the second antenna group and the third antenna group.

Figure 3Y:
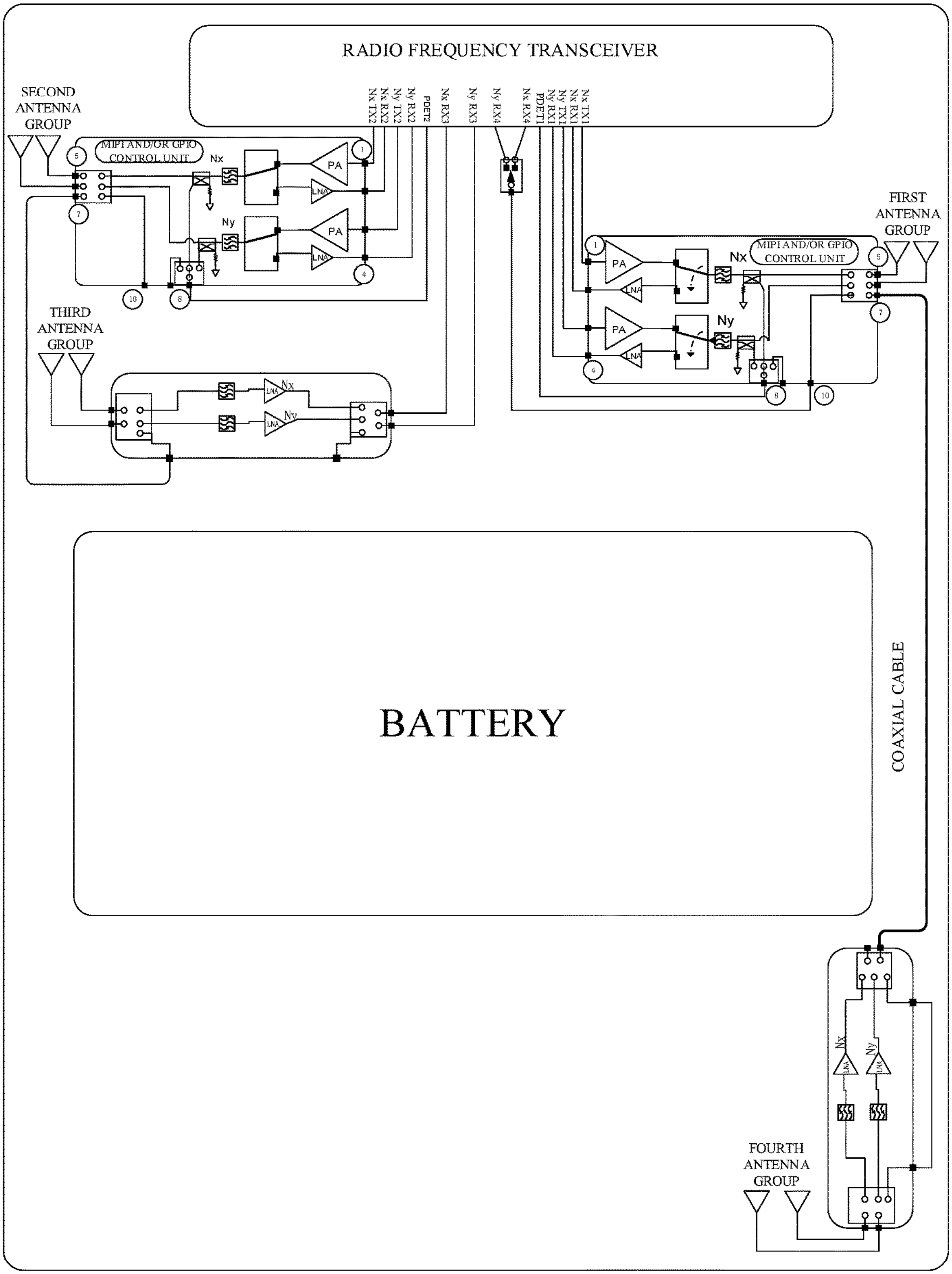
FIG. 3Y is a schematic structural diagram illustrating a radio frequency system according to another implementation of the present disclosure.

As illustrate in FIG. 3Y, in this example, the radio frequency architecture has the following function: ① supporting 5G NR dual-band; ② not supporting DL CA; ③ not supporting transmission of an SSR with four antennas in a polling manner; ④ supporting NR 2T4R (one transmitting path and four receiving paths in single-band).

The radio frequency architecture for 5G includes a radio frequency transceiver, two transmitting modules (a first transmitting module and a second transmitting module), two receiving modules (a first receiving module and a second receiving module), four antenna groups (a first antenna group, a second antenna group, a third antenna group, and a fourth antenna group), and one receiving port selector-switch (including an SPDT switch). The radio frequency transceiver, the first transmitting module, the second transmitting module, the first receiving module, and the receiving port selector-switch are disposed on a main board (three modules above a battery in this figure). The second receiving module is disposed on a sub board (one module below the battery in this figure). Each receiving module is disposed adjacent to an antenna with which the receiving module is coupled.

The first transmitting module is disposed adjacent to the first antenna group. The second transmitting module is disposed adjacent to the second antenna group. The first receiving module is disposed adjacent to the third antenna group. The second receiving module is disposed adjacent to the fourth antenna group.

The structure and connection of internal devices of the transmitting module are similar to that of the transmitting module in FIG. 2J. The internal devices and connection therebetween of each receiving module are similar to that of the receiving module in FIG. 1M.

The radio frequency transceiver has a first transmitting port Nx TX1 in a first band coupled with a first external port of the first transmitting module. The radio frequency transceiver has a first transmitting port Ny TX1 in a second band coupled with a third external port of the first transmitting module. The radio frequency transceiver has a second transmitting port Nx TX2 in the first band coupled with a first external port of the second transmitting module. The radio frequency transceiver has a second transmitting port Ny TX2 in the second band coupled with a third external port of the second transmitting module. The radio frequency transceiver has a first receiving port Nx RX1 in the first band coupled with a second external port of the first transmitting module. The radio frequency transceiver has a first receiving port Ny RX1 in the second band coupled with a fourth external port of the first transmitting module. The radio frequency transceiver has a second receiving port Nx RX2 in the first band coupled with a second external port of the second transmitting module. The radio frequency transceiver has a second receiving port Ny RX2 in the second band coupled with a fourth external port of the second transmitting module. The radio frequency transceiver has a first PDET1 port coupled with an eighth external port of the first transmitting module. The radio frequency transceiver has a second PDET2 port coupled with an eighth external port of the second transmitting module. The radio frequency transceiver has a fourth receiving port Nx RX4 in the first band and a fourth receiving port Ny RX4 in the second band coupled with two T port of the receiving port selector-switch. The receiving port selector-switch has a P port coupled with a tenth external port of the first transmitting module. The radio frequency transceiver has a third receiving port Nx RX3 in the first band coupled with one P port of a second transfer switch of the first receiving module. The radio frequency transceiver has a third receiving port Ny RX3 in the second band coupled with the other P port of the second transfer switch of the first receiving module.

The first antenna group includes two antennas respectively coupled with a fifth external port and a sixth external port of the first transmitting module. The second antenna group includes two antennas respectively coupled with a fifth external port and a sixth external port of the second transmitting module. The third antenna group includes two antennas respectively coupled with two P port of a first transfer switch of the first receiving module. The fourth antenna group includes two antennas respectively coupled with two P port of a first transfer switch of the second receiving module.

An electronic device including the radio frequency architecture described above switches on a transmitting path between a transmitting port in a target band of the radio frequency transceiver and a target antenna group in the radio frequency system, to transmit a signal through an antenna in the target antenna group.

In an example, the electronic device including the foregoing radio frequency architecture performs, in single-band (for example, Nx band), switching among transmit antennas as follows.

In a first transmission period, the electronic device controls a first T port of a channel selector-switch of the first transmitting module to be connected to a first P port or a second P port of the channel selector-switch to transmit a signal, and controls the first T port of the channel selector-switch of the first transmitting module to be connected to a third P port of the channel selector-switch and a Bypass channel of the second receiving module to switch on to transmit a signal, to achieve signal transmission through antennas of the first antenna group and the fourth antenna group.

In a second transmission period, the electronic device controls a first T port of a channel selector-switch of the second transmitting module to be connected to a first P port or a second P port of the channel selector-switch to transmit a signal, and controls the first T port of the channel selector-switch of the second transmitting module to be connected to a third P port of the channel selector-switch and a Bypass channel of the first receiving module to switch on to transmit a signal, to achieve signal transmission through antennas of the second antenna group and the third antenna group.

Figure 3Z:
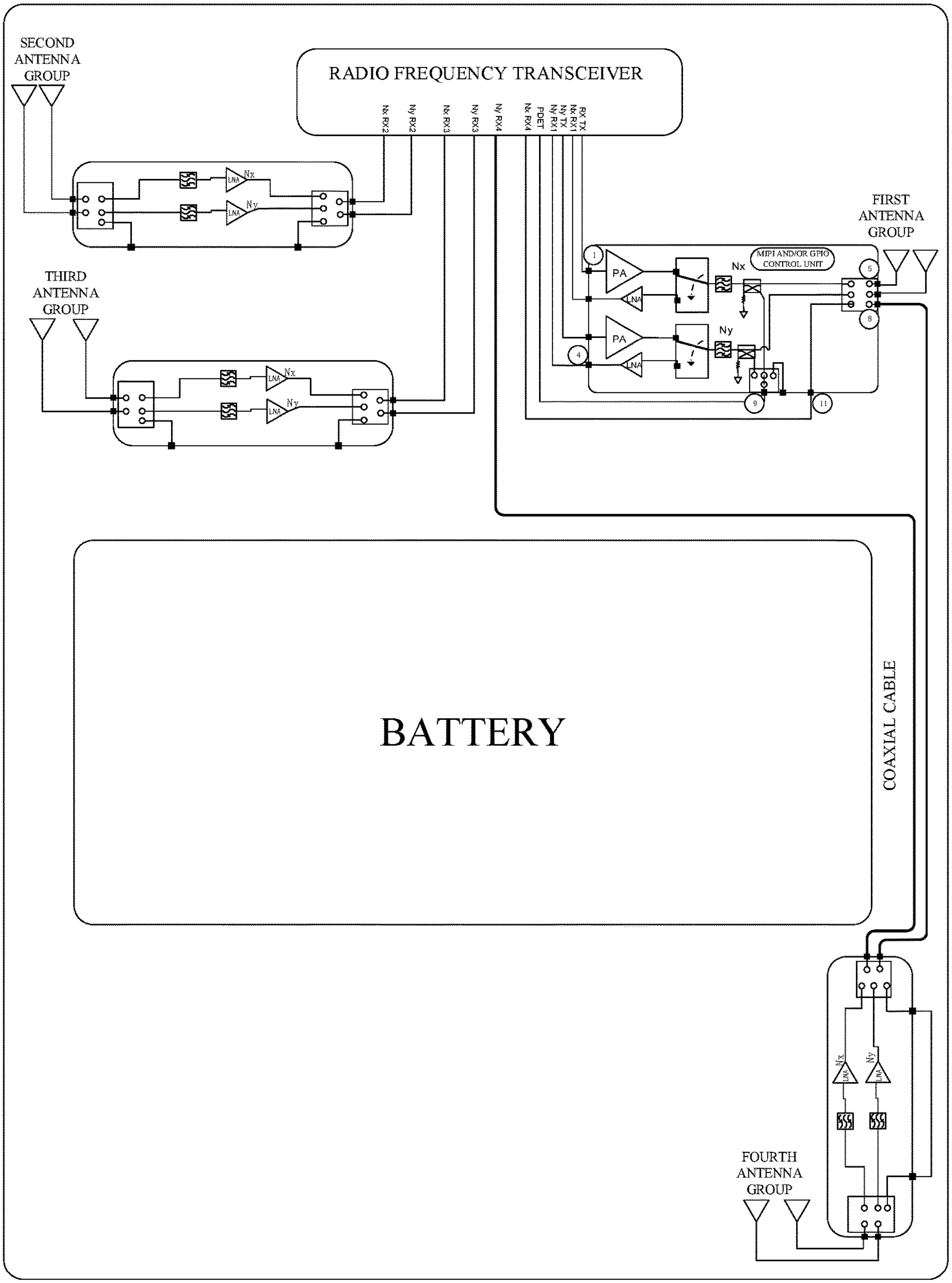
FIG. 3Z is a schematic structural diagram illustrating a radio frequency system according to another implementation of the present disclosure.

As illustrate in FIG. 3Z, in this example, the radio frequency architecture has the following function: ① supporting 5G NR dual-band; ② not supporting UL CA; ③ supporting DL CA; ④ not supporting transmission of an SSR with four antennas in a polling manner; ⑤ supporting NR 1T4R (dual-band, one transmitting path and four receiving paths).

The radio frequency architecture for 5G includes a radio frequency transceiver, one transmitting module, three receiving modules (a first receiving module, a second receiving module, and a third receiving module), and four antenna groups (a first antenna group, a second antenna group, a third antenna group, and a fourth antenna group). Each of the first antenna group, the second antenna group, the third antenna group, and the fourth antenna group includes two antennas. The radio frequency transceiver, the transmitting module, the first receiving module, and the second receiving module are disposed on a main board (three modules above a battery in this figure). The third receiving module is disposed on a sub board (one module below the battery in this figure). Each transmitting module/receiving module is disposed adjacent to an antenna group with which the transmitting module/receiving module is coupled.

The transmitting module is disposed adjacent to the first antenna group. The first receiving module is disposed adjacent to the second antenna group. The second receiving module is disposed adjacent to the third antenna group. The third receiving module is disposed adjacent to the fourth antenna group.

The structure and connection of internal devices of the transmitting module are similar to that of the transmitting module in FIG. 2J. The internal devices and connection therebetween of each receiving module are similar to that of the receiving module in FIG. 1M.

The radio frequency transceiver has a transmitting port Nx TX in an Nx band coupled with a first external port of the transmitting module. The radio frequency transceiver has a transmitting port Ny TX in an Ny band coupled with a third external port of the transmitting module. The radio frequency transceiver has a first receiving port Nx RX1 in the Nx band coupled with a second external port of the transmitting module. The radio frequency transceiver has a first receiving port Ny RX1 in the Ny band coupled with a fourth external port of the transmitting module. The radio frequency transceiver has a PDET port coupled with an eighth external port of the transmitting module. The radio frequency transceiver has a fourth receiving port Nx RX4 in the Nx band coupled with a tenth external port of the transmitting module. The radio frequency transceiver has a fourth receiving port Ny RX4 in the Ny band coupled with a second P port of a second transfer switch of the third receiving module. The radio frequency transceiver has a third receiving port Ny RX3 in the Ny band coupled with a second P port of a second transfer switch of the second receiving module. The radio frequency transceiver has a third receiving port Nx RX3 in the Nx band coupled with a first P port of the second transfer switch of the second receiving module. The radio frequency transceiver has a second receiving port Ny RX2 in the Ny band coupled with a second P port of a second transfer switch of the first receiving module. The radio frequency transceiver has a second receiving port Nx RX2 in the Nx band coupled with a first P port of the second transfer switch of the first receiving module.

The first antenna group includes two antennas respectively coupled with a fifth external port and a sixth external port of the transmitting module. The transmitting module has a seventh external port coupled with a first P port of the second transfer switch of the third receiving module. The second antenna group includes two antennas respectively coupled with two P port of a first transfer switch of the first receiving module. The third antenna group includes two antennas respectively coupled with two P port of a first transfer switch of the second receiving module. The fourth antenna group includes two antennas respectively coupled with two P port of a first transfer switch of the third receiving module.

An electronic device including the radio frequency architecture described above switches on a transmitting path between a transmitting port in a target band of the radio frequency transceiver and a target antenna group in the radio frequency system, to transmit a signal through an antenna in the target antenna group.

In an example, the electronic device including the foregoing radio frequency architecture performs, in single-band (for example, Nx band), switching among transmit antennas as follows.

In a first transmission period, the electronic device controls a first T port of a channel selector-switch of the transmitting module to be connected to a first P port of the channel selector-switch, to transmit a signal through an antenna of the first antenna group.

In a second transmission period, the electronic device controls the first T port of the channel selector-switch of the transmitting module to be connected to a third P port of the channel selector-switch and a Bypass channel of the third receiving module to switch on, to transmit a signal through a first antenna of the fourth antenna group.

Figure 4A:
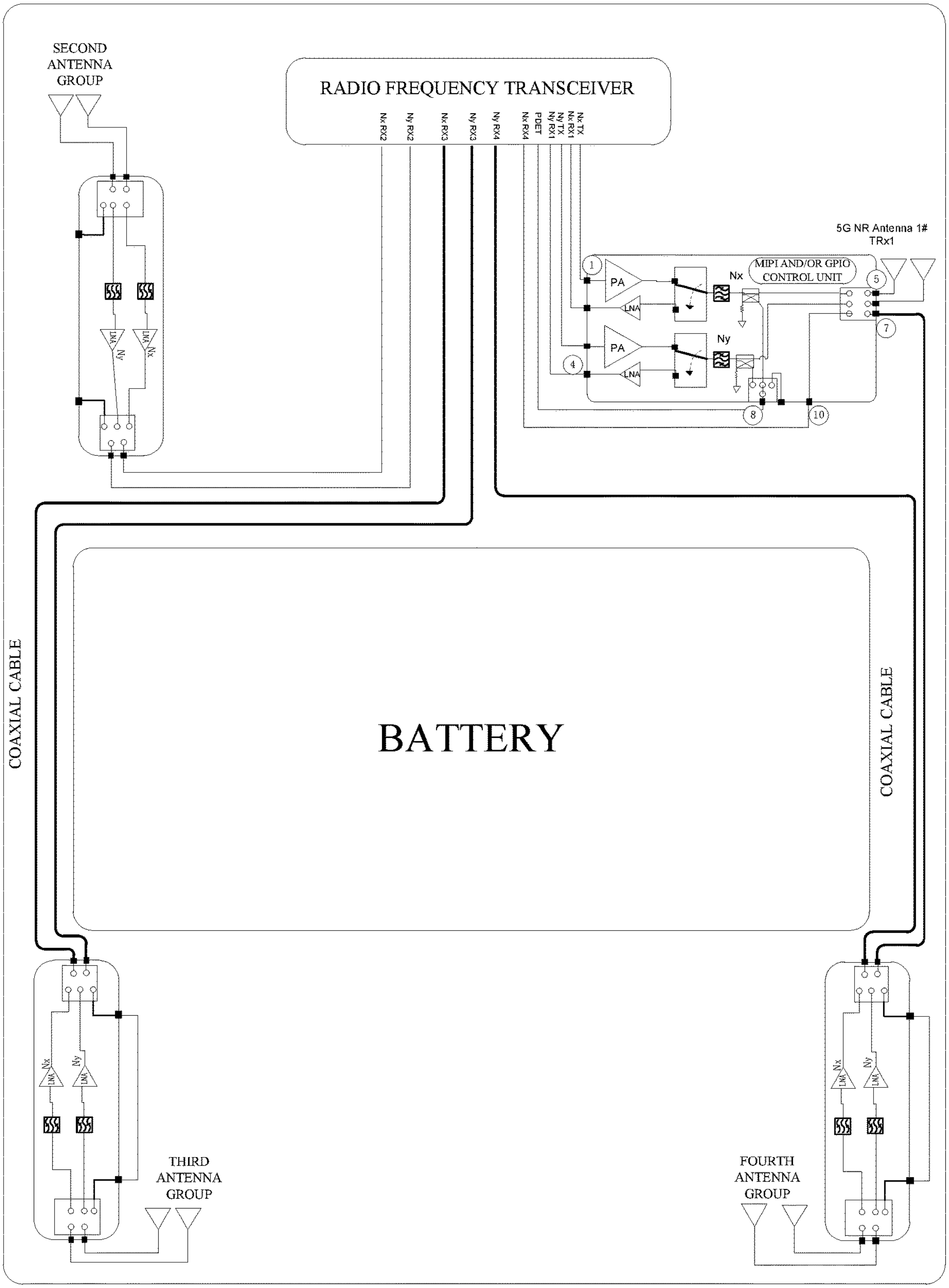
FIG. 4A is a schematic structural diagram illustrating a radio frequency system according to another implementation of the present disclosure.

As illustrated in FIG. 4A, in this example, the radio frequency architecture has the following function: ① supporting 5G NR dual-band; ② not supporting UL CA; ③ supporting DL CA; ④ not supporting transmission of an SSR with four antennas in a polling manner; ⑤ supporting NR 1T4R (dual-band, one transmitting path and four receiving paths).

The radio frequency architecture for 5G includes a radio frequency transceiver, one transmitting module, three receiving modules (a first receiving module, a second receiving module, and a third receiving module), and four antenna groups (a first antenna group, a second antenna group, a third antenna group, and a fourth antenna group). Each of the first antenna group, the second antenna group, the third antenna group, and the fourth antenna group includes two antennas. The radio frequency transceiver, the transmitting module, and the first receiving module are disposed on a main board (two modules above a battery in this figure). The second receiving module and the third receiving module are disposed on a sub board (two modules below the battery in this figure). Each transmitting module/receiving module is disposed adjacent to an antenna group with which the transmitting module/receiving module is coupled. The disclosure is not limited to the manner in which the transmitting module and the receiving modules are placed. For example, the transmitting module or the receiving modules may be horizontally or vertically placed.

The transmitting module is disposed adjacent to the first antenna group. The first receiving module is disposed adjacent to the second antenna group. The second receiving module is disposed adjacent to the third antenna group. The third receiving module is disposed adjacent to the fourth antenna group.

The structure and connection of internal devices of the transmitting module are similar to that of the transmitting module in FIG. 2J. The internal devices and connection therebetween of each receiving module are similar to that of the receiving module in FIG. 1M.

The radio frequency transceiver has a transmitting port Nx TX in an Nx band coupled with a first external port of the transmitting module. The radio frequency transceiver has a transmitting port Ny TX in an Ny band coupled with a third external port of the transmitting module. The radio frequency transceiver has a first receiving port Nx RX1 in the Nx band coupled with a second external port of the transmitting module. The radio frequency transceiver has a first receiving port Ny RX1 in the Ny band coupled with a fourth external port of the transmitting module. The radio frequency transceiver has a PDET port coupled with an eighth external port of the transmitting module. The radio frequency transceiver has a fourth receiving port Nx RX4 in the Nx band coupled with a tenth external port of the transmitting module. The radio frequency transceiver has a fourth receiving port Ny RX4 in the Ny band coupled with a second P port of a second transfer switch of the third receiving module. The radio frequency transceiver has a third receiving port Ny RX3 in the Ny band coupled with a second P port of a second transfer switch of the second receiving module. The radio frequency transceiver has a third receiving port Nx RX3 in the Nx band coupled with a first P port of the second transfer switch of the second receiving module. The radio frequency transceiver has a second receiving port Ny RX2 in the Ny band coupled with a second P port of a second transfer switch of the first receiving module. The radio frequency transceiver has a second receiving port Nx RX2 in the Nx band coupled with a first P port of the second transfer switch of the first receiving module.

The first antenna group includes two antennas respectively coupled with a fifth external port and a sixth external port of the transmitting module. The transmitting module has a seventh external port coupled with a first P port of the second transfer switch of the third receiving module. The second antenna group includes two antennas respectively coupled with two P port of a first transfer switch of the first receiving module. The third antenna group includes two antennas respectively coupled with two P port of a first transfer switch of the second receiving module. The fourth antenna group includes two antennas respectively coupled with two P port of a first transfer switch of the third receiving module.

An electronic device including the radio frequency architecture described above switches on a transmitting path between a transmitting port in a target band of the radio frequency transceiver and a target antenna group in the radio frequency system, to transmit a signal through an antenna in the target antenna group.

In an example, the electronic device including the foregoing radio frequency architecture performs, in single-band (for example, Nx band), switching among transmit antennas as follows.

In a first transmission period, the electronic device controls a first T port of a channel selector-switch of the transmitting module to be connected to a first P port of the channel selector-switch, to transmit a signal through an antenna of the first antenna group.

In a second transmission period, the electronic device controls the first T port of the channel selector-switch of the transmitting module to be connected to a third P port of the channel selector-switch and a Bypass channel of the third receiving module to switch on, to transmit a signal through a first antenna of the fourth antenna group.

Figure 4B:
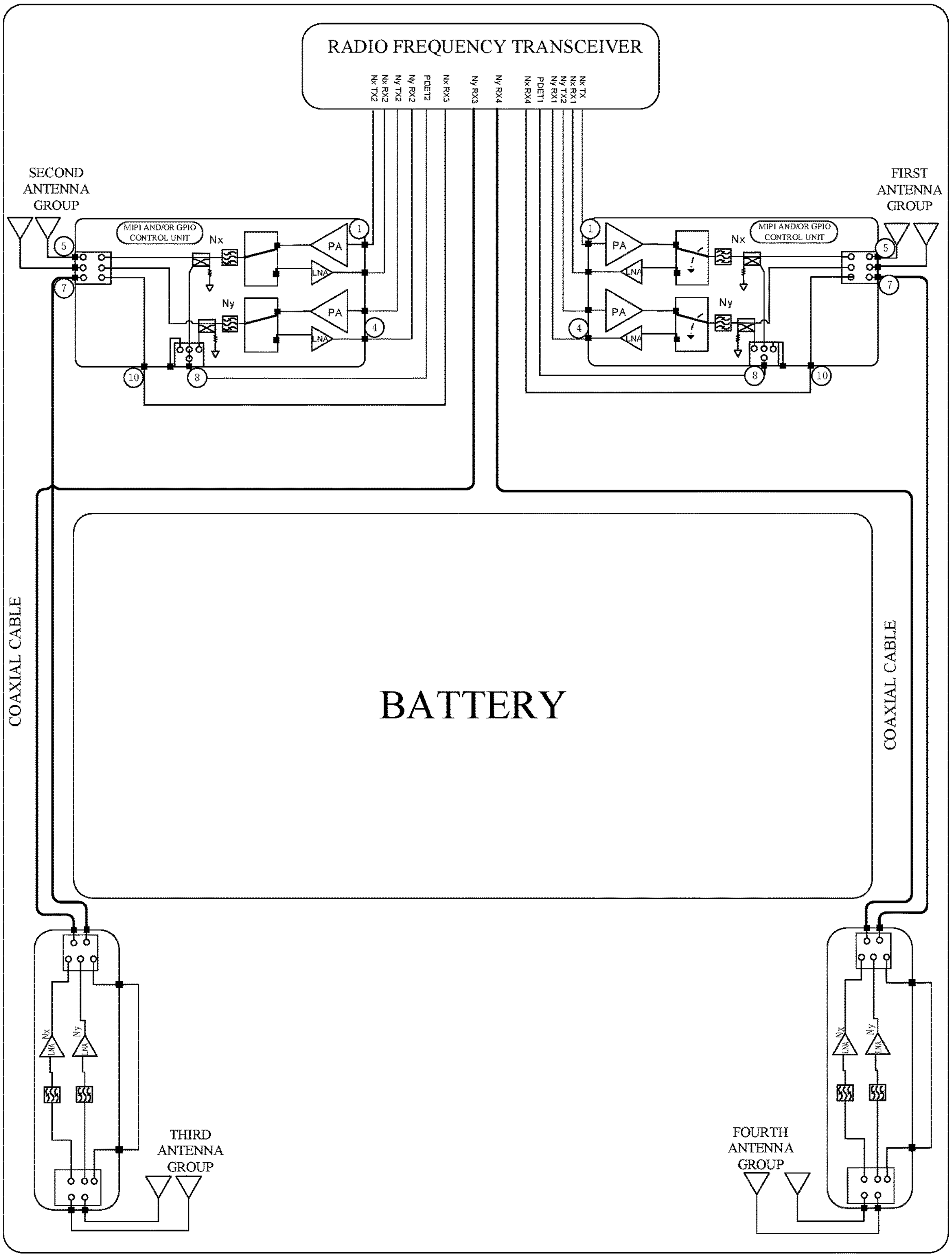
FIG. 4B is a schematic structural diagram illustrating a radio frequency system according to another implementation of the present disclosure.

As illustrated in FIG. 4B, in this example, the radio frequency architecture has the following function: ① supporting 5G NR dual-band; ② not supporting UL CA; ③ supporting DL CA; ④ not supporting transmission of an SSR with four antennas in a polling manner; ⑤ supporting NR 2T4R (dual-band, two transmitting paths and four receiving paths).

The radio frequency architecture for 5G includes a radio frequency transceiver, two transmitting modules (a first transmitting module and a second transmitting module), two receiving modules (a first receiving module and a second receiving module), and four antenna groups (a first antenna group, a second antenna group, a third antenna group, and a fourth antenna group). Each of the first antenna group, the second antenna group, the third antenna group, and the fourth antenna group includes two antennas. The radio frequency transceiver, the first transmitting module, and the second transmitting module are disposed on a main board (two modules above a battery in this figure). The first receiving module and the second receiving module are disposed on a sub board (two modules below the battery in this figure). Each transmitting module/receiving module is disposed adjacent to an antenna group with which the transmitting module/receiving module is coupled. The disclosure is not limited to the manner in which the transmitting module and the receiving modules are placed. For example, the transmitting module or the receiving modules may be horizontally or vertically placed.

The first transmitting module is disposed adjacent to the first antenna group. The second transmitting module is disposed adjacent to the second antenna group. The first receiving module is disposed adjacent to the third antenna group. The second receiving module is disposed adjacent to the fourth antenna group.

The structure and connection of internal devices of the transmitting module are similar to that of the transmitting module in FIG. 2J. The internal devices and connection therebetween of each receiving module are similar to that of the receiving module in FIG. 1M.

The radio frequency transceiver has a first transmitting port Nx TX1 in an Nx band coupled with a first external port of the first transmitting module. The radio frequency transceiver has a first transmitting port Ny TX1 in an Ny band coupled with a third external port of the first transmitting module. The radio frequency transceiver has a first receiving port Nx RX1 in the Nx band coupled with a second external port of the first transmitting module. The radio frequency transceiver has a first receiving port Ny RX1 in the Ny band coupled with a fourth external port of the first transmitting module. The radio frequency transceiver has a second transmitting port Nx TX2 in the Nx band coupled with a first external port of the second transmitting module. The radio frequency transceiver has a second transmitting port Ny TX2 in the Ny band coupled with a third external port of the second transmitting module. The radio frequency transceiver has a second receiving port Nx RX2 in the Nx band coupled with a second external port of the second transmitting module. The radio frequency transceiver has a second receiving port Ny RX2 in the Ny band coupled with a fourth external port of the second transmitting module. The radio frequency transceiver has a first PDET1 port coupled with an eighth external port of the first transmitting module. The radio frequency transceiver has a second PDET2 port coupled with an eighth external port of the second transmitting module. The radio frequency transceiver has a fourth receiving port Nx RX4 in the Nx band coupled with a tenth external port of the first transmitting module. The radio frequency transceiver has a third receiving port Nx RX3 in the Nx band coupled with a tenth external port of the second transmitting module. The radio frequency transceiver has a fourth receiving port Ny RX4 in the Ny band coupled with a second P port of a second transfer switch of the second receiving module. The radio frequency transceiver has a third receiving port Ny RX3 in the Ny band coupled with a second P port of a second transfer switch of the first receiving module.

The first antenna group includes two antennas respectively coupled with a fifth external port and a sixth external port of the first transmitting module. The first transmitting module has a seventh external port coupled with a first P port of the second transfer switch of the second receiving module. The second antenna group includes two antennas respectively coupled with a fifth external port and a sixth external port of the second transmitting module. The second transmitting module has a seventh external port coupled with a first P port of the second transfer switch of the first receiving module. The third antenna group includes two antennas respectively coupled with two P port of a first transfer switch of the first receiving module. The fourth antenna group includes two antennas respectively coupled with two P port of a first transfer switch of the second receiving module.

An electronic device including the radio frequency architecture described above switches on a transmitting path between a transmitting port in a target band of the radio frequency transceiver and a target antenna group in the radio frequency system, to transmit a signal through an antenna in the target antenna group.

In an example, the electronic device including the foregoing radio frequency architecture performs, in single-band (for example, Nx band), switching among transmit antennas as follows.

In a first transmission period, the electronic device controls a first T port of a channel selector-switch of the first transmitting module to be connected to a first P port of the channel selector-switch to transmit a signal, and controls the first T port of the channel selector-switch of the first transmitting module to be connected to a third P port of the channel selector-switch and a Bypass channel of the second receiving module to switch on to transmit a signal, to achieve signal transmission through antennas of the first antenna group and the fourth antenna group.

In a second transmission period, the electronic device controls a first T port of a channel selector-switch of the second transmitting module to be connected to a first P port of the channel selector-switch to transmit a signal, and controls the first T port of the channel selector-switch of the second transmitting module to be connected to a third P port of the channel selector-switch and a Bypass channel of the first receiving module to switch on to transmit a signal, to achieve signal transmission through antennas of the second antenna group and the third antenna group.

Figure 4C:
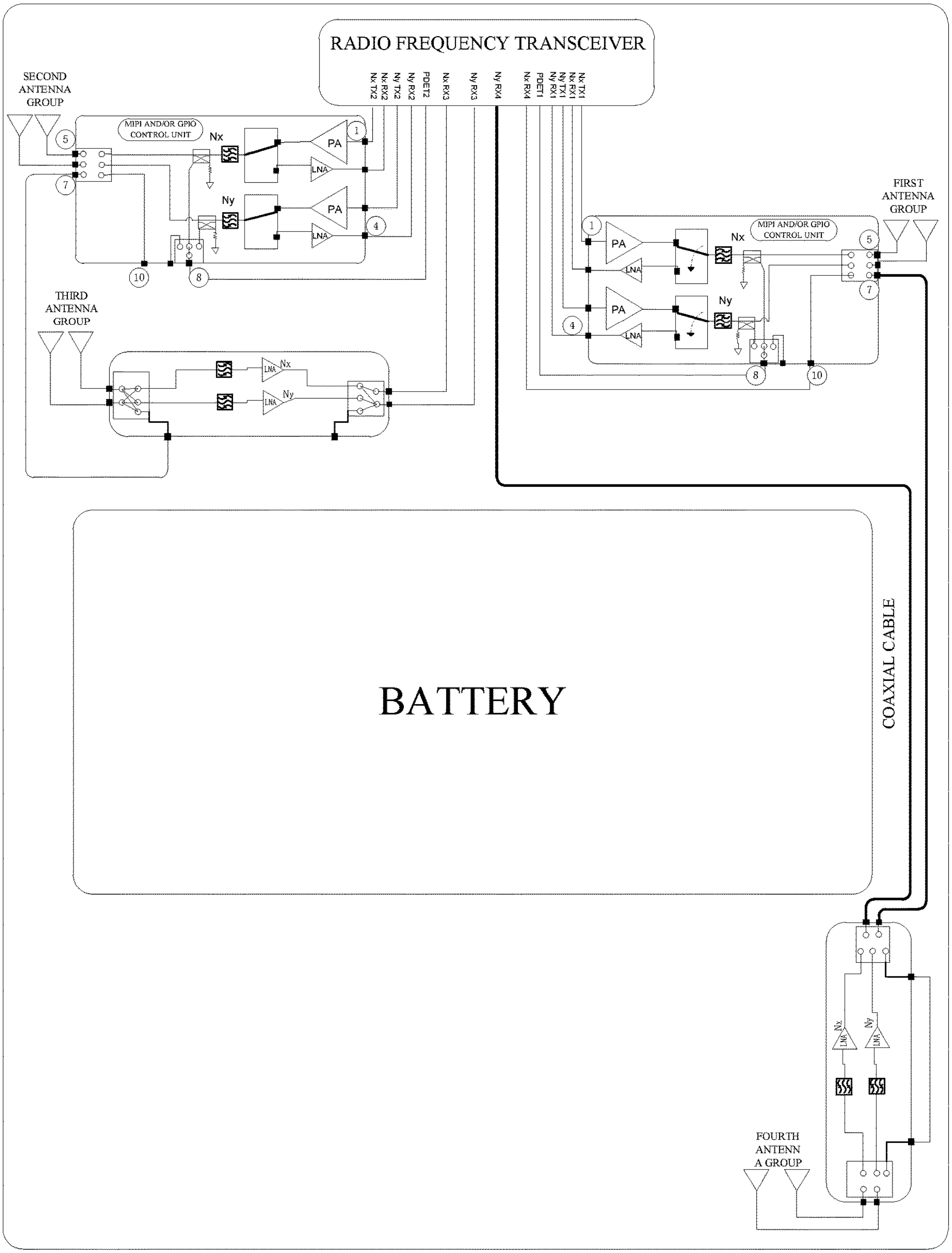
FIG. 4C is a schematic structural diagram illustrating a radio frequency system according to another implementation of the present disclosure.

As illustrated in FIG. 4C, in this example, the radio frequency architecture has the following function: ① supporting 5G NR dual-band; ② not supporting UL CA; ③ supporting DL CA; ④ not supporting transmission of an SSR with four antennas in a polling manner; ⑤ supporting NR 2T4R (dual-band, two transmitting paths and four receiving paths).

The radio frequency architecture for 5G includes a radio frequency transceiver, two transmitting modules (a first transmitting module and a second transmitting module), two receiving modules (a first receiving module and a second receiving module), and four antenna groups (a first antenna group, a second antenna group, a third antenna group, and a fourth antenna group). Each of the first antenna group, the second antenna group, the third antenna group, and the fourth antenna group includes two antennas. The radio frequency transceiver, the first transmitting module, the second transmitting module, and the first receiving module are disposed on a main board (three modules above a battery in this figure). The second receiving module is disposed on a sub board (one module below the battery in this figure). Each transmitting module/receiving module is disposed adjacent to an antenna group with which the transmitting module/receiving module is coupled. The disclosure is not limited to the manner in which the transmitting module and the receiving modules are placed. For example, the transmitting module or the receiving modules may be horizontally or vertically placed.

The first transmitting module is disposed adjacent to the first antenna group. The second transmitting module is disposed adjacent to the second antenna group. The first receiving module is disposed adjacent to the third antenna group. The second receiving module is disposed adjacent to the fourth antenna group.

The structure and connection of internal devices of the transmitting module are similar to that of the transmitting module in FIG. 2J. The internal devices and connection therebetween of each receiving module are similar to that of the receiving module in FIG. 1M.

The radio frequency transceiver has a first transmitting port Nx TX1 in an Nx band coupled with a first external port of the first transmitting module. The radio frequency transceiver has a first transmitting port Ny TX1 in an Ny band coupled with a third external port of the first transmitting module. The radio frequency transceiver has a first receiving port Nx RX1 in the Nx band coupled with a second external port of the first transmitting module. The radio frequency transceiver has a first receiving port Ny RX1 in the Ny band coupled with a fourth external port of the first transmitting module. The radio frequency transceiver has a second transmitting port Nx TX2 in the Nx band coupled with a first external port of the second transmitting module. The radio frequency transceiver has a second transmitting port Ny TX2 in the Ny band coupled with a third external port of the second transmitting module. The radio frequency transceiver has a second receiving port Nx RX2 in the Nx band coupled with a second external port of the second transmitting module. The radio frequency transceiver has a second receiving port Ny RX2 in the Ny band coupled with a fourth external port of the second transmitting module. The radio frequency transceiver has a first PDET1 port coupled with an eighth external port of the first transmitting module. The radio frequency transceiver has a second PDET2 port coupled with an eighth external port of the second transmitting module. The radio frequency transceiver has a fourth receiving port Nx RX4 in the Nx band coupled with a tenth external port of the first transmitting module. The radio frequency transceiver has a third receiving port Nx RX3 in the Nx band coupled with a first P port of a second transfer switch of the first receiving module. The radio frequency transceiver has a fourth receiving port Ny RX4 in the Ny band coupled with a second P port of a second transfer switch of the second receiving module. The radio frequency transceiver has a third receiving port Ny RX3 in the Ny band coupled with a second P port of the second transfer switch of the first receiving module.

The first antenna group includes two antennas respectively coupled with a fifth external port and a sixth external port of the first transmitting module. The first transmitting module has a seventh external port coupled with a first P port of the second transfer switch of the second receiving module. The second antenna group includes two antennas respectively coupled with a fifth external port and a sixth external port of the second transmitting module. The second transmitting module has a seventh external port coupled with an AUX of the first receiving module. The third antenna group includes two antennas respectively coupled with two P port of a first transfer switch of the first receiving module. The fourth antenna group includes two antennas respectively coupled with two P port of a first transfer switch of the second receiving module.

An electronic device including the radio frequency architecture described above switches on a transmitting path between a transmitting port in a target band of the radio frequency transceiver and a target antenna group in the radio frequency system, to transmit a signal through an antenna in the target antenna group.

In an example, the electronic device including the foregoing radio frequency architecture performs, in single-band (for example, Nx band), switching among transmit antennas as follows.

In a first transmission period, the electronic device controls a first T port of a channel selector-switch of the first transmitting module to be connected to a first P port of the channel selector-switch, and controls the first T port of the channel selector-switch of the first transmitting module to be connected to a third P port of the channel selector-switch and a Bypass channel of the second receiving module to switch on, to achieve signal transmission through antennas of the first antenna group and the fourth antenna group.

In a second transmission period, the electronic device controls a first T port of a channel selector-switch of the second transmitting module to be connected to a first P port of the channel selector-switch, and controls the first T port of the channel selector-switch of the second transmitting module to be connected to a third P port of the channel selector-switch, to achieve signal transmission through antennas of the second antenna group and the third antenna group.

Figure 4D:
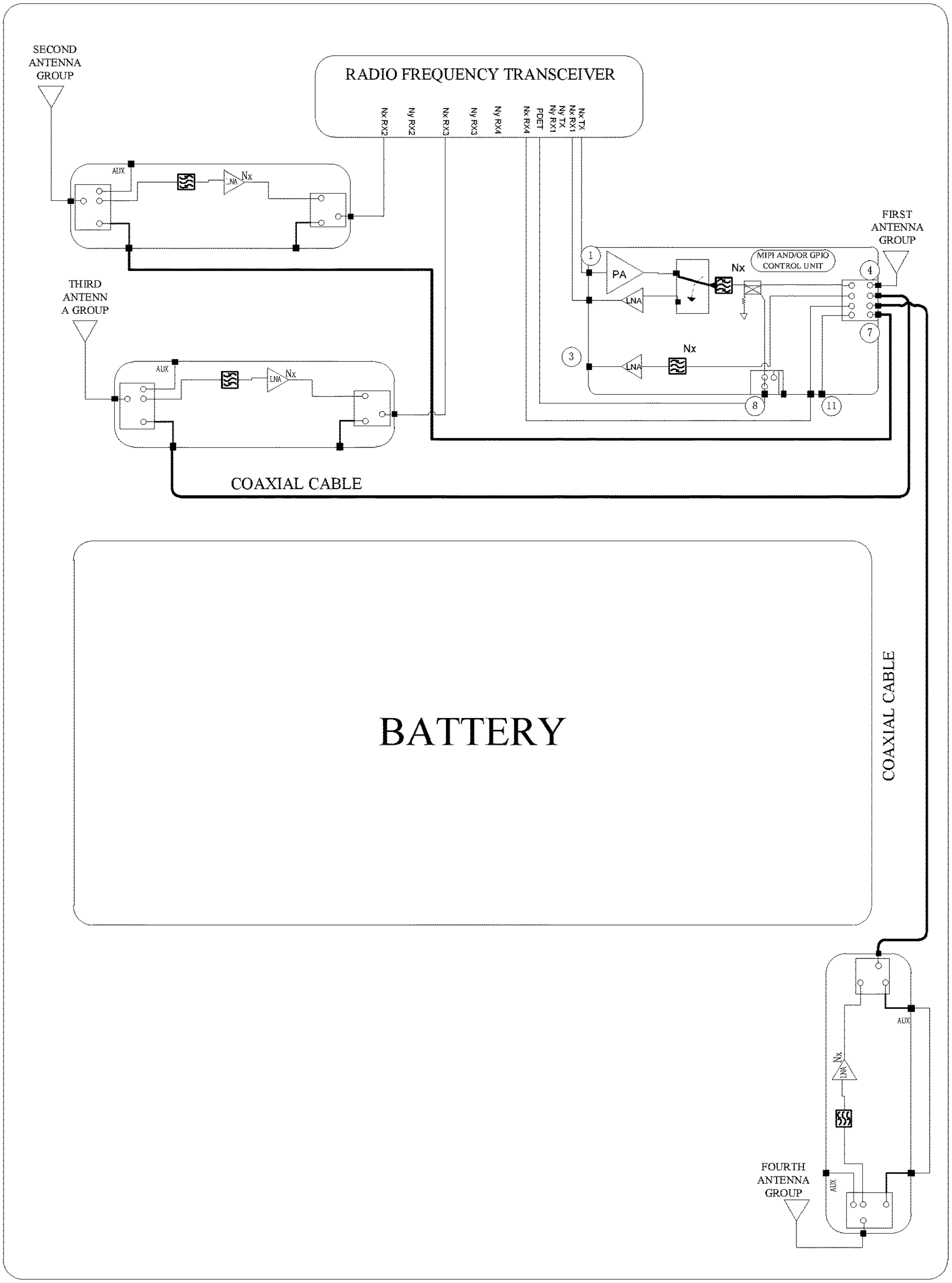
FIG. 4D is a schematic structural diagram illustrating a radio frequency system according to another implementation of the present disclosure.

As illustrated in FIG. 4D, in this example, the radio frequency architecture has the following function: ① supporting 5G NR single-band; ② not supporting UL CA; ③ not supporting DL CA; ④ supporting transmission of an SSR with four antennas in a polling manner; ⑤ supporting NR 1T4R (single-band, one transmitting path and four receiving paths).

The radio frequency architecture for 5G includes a radio frequency transceiver, one transmitting module, three receiving modules (a first receiving module, a second receiving module, and a third receiving module), and four antenna groups (a first antenna group, a second antenna group, a third antenna group, and a fourth antenna group). Each of the first antenna group, the second antenna group, the third antenna group, and the fourth antenna group includes one antenna. The radio frequency transceiver, the transmitting module, the first receiving module, and the second receiving module are disposed on a main board (three modules above a battery in this figure). The third receiving module is disposed on a sub board (one module below the battery in this figure). Each transmitting module/receiving module is disposed adjacent to the antenna group with which the transmitting module/receiving module is coupled.

The transmitting module is disposed adjacent to the first antenna group. The first receiving module is disposed adjacent to the second antenna group. The second receiving module is disposed adjacent to the third antenna group. The third receiving module is disposed adjacent to the fourth antenna group.

The structure and connection of internal devices of the transmitting module are similar to that of the transmitting module in FIG. 2L. The internal devices and connection therebetween of each receiving module are similar to that of the receiving module in FIG. 1O2.

The radio frequency transceiver has a transmitting port Nx TX in an Nx band coupled with a first external port of the transmitting module. The radio frequency transceiver has a first receiving port Nx RX1 in the Nx band coupled with a second external port of the transmitting module. The radio frequency transceiver has a PDET port coupled with an eighth external port of the transmitting module. The radio frequency transceiver has a second receiving port Nx RX2 in the Nx band coupled with a P port of a second transfer switch of the first receiving module. The radio frequency transceiver has a third receiving port Nx RX3 in the Nx band coupled with a P port of a second transfer switch of the second receiving module. The radio frequency transceiver has a fourth receiving port Nx RX4 in the Nx band coupled with a tenth external port of the transmitting module.

The antenna of the first antenna group is coupled with a fourth external port of the transmitting module. The antenna of the second antenna group is coupled with a P port of a first transfer switch of the first receiving module. The antenna of the third antenna group is coupled with a P port of a first transfer switch of the second receiving module. The antenna of the fourth antenna group is coupled with a P port of a first transfer switch of the third receiving module. The transmitting module has a channel selector-switch, which has a fourth P port coupled with an AUX of the first receiving module, a second P port coupled with an AUX of the second receiving module, and a third P port coupled with a P port of a second transfer switch of the third receiving module.

An electronic device including the radio frequency architecture described above switches on a transmitting path between a transmitting port in a target band of the radio frequency transceiver and a target antenna group in the radio frequency system, to transmit a signal through an antenna in the target antenna group.

In an example, the electronic device including the foregoing radio frequency architecture performs, in single-band (for example, Nx band), switching among transmit antennas as follows.

In a first transmission period, the electronic device controls a first T port of the channel selector-switch of the transmitting module to be connected to a first P port of the channel selector-switch, to transmit a signal through an antenna of the first antenna group.

In a second transmission period, the electronic device controls the first T port of the channel selector-switch of the transmitting module to be connected to a fourth P port of the channel selector-switch, to transmit a signal through an antenna of the second antenna group.

In a third transmission period, the electronic device controls the first T port of the channel selector-switch of the transmitting module to be connected to a second P port of the channel selector-switch, to transmit a signal through an antenna of the third antenna group.

In a fourth transmission period, the electronic device controls the first T port of the channel selector-switch of the transmitting module to be connected to a third P port of the channel selector-switch and a Bypass channel of the third receiving module to switch on, to transmit a signal through an antenna of the fourth antenna group.

Figure 4E:
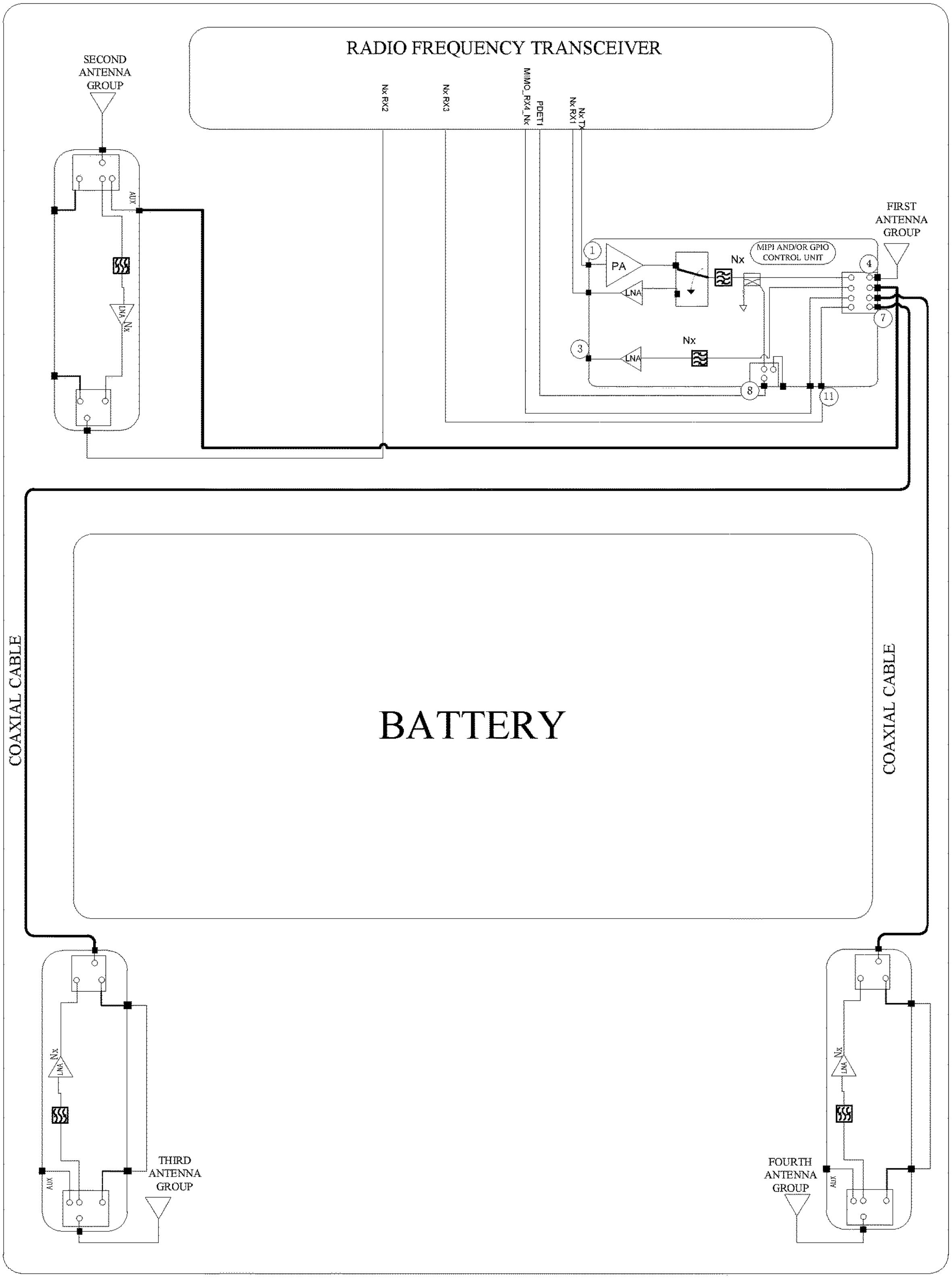
FIG. 4E is a schematic structural diagram illustrating a radio frequency system according to another implementation of the present disclosure.

As illustrated in FIG. 4E, in this example, the radio frequency architecture has the following function: ① supporting 5G NR single-band; ② not supporting UL CA; ③ not supporting DL CA; ④ supporting transmission of an SSR with four antennas in a polling manner; ⑤ supporting NR 1T4R (single-band, one transmitting path and four receiving paths).

The radio frequency architecture for 5G includes a radio frequency transceiver, one transmitting module, three receiving modules (a first receiving module, a second receiving module, and a third receiving module), and four antenna groups (a first antenna group, a second antenna group, a third antenna group, and a fourth antenna group). Each of the first antenna group, the second antenna group, the third antenna group, and the fourth antenna group includes one antenna. The radio frequency transceiver, the transmitting module, and the first receiving module, are disposed on a main board (two modules above a battery in this figure). The second receiving module and the third receiving module are disposed on a sub board (two modules below the battery in this figure). Each transmitting module/receiving module is disposed adjacent to the antenna group with which the transmitting module/receiving module is coupled.

The transmitting module is disposed adjacent to the first antenna group. The first receiving module is disposed adjacent to the second antenna group. The second receiving module is disposed adjacent to the third antenna group. The third receiving module is disposed adjacent to the fourth antenna group.

The structure and connection of internal devices of the transmitting module are similar to that of the transmitting module in FIG. 2L. The internal devices and connection therebetween of each receiving module are similar to that of the receiving module in FIG. 1O2.

The radio frequency transceiver has a transmitting port Nx TX in an Nx band coupled with a first external port of the transmitting module. The radio frequency transceiver has a first receiving port Nx RX1 in the Nx band coupled with a second external port of the transmitting module. The radio frequency transceiver has a PDET1 port coupled with an eighth external port of the transmitting module. The radio frequency transceiver has a second receiving port Nx RX2 in the Nx band coupled with a P port of a second transfer switch of the first receiving module. The radio frequency transceiver has a third receiving port Nx RX3 in the Nx band coupled with an eleventh external port of the transmitting module. The radio frequency transceiver has a fourth receiving port MIMO_RX4_Nx in the Nx band coupled with a tenth external port of the transmitting module.

The antenna of the first antenna group is coupled with a fourth external port of the transmitting module. The antenna of the second antenna group is coupled with a P port of a first transfer switch of the first receiving module. The antenna of the third antenna group is coupled with a P port of a first transfer switch of the second receiving module. The antenna of the fourth antenna group is coupled with a P port of a first transfer switch of the third receiving module. The transmitting module has a channel selector-switch, which has a second P port coupled with an AUX of the first receiving module, a third P port coupled with a P port of a second transfer switch of the third receiving module, and a fourth P port coupled with a P port of a second transfer switch of the second receiving module.

An electronic device including the radio frequency architecture described above switches on a transmitting path between a transmitting port in a target band of the radio frequency transceiver and a target antenna group in the radio frequency system, to transmit a signal through an antenna in the target antenna group.

In an example, the electronic device including the foregoing radio frequency architecture performs, in single-band (for example, Nx band), switching among transmit antennas as follows.

In a first transmission period, the electronic device controls a first T port of the channel selector-switch of the transmitting module to be connected to a first P port of the channel selector-switch, to transmit a signal through an antenna of the first antenna group.

In a second transmission period, the electronic device controls the first T port of the channel selector-switch of the transmitting module to be connected to a second P port of the channel selector-switch, to transmit a signal through an antenna of the second antenna group.

In a third transmission period, the electronic device controls the first T port of the channel selector-switch of the transmitting module to be connected to a fourth P port of the channel selector-switch and a Bypass channel of the second receiving module to switch on, to transmit a signal through an antenna of the third antenna group.

In a fourth transmission period, the electronic device controls the first T port of the channel selector-switch of the transmitting module to be connected to a third P port of the channel selector-switch and a Bypass channel of the third receiving module to switch on, to transmit a signal through an antenna of the fourth antenna group.

Figure 4F:
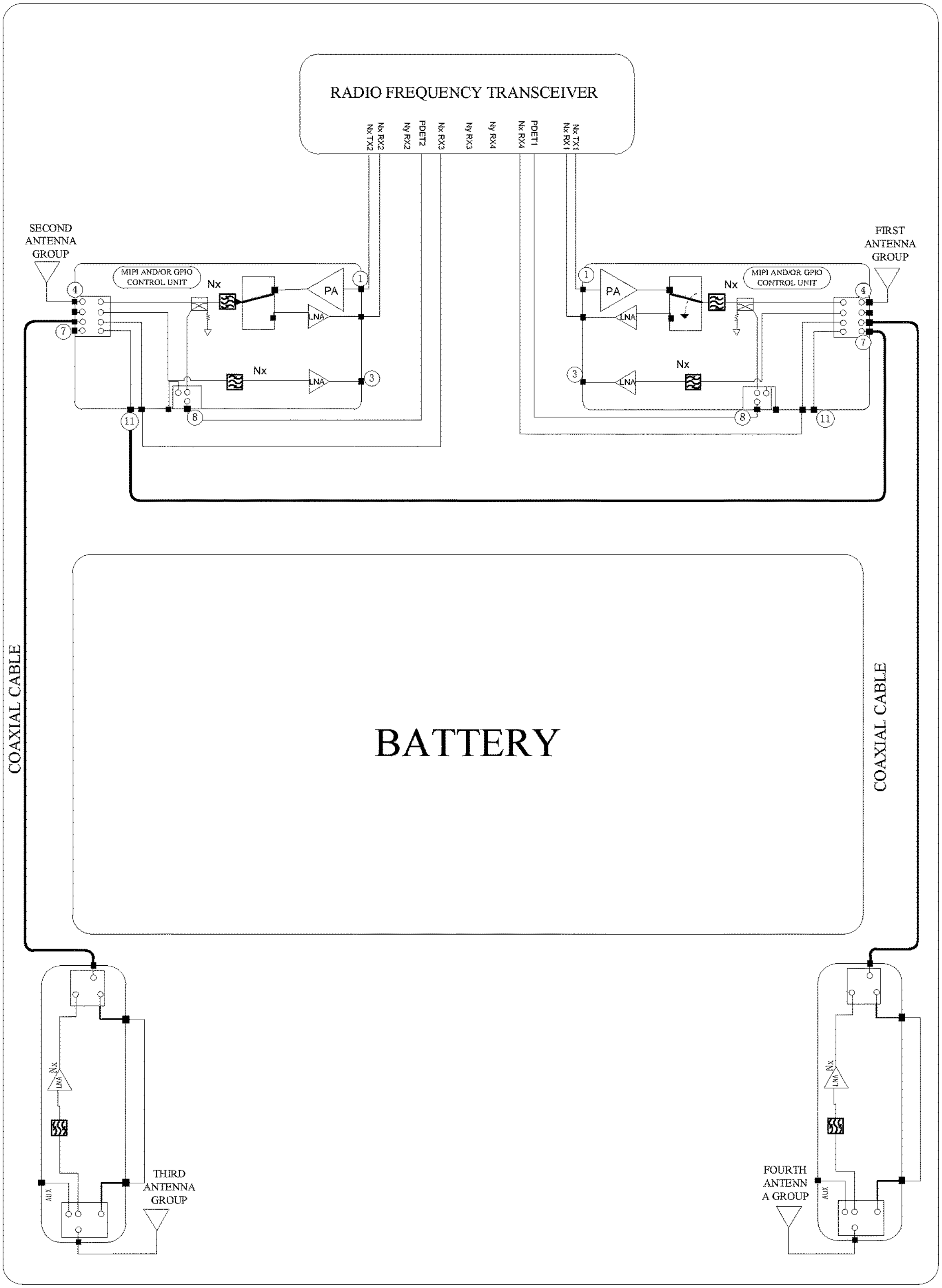
FIG. 4F is a schematic structural diagram illustrating a radio frequency system according to another implementation of the present disclosure.

As illustrated in FIG. 4F, in this example, the radio frequency architecture has the following function: ① supporting 5G NR single-band; ② not supporting UL CA; ③ not supporting DL CA; ④ supporting transmission of an SSR with four antennas in a polling manner; ⑤ supporting NR 2T4R (single-band, two transmitting paths and four receiving paths).

The radio frequency architecture for 5G includes a radio frequency transceiver, two transmitting modules (a first transmitting module and a second transmitting module), two receiving modules (a first receiving module and a second receiving module), and four antenna groups (a first antenna group, a second antenna group, a third antenna group, and a fourth antenna group). Each of the first antenna group, the second antenna group, the third antenna group, and the fourth antenna group includes one antenna. The radio frequency transceiver, the first transmitting module, and the second transmitting module are disposed on a main board (two modules above a battery in this figure). The first receiving module and the second receiving module are disposed on a sub board (two modules below the battery in this figure). Each transmitting module/receiving module is disposed adjacent to an antenna group with which the transmitting module/receiving module is coupled.

The first transmitting module is disposed adjacent to the first antenna group. The second transmitting module is disposed adjacent to the second antenna group. The first receiving module is disposed adjacent to the third antenna group. The second receiving module is disposed adjacent to the fourth antenna group.

The structure and connection of internal devices of the transmitting module are similar to that of the transmitting module in FIG. 2L. The internal devices and connection therebetween of each receiving module are similar to that of the receiving module in FIG. 1O2.

The radio frequency transceiver has a first transmitting port Nx TX1 in an Nx band coupled with a first external port of the first transmitting module. The radio frequency transceiver has a first receiving port Nx RX1 in the Nx band coupled with a second external port of the first transmitting module. The radio frequency transceiver has a first PDET1 port coupled with an eighth external port of the first transmitting module. The radio frequency transceiver has a second transmitting port Nx TX2 in the Nx band coupled with a first external port of the second transmitting module. The radio frequency transceiver has a second receiving port Nx RX2 in the Nx band coupled with a second external port of the second transmitting module. The radio frequency transceiver has a second PDET2 port coupled with an eighth external port of the second transmitting module. The radio frequency transceiver has a third receiving port Nx RX3 in the Nx band coupled with a tenth external port of the second transmitting module. The radio frequency transceiver has a fourth receiving port Nx RX4 in the Nx band coupled with a tenth external port of the first transmitting module.

The antenna of the first antenna group is coupled with a fourth external port of the first transmitting module. The antenna of the second antenna group is coupled with a fourth external port of the second transmitting module. The antenna of the third antenna group is coupled with a P port of a first transfer switch of the first receiving module. The antenna of the fourth antenna group is coupled with a P port of a first transfer switch of the second receiving module. The first transmitting module has a channel selector-switch, which has a third P port coupled with a P port of a second transfer switch of the second receiving module and a fourth P port coupled with an eleventh external port of the second transmitting module. The second transmitting module has a channel selector-switch, which has a third P port coupled with a P port of a second transfer switch of the first receiving module.

An electronic device including the radio frequency architecture described above switches on a transmitting path between a transmitting port in a target band of the radio frequency transceiver and a target antenna group in the radio frequency system, to transmit a signal through an antenna in the target antenna group.

In an example, the electronic device including the foregoing radio frequency architecture performs, in single-band (for example, Nx band), switching among transmit antennas as follows.

In a first transmission period, the electronic device controls a first T port of a channel selector-switch of the first transmitting module to be connected to a first P port of the channel selector-switch of the first transmitting module, and controls the first T port of the channel selector-switch of the first transmitting module to be connected to a third P port of the channel selector-switch of the first transmitting module, to achieve signal transmission through antennas in antenna groups.

In a second transmission period, the electronic device controls a first T port of a channel selector-switch of the second transmitting module to be connected to a fourth P port of the channel selector-switch of the second transmitting module, and controls the first T port of the channel selector-switch of the second transmitting module to be connected to a third P port of the channel selector-switch of the second transmitting module, to achieve signal transmission through antennas in antenna groups.

Figure 4G:
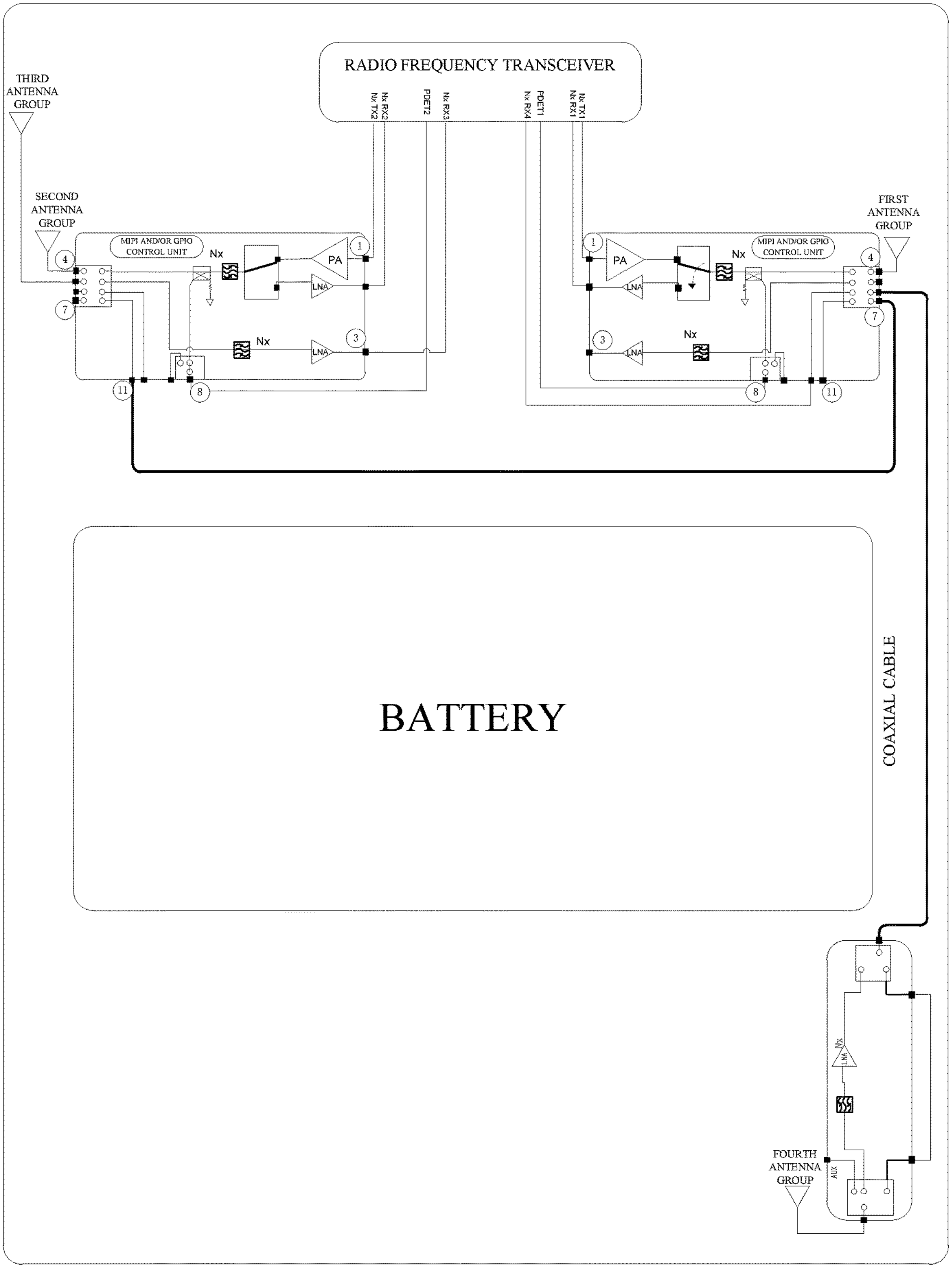
FIG. 4G is a schematic structural diagram illustrating a radio frequency system according to another implementation of the present disclosure.

As illustrated in FIG. 4G, in this example, the radio frequency architecture has the following function: ① supporting 5G NR single-band; ② not supporting UL CA; ③ not supporting DL CA; ④ supporting transmission of an SSR with four antennas in a polling manner; ⑤ supporting NR 2T4R (single-band, two transmitting paths and four receiving paths).

The radio frequency architecture for 5G includes a radio frequency transceiver, two transmitting modules (a first transmitting module and a second transmitting module), one receiving module, and three antenna groups (a first antenna group, a second antenna group, and a third antenna group). The first antenna group includes one antenna (a first antenna). The second antenna group includes two antennas (a second antenna and a third antenna). The third antenna group includes one antenna (a fourth antenna). The radio frequency transceiver, the first transmitting module, and the second transmitting module are disposed on a main board (two modules above a battery in this figure). The receiving module is disposed on a sub board (one module below the battery in this figure).

The first transmitting module is disposed adjacent to the first antenna group. The second transmitting module is disposed adjacent to the second antenna and the third antenna. The receiving module is disposed adjacent to the third antenna group.

The structure and connection of internal devices of the transmitting module are similar to that of the transmitting module in FIG. 2L. The internal devices and connection therebetween of each receiving module are similar to that of the receiving module in FIG. 1O2.

The radio frequency transceiver has a first transmitting port Nx TX1 in an Nx band coupled with a first external port of the first transmitting module. The radio frequency transceiver has a first receiving port Nx RX1 in the Nx band coupled with a second external port of the first transmitting module. The radio frequency transceiver has a first PDET1 port coupled with an eighth external port of the first transmitting module. The radio frequency transceiver has a second transmitting port Nx TX2 in the Nx band coupled with a first external port of the second transmitting module. The radio frequency transceiver has a second receiving port Nx RX2 in the Nx band coupled with a second external port of the second transmitting module. The radio frequency transceiver has a second PDET2 port coupled with an eighth external port of the second transmitting module. The radio frequency transceiver has a third receiving port Nx RX3 in the Nx band coupled with a third external port of the second transmitting module. The radio frequency transceiver has a fourth receiving port Nx RX4 in the Nx band coupled with a tenth external port of the first transmitting module.

The first antenna is coupled with a fourth external port of the first transmitting module. The second antenna is coupled with a fourth external port of the second transmitting module. The third antenna is coupled with a fifth external port of the second transmitting module. The fourth antenna is coupled with a P port of a first transfer switch of the receiving module. The first transmitting module has a channel selector-switch, which has a third P port coupled with a P port of a second transfer switch of the receiving module and a fourth P port coupled with an eleventh external port of the second transmitting module.

An electronic device including the radio frequency architecture described above switches on a transmitting path between a transmitting port in a target band of the radio frequency transceiver and a target antenna group in the radio frequency system, to transmit a signal through an antenna in the target antenna group.

In an example, the electronic device including the foregoing radio frequency architecture performs, in single-band (for example, Nx band), switching among transmit antennas as follows.

In a first transmission period, the electronic device controls a first T port of the channel selector-switch of the first transmitting module to be connected to a first P port of the channel selector-switch of the first transmitting module, and controls the first T port of the channel selector-switch of the first transmitting module to be connected to a third P port of the channel selector-switch of the first transmitting module and a Bypass channel of the receiving module to switch on, to achieve signal transmission through corresponding antennas.

In a second transmission period, the electronic device controls a first T port of a channel selector-switch of the second transmitting module to be connected to a first P port of the channel selector-switch of the second transmitting module, controls the first T port of the channel selector-switch of the first transmitting module to be connected to a fourth P port of the channel selector-switch of the first transmitting module, and controls a fourth T port of the channel selector-switch of the second transmitting module to be connected to a second P port of the channel selector-switch of the second transmitting module, to achieve signal transmission through corresponding antennas.

Figure 4H:
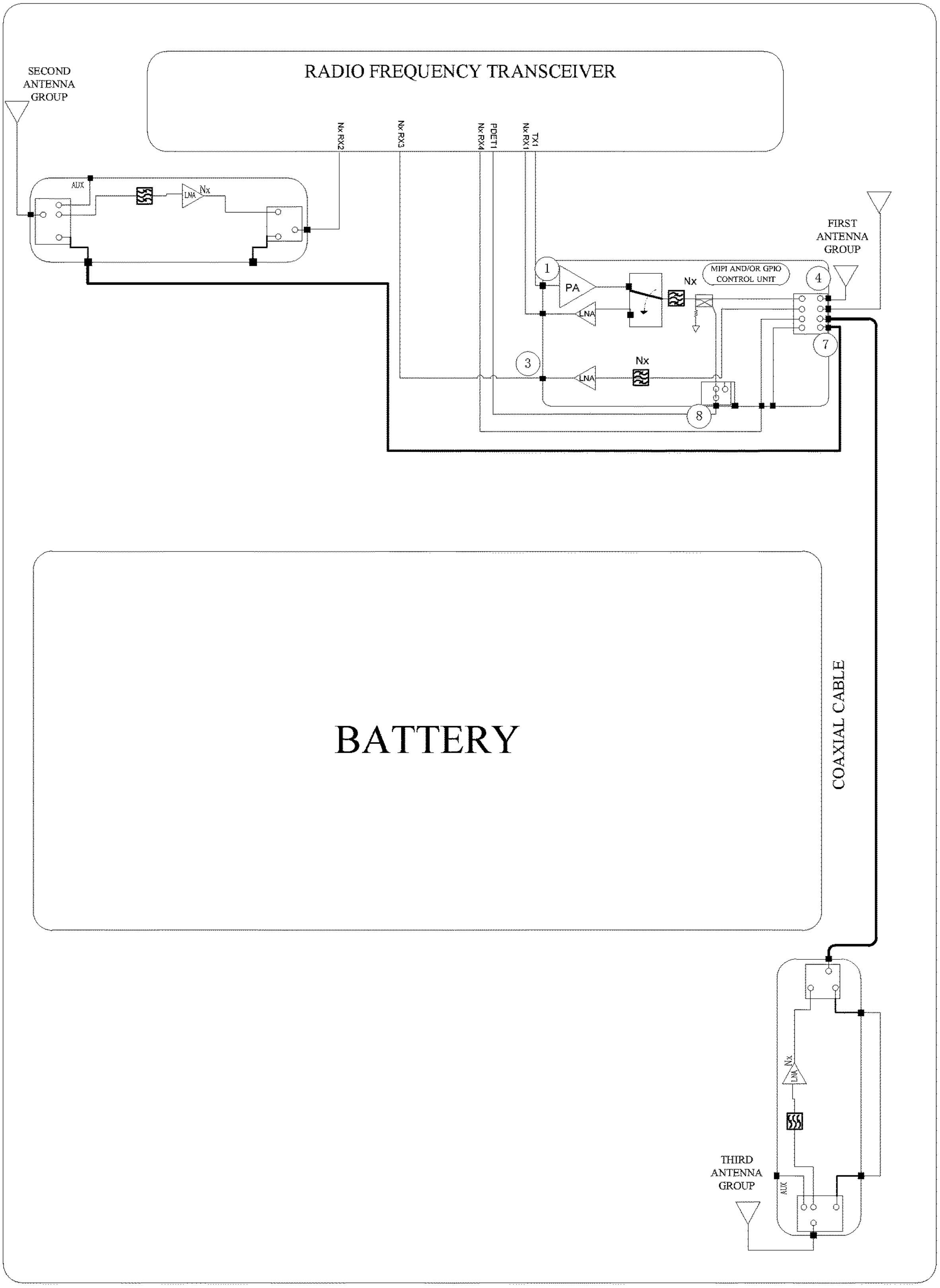
FIG. 4H is a schematic structural diagram illustrating a radio frequency system according to another implementation of the present disclosure.

As illustrated in FIG. 4H, in this example, the radio frequency architecture has the following function: ① supporting 5G NR single-band; ② not supporting UL CA; ③ not supporting DL CA; ④ supporting transmission of an SSR with four antennas in a polling manner; ⑤ supporting NR 1T4R (single-band, one transmitting path and four receiving paths).

The radio frequency architecture for 5G includes a radio frequency transceiver, one transmitting module, two receiving modules (a first receiving module and a second receiving module), and three antenna groups (a first antenna group, a second antenna group, and a third antenna group). The first antenna group includes two antennas. The second antenna group includes one antenna. The third antenna group includes one antenna. The radio frequency transceiver, the transmitting module, and the first receiving module are disposed on a main board (two modules above a battery in this figure). The second receiving module is disposed on a sub board (one module below the battery in this figure). Each module is disposed adjacent to an antenna group with which the module is coupled.

The transmitting module is disposed adjacent to the first antenna group. The first receiving module is disposed adjacent to the second antenna group. The second receiving module is disposed adjacent to the third antenna group.

The structure and connection of internal devices of the transmitting module are similar to that of the transmitting module in FIG. 2L. The internal devices and connection therebetween of each receiving module are similar to that of the receiving module in FIG. 1O2. The first receiving module has an AUX coupled with a seventh external port of the transmitting module, to support transmitting an SRS TX signal through a corresponding antenna or self-switching among antennas for signal transmission.

The radio frequency transceiver has a first transmitting port TX1 coupled with a first external port of the transmitting module. The radio frequency transceiver has a first receiving port Nx RX1 in a first band coupled with a second external port of the transmitting module. The radio frequency transceiver has a third receiving port Nx RX3 in the first band coupled with a third external port of the transmitting module. The radio frequency transceiver has a fourth receiving port Nx RX4 in the first band coupled with a tenth external port of the transmitting module. The radio frequency transceiver has a second receiving port Nx RX2 in the first band coupled with a P port of a second transfer switch of the first receiving module. The radio frequency transceiver has a PDET port coupled with an eighth external port of the transmitting module.

The second antenna group is coupled with a P port of a first transfer switch (an SP3T switch) of the first receiving module. The first transfer switch has a first T port that corresponds to a first AUX of the first receiving module. The first transfer switch has a second T port coupled with a filter. The filter is coupled with an LNA. The LNA is coupled with a first T port of the second transfer switch (an SPDT switch) of the first receiving module. The first transfer switch has a third T port coupled with a second AUX of the first receiving module. The second AUX is coupled with the seventh external port of the transmitting module.

The connection between the third antenna group and the second receiving module as well as between the internal devices of the second receiving module are similar to that between the second antenna group and the first receiving module as well as between the internal devices of the first receiving module.

An electronic device including the radio frequency architecture described above switches on a transmitting path between a transmitting port in a target band of the radio frequency transceiver and a target antenna group in the radio frequency system, to transmit a signal through an antenna in the target antenna group.

In an example, the electronic device including the foregoing radio frequency architecture performs, in single-band (for example, Nx band), switching among transmit antennas as follows.

In a first transmission period, the electronic device controls a first T port of a channel selector-switch of the transmitting module to be connected to a first P port of the channel selector-switch, and controls the first T port of the channel selector-switch of the transmitting module to be connected to a second P port of the channel selector-switch, to achieve signal transmission through antennas in the first antenna group.

In a second transmission period, the electronic device controls the first T port of the channel selector-switch of the transmitting module to be connected to a fourth P port of the channel selector-switch, and controls the first T port of the channel selector-switch of the transmitting module to be connected to a third P port of the channel selector-switch, to achieve signal transmission through antennas in the second and third antenna group.

Figure 4I:
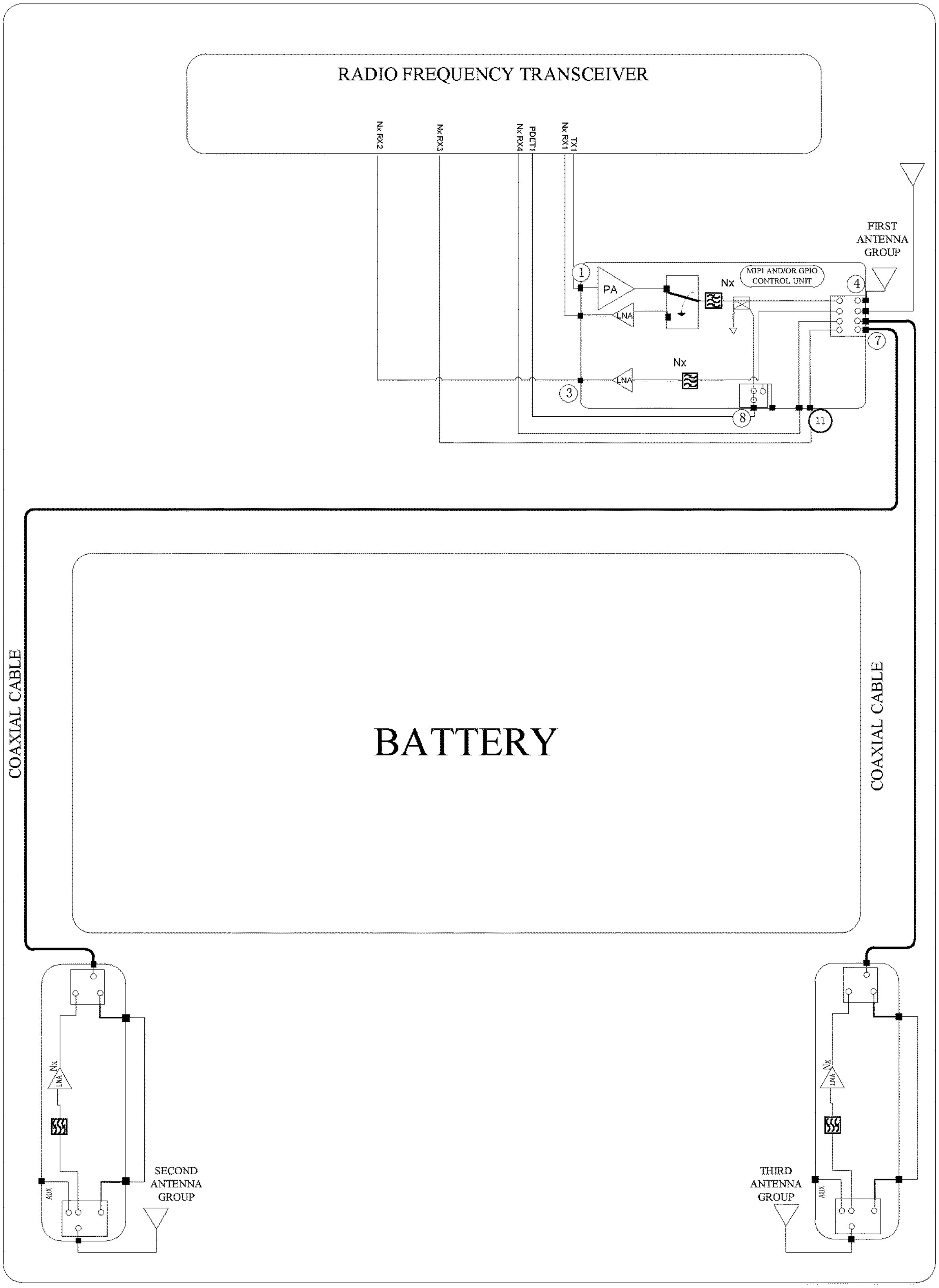
FIG. 4I is a schematic structural diagram illustrating a radio frequency system according to another implementation of the present disclosure.

As illustrated in FIG. 4I, in this example, the radio frequency architecture has the following function: ① supporting 5G NR single-band; ② not supporting UL CA; ③ not supporting DL CA; ④ supporting transmission of an SSR with four antennas in a polling manner; ⑤ supporting NR 1T4R (single-band, one transmitting path and four receiving paths).

The radio frequency architecture for 5G includes a radio frequency transceiver, one transmitting module, two receiving modules (a first receiving module and a second receiving module), and three antenna groups (a first antenna group, a second antenna group, and a third antenna group). The first antenna group includes two antennas. The second antenna group includes one antenna. The third antenna group includes one antenna. The radio frequency transceiver and the transmitting module are disposed on a main board (one module above a battery in this figure). The first receiving module and the second receiving module are disposed on a sub board (two modules below the battery in this figure). Each receiving module is disposed adjacent to an antenna with which the receiving module is coupled.

The transmitting module is disposed adjacent to the first antenna group. The first receiving module is disposed adjacent to the second antenna group. The second receiving module is disposed adjacent to the third antenna group.

The structure and connection of internal devices of the transmitting module are similar to that of the transmitting module in FIG. 2L. The internal devices and connection therebetween of each receiving module are similar to that of the receiving module in FIG. 1O2.

The radio frequency transceiver has a transmitting port TX1 coupled with a first external port of the transmitting module. The radio frequency transceiver has a first receiving port Nx RX1 in a first band coupled with a second external port of the transmitting module. The radio frequency transceiver has a fourth receiving port Nx RX4 in the first band coupled with a tenth external port of the transmitting module. The radio frequency transceiver has a third receiving port Nx RX3 in the first band coupled with an eleventh external port of the transmitting module. The radio frequency transceiver has a second receiving port Nx RX2 in the first band coupled with a third external port of the transmitting module.

The second antenna group is coupled with a P port of a first transfer switch (an SP3T switch) of the first receiving module. The first transfer switch has a first T port that corresponds to a first AUX of the first receiving module. The first transfer switch has a second T port coupled with a filter. The filter is coupled with an LNA. The LNA is coupled with a first T port of a second transfer switch (an SPDT switch) of the first receiving module. The first transfer switch has a third T port coupled with a second T port of the second transfer switch of the first receiving module.

The connection between the third antenna group and the second receiving module as well as between the internal devices of the second receiving module are similar to that between the second antenna group and the first receiving module as well as between the internal devices of the first receiving module.

An electronic device including the radio frequency architecture described above switches on a transmitting path between a transmitting port in a target band of the radio frequency transceiver and a target antenna group in the radio frequency system, to transmit a signal through an antenna in the target antenna group.

In an example, the electronic device including the foregoing radio frequency architecture performs, in single-band (for example, Nx band), SRS four antenna rotation or autonomous transmission switching as follows.

In a first transmission period, the electronic device controls a first T port of a channel selector-switch of the transmitting module to be connected to a first P port of the channel selector-switch, to transmit a signal through an antenna in an antenna group.

In a second transmission period, the electronic device controls the first T port of the channel selector-switch of the transmitting module to be connected to a second P port of the channel selector-switch, to transmit a signal through an antenna in an antenna group.

In a third transmission period, the electronic device controls the first T port of the channel selector-switch of the transmitting module to be connected to a fourth P port of the channel selector-switch, to transmit a signal through an antenna in an antenna group.

In a fourth transmission period, the electronic device controls the first T port of the channel selector-switch of the transmitting module to be connected to a third P port of the channel selector-switch, to transmit a signal through an antenna in an antenna group.

Figure 4J:
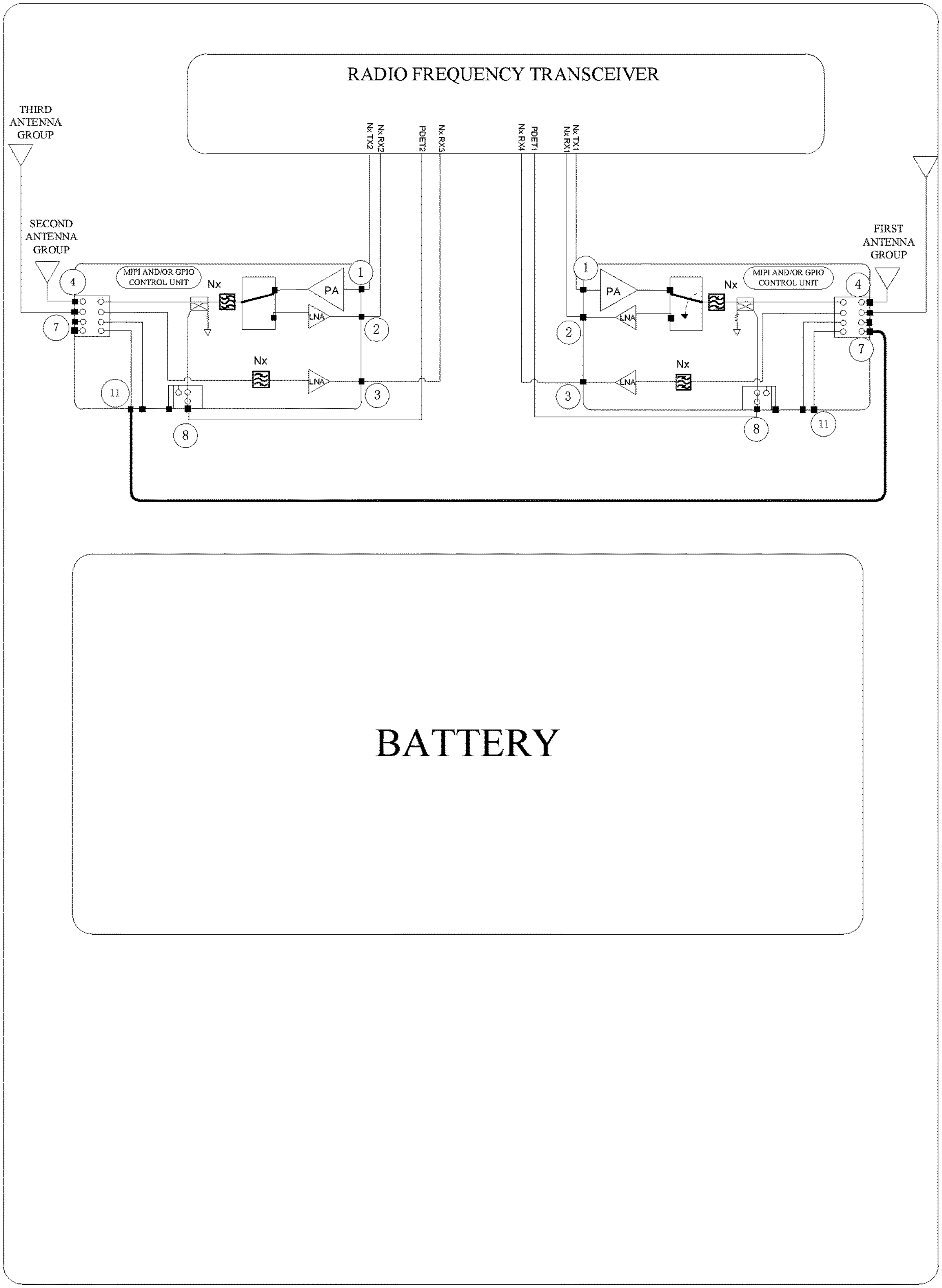
FIG. 4J is a schematic structural diagram illustrating a radio frequency system according to another implementation of the present disclosure.

As illustrated in FIG. 4J, in this example, the radio frequency architecture has the following function: ① supporting 5G NR single-band; ② not supporting UL CA; ③ not supporting DL CA; ④ supporting transmission of an SSR with four antennas in a polling manner; ⑤ supporting NR 2T4R (single-band, two transmitting paths and four receiving paths).

The radio frequency architecture for 5G includes a radio frequency transceiver, two transmitting modules (a first transmitting module and a second transmitting module), and two antenna groups (a first antenna group and a second antenna group). Each antenna group includes two antennas. The radio frequency transceiver and the two transmitting modules are disposed on a main board (two modules above a battery in this figure).

The first transmitting module is disposed adjacent to the first antenna group. The second transmitting module is disposed adjacent to the second antenna group.

The structure and connection of internal devices of the first transmitting module and the second transmitting module are similar to that of the transmitting module in FIG. 2L. The disclosure is not limited herein.

The radio frequency transceiver has a first transmitting port Nx TX1 coupled with a first external port of the first transmitting module. The radio frequency transceiver has a first receiving port Nx RX1 in a first band coupled with a second external port of the first transmitting module. The radio frequency transceiver has a fourth receiving port Nx RX4 in the first band coupled with a third external port of the first transmitting module. The radio frequency transceiver has a second transmitting port Nx TX2 coupled with a first external port of the second transmitting module. The radio frequency transceiver has a second receiving port Nx RX2 in the first band coupled with a second external port of the second transmitting module. The radio frequency transceiver has a third receiving port Nx RX3 in the first band coupled with a third external port of the second transmitting module. The radio frequency transceiver has a first PDET1 port coupled with an eighth external port of the first transmitting module. The radio frequency transceiver has a second PDET2 port coupled with an eighth external port of the second transmitting module.

The first antenna group is coupled with a fourth external port and a fifth external port of the first transmitting module. The second antenna group is coupled with a fourth external port and a fifth external port of the second transmitting module. The first transmitting module has a seventh external port coupled with an eleventh external port of the second transmitting module.

An electronic device including the radio frequency architecture described above switches on a transmitting path between a transmitting port in a target band of the radio frequency transceiver and a target antenna group in the radio frequency system, to transmit a signal through an antenna in the target antenna group.

In an example, the electronic device including the foregoing radio frequency architecture performs, in single-band (for example, Nx band), SRS four antenna rotation or autonomous transmission switching as follows.

In a first transmission period, the electronic device controls a first T port of a channel selector-switch of the first transmitting module to be connected to a first P port of the channel selector-switch, and controls the first T port of the channel selector-switch of the first transmitting module to be connected to a second P port of the channel selector-switch, to achieve signal transmission through antennas in an antenna group.

In a second transmission period, the electronic device controls a first T port of a channel selector-switch of the second transmitting module to be connected to a first P port of the channel selector-switch, and controls the first T port of the channel selector-switch of the second transmitting module to be connected to a second P port of the channel selector-switch, to achieve signal transmission through antennas in an antenna group.

In addition, the radio frequency architecture is compatible with 1T4R SRS switching, that is, has the ability to transmit from the first transmitting module to the four antenna groups. In the first transmission period and the second transmission period, a signal passes through the fourth external port and the fifth external port of the first transmitting module. In the third transmission period, a signal is transferred from the seventh external port of the first transmitting module to the eleventh external port of the second transmitting module, and then from the eleventh external port of the second transmitting module to the second antenna group via the channel selector-switch of the second transmitting module. In the fourth transmission period, a signal is transferred from the seventh external port of the first transmitting module to the eleventh external port of the second transmitting module, and then from the eleventh external port of the second transmitting module to the second antenna group via the channel selector-switch of the second transmitting module.

Figure 4K:
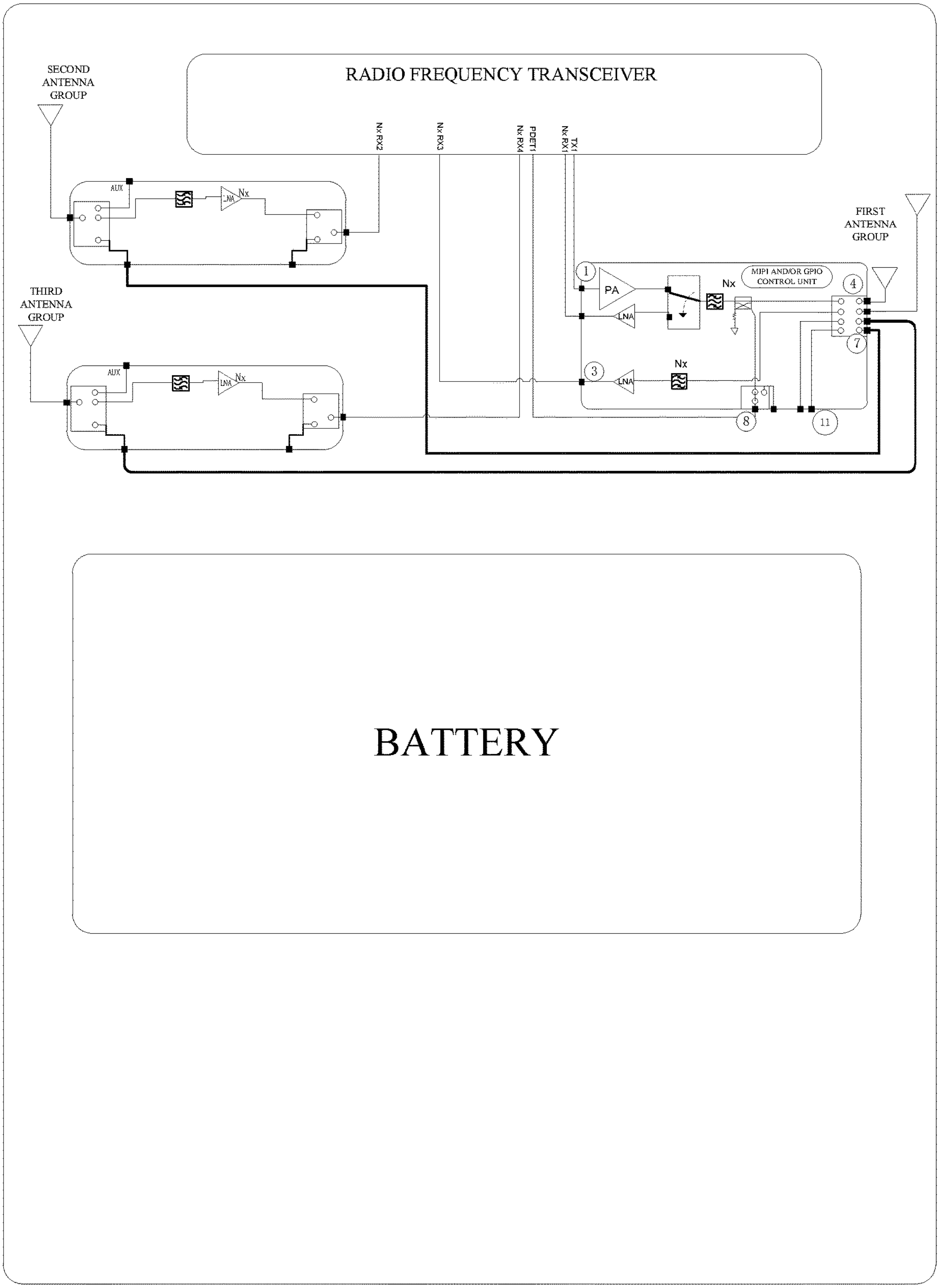
FIG. 4K is a schematic structural diagram illustrating a radio frequency system according to another implementation of the present disclosure.

As illustrated in FIG. 4K, in this example, the radio frequency architecture has the following function: ① supporting 5G NR single-band; ② not supporting UL CA; ③ not supporting DL CA; ④ supporting transmission of an SSR with four antennas in a polling manner; ⑤ supporting NR 1T4R (single-band, one transmitting path and four receiving paths).

The radio frequency architecture for 5G includes a radio frequency transceiver, one transmitting module, two receiving modules (a first receiving module and a second receiving module), and three antenna groups (a first antenna group, a second antenna group, and a third antenna group). Each antenna group includes one antenna. The radio frequency transceiver, the transmitting module, the first receiving module, and the second receiving module are disposed on a main board. Each receiving module is disposed adjacent to an antenna with which the receiving module is coupled.

The transmitting module is disposed adjacent to the first antenna group. The first receiving module is disposed adjacent to the second antenna group. The second receiving module is disposed adjacent to the third antenna group.

The structure and connection of internal devices of the transmitting module are similar to that of the transmitting module in FIG. 2L. The internal devices and connection therebetween of each receiving module are similar to that of the receiving module in FIG. 1O2. The first receiving module has an AUX coupled with a seventh external port of the transmitting module, to support transmitting an SRS TX signal through a corresponding antenna or self-switching among antennas for signal transmission. The second receiving module has an AUX coupled with a sixth external port of the transmitting module, to support transmitting an SRS TX signal through a corresponding antenna or self-switching among antennas for signal transmission.

The radio frequency transceiver has a transmitting port TX1 coupled with a first external port of the transmitting module. The radio frequency transceiver has a first receiving port Nx RX1 in an Nx band coupled with a second external port of the transmitting module. The radio frequency transceiver has a third receiving port Nx RX3 in the Nx band coupled with a third external port of the transmitting module. The radio frequency transceiver has a second receiving port Nx RX2 in the Nx band coupled with a P port of a second transfer switch of the first receiving module. The radio frequency transceiver has a fourth receiving port Nx RX4 in the Nx band coupled with a P port of a second transfer switch of the second receiving module. The radio frequency transceiver has a PDET port coupled with an eighth external port of the transmitting module.

The second antenna group is coupled with a P port of a first transfer switch (an SP3T switch) of the first receiving module. The first receiving module has an AUX (any AUX coupled with the first transfer switch of the first receiving module) coupled with the seventh external port of the transmitting module. The third antenna group is coupled with a P port of a first transfer switch of the second receiving module. The second receiving module has an AUX (any AUX coupled with the first transfer switch of the second receiving module) coupled with the sixth external port of the transmitting module.

An electronic device including the radio frequency architecture described above switches on a transmitting path between a transmitting port in a target band of the radio frequency transceiver and a target antenna group in the radio frequency system, to transmit a signal through an antenna in the target antenna group.

In an example, the electronic device including the foregoing radio frequency architecture performs, in single-band (for example, Nx band), switching among transmit antennas as follows.

In a first transmission period, the electronic device controls a first T port of a channel selector-switch of the transmitting module to be connected to a first P port of the channel selector-switch, to transmit a signal through an antenna in an antenna group.

In a second transmission period, the electronic device controls the first T port of the channel selector-switch of the transmitting module to be connected to a fourth P port of the channel selector-switch, to transmit a signal through an antenna in an antenna group.

In a third transmission period, the electronic device controls the first T port of the channel selector-switch of the transmitting module to be connected to a second P port of the channel selector-switch, to transmit a signal through an antenna in an antenna group.

In a fourth transmission period, the electronic device controls the first T port of the channel selector-switch of the transmitting module to be connected to a third P port of the channel selector-switch, to transmit a signal through an antenna in an antenna group.

Figure 4L:
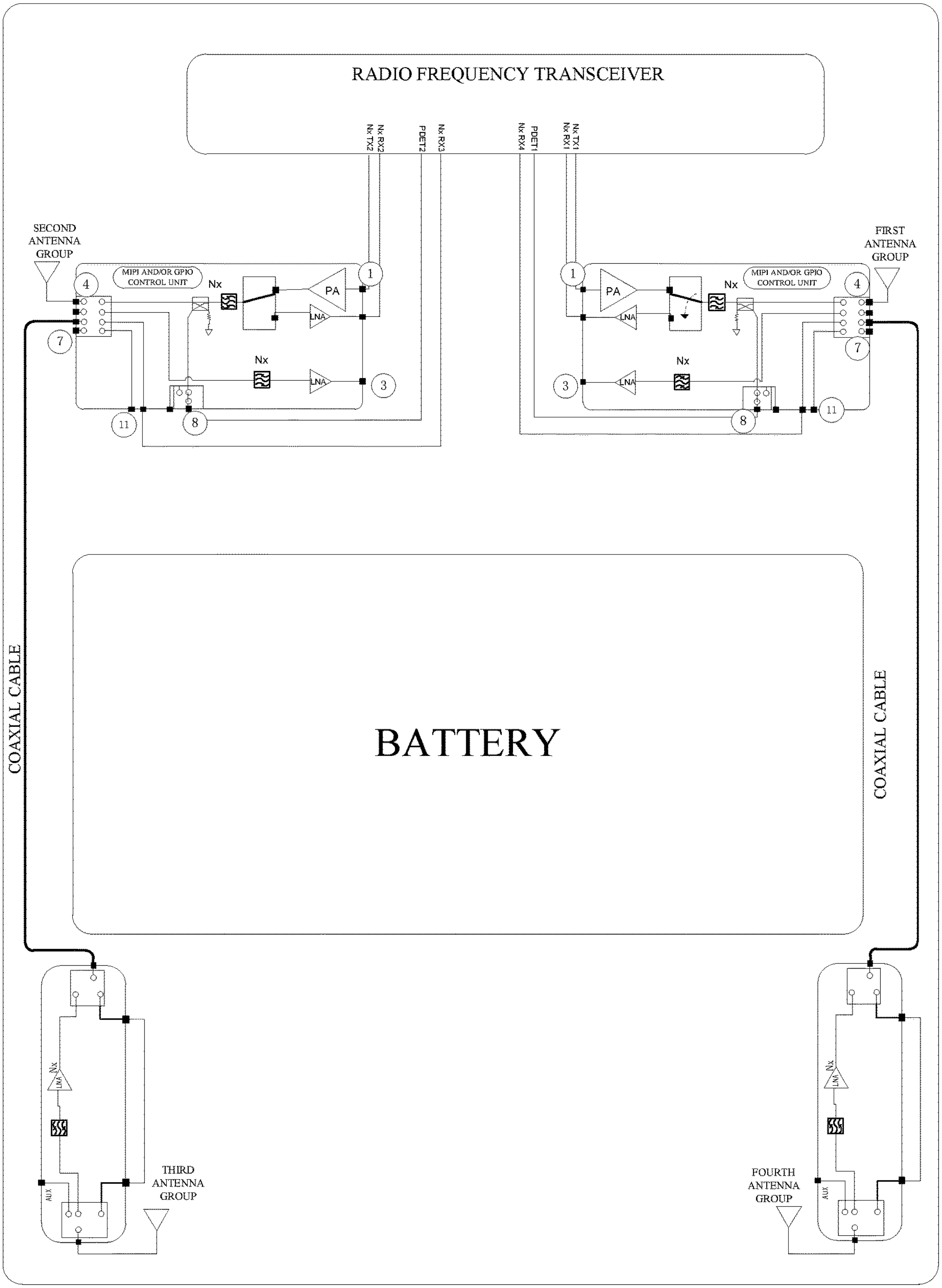
FIG. 4L is a schematic structural diagram illustrating a radio frequency system according to another implementation of the present disclosure.

As illustrated in FIG. 4L, in this example, the radio frequency architecture has the following function: ① supporting 5G NR single-band; ② not supporting UL CA; ③ not supporting DL CA; ④ supporting transmission of an SSR with four antennas in a polling manner; ⑤ supporting NR 2T4R (single-band, two transmitting paths and four receiving paths).

The radio frequency architecture for 5G includes a radio frequency transceiver, two transmitting modules (a first transmitting module and a second transmitting module), two receiving modules (a first receiving module and a second receiving module), and four antenna groups (a first antenna group, a second antenna group, a third antenna group, and a fourth antenna group). Each antenna group includes one antenna. The radio frequency transceiver, the first transmitting module, and the second transmitting module are disposed on a main board (two modules above a battery in this figure). The first receiving module and the second receiving module are disposed on a sub board (two modules below the battery in this figure). Each receiving module is disposed adjacent to an antenna with which the receiving module is coupled.

The first transmitting module is disposed adjacent to the first antenna group. The second transmitting module is disposed adjacent to the second antenna group. The first receiving module is disposed adjacent to the third antenna group. The second receiving module is disposed adjacent to the fourth antenna group.

The structure and connection of internal devices of the transmitting module are similar to that of the transmitting module in FIG. 2L. The internal devices and connection therebetween of each receiving module are similar to that of the receiving module in FIG. 1O2.

The radio frequency transceiver has a first transmitting port Nx TX1 coupled with a first external port of the first transmitting module. The radio frequency transceiver has a first receiving port Nx RX1 in a first band coupled with a second external port of the first transmitting module. The radio frequency transceiver has a fourth receiving port Nx RX4 in the first band coupled with a tenth external port of the first transmitting module. The radio frequency transceiver has a second transmitting port Nx TX2 coupled with a first external port of the second transmitting module. The radio frequency transceiver has a second receiving port Nx RX2 in the first band coupled with a second external port of the second transmitting module. The radio frequency transceiver has a third receiving port Nx RX3 in the first band coupled with a tenth external port of the second transmitting module. The radio frequency transceiver has a first PDET1 port coupled with an eighth external port of the first transmitting module. The radio frequency transceiver has a second PDET2 port coupled with an eighth external port of the second transmitting module.

The first antenna group is coupled with a fourth external port of the first transmitting module. The second antenna group is coupled with a fourth external port of the second transmitting module. The third antenna group is coupled with a P port of a first transfer switch of the first receiving module. The fourth antenna group is coupled with a P port of a first transfer switch of the second receiving module. The first receiving module has a second transfer switch, which has a P port coupled with a sixth external port of the second transmitting module. The second receiving module has a second transfer switch, which has a P port coupled with a sixth external port of the first transmitting module.

An electronic device including the radio frequency architecture described above switches on a transmitting path between a transmitting port in a target band of the radio frequency transceiver and a target antenna group in the radio frequency system, to transmit a signal through an antenna in the target antenna group.

In an example, the electronic device including the foregoing radio frequency architecture performs, in single-band (for example, Nx band), SRS four antenna rotation or autonomous transmission switching as follows.

In a first transmission period, the electronic device controls a first T port of a channel selector-switch of the first transmitting module to be connected to a first P port of the channel selector-switch of the first transmitting module, and controls a first T port of a channel selector-switch of the second transmitting module to be connected to a third P port of the channel selector-switch of the second transmitting module, to achieve signal transmission through antennas in antenna groups.

In a second transmission period, the electronic device controls the first T port of the channel selector-switch of the second transmitting module to be connected to a first P port of the channel selector-switch of the second transmitting module, and controls the first T port of the channel selector-switch of the first transmitting module to be connected to a third P port of the channel selector-switch of the first transmitting module, to achieve signal transmission through antennas in antenna groups.

Figure 4M:
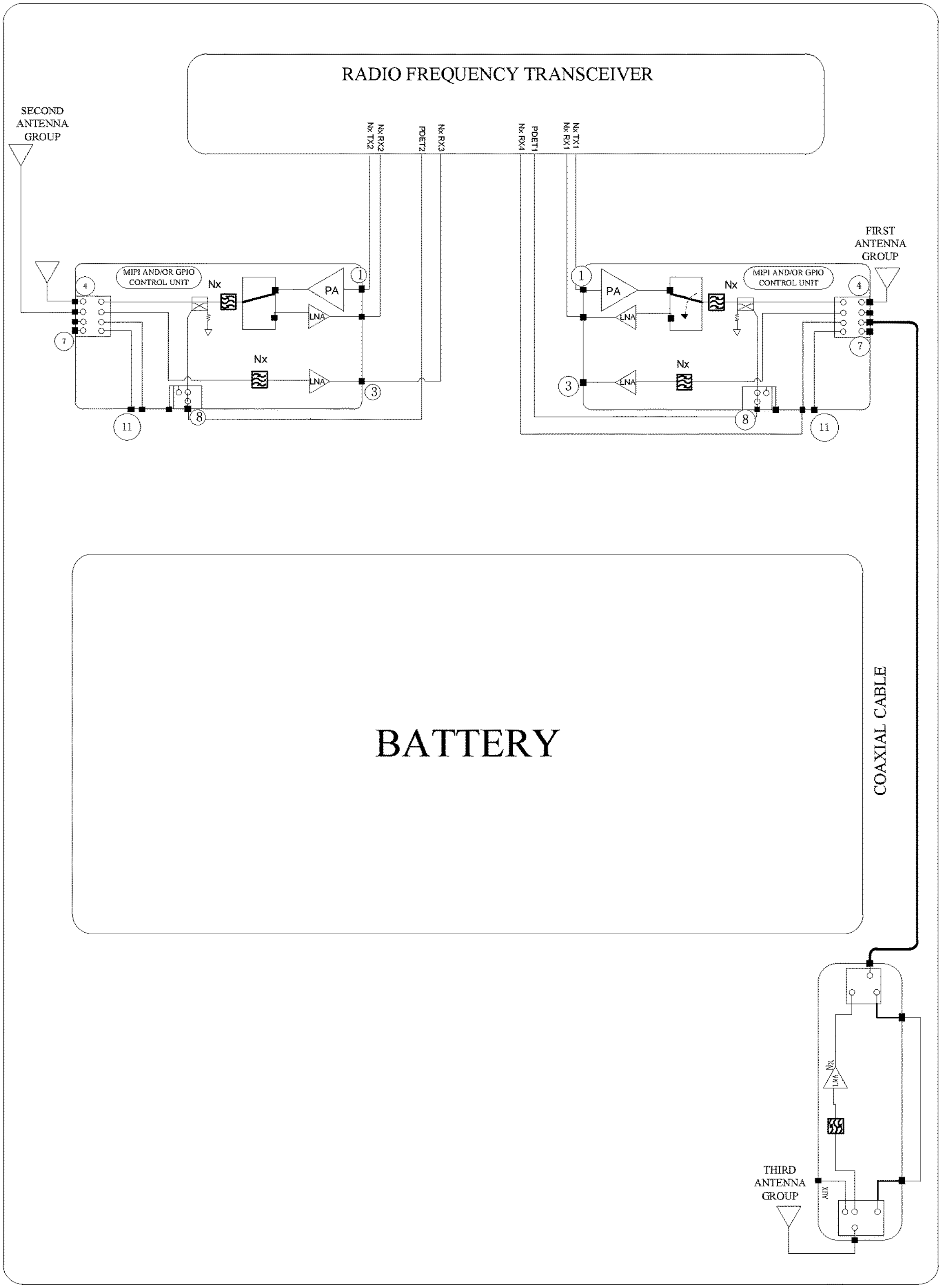
FIG. 4M is a schematic structural diagram illustrating a radio frequency system according to another implementation of the present disclosure.

As illustrated in FIG. 4M, in this example, the radio frequency architecture has the following function: ① supporting 5G NR single-band; ② not supporting UL CA; ③ not supporting DL CA; ④ supporting transmission of an SSR with four antennas in a polling manner; ⑤ supporting NR 2T4R (single-band, two transmitting paths and four receiving paths).

The radio frequency architecture for 5G includes a radio frequency transceiver, two transmitting modules (a first transmitting module and a second transmitting module), one receiving module, and three antenna groups (a first antenna group, a second antenna group, and a third antenna group). The first antenna group includes one antenna. The second antenna group includes two antennas. The third antenna group includes one antenna. The radio frequency transceiver, the first transmitting module, and the second transmitting module are disposed on a main board (two modules above a battery in this figure). The receiving module is disposed on a sub board (one module below the battery in this figure). Each receiving module is disposed adjacent to an antenna with which the receiving module is coupled.

The first transmitting module is disposed adjacent to the first antenna group. The second transmitting module is disposed adjacent to the second antenna group. The receiving module is disposed adjacent to the third antenna group.

The structure and connection of internal devices of the transmitting module are similar to that of the transmitting module in FIG. 2L. The internal devices and connection therebetween of each receiving module are similar to that of the receiving module in FIG. 1O2.

The radio frequency transceiver has a first transmitting port Nx TX1 coupled with a first external port of the first transmitting module. The radio frequency transceiver has a first receiving port Nx RX1 in a first band coupled with a second external port of the first transmitting module. The radio frequency transceiver has a fourth receiving port Nx RX4 in the first band coupled with a tenth external port of the first transmitting module. The radio frequency transceiver has a second transmitting port Nx TX2 coupled with a first external port of the second transmitting module. The radio frequency transceiver has a second receiving port Nx RX2 in the first band coupled with a second external port of the second transmitting module. The radio frequency transceiver has a third receiving port Nx RX3 in the first band coupled with a third external port of the second transmitting module. The radio frequency transceiver has a first PDET1 port coupled with an eighth external port of the first transmitting module. The radio frequency transceiver has a second PDET2 port coupled with an eighth external port of the second transmitting module.

The first antenna group is coupled with a fourth external port of the first transmitting module. The second antenna group is coupled with a fourth external port and a fifth external port of the second transmitting module. The third antenna group is coupled with a P port of a first transfer switch of the receiving module. The receiving module has a second transfer switch, which has a P port coupled with a sixth external port of the first transmitting module.

An electronic device including the radio frequency architecture described above switches on a transmitting path between a transmitting port in a target band of the radio frequency transceiver and a target antenna group in the radio frequency system, to transmit a signal through an antenna in the target antenna group.

In an example, the electronic device including the foregoing radio frequency architecture performs, in single-band (for example, Nx band), SRS four antenna rotation or autonomous transmission switching as follows.

In a first transmission period, the electronic device controls a first T port of a channel selector-switch of the first transmitting module to be connected to a first P port of the channel selector-switch, and controls the first T port of the channel selector-switch of the first transmitting module to be connected to a third P port of the channel selector-switch, to transmit signals through antennas in antenna groups.

In a second transmission period, the electronic device controls a first T port of a channel selector-switch of the second transmitting module to be connected to a first P port of the channel selector-switch, and controls the first T port of the channel selector-switch of the second transmitting module to be connected to a second P port of the channel selector-switch, to transmit signals through antennas in an antenna group.

Figure 4N:
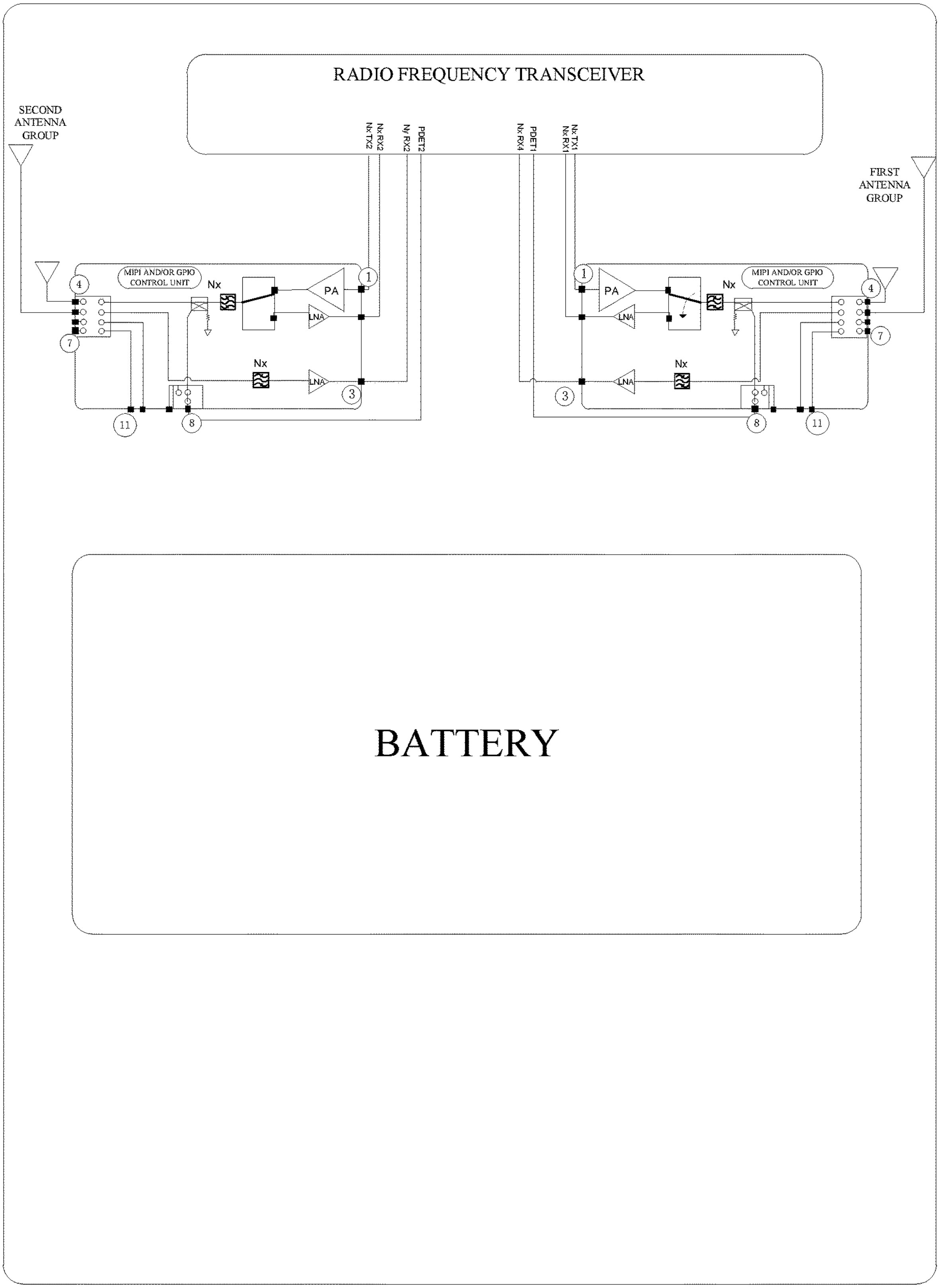
FIG. 4N is a schematic structural diagram illustrating a radio frequency system according to another implementation of the present disclosure.

As illustrated in FIG. 4N, in this example, the radio frequency architecture has the following function: ① supporting 5G NR single-band; ② not supporting UL CA; ③ not supporting DL CA; ④ supporting transmission of an SSR with four antennas in a polling manner; ⑤ supporting NR 2T4R (single-band, two transmitting paths and four receiving paths).

The radio frequency architecture for 5G includes a radio frequency transceiver, two transmitting modules (a first transmitting module and a second transmitting module), and two antenna groups (a first antenna group and a second antenna group). Each antenna group includes two antennas. The radio frequency transceiver and the two transmitting modules are disposed on a main board (two modules above a battery in this figure). Each receiving module is disposed adjacent to an antenna with which the receiving module is coupled.

The first transmitting module is disposed adjacent to the first antenna group. The second transmitting module is disposed adjacent to the second antenna group.

The structure and connection of internal devices of the first transmitting module and the second transmitting module are similar to that of the transmitting module in FIG. 2L. The disclosure is not limited herein.

The radio frequency transceiver has a first transmitting port Nx TX1 coupled with a first external port of the first transmitting module. The radio frequency transceiver has a first receiving port Nx RX1 in a first band coupled with a second external port of the first transmitting module. The radio frequency transceiver has a fourth receiving port Nx RX4 in the first band coupled with a third external port of the first transmitting module. The radio frequency transceiver has a second transmitting port Nx TX2 coupled with a first external port of the second transmitting module. The radio frequency transceiver has a second receiving port Nx RX2 in the first band coupled with a second external port of the second transmitting module. The radio frequency transceiver has a third receiving port Nx RX3 in the first band coupled with a third external port of the second transmitting module. The radio frequency transceiver has a first PDET1 port coupled with an eighth external port of the first transmitting module. The radio frequency transceiver has a second PDET2 port coupled with an eighth external port of the second transmitting module.

The first antenna group is coupled with a fourth external port and a fifth external port of the first transmitting module. The second antenna group is coupled with a fourth external port and a fifth external port of the second transmitting module.

An electronic device including the radio frequency architecture described above switches on a transmitting path between a transmitting port in a target band of the radio frequency transceiver and a target antenna group in the radio frequency system, to transmit a signal through an antenna in the target antenna group.

In an example, the electronic device including the foregoing radio frequency architecture performs, in single-band (for example, Nx band), SRS four antenna rotation or autonomous transmission switching as follows.

In a first transmission period, the electronic device controls a first T port of a channel selector-switch of the first transmitting module to be connected to a first P port of the channel selector-switch, and controls the first T port of the channel selector-switch of the first transmitting module to be connected to a second P port of the channel selector-switch, to achieve signal transmission through antennas in an antenna group.

In a second transmission period, the electronic device controls a first T port of a channel selector-switch of the second transmitting module to be connected to a first P port of the channel selector-switch, and controls the first T port of the channel selector-switch of the second transmitting module to be connected to a second P port of the channel selector-switch, to achieve signal transmission through antennas in an antenna group.

Figure 4O:
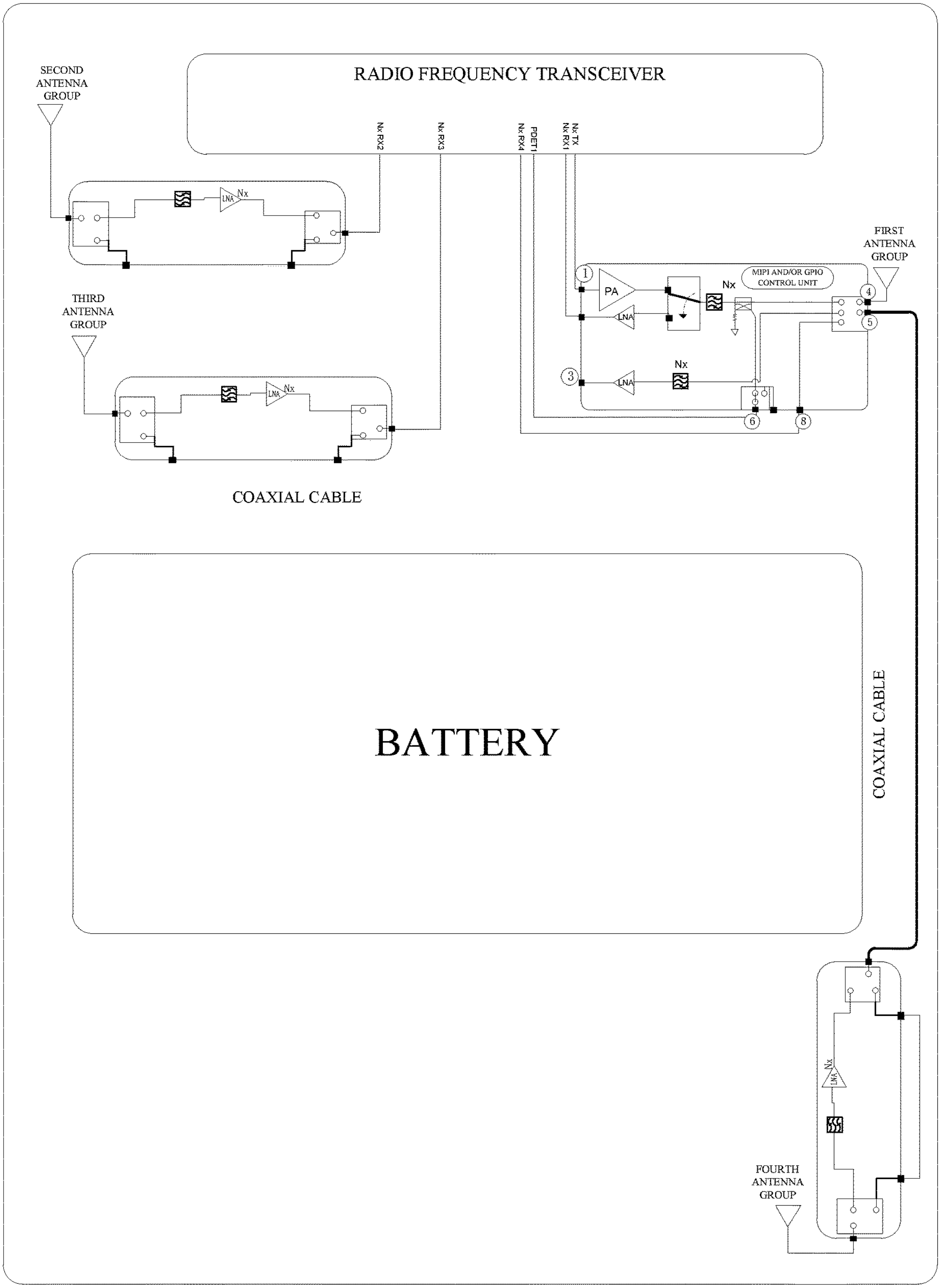
FIG. 4O is a schematic structural diagram illustrating a radio frequency system according to another implementation of the present disclosure.

As illustrated in FIG. 4O, in this example, the radio frequency architecture has the following function: ① supporting 5G NR single-band; ② not supporting UL CA; ③ supporting DL CA; ④ not supporting transmission of an SSR with four antennas in a polling manner; ⑤ supporting NR 1T4R (single-band, one transmitting path and four receiving paths).

The radio frequency architecture for 5G includes a radio frequency transceiver, one transmitting module, three receiving modules (a first receiving module, a second receiving module, and a third receiving module), and four antenna groups (a first antenna group, a second antenna group, a third antenna group, and a fourth antenna group). Each antenna group includes one antenna. The radio frequency transceiver, the transmitting module, the first receiving module, and the second receiving module are disposed on a main board (three modules above a battery in this figure). The third receiving module is disposed on a sub board (one module below the battery in this figure). Each receiving module is disposed adjacent to the antenna with which the receiving module is coupled.

The transmitting module is disposed adjacent to the first antenna group. The first receiving module is disposed adjacent to the second antenna group. The second receiving module is disposed adjacent to the third antenna group. The third receiving module is disposed adjacent to the fourth antenna group.

The structure and connection of internal devices of the transmitting module are similar to that of the transmitting module in FIG. 2K. The internal devices and connection therebetween of each receiving module are similar to that of the receiving module in FIG. 1N2.

The radio frequency transceiver has a transmitting port Nx TX coupled with a first external port of the transmitting module. The radio frequency transceiver has a first receiving port Nx RX1 in a first band coupled with a second external port of the transmitting module. The radio frequency transceiver has a fourth receiving port Nx RX4 in the first band coupled with an eighth external port of the transmitting module. The radio frequency transceiver has a second receiving port Nx RX2 in the first band coupled with a P port of a second transfer switch of the first receiving module. The radio frequency transceiver has a third receiving port Nx RX3 in the first band coupled with a P port of a second transfer switch of the second receiving module.

The second antenna group is coupled with a P port of a first transfer switch of the first receiving module. The third antenna group is coupled with a P port of a first transfer switch of the second receiving module. The fourth antenna group is coupled with a P port of a first transfer switch of the third receiving module. The third receiving module has a second transfer switch, which has a P port coupled with a fifth external port of the transmitting module.

An electronic device including the radio frequency architecture described above switches on a transmitting path between a transmitting port in a target band of the radio frequency transceiver and a target antenna group in the radio frequency system, to transmit a signal through an antenna in the target antenna group.

In an example, the electronic device including the foregoing radio frequency architecture performs, in single-band (for example, Nx band), transmitting an SRS with four antennas in turn or autonomous transmission switching as follows.

In a first transmission period, the electronic device controls a first T port of a channel selector-switch of the transmitting module to be connected to a first P port of the channel selector-switch, to achieve signal transmission through an antenna of an antenna group.

In a second transmission period, the electronic device controls the first T port of the channel selector-switch of the transmitting module to be connected to a second P port of the channel selector-switch, to achieve signal transmission through an antenna of an antenna group.

Figure 4P:
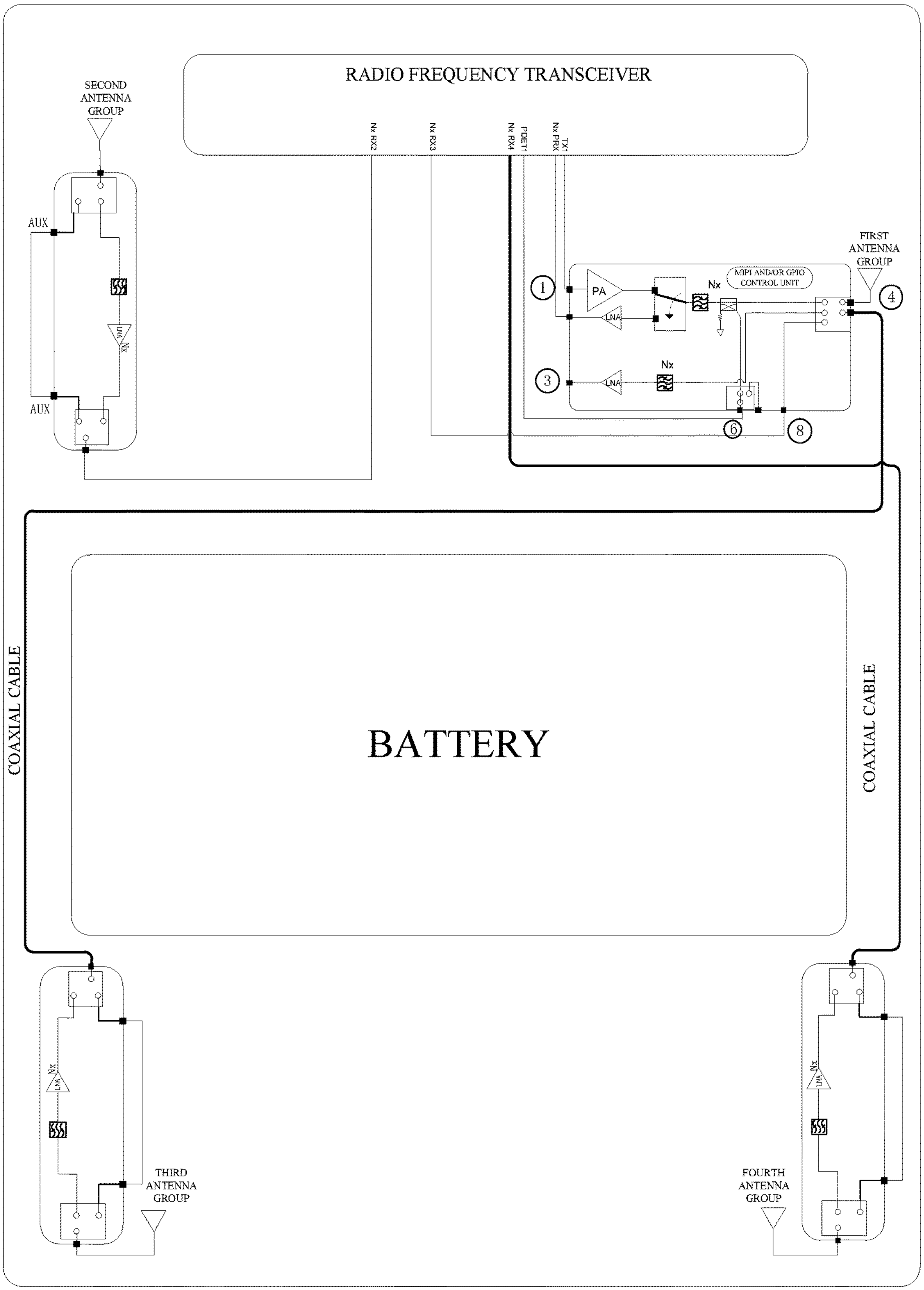
FIG. 4P is a schematic structural diagram illustrating a radio frequency system according to another implementation of the present disclosure.

As illustrated in FIG. 4P, in this example, the radio frequency architecture has the following function: ① supporting 5G NR single-band; ② not supporting UL CA; ③ not supporting DL CA; ④ not supporting transmission of an SSR with four antennas in a polling manner; ⑤ supporting NR 1T4R (single-band, one transmitting path and four receiving paths).

The radio frequency architecture for 5G includes a radio frequency transceiver, one transmitting module, three receiving modules (a first receiving module, a second receiving module, and a third receiving module), and four antenna groups (a first antenna group, a second antenna group, a third antenna group, and a fourth antenna group). Each antenna group includes one antenna. The radio frequency transceiver, the transmitting module, and the first receiving module are disposed on a main board (two modules above a battery in this figure). The second receiving module and the third receiving module are disposed on a sub board (two modules below the battery in this figure). Each receiving module is disposed adjacent to an antenna with which the receiving module is coupled.

The transmitting module is disposed adjacent to the first antenna group. The first receiving module is disposed adjacent to the second antenna group. The second receiving module is disposed adjacent to the third antenna group. The third receiving module is disposed adjacent to the fourth antenna group.

The structure and connection of internal devices of the transmitting module are similar to that of the transmitting module in FIG. 2K. The internal devices and connection therebetween of each receiving module are similar to that of the receiving module in FIG. 1N2. The first receiving module has an AUX (an AUX coupled with a first transfer switch of the first receiving module) connected with the other AUX (an AUX coupled with a second transfer switch of the first receiving module) of the first receiving module, to support transmitting an SRS TX signal through a corresponding antenna or self-switching among antennas for signal transmission.

The radio frequency transceiver has a transmitting port TX1 in a first band coupled with a first external port of the transmitting module. The radio frequency transceiver has a first receiving port Nx RX1 in the first band coupled with a second external port of the transmitting module. The radio frequency transceiver has a second receiving port Nx RX2 in the first band coupled with a P port of the second transfer switch of the first receiving module. The radio frequency transceiver has a third receiving port Nx RX3 in the first band coupled with an eighth external port of the transmitting module. The radio frequency transceiver has a fourth receiving port Nx RX4 in the first band coupled with a P port of a second transfer switch of the third receiving module. The radio frequency transceiver has a PDET port coupled with a sixth external port of the transmitting module.

The first antenna group is coupled with a fourth external port of the transmitting module. The second antenna group is coupled with a P port of the first transfer switch of the first receiving module. The third antenna group is coupled with a P port of a first transfer switch of the second receiving module. The fourth antenna group is coupled with a P port of a first transfer switch of the third receiving module. The second receiving module has a second transfer switch, which has a P port coupled with a fifth external port of the transmitting module.

An electronic device including the radio frequency architecture described above switches on a transmitting path between a transmitting port in a target band of the radio frequency transceiver and a target antenna group in the radio frequency system, to transmit a signal through an antenna in the target antenna group.

In an example, the electronic device including the foregoing radio frequency architecture performs, in single-band (for example, Nx band), switching among transmit antennas as follows.

In a first transmission period, the electronic device controls a first T port of a channel selector-switch of the transmitting module to be connected to a first P port of the channel selector-switch, to transmit a signal through an antenna of the first antenna group.

In a second transmission period, the electronic device controls the first T port of the channel selector-switch of the transmitting module to be connected to a second P port of the channel selector-switch, to transmit a signal through an antenna of the third antenna group.

Figure 4Q:
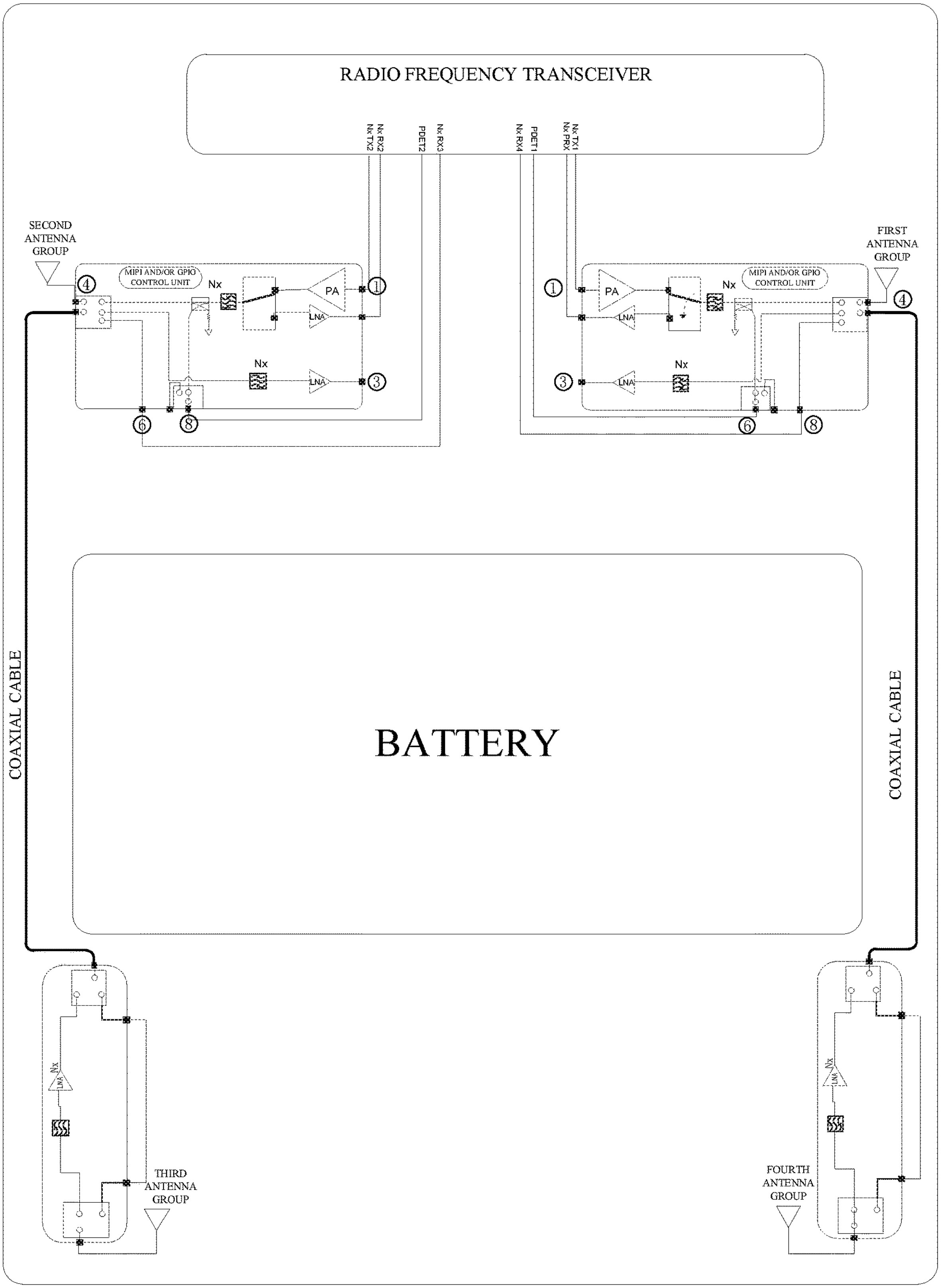
FIG. 4Q is a schematic structural diagram illustrating a radio frequency system according to another implementation of the present disclosure.

As illustrated in FIG. 4Q, in this example, the radio frequency architecture has the following function: ① supporting 5G NR single-band; ② not supporting UL CA; ③ not supporting DL CA; ④ not supporting SRS switching in four antennas; ⑤ supporting NR 2T4R (two transmitting paths and four receiving paths in total).

The radio frequency architecture for 5G includes a radio frequency transceiver, two transmitting modules (a first transmitting module and a second transmitting module), two receiving modules (a first receiving module and a second receiving module), and four antenna groups (a first antenna group, a second antenna group, a third antenna group, and a fourth antenna group). Each of the first antenna group, the second antenna group, the third antenna group, and the fourth antenna group includes one antenna. The radio frequency transceiver, the first transmitting module, and the second transmitting module are disposed on a main board (two modules above a battery in this figure). The first receiving module and the second receiving module are disposed on a sub board (two modules below the battery in this figure). Each transmitting module/receiving module is disposed adjacent to the antenna group with which the transmitting module/receiving module is coupled.

The first transmitting module is disposed adjacent to the first antenna group. The second transmitting module is disposed adjacent to the second antenna group. The first receiving module is disposed adjacent to the third antenna group. The second receiving module is disposed adjacent to the fourth antenna group.

The structure and connection of internal devices of the transmitting module are similar to that of the transmitting module in FIG. 2K. The internal devices and connection therebetween of each receiving module are similar to that of the receiving module in FIG. 1N2.

The radio frequency transceiver has a first transmitting port Nx TX1 in an Nx band coupled with a first external port of the first transmitting module. The radio frequency transceiver has a second transmitting port Nx TX2 in the Nx band coupled with a first external port of the second transmitting module. The radio frequency transceiver has a first receiving port Nx RX1 in the Nx band coupled with a second external port of the first transmitting module. The radio frequency transceiver has a second receiving port Nx RX2 in the Nx band coupled with a second external port of the second transmitting module. The radio frequency transceiver has a third receiving port Nx RX3 in the Nx band coupled with a sixth external port of the second transmitting module. The radio frequency transceiver has a fourth receiving port Nx RX4 in the Nx band coupled with an eighth external port of the first transmitting module. The radio frequency transceiver has a first PDET1 port coupled with a sixth external port of the first transmitting module. The radio frequency transceiver has a second PDET2 port coupled with an eighth external port of the second transmitting module.

The antenna of the first antenna group is coupled with a fourth external port of the first transmitting module. The antenna of the second antenna group is coupled with a fourth external port of the second transmitting module. The antenna of the third antenna group is coupled with a P port of a first transfer switch of the first receiving module. The antenna of the fourth antenna group is coupled with a P port of a first transfer switch of the second receiving module.

An electronic device including the radio frequency architecture described above switches on a transmitting path between a transmitting port in a target band of the radio frequency transceiver and a target antenna group in the radio frequency system, to transmit a signal through an antenna in the target antenna group.

In an example, the electronic device including the foregoing radio frequency architecture performs, in single-band (for example, Nx band), switching among transmit antennas as follows.

In a first transmission period, the electronic device controls a first T port of a channel selector-switch of the first transmitting module to be connected to a first P port of the channel selector-switch, and controls the first T port of the channel selector-switch of the first transmitting module to be connected to a second P port of the channel selector-switch and a Bypass channel of the second receiving module to switch on, to achieve signal transmission through antennas in the first antenna group and the fourth antenna group.

In a second transmission period, the electronic device controls a first T port of a channel selector-switch of the second transmitting module to be connected to a first P port of the channel selector-switch, and controls the first T port of the channel selector-switch of the second transmitting module to be connected to a second P port of the channel selector-switch and a Bypass channel of the first receiving module to switch on, to achieve signal transmission through antennas in the second antenna group and the third antenna group.

Figure 4R:
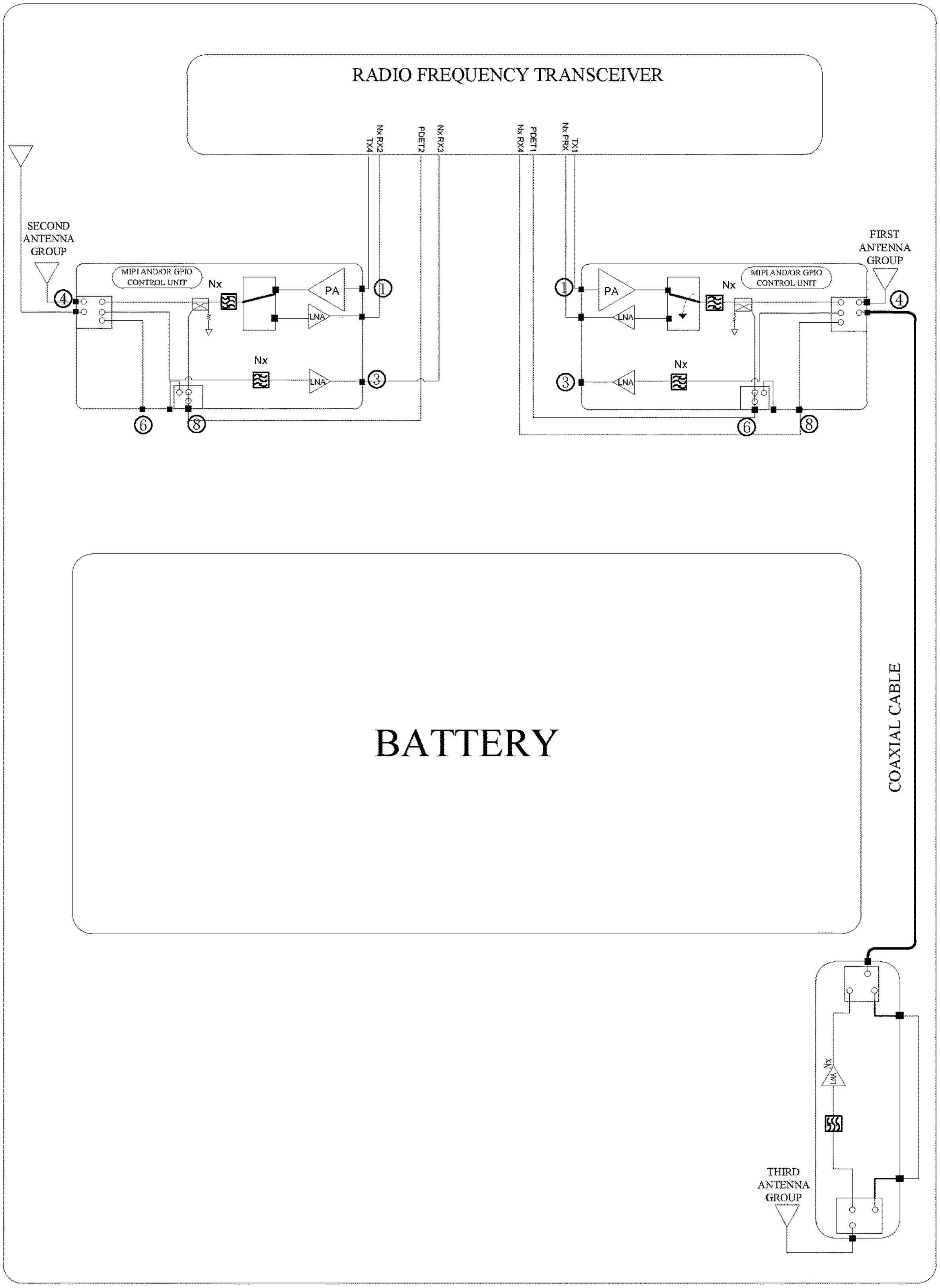
FIG. 4R is a schematic structural diagram illustrating a radio frequency system according to another implementation of the present disclosure.

As illustrated in FIG. 4R, in this example, the radio frequency architecture has the following function: ① supporting 5G NR single-band; ② not supporting UL CA; ③ not supporting DL CA; ④ not supporting SRS switching in four antennas; ⑤ supporting NR 2T4R (four transmitting paths and eight receiving paths in total).

The radio frequency architecture for 5G includes a radio frequency transceiver, two transmitting modules (a first transmitting module and a second transmitting module), one receiving module, and three antenna groups (a first antenna group, a second antenna group, and a third antenna group). The first antenna group includes one antenna. The second antenna group includes two antennas. The third antenna group includes one antenna. The radio frequency transceiver, the first transmitting module, and the second transmitting module are disposed on a main board (two modules above a battery in this figure). The receiving module is disposed on a sub board (one module below the battery in this figure). Each transmitting module/receiving module is disposed adjacent to the antenna group with which the receiving module is coupled.

The first transmitting module is disposed adjacent to the first antenna group. The second transmitting module is disposed adjacent to the second antenna group. The receiving module is disposed adjacent to the third antenna group.

The structure and connection of internal devices of the transmitting module are similar to that of the transmitting module in FIG. 2K. The internal devices and connection therebetween of each receiving module are similar to that of the receiving module in FIG. 1N2.

The radio frequency transceiver has a first transmitting port TX1 in an Nx band coupled with a first external port of the first transmitting module. The radio frequency transceiver has a fourth transmitting port TX4 in the Nx band coupled with a first external port of the second transmitting module. The radio frequency transceiver has a first receiving port Nx PRX in the Nx band coupled with a second external port of the first transmitting module. The radio frequency transceiver has a second receiving port Nx RX2 in the Nx band coupled with a second external port of the second transmitting module. The radio frequency transceiver has a third receiving port Nx RX3 in the Nx band coupled with a third external port of the second transmitting module. The radio frequency transceiver has a fourth receiving port Nx RX4 in the Nx band coupled with an eighth external port of the first transmitting module. The radio frequency transceiver has a first PDET1 port coupled with a sixth external port of the first transmitting module. The radio frequency transceiver has a second PDET2 port coupled with an eighth external port of the second transmitting module.

The antenna of the first antenna group is coupled with a fourth external port of the first transmitting module. The two antennas of the second antenna group are respectively coupled with a fourth external port and a fifth external port of the second transmitting module. The antenna of the third antenna group is coupled with a P port of a first transfer switch of the receiving module.

An electronic device including the radio frequency architecture described above switches on a transmitting path between a transmitting port in a target band of the radio frequency transceiver and a target antenna group in the radio frequency system, to transmit a signal through an antenna in the target antenna group.

In an example, the electronic device including the foregoing radio frequency architecture performs, in single-band (for example, Nx band), switching among transmit antennas as follows.

In a first transmission period, the electronic device controls a first T port of a channel selector-switch of the first transmitting module to be connected to a first P port of the channel selector-switch, and controls the first T port of the channel selector-switch of the first transmitting module to be connected to a second P port of the channel selector-switch and a Bypass channel of the receiving module to switch on, to achieve signal transmission through antennas in the first antenna group and the third antenna group.

In a second transmission period, the electronic device controls a first T port of a channel selector-switch of the second transmitting module to be connected to a first P port of the channel selector-switch, and controls the first T port of the channel selector-switch of the second transmitting module to be connected to a second P port of the channel selector-switch, to transmit a signal through a second antenna in the second antenna group and transmit a signal through a first antenna in the second antenna group.

Figure 4S:
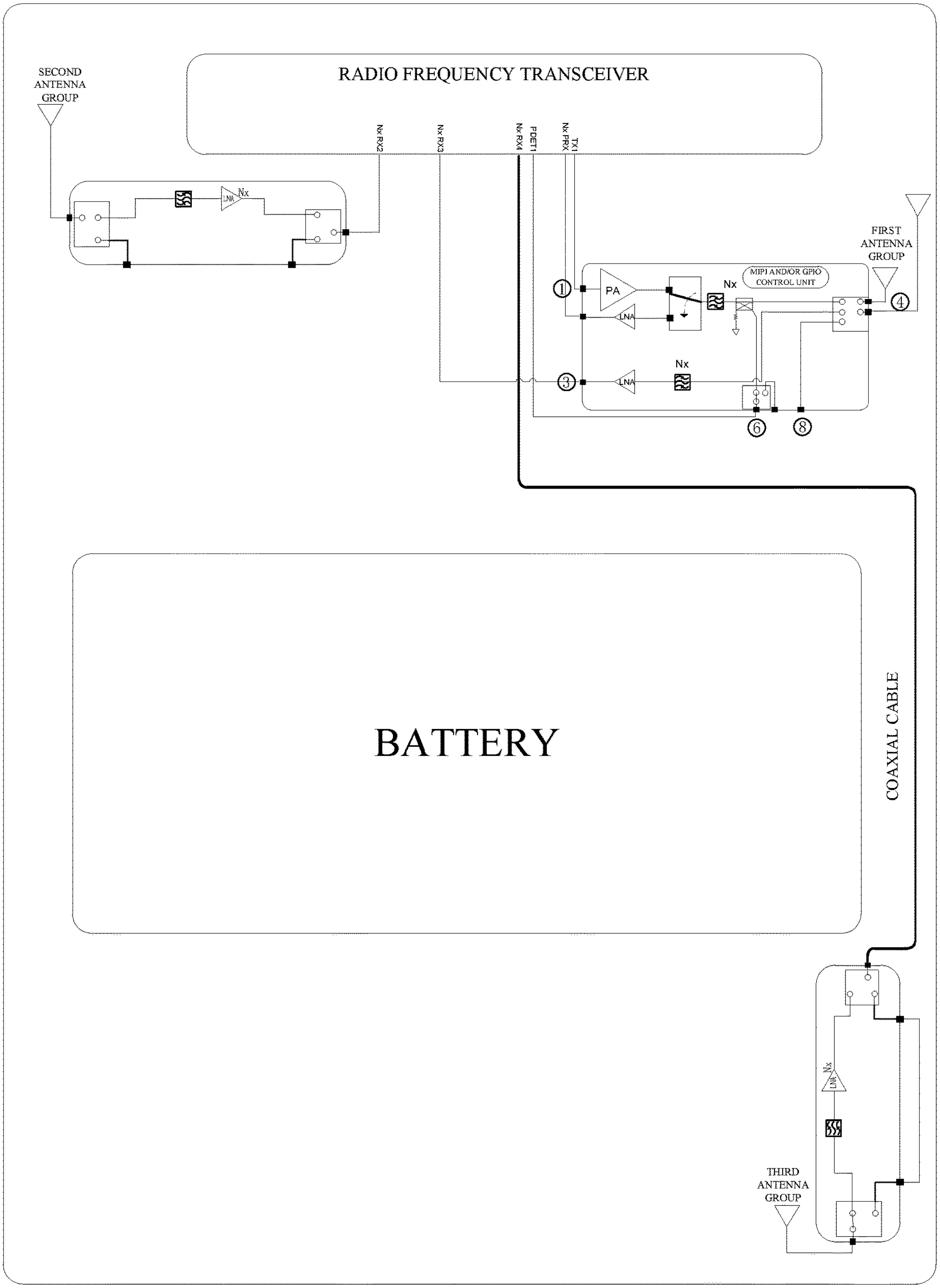
FIG. 4S is a schematic structural diagram illustrating a radio frequency system according to another implementation of the present disclosure.

As illustrated in FIG. 4S, in this example, the radio frequency architecture has the following function: ① supporting 5G NR single-band; ② not supporting UL CA; ③ not supporting DL CA; ④ not supporting SRS switching in four antennas; ⑤ supporting NR 1T4R (one transmitting path and four receiving paths in total).

The radio frequency architecture for 5G includes a radio frequency transceiver, one transmitting module, two receiving modules (a first receiving module and a second receiving module), and three antenna groups (a first antenna group, a second antenna group, and a third antenna group). The first antenna group includes two antennas. The second antenna group includes one antenna. The third antenna group includes one antenna. The radio frequency transceiver, the transmitting module, and the first receiving module are disposed on a main board (two modules above a battery in this figure). The second receiving module is disposed on a sub board (one module below the battery in this figure). Each receiving module is disposed adjacent to an antenna with which the receiving module is coupled.

The transmitting module is disposed adjacent to the first antenna group. The first receiving module is disposed adjacent to the second antenna group. The second receiving module is disposed adjacent to the third antenna group.

The structure and connection of internal devices of the transmitting module are similar to that of the transmitting module in FIG. 2K. The internal devices and connection therebetween of each receiving module are similar to that of the receiving module in FIG. 1N2. The first receiving module has an AUX (an AUX coupled with a first transfer switch of the first receiving module) coupled with the other AUX (an AUX coupled with a second transfer switch of the first receiving module) of the first receiving module, to support transmitting an SRS TX signal through a corresponding antenna or self-switching among antennas for signal transmission.

The radio frequency transceiver has a first transmitting port TX1 in a first band coupled with a first external port of the transmitting module. The radio frequency transceiver has a first receiving port Nx PRX in the first band coupled with a second external port of the transmitting module. The radio frequency transceiver has a second receiving port Nx RX2 in the first band coupled with a P port of a second transfer switch of the first receiving module. The radio frequency transceiver has a third receiving port Nx RX3 in the first band coupled with a third external port of the transmitting module. The radio frequency transceiver has a fourth receiving port Nx RX4 in the first band coupled with a P port of a second transfer switch of the second receiving module. The radio frequency transceiver has a PDET port coupled with a sixth external port of the transmitting module.

The two antennas of the first antenna group are coupled with a fourth external port and a fifth external port of the transmitting module. The second antenna group is coupled with a P port of a first transfer switch of the first receiving module. The third antenna group is coupled with a P port of a first transfer switch of the second receiving module.

An electronic device including the radio frequency architecture described above switches on a transmitting path between a transmitting port in a target band of the radio frequency transceiver and a target antenna group in the radio frequency system, to transmit a signal through an antenna in the target antenna group.

In an example, the electronic device including the foregoing radio frequency architecture performs, in single-band (for example, Nx band), switching among transmit antennas as follows.

In a first transmission period, the electronic device controls a first T port of a channel selector-switch of the transmitting module to be connected to a first P port of the channel selector-switch, to transmit a signal through a first antenna in the first antenna group.

In a second transmission period, the electronic device controls the first T port of the channel selector-switch of the transmitting module to be connected to a second P port of the channel selector-switch, to transmit a signal through a second antenna in the first antenna group.

Figure 4T:
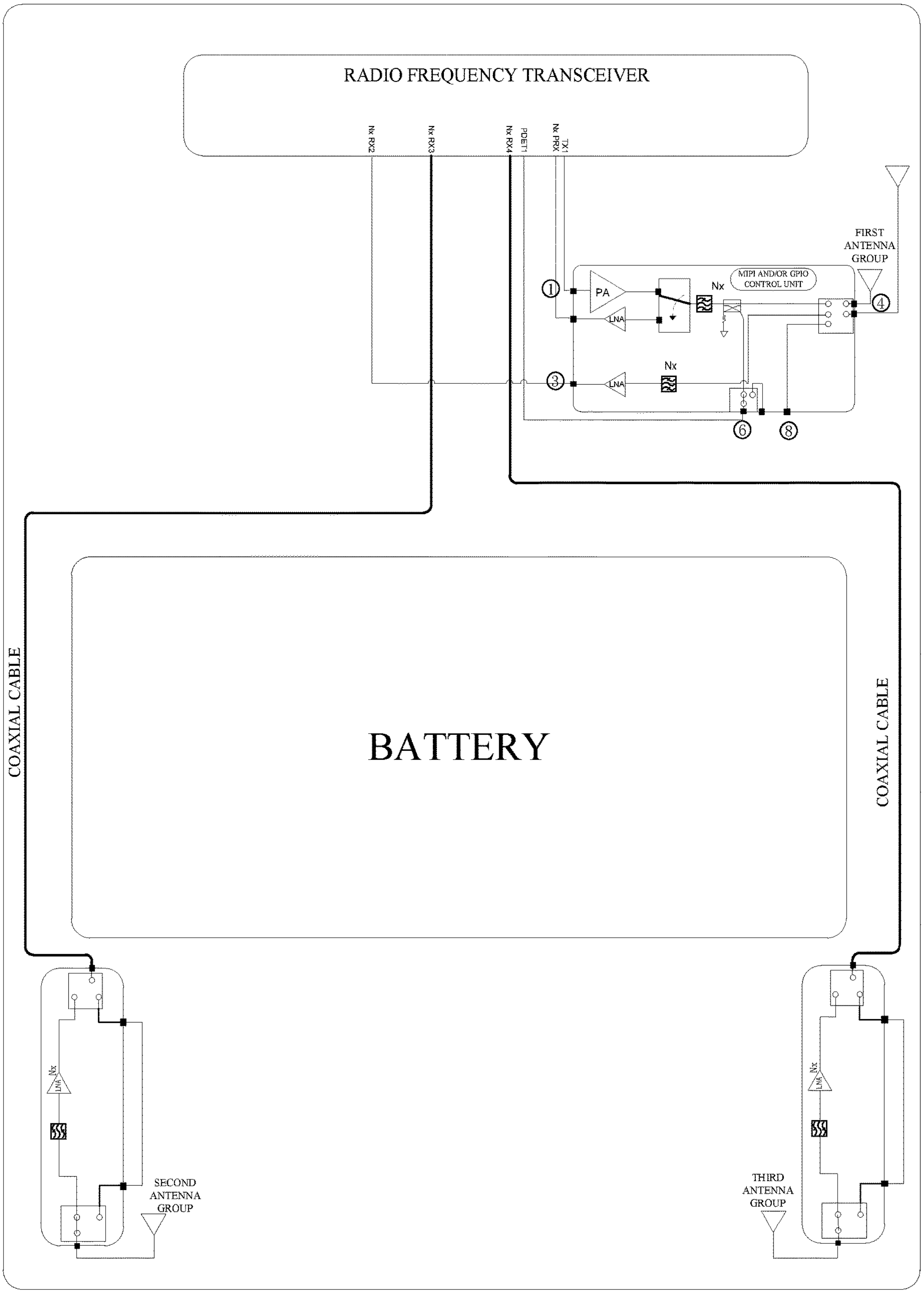
FIG. 4T is a schematic structural diagram illustrating a radio frequency system according to another implementation of the present disclosure.

As illustrated in FIG. 4T, in this example, the radio frequency architecture has the following function: ① supporting 5G NR single-band; ② not supporting UL CA; ③ not supporting DL CA; ④ not supporting SRS switching in four antennas; ⑤ supporting NR 1T4R (one transmitting path and four receiving paths in total).

The radio frequency architecture for 5G includes a radio frequency transceiver, one transmitting module, two receiving modules (a first receiving module and a second receiving module), and three antenna groups (a first antenna group, a second antenna group, and a third antenna group). The first antenna group includes two antennas. The second antenna group includes one antenna. The third antenna group includes one antenna. The radio frequency transceiver and the transmitting module are disposed on a main board (one module above a battery in this figure). The first receiving module and the second receiving module is disposed on a sub board (two modules below the battery in this figure). Each receiving module is disposed adjacent to an antenna with which the receiving module is coupled.

The transmitting module is disposed adjacent to the first antenna group. The first receiving module is disposed adjacent to the second antenna group. The second receiving module is disposed adjacent to the third antenna group.

The structure and connection of internal devices of the transmitting module are similar to that of the transmitting module in FIG. 2K. The internal devices and connection therebetween of each receiving module are similar to that of the receiving module in FIG. 1N2.

The radio frequency transceiver has a first transmitting port TX1 in a first band coupled with a first external port of the transmitting module. The radio frequency transceiver has a first receiving port Nx PRX in the first band coupled with a second external port of the transmitting module. The radio frequency transceiver has a second receiving port Nx RX2 in the first band coupled with a third external port of the transmitting module. The radio frequency transceiver has a third receiving port Nx RX3 in the first band coupled with a P port of a second transfer switch of the first receiving module. The radio frequency transceiver has a fourth receiving port Nx RX4 in the first band coupled with a P port of a second transfer switch of the second receiving module. The radio frequency transceiver has a PDET port coupled with a sixth external port of the transmitting module.

The two antennas of the first antenna group are respectively coupled with a fourth external port and a fifth external port of the transmitting module. The antenna of the second antenna group is coupled with a P port of a first transfer switch of the first receiving module. The antenna of the third antenna group is coupled with a P port of a first transfer switch of the second receiving module.

An electronic device including the radio frequency architecture described above switches on a transmitting path between a transmitting port in a target band of the radio frequency transceiver and a target antenna group in the radio frequency system, to transmit a signal through an antenna in the target antenna group.

In an example, the electronic device including the foregoing radio frequency architecture performs, in single-band (for example, Nx band), switching among transmit antennas as follows.

In a first transmission period, the electronic device controls a first T port of a channel selector-switch of the transmitting module to be connected to a first P port of the channel selector-switch, to transmit a signal through a first antenna in the first antenna group.

In a second transmission period, the electronic device controls the first T port of the channel selector-switch of the transmitting module to be connected to a second P port of the channel selector-switch, to transmit a signal through a second antenna in the first antenna group.

Figure 4U:
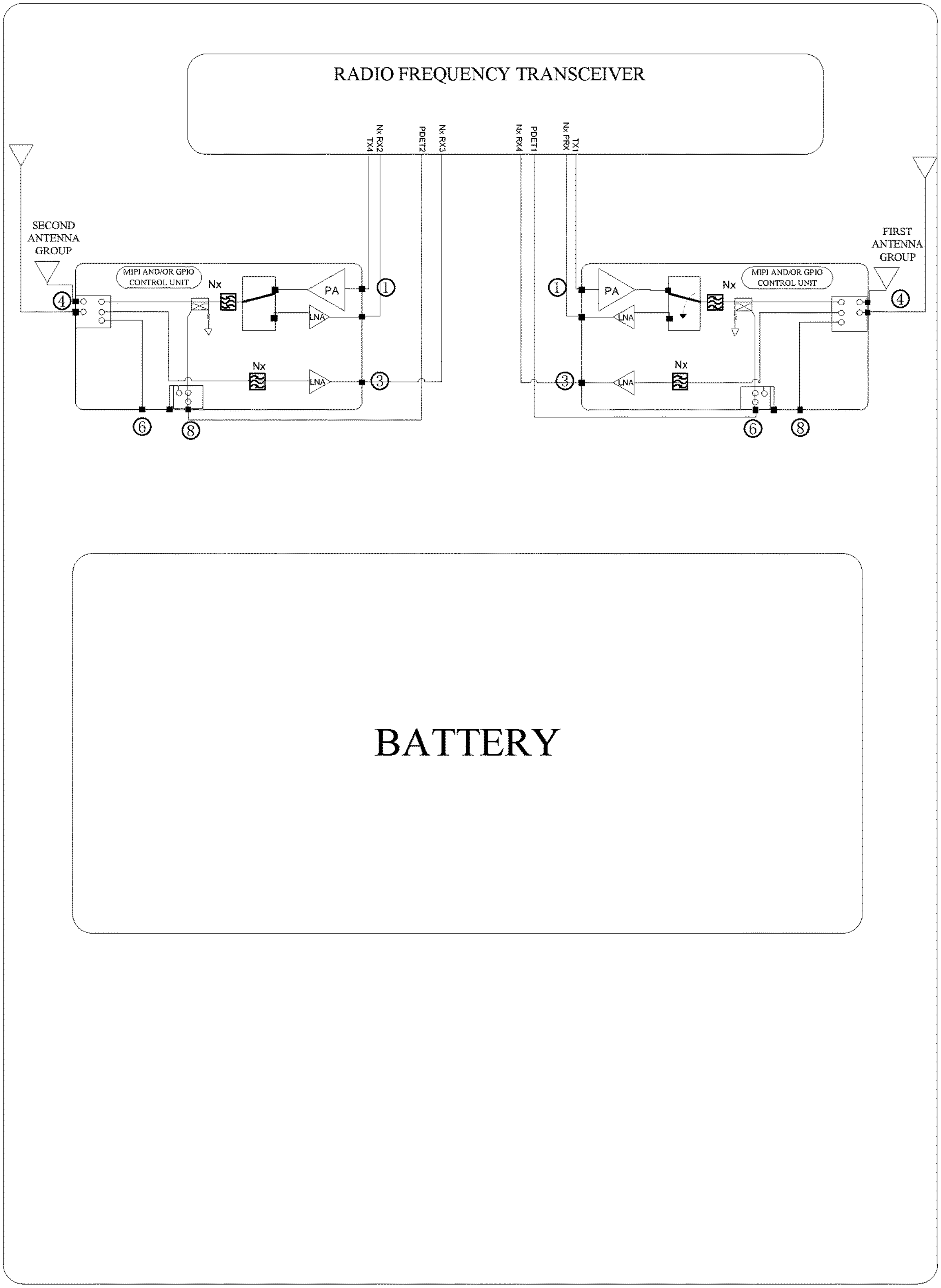
FIG. 4U is a schematic structural diagram illustrating a radio frequency system according to another implementation of the present disclosure.

As illustrated in FIG. 4U, in this example, the radio frequency architecture has the following function: ① supporting 5G NR single-band; ② not supporting UL CA; ③ not supporting DL CA; ④ not supporting SRS switching in four antennas; ⑤ supporting NR 2T4R (four transmitting paths and eight receiving paths in total).

The radio frequency architecture for 5G includes a radio frequency transceiver, two transmitting modules (a first transmitting module and a second transmitting module), and two antenna groups (a first antenna group and a second antenna group). Each of the first antenna group and the second antenna group includes two antennas. The radio frequency transceiver, the first transmitting module, and the second transmitting module are disposed on a main board (two modules above a battery in this figure). Each transmitting module is disposed adjacent to an antenna group with which the transmitting module is coupled.

The first transmitting module is disposed adjacent to the first antenna group. The second transmitting module is disposed adjacent to the second antenna group.

The structure and connection of internal devices of the first transmitting module and the second transmitting module are similar to that of the transmitting module in FIG. 2K.

The radio frequency transceiver has a first transmitting port TX1 in an Nx band coupled with a first external port of the first transmitting module. The radio frequency transceiver has a fourth transmitting port TX4 in the Nx band coupled with a first external port of the second transmitting module. The radio frequency transceiver has a first receiving port Nx PRX in the Nx band coupled with a second external port of the first transmitting module. The radio frequency transceiver has a second receiving port Nx RX2 in the Nx band coupled with a second external port of the second transmitting module. The radio frequency transceiver has a third receiving port Nx RX3 in the Nx band coupled with a third external port of the second transmitting module. The radio frequency transceiver has a fourth receiving port Nx RX4 in the Nx band coupled with a third external port of the first transmitting module. The radio frequency transceiver has a first PDET1 port coupled with a sixth external port of the first transmitting module. The radio frequency transceiver has a second PDET2 port coupled with an eighth external port of the second transmitting module.

The two antennas of the first antenna group are coupled with a fourth external port and a fifth external port of the first transmitting module. The two antennas of the second antenna group are coupled with a fourth external port and a fifth external port of the second transmitting module.

An electronic device including the radio frequency architecture described above switches on a transmitting path between a transmitting port in a target band of the radio frequency transceiver and a target antenna group in the radio frequency system, to transmit a signal through an antenna in the target antenna group.

In an example, the electronic device including the foregoing radio frequency architecture performs, in single-band (for example, Nx band), switching among transmit antennas as follows.

In a first transmission period, the electronic device controls a first T port of a channel selector-switch of the first transmitting module to be connected to a first P port of the channel selector-switch of the first transmitting module, and controls the first T port of the channel selector-switch of the first transmitting module to be connected to a second P port of the channel selector-switch of the first transmitting module, to achieve signal transmission through a first antenna and a second antenna in the first antenna group.

In a second transmission period, the electronic device controls a first T port of a channel selector-switch of the second transmitting module to be connected to a first P port of the channel selector-switch of the second transmitting module, and controls the first T port of the channel selector-switch of the second transmitting module to be connected to a second P port of the channel selector-switch of the second transmitting module, to achieve signal transmission through a first antenna and a second antenna in the second antenna group.

Figure 4V:
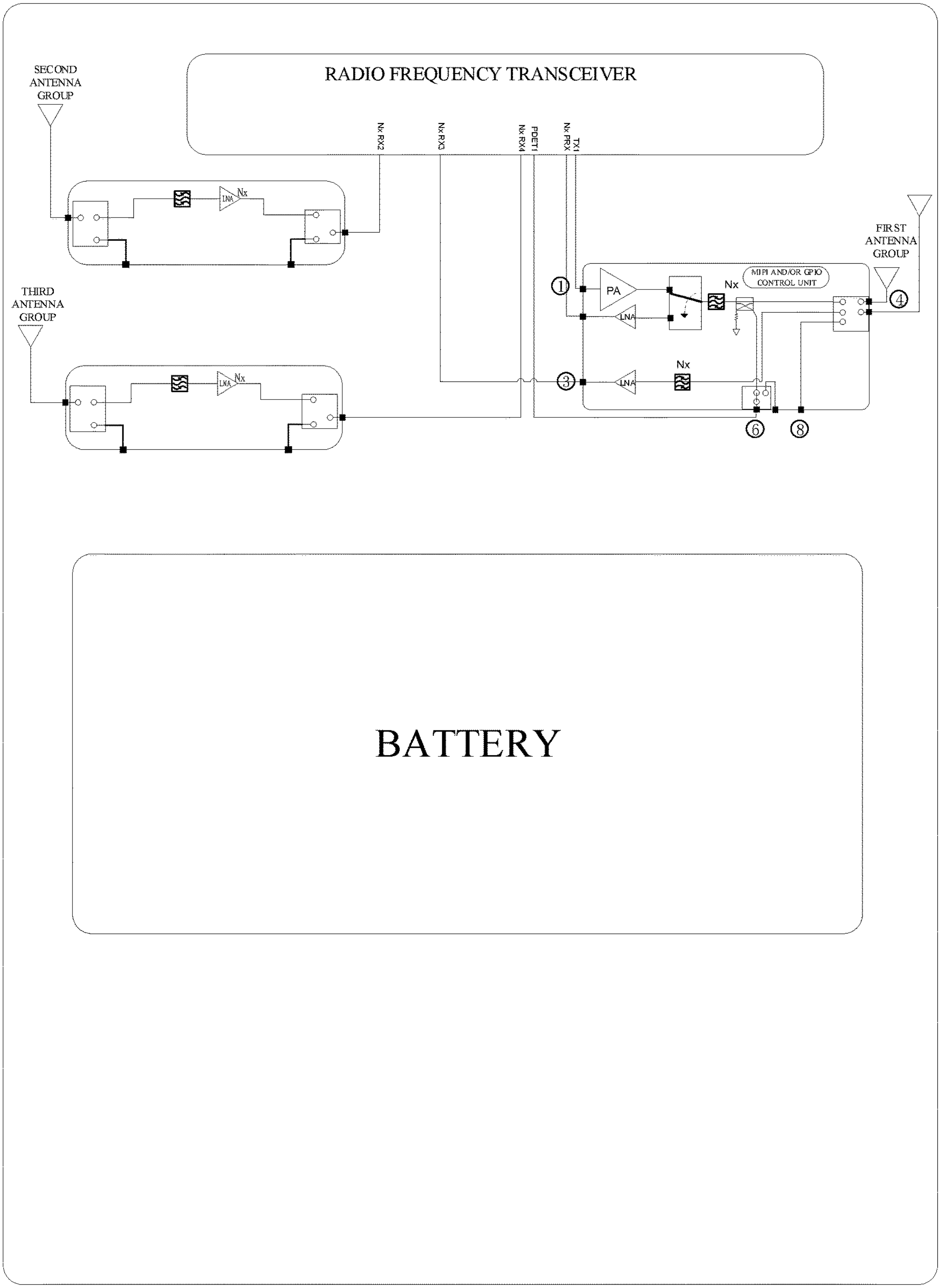
FIG. 4V is a schematic structural diagram illustrating a radio frequency system according to another implementation of the present disclosure.

As illustrated in FIG. 4V, in this example, the radio frequency architecture has the following function: ① supporting 5G NR single-band; ② not supporting UL CA; ③ not supporting DL CA; ④ not supporting SRS switching in four antennas; ⑤ supporting NR 1T4R (one transmitting path and four receiving paths in total).

The radio frequency architecture for 5G includes a radio frequency transceiver, one transmitting module, two receiving modules (a first receiving module and a second receiving module), and three antenna groups (a first antenna group, a second antenna group, and a third antenna group). The first antenna group includes two antennas. The second antenna group includes one antenna. The third antenna group includes one antenna. The radio frequency transceiver, the transmitting module, the first receiving module, and the second receiving module are disposed on a main board (three modules above a battery in this figure). Each receiving module is disposed adjacent to an antenna with which the receiving module is coupled.

The transmitting module is disposed adjacent to the first antenna group. The first receiving module is disposed adjacent to the second antenna group. The second receiving module is disposed adjacent to the third antenna group.

The structure and connection of internal devices of the transmitting module are similar to that of the transmitting module in FIG. 2K. The internal devices and connection therebetween of each receiving module are similar to that of the receiving module in FIG. 1N2.

The radio frequency transceiver has a first transmitting port TX1 in a first band coupled with a first external port of the transmitting module. The radio frequency transceiver has a first receiving port Nx PRX in the first band coupled with a second external port of the transmitting module. The radio frequency transceiver has a second receiving port Nx RX2 in the first band coupled with a P port of a second transfer switch of the first receiving module. The radio frequency transceiver has a third receiving port Nx RX3 in the first band coupled with a third external port of the transmitting module. The radio frequency transceiver has a fourth receiving port Nx RX4 in the first band coupled with a P port of a second transfer switch of the second receiving module. The radio frequency transceiver has a PDET port coupled with a sixth external port of the transmitting module.

The two antennas of the first antenna group are coupled with a fourth external port and a fifth external port of the transmitting module. The antenna of the second antenna group is coupled with a P port of a first transfer switch of the first receiving module. The antenna of the third antenna group is coupled with a P port of a first transfer switch of the second receiving module.

An electronic device including the radio frequency architecture described above switches on a transmitting path between a transmitting port in a target band of the radio frequency transceiver and a target antenna group in the radio frequency system, to transmit a signal through an antenna in the target antenna group.

In an example, the electronic device including the foregoing radio frequency architecture performs, in single-band (for example, Nx band), switching among transmit antennas as follows.

In a first transmission period, the electronic device controls a first T port of a channel selector-switch of the transmitting module to be connected to a first P port of the channel selector-switch, to transmit a signal through a first antenna in the first antenna group.

In a second transmission period, the electronic device controls the first T port of the channel selector-switch of the transmitting module to be connected to a second P port of the channel selector-switch, to transmit a signal through a second antenna in the first antenna group.

Figure 4W:
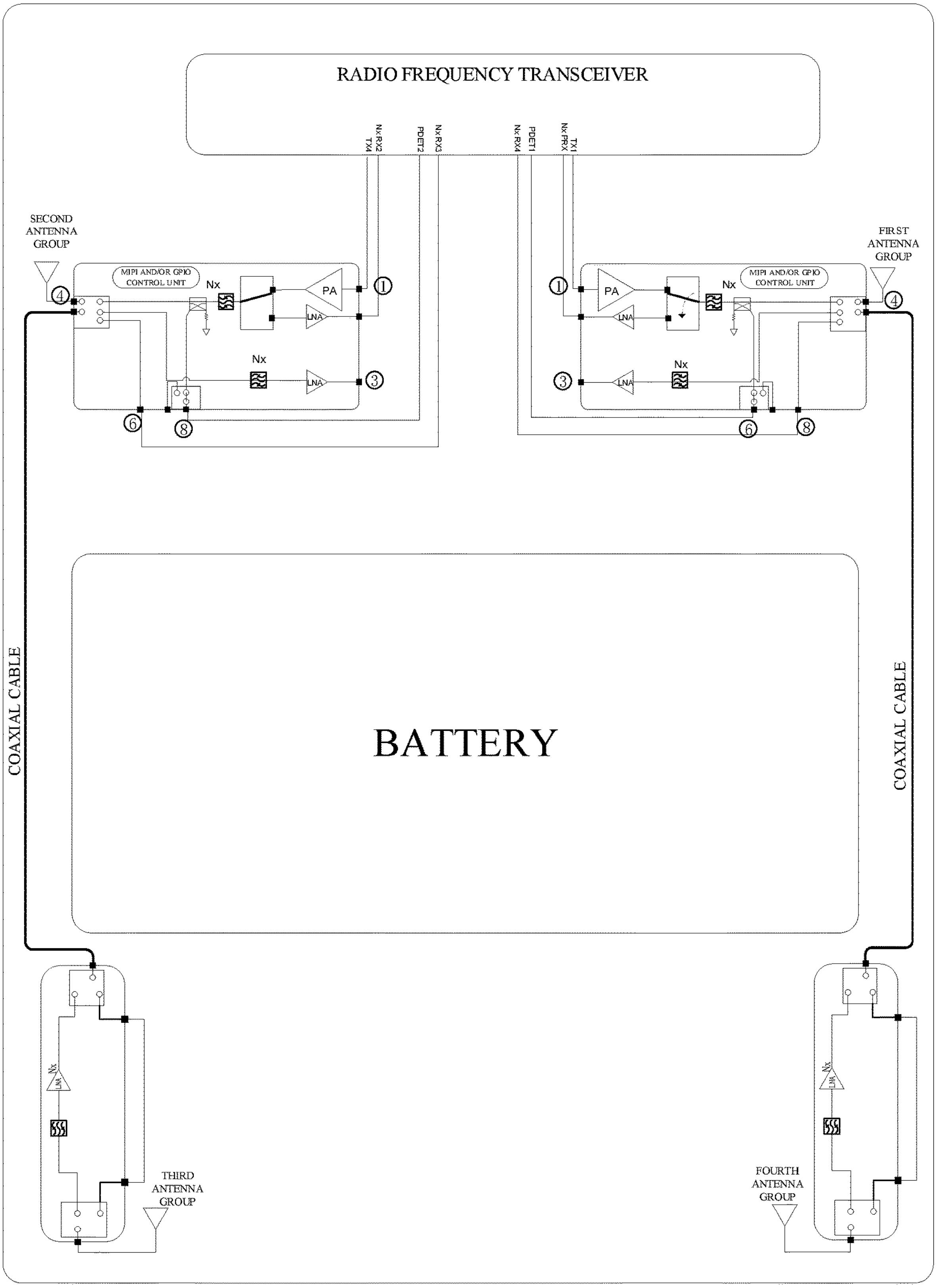
FIG. 4W is a schematic structural diagram illustrating a radio frequency system according to another implementation of the present disclosure.

As illustrated in FIG. 4W, in this example, the radio frequency architecture has the following function: ① supporting 5G NR single-band; ② not supporting UL CA; ③ not supporting DL CA; ④ not supporting SRS switching in four antennas; ⑤ supporting NR 2T4R (four transmitting paths and eight receiving paths in total).

The radio frequency architecture for 5G includes a radio frequency transceiver, two transmitting modules (a first transmitting module and a second transmitting module), two receiving modules (a first receiving module and a second receiving module), and four antenna groups (a first antenna group, a second antenna group, a third antenna group, and a fourth antenna group). Each of the first antenna group, the second antenna group, the third antenna group, and the fourth antenna group includes one antenna. The radio frequency transceiver, the first transmitting module, and the second transmitting module are disposed on a main board (two modules above a battery in this figure). The first receiving module and the second receiving module are disposed on a sub board (two modules below the battery in this figure). Each transmitting module/receiving module is disposed adjacent to the antenna group with which the transmitting module/receiving module is coupled.

The first transmitting module is disposed adjacent to the first antenna group. The second transmitting module is disposed adjacent to the second antenna group. The first receiving module is disposed adjacent to the third antenna group. The second receiving module is disposed adjacent to the fourth antenna group.

The structure and connection of internal devices of the transmitting module are similar to that of the transmitting module in FIG. 2K. The internal devices and connection therebetween of each receiving module are similar to that of the receiving module in FIG. 1N2.

The radio frequency transceiver has a first transmitting port TX1 in an Nx band coupled with a first external port of the first transmitting module. The radio frequency transceiver has a fourth transmitting port TX4 in the Nx band coupled with a first external port of the second transmitting module. The radio frequency transceiver has a first receiving port Nx PRX in the Nx band coupled with a second external port of the first transmitting module. The radio frequency transceiver has a second receiving port Nx RX2 in the Nx band coupled with a second external port of the second transmitting module. The radio frequency transceiver has a third receiving port Nx RX3 in the Nx band coupled with a sixth external port of the second transmitting module. The radio frequency transceiver has a fourth receiving port Nx RX4 in the Nx band coupled with an eighth external port of the first transmitting module. The radio frequency transceiver has a first PDET1 port coupled with a sixth external port of the first transmitting module. The radio frequency transceiver has a second PDET2 port coupled with an eighth external port of the second transmitting module.

The antenna of the first antenna group is coupled with a fourth external port of the first transmitting module. The antenna of the second antenna group is coupled with a fourth external port of the second transmitting module. The antenna of the third antenna group is coupled with a P port of a first transfer switch of the first receiving module. The antenna of the fourth antenna group is coupled with a P port of a first transfer switch of the second receiving module.

An electronic device including the radio frequency architecture described above switches on a transmitting path between a transmitting port in a target band of the radio frequency transceiver and a target antenna group in the radio frequency system, to transmit a signal through an antenna in the target antenna group.

In an example, the electronic device including the foregoing radio frequency architecture performs, in single-band (for example, Nx band), switching among transmit antennas as follows.

In a first transmission period, the electronic device controls a first T port of a channel selector-switch of the first transmitting module to be connected to a first P port of the channel selector-switch, to transmit a signal through the antenna in the first antenna group.

In a second transmission period, the electronic device controls a first T port of a channel selector-switch of the second transmitting module to be connected to a first P port of the channel selector-switch, to transmit a signal through the antenna in the second antenna group.

In a third transmission period, the electronic device controls the first T port of the channel selector-switch of the second transmitting module to be connected to a second P port of the channel selector-switch and a Bypass channel of the first receiving module to switch on, to transmit a signal through the antenna in the third antenna group.

In a fourth transmission period, the electronic device controls the first T port of the channel selector-switch of the first transmitting module to be connected to a second P port of the channel selector-switch and a Bypass channel of the second receiving module to switch on, to transmit a signal through the antenna in the fourth antenna group.

Figure 4X:
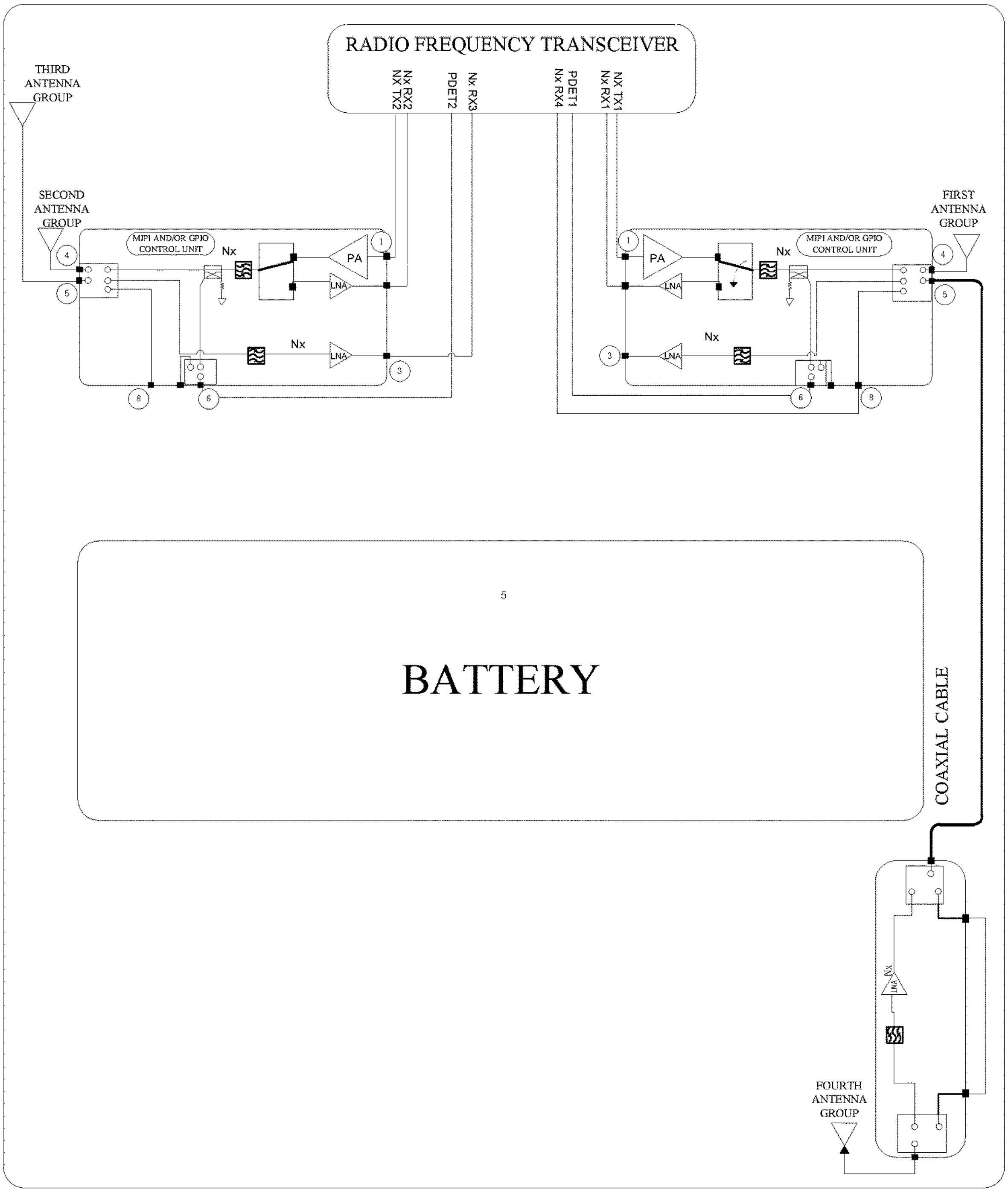
FIG. 4X is a schematic structural diagram illustrating a radio frequency system according to another implementation of the present disclosure.

As illustrated in FIG. 4X, in this example, the radio frequency architecture has the following function: ① supporting 5G NR single-band; ② not supporting UL CA; ③ not supporting DL CA; ④ not supporting transmission of an SSR with four antennas in a polling manner; ⑤ supporting NR 2T4R (two transmitting paths and four receiving paths in single-band).

The radio frequency architecture for 5G includes a radio frequency transceiver, two transmitting modules (a first transmitting module and a second transmitting module), one receiving module, and three antenna groups (a first antenna group, a second antenna group, and a third antenna group). The first antenna group includes one antenna. The second antenna group includes two antennas. The third antenna group includes one antenna. The radio frequency transceiver, the first transmitting module, and the second transmitting module are disposed on a main board (two modules above a battery in this figure). The receiving module is disposed on a sub board (one module below the battery in this figure). Each transmitting module/receiving module is disposed adjacent to the antenna group with which the receiving module is coupled.

The first transmitting module is disposed adjacent to the first antenna group. The second transmitting module is disposed adjacent to the second antenna group. The receiving module is disposed adjacent to the third antenna group.

The structure and connection of internal devices of the transmitting module are similar to that of the transmitting module in FIG. 2K. The internal devices and connection therebetween of each receiving module are similar to that of the receiving module in FIG. 1N2.

The radio frequency transceiver has a first transmitting port Nx TX1 in an Nx band coupled with a first external port of the first transmitting module. The radio frequency transceiver has a second transmitting port Nx TX2 in the Nx band coupled with a first external port of the second transmitting module. The radio frequency transceiver has a first receiving port Nx RX1 in the Nx band coupled with a second external port of the first transmitting module. The radio frequency transceiver has a second receiving port Nx RX2 in the Nx band coupled with a second external port of the second transmitting module. The radio frequency transceiver has a third receiving port Nx RX3 in the Nx band coupled with a third external port of the second transmitting module. The radio frequency transceiver has a fourth receiving port Nx RX4 in the Nx band coupled with an eighth external port of the first transmitting module. The radio frequency transceiver has a first PDET1 port coupled with a sixth external port of the first transmitting module. The radio frequency transceiver has a second PDET2 port coupled with a sixth external port of the second transmitting module.

The antenna of the first antenna group is coupled with a fourth external port of the first transmitting module. The two antennas of the second antenna group are respectively coupled with a fourth external port and a fifth external port of the second transmitting module. The antenna of the third antenna group is coupled with a P port of a first transfer switch of the receiving module.

An electronic device including the radio frequency architecture described above switches on a transmitting path between a transmitting port in a target band of the radio frequency transceiver and a target antenna group in the radio frequency system, to transmit a signal through an antenna in the target antenna group.

In an example, the electronic device including the foregoing radio frequency architecture performs, in single-band (for example, Nx band), switching among transmit antennas as follows.

In a first transmission period, the electronic device controls a first T port of a channel selector-switch of the first transmitting module to be connected to a first P port of the channel selector-switch, and controls the first T port of the channel selector-switch of the first transmitting module to be connected to a second P port of the channel selector-switch and a Bypass channel of the receiving module to switch on, to achieve signal transmission through antennas in the first antenna group and the third antenna group.

In a second transmission period, the electronic device controls a first T port of a channel selector-switch of the second transmitting module to be connected to a first P port of the channel selector-switch, and controls the first T port of the channel selector-switch of the second transmitting module to be connected to a second P port of the channel selector-switch, to achieve signal transmission through the two antennas in the second antenna group.

Figure 4Y:
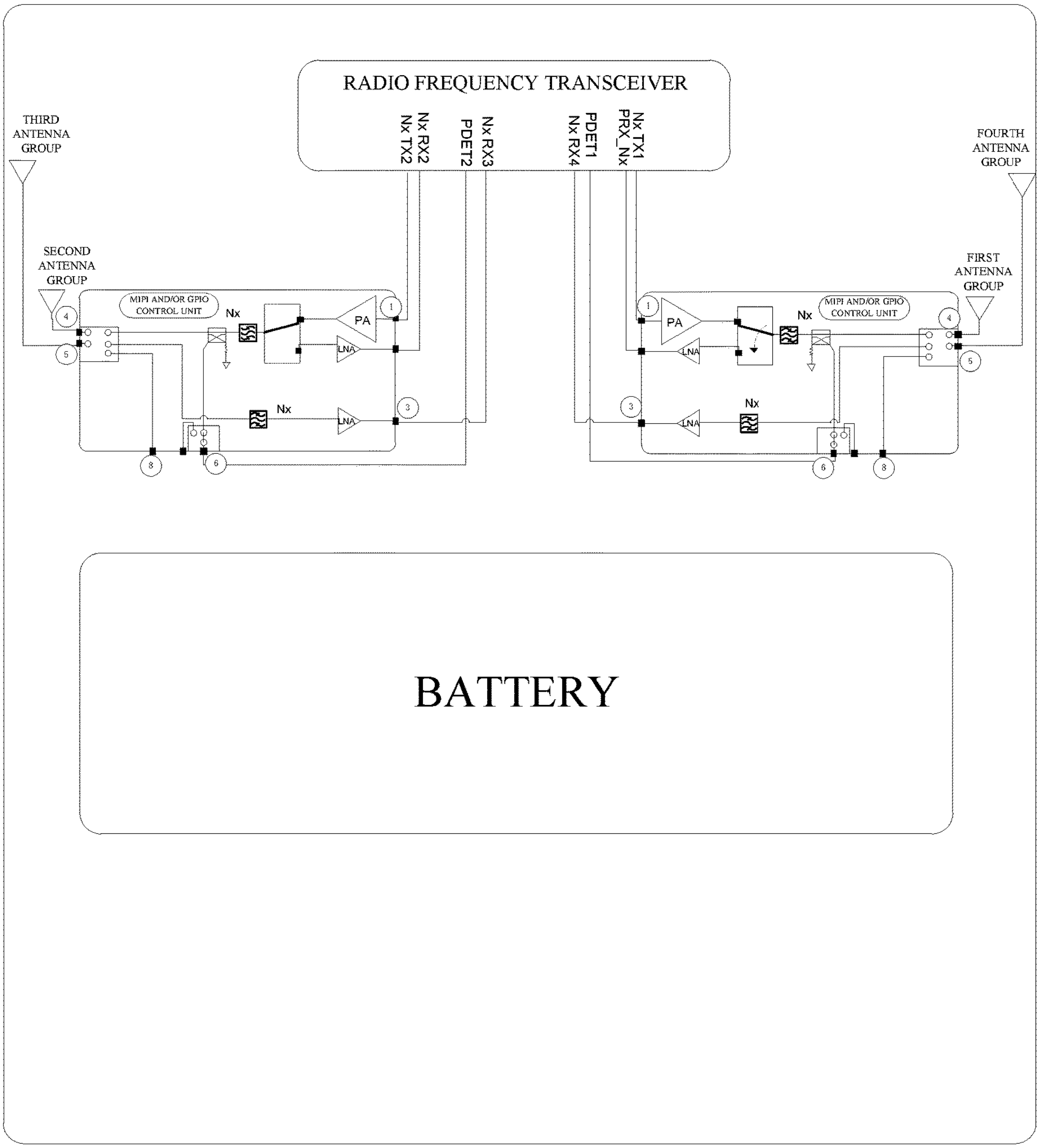
FIG. 4Y is a schematic structural diagram illustrating a radio frequency system according to another implementation of the present disclosure.

As illustrated in FIG. 4Y, in this example, the radio frequency architecture has the following function: ① supporting 5G NR single-band; ② not supporting UL CA; ③ not supporting DL CA; ④ not supporting transmission of an SSR with four antennas in a polling manner; ⑤ supporting NR 2T4R (two transmitting paths and four receiving paths in single-band).

The radio frequency architecture for 5G includes a radio frequency transceiver, two transmitting modules (a first transmitting module and a second transmitting module), and two antenna groups (a first antenna group and a second antenna group). Each antenna group includes two antennas. The radio frequency transceiver, the first transmitting module, and the second transmitting module are disposed on a main board (two modules above a battery in this figure). Each transmitting module is disposed adjacent to an antenna group with which the transmitting module is coupled.

The first transmitting module is disposed adjacent to the first antenna group. The second transmitting module is disposed adjacent to the second antenna group.

The structure and connection of internal devices of the first transmitting module and the second transmitting module are similar to that of the transmitting module in FIG. 2K.

The radio frequency transceiver has a first transmitting port Nx TX1 in an Nx band coupled with a first external port of the first transmitting module. The radio frequency transceiver has a second transmitting port Nx TX2 in the Nx band coupled with a first external port of the second transmitting module. The radio frequency transceiver has a first receiving port Nx PRX_Nx in the Nx band coupled with a second external port of the first transmitting module. The radio frequency transceiver has a second receiving port Nx RX2 in the Nx band coupled with a second external port of the second transmitting module. The radio frequency transceiver has a third receiving port Nx RX3 in the Nx band coupled with a third external port of the second transmitting module. The radio frequency transceiver has a fourth receiving port Nx RX4 in the Nx band coupled with a third external port of the first transmitting module. The radio frequency transceiver has a first PDET1 port coupled with a sixth external port of the first transmitting module. The radio frequency transceiver has a second PDET2 port coupled with a sixth external port of the second transmitting module.

The two antennas of the first antenna group are coupled with a fourth external port and a fifth external port of the first transmitting module. The two antennas of the second antenna group are coupled with a fourth external port and a fifth external port of the second transmitting module.

An electronic device including the radio frequency architecture described above switches on a transmitting path between a transmitting port in a target band of the radio frequency transceiver and a target antenna group in the radio frequency system, to transmit a signal through an antenna in the target antenna group.

In an example, the electronic device including the foregoing radio frequency architecture performs, in single-band (for example, Nx band), switching among transmit antennas as follows.

In a first transmission period, the electronic device controls a first T port of a channel selector-switch of the first transmitting module to be connected to a first P port of the channel selector-switch of the first transmitting module, and controls the first T port of the channel selector-switch of the first transmitting module to be connected to a second P port of the channel selector-switch of the first transmitting module, to transmit signals through the two antennas in the first antenna group.

In a second transmission period, the electronic device controls a first T port of a channel selector-switch of the second transmitting module to be connected to a first P port of the channel selector-switch of the second transmitting module, and controls the first T port of the channel selector-switch of the second transmitting module to be connected to a second P port of the channel selector-switch of the second transmitting module, to transmit signals through the two antennas in the second antenna group.

It should be noted that, the external port described in the implementations of the present disclosure may be a port inherent to the internal device of the module, or may be an independent physical port extended with a wire, which is not limited herein. The internal ports of the above various n1Pn2T (n1 is greater than or equal to 1, and n2 is greater than or equal to 2) switches (including any of the described channel selector-switch, power detection selector-switch, transmit-receive transfer switch, first transfer switch, second transfer switch, receiving port selector-switch, etc.) may be in full connection or simplified connection, and the connection between internal ports may be correspondingly set according to requirements. For example, for the 4P4T switch, the first P port can be coupled only with the first T port, and the second P port can be coupled with three T ports. A switch with a full-coupling structure has an internal controllable circuit structure that can construct a path, such as construction and control through a switch transistor.

It should be noted that, the coaxial cable in the radio frequency system described in the implementations of the present disclosure may also be replaced by a liquid crystal polymer (LCP) material such as LCP soft board or the like.

In a fourth aspect, implementations of the disclosure provide an electronic device. The electronic device includes the radio frequency system according to any aspect of the foregoing implementations. The radio frequency system includes a radio frequency transceiver, a radio frequency processing circuit, and at least two antenna groups. The radio frequency transceiver is coupled with the radio frequency processing circuit, and the radio frequency processing circuit is coupled with the at least two antenna groups. The radio frequency system supports a simultaneous downlink reception with four antennas. The at least two antenna groups include m antennas, where m is greater than or equal to 4 and less than or equal to 8. The radio frequency processing circuit includes modules which are the same in number as the at least two antenna groups. The modules include at least one transmitting module, or at least one transmitting module and at least one receiving module. Each transmitting module is disposed adjacent to the antenna group with which the transmitting module is coupled, and each receiving module is disposed adjacent to the antenna group with which the receiving module is coupled.

The electronic device at least includes any of: a mobile terminal and a base station.

Figure 5:
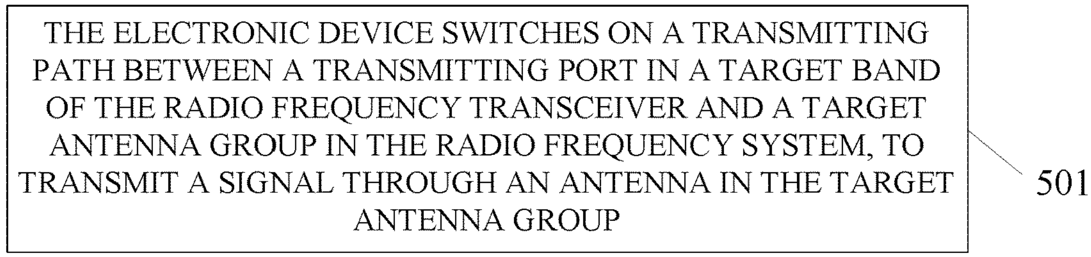
FIG. 5 is a schematic flowchart illustrating a method for antenna switching according to an implementation of the present disclosure.

In a fifth aspect, implementations of the disclosure provide a method for controlling antenna switching. The method is applicable to the electronic device of the above implementations. The electronic device includes a radio frequency system. The radio frequency system includes a radio frequency transceiver, a radio frequency processing circuit, and at least two antenna groups. As illustrated in FIG. 5, the method includes the following. At 501, the electronic device switches on a transmitting path between a transmitting port in a target band of the radio frequency transceiver and a target antenna group in the radio frequency system, to transmit a signal through an antenna in the target antenna group.

Figure 6:
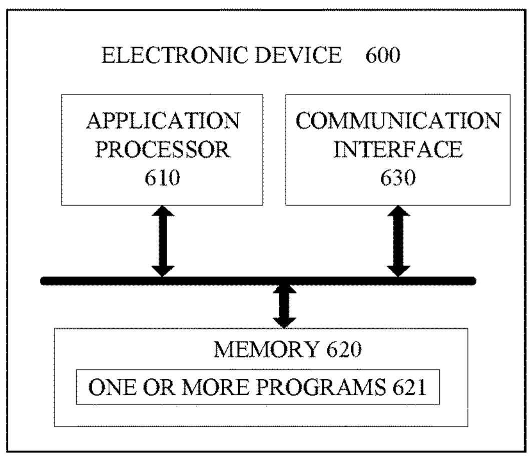
FIG. 6 is a schematic structural diagram illustrating an electronic device according to an implementation of the present disclosure.

In a sixth aspect, implementations of the disclosure provide an electronic device 600. FIG. 6 is a schematic structural diagram illustrating the electronic device 600. As illustrated in FIG. 6, the electronic device 600 includes an application processor 610, a memory 620, a communication interface 630, and one or more programs 621. The one or more programs 621 are stored in the memory 620 and configured to be executed by the application processor 610. The one or more programs 621 include instructions for performing the following. A transmitting path(s) between a transmitting port(s) in a target band of the radio frequency transceiver and a target antenna group(s) in the radio frequency system is switched on, to achieve signal transmission through an antenna(s) in the target antenna group(s).

According to the implementations of the disclosure, the electronic device can achieve switching between multiple transmit antennas, thus satisfying an antenna switching function in a multiple-antenna architecture.

Figure 7:
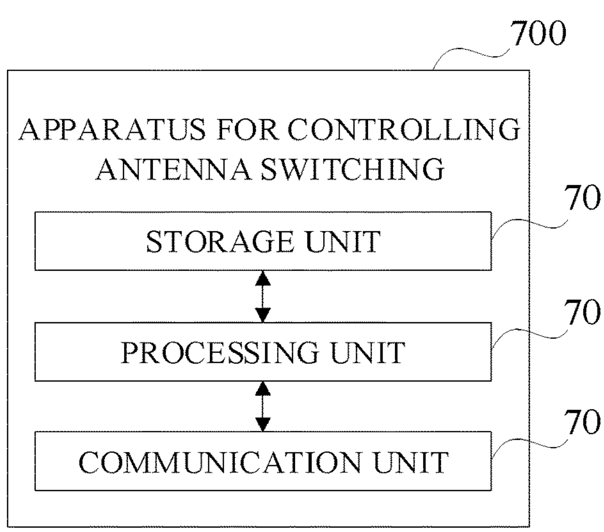
FIG. 7 is a block diagram illustrating functional units of an apparatus for antenna switching according to an implementation of the present disclosure.

In a seventh aspect, as illustrated in FIG. 7, implementations of the disclosure provide an apparatus for controlling antenna switching. The apparatus is applicable to the electronic device of the above implementations. The electronic device includes a radio frequency system. The radio frequency system includes a radio frequency transceiver, a radio frequency processing circuit, and at least two antenna groups. The apparatus includes a processing unit 701 and a communication unit 702.

According to the implementations of the disclosure, the electronic device can achieve switching between multiple transmit antennas, thus satisfying an antenna switching function in a multiple-antenna architecture.

Implementations of the present disclosure also provide a computer readable storage medium. The computer readable storage medium is configured to store computer programs for electronic data interchange which, when executed, are operable with a computer to execute all or part of the operations of any of the methods described in the above-described method implementations. The computer may include an electronic device.

Implementations of the present disclosure also provide a computer program product. The computer program product includes a non-transitory computer readable storage medium that stores computer programs. The computer programs are operable with a computer to perform all or part of the operations of any of the methods described in the above method implementations. The computer program product may be a software installation package. The computer may include an electronic device.

It is to be noted that, for the sake of simplicity, the foregoing method implementations are described as a series of action combinations, however, it will be appreciated by those skilled in the art that the present disclosure is not limited by the sequence of actions described. According to the present disclosure, certain steps or operations may be performed in other order or simultaneously. Besides, it will be appreciated by those skilled in the art that the implementations described in the specification are exemplary implementations and the actions and modules involved are not necessarily essential to the present disclosure.

In the foregoing implementations, the description of each implementation has its own emphasis. For the parts not described in detail in one implementation, reference may be made to related descriptions in other implementations.

In the implementations of the disclosure, the apparatus disclosed in implementations provided herein may be implemented in other manners. For example, the device/apparatus implementations described above are merely illustrative; for instance, the division of the unit is only a logical function division and there can be other manners of division during actual implementations, for example, multiple units or components may be combined or may be integrated into another system, or some features may be ignored, omitted, or not performed. In addition, coupling or communication connection between each illustrated or discussed component may be direct coupling or communication connection, or may be indirect coupling or communication among devices or units via some interfaces, and may be electrical connection, mechanical connection, or other forms of connection.

The units described as separate components may or may not be physically separated, the components illustrated as units may or may not be physical units, that is, they may be in the same place or may be distributed to multiple network elements. All or part of the units may be selected according to actual needs to achieve the purpose of the technical solutions of the implementations.

In addition, the functional units in various implementations of the present disclosure may be integrated into one processing unit, or each unit may be physically present, or two or more units may be integrated into one unit. The above-mentioned integrated unit can be implemented in the form of hardware or a software function unit.

The integrated unit may be stored in a computer-readable memory when it is implemented in the form of a software functional unit and is sold or used as a separate product. Based on such understanding, the technical solutions of the present disclosure essentially, or the part of the technical solutions that contributes to the related art, or all or part of the technical solutions, may be embodied in the form of a software product which is stored in a memory and includes instructions for causing a computer device (which may be a personal computer, a server, or a network device and so on) to perform all or part of the steps described in the various implementations of the present disclosure. The memory includes various medium capable of storing program codes, such as a USB (universal serial bus) flash disk, a read-only memory (ROM), a random-access memory (RAM), a removable hard disk, Disk, compact disc (CD), or the like.

It will be understood by those of ordinary skilled in the art that all or a part of the various methods of the implementations described above may be accomplished by means of a program to instruct associated hardware, the program may be stored in a computer-readable memory, which may include a flash memory, a ROM, a RAM, Disk or CD, and so on.

The implementations of the present disclosure are described in detail above. The principle and implementation of the present disclosure are described herein through specific examples. The above description about the implementations is merely provided to help understand the method and core ideas of the present disclosure. In addition, a person of ordinary skilled in the art can make variations and modifications to the present disclosure in terms of the specific implementations and application scopes according to the ideas of the present disclosure. Therefore, the content of specification shall not be construed as a limit to the present disclosure.

The above is the implementations of the present disclosure. It shall be pointed out that a person ordinarily skilled in the art can make some improvements and polishes without departing from the principle of the implementations of the present disclosure. These improvements and polishes shall be construed to be the protection range of the present disclosure.

What is claimed is:

1. A radio frequency system, supporting simultaneous downlink reception with four antennas and comprising:

m antennas, divided into at least two antenna groups, m being greater than or equal to 4 and less than or equal to 8;

a radio frequency processing circuit, coupled with the at least two antenna groups, the radio frequency processing circuit comprising modules which are the same in number as the at least two antenna groups, each module being coupled with one antenna group and being disposed adjacent to the antenna group with which the module is coupled, and the modules comprise a transmitting module and a receiving module; and a radio frequency transceiver, coupled with the radio frequency processing circuit, wherein the receiving module comprises:

two signal receiving channels, wherein each signal receiving channel comprises a filter and an LNA coupled with the filter;

a first transfer switch, coupled with the two signal receiving channels;

a second transfer switch, coupled with the two signal receiving channels; and an internal Bypass channel;

wherein the first transfer switch or the second transfer switch comprises an n1Pn2T switch, and "P" represents pole and "T" represents throw;

wherein the first transfer switch is coupled with an antenna in an antenna group corresponding to the receiving module;

wherein the second transfer switch is coupled with at least one of the transmitting module and the radio frequency transceiver, the receiving module is disposed adjacent to the antenna group, and n1 is a positive integer and n2 is an integer greater than or equal to 2;

wherein the two signal receiving channels comprise two LNAs and two filters in total;

wherein the first transfer switch has a P port configured to be coupled with the antenna of the antenna group;

wherein the first transfer switch has a first T port coupled with a first filter of the two filters, the first filter is coupled with a first LNA of the two LNAs, and the first LNA is coupled with a first T port of the second transfer switch;

wherein the first transfer switch has a second T port coupled with a second filter of the two filters, the second filter is coupled with a second LNA of the two LNAs, and the second LNA is coupled with a second T port of the second transfer switch;

wherein the internal Bypass channel is coupled between a third T port of the first transfer switch and a third T port of the second transfer switch; and wherein the second transfer switch has a P port configured to be coupled with the transmitting module.

2. The radio frequency system of claim 1, wherein the radio frequency system supports a single-transmit mode and the radio frequency processing circuit comprises one transmitting module and two or three receiving modules.

3. The radio frequency system of claim 2, wherein the one transmitting module and at least one receiving module of the two or three receiving modules are disposed on a main board, and the rest of the two or three receiving modules is disposed on a sub board, wherein the rest of the two or three receiving modules refers to one or more receiving modules except the at least one receiving module disposed on the main board.

4. The radio frequency system of claim 2, wherein the radio frequency transceiver is coupled with the one transmitting module and the two or three receiving modules.

5. The radio frequency system of claim 4, wherein the one transmitting module is coupled with at least one receiving module of the two or three receiving modules, to support a signal transmitting function of the at least one receiving module.

6. The radio frequency system of claim 1, wherein the radio frequency system supports a dual-transmit mode and the radio frequency processing circuit at least comprises two transmitting modules.

7. The radio frequency system of claim 6, wherein the two transmitting modules are disposed on a main board.

8. The radio frequency system of claim 6, wherein the radio frequency processing circuit further comprises one or two receiving modules, and at least one receiving module of the one or two receiving modules is disposed on a sub board.

9. The radio frequency system of claim 8, wherein at least one of:

the radio frequency transceiver is coupled with the two transmitting modules;

the two transmitting modules are coupled with each other;

the radio frequency transceiver is coupled with the one or two receiving modules; and at least one transmitting module of the two transmitting modules is coupled with at least one receiving module of the one or two receiving modules to support a signal transmitting function of the at least one receiving module.

10. The radio frequency system of claim 1, wherein the radio frequency processing circuit further comprises at least one receiving port selector-switch, and each of the at least one receiving port selector-switch is coupled with a signal receiving port of the radio frequency transceiver and is coupled with the transmitting module or the receiving module.

11. The radio frequency system of claim 1, wherein the at least one channel selector-switch is coupled with an antenna group corresponding to the transmitting module and the transmitting module is disposed adjacent to the antenna group.

12. The radio frequency system of claim 11, wherein the transmitting module supports one band and further comprises one power coupler, the signal transmit-receive processing circuit comprises:

one power amplifier (PA);

one low noise amplifier (LNA);

one transmit-receive transfer switch, coupled with the PA and the LNA; and one filter, coupled with the transmit-receive transfer switch; and the signal transmit-receive processing circuit is coupled with the power coupler and the at least one channel selector-switch, wherein the transmit-receive transfer switch comprises a single-pole double-throw (SPDT) switch.

13. A method for controlling antenna switching, applicable to an electronic device comprising a radio frequency system, the radio frequency system supporting simultaneous downlink reception with four antennas and comprising;

m antennas, divided into at least two antenna groups, m being greater than or equal to 4 and less than or equal to 8;

a radio frequency processing circuit, coupled with the at least two antenna groups, the radio frequency processing circuit comprising modules which are the same in number as the at least two antenna groups, each module being coupled with one antenna group and being disposed adjacent to the antenna group with which the module is coupled, and the modules comprise a transmitting module and a receiving module; and a radio frequency transceiver, coupled with the radio frequency processing circuit, wherein the receiving module comprises:

two signal receiving channels, wherein each signal receiving channel comprises a filter and an LNA coupled with the filter;

a first transfer switch, coupled with the two signal receiving channels;

a second transfer switch, coupled with the two signal receiving channels; and an internal Bypass channel;

wherein the first transfer switch or the second transfer switch comprises an n1Pn2T switch, and "P" represents pole and "T" represents throw;

wherein the first transfer switch is coupled with an antenna in an antenna group corresponding to the receiving module;

wherein the second transfer switch is coupled with at least one of the transmitting module and the radio frequency transceiver, the receiving module is disposed adjacent to the antenna group, and n1 is a positive integer and n2 is an integer greater than or equal to 2;

wherein the two signal receiving channels comprise two LNAs and two filters in total;

wherein the first transfer switch has a P port configured to be coupled with the antenna of the antenna group;

wherein the first transfer switch has a first T port coupled with a first filter of the two filters, the first filter is coupled with a first LNA of the two LNAs, and the first LNA is coupled with a first T port of the second transfer switch;

wherein the first transfer switch has a second T port coupled with a second filter of the two filters, the second filter is coupled with a second LNA of the two LNAs, and the second LNA is coupled with a second T port of the second transfer switch;

wherein the internal Bypass channel is coupled between a third T port of the first transfer switch and a third T port of the second transfer switch; and wherein the second transfer switch has a P port configured to be coupled with the transmitting module;

the method comprising:

switching on a transmitting path between a transmitting port in a target band of the radio frequency transceiver and a target antenna group in the radio frequency system, to transmit a signal through an antenna in the target antenna group.

14. An electronic device comprising a radio frequency system, the radio frequency system supporting simultaneous downlink reception with four antennas and comprising:

m antennas, divided into at least two antenna groups, m being greater than or equal to 4 and less than or equal to 8;

a radio frequency processing circuit, coupled with the at least two antenna groups, the radio frequency processing circuit comprising modules which are the same in number as the at least two antenna groups, each module being coupled with one antenna group and being disposed adjacent to the antenna group with which the module is coupled, and the modules comprise a transmitting module and a receiving module; and a radio frequency transceiver, coupled with the radio frequency processing circuit, wherein the receiving module comprises:

two signal receiving channels, wherein each signal receiving channel comprises a filter and an LNA coupled with the filter;

a first transfer switch, coupled with the two signal receiving channels;

a second transfer switch, coupled with the two signal receiving channels; and an internal Bypass channel;

wherein the first transfer switch or the second transfer switch comprises an n1Pn2T switch, and "P" represents pole and "T" represents throw;

wherein the first transfer switch is coupled with an antenna in an antenna group corresponding to the receiving module;

wherein the second transfer switch is coupled with at least one of the transmitting module and the radio frequency transceiver, the receiving module is disposed adjacent to the antenna group, and n1 is a positive integer and n2 is an integer greater than or equal to 2;

wherein the two signal receiving channels comprise two LNAs and two filters in total;

wherein the first transfer switch has a P port configured to be coupled with the antenna of the antenna group;

wherein the first transfer switch has a first T port coupled with a first filter of the two filters, the first filter is coupled with a first LNA of the two LNAs, and the first LNA is coupled with a first T port of the second transfer switch;

wherein the first transfer switch has a second T port coupled with a second filter of the two filters, the second filter is coupled with a second LNA of the two LNAs, and the second LNA is coupled with a second T port of the second transfer switch;

wherein the internal Bypass channel is coupled between a third T port of the first transfer switch and a third T port of the second transfer switch; and wherein the second transfer switch has a P port configured to be coupled with the transmitting module.

15. The electronic device of claim 14, wherein the internal Bypass channel is disposed between the first transfer switch and the second transfer switch of the receiving module and configured to be coupled with the transmitting module to support a signal transmitting function of the receiving module.

* * * * *